US012376488B2

(12) United States Patent
Maier-Flaig et al.

(10) Patent No.: US 12,376,488 B2
(45) Date of Patent: Jul. 29, 2025

(54) ELECTRONIC DEVICE

(71) Applicant: Merck Patent GmbH, Darmstadt (DE)

(72) Inventors: Florian Maier-Flaig, Weinheim (DE); Frank Voges, Bad Duerkheim (DE); Elvira Montenegro, Weinheim (DE); Teresa Mujica-Fernaud, Tenerife (ES); Aurélie Ludemann, Frankfurt am Main (DE)

(73) Assignee: MERCK PATENT GMBH, Darmstadt (DE)

( * ) Notice: Subject to any disclaimer, the term of this patent is extended or adjusted under 35 U.S.C. 154(b) by 890 days.

(21) Appl. No.: 17/608,028

(22) PCT Filed: Apr. 30, 2020

(86) PCT No.: PCT/EP2020/061978

§ 371 (c)(1),
(2) Date: Nov. 1, 2021

(87) PCT Pub. No.: WO2020/225069

PCT Pub. Date: Nov. 12, 2020

(65) Prior Publication Data

US 2022/0199908 A1 Jun. 23, 2022

(30) Foreign Application Priority Data

May 3, 2019 (EP) .................................... 19172609

(51) Int. Cl.

| | |
|---|---|
| ***H01L 51/50*** | (2006.01) |
| ***H10K 85/60*** | (2023.01) |
| *H10K 50/11* | (2023.01) |
| *H10K 50/15* | (2023.01) |
| *H10K 71/00* | (2023.01) |
| *H10K 71/16* | (2023.01) |
| *H10K 101/40* | (2023.01) |

(52) U.S. Cl.

CPC ......... *H10K 85/624* (2023.02); *H10K 85/626* (2023.02); *H10K 85/633* (2023.02); *H10K 85/6572* (2023.02); *H10K 85/6574* (2023.02); *H10K 50/11* (2023.02); *H10K 50/156* (2023.02); *H10K 71/00* (2023.02); *H10K 71/16* (2023.02); *H10K 2101/40* (2023.02)

(58) Field of Classification Search

None

See application file for complete search history.

(56) References Cited

U.S. PATENT DOCUMENTS

| | | | | |
|---|---|---|---|---|
| 2007/0007882 | A1* | 1/2007 | Fukuoka ................ | H10K 50/19 252/301.16 |
| 2012/0018717 | A1 | 1/2012 | Kim | |
| 2012/0326141 | A1 | 12/2012 | Pflumm et al. | |
| 2015/0236261 | A1 | 8/2015 | Stoessel et al. | |
| 2017/0033307 | A1* | 2/2017 | Choi .................... | H10K 50/156 |
| 2017/0288147 | A1* | 10/2017 | Fujita ..................... | H10K 85/40 |

FOREIGN PATENT DOCUMENTS

| | | | |
|---|---|---|---|
| JP | 2012-521418 | A | 9/2012 |
| JP | 2013-522864 | A | 6/2013 |
| JP | 2015-535818 | A | 12/2015 |
| KR | 10-1111413 | B1 | 2/2012 |
| KR | 10-2015-0058396 | A | 5/2015 |
| WO | 2013/002514 | A2 | 1/2013 |
| WO | 2014/044344 | A1 | 3/2014 |
| WO | 2014/072017 | A1 | 5/2014 |
| WO | 2016/062371 | A1 | 4/2016 |

OTHER PUBLICATIONS

International Search Report and Written Opinion received for PCT Patent Application No. PCT/EP2020/061978, mailed on Jul. 27, 2020, 12 pages (2 pages of English Translation and 10 pages of Original Document).

International Preliminary Report on Patentability received for PCT Patent Application No. PCT/EP2020/061978, mailed on Nov. 18, 2021, 15 pages (8 pages of English Translation and 7 pages of Original Document).

* cited by examiner

*Primary Examiner* — Gregory D Clark

(74) *Attorney, Agent, or Firm* — Faegre Drinker Biddle & Reath LLP

(57) ABSTRACT

The application relates to an electronic device comprising an organic layer containing a mixture of at least two different compounds.

16 Claims, No Drawings

ELECTRONIC DEVICE

CROSS-REFERENCE TO RELATED APPLICATIONS

This application is a national stage application (under 35 U.S.C. § 371) of PCT/EP2020/061978, filed Apr. 30, 2020, which claims benefit of European Application No. 19172609.0, filed May 3, 2019, both of which are incorporated herein by reference in their entirety.

The present application relates to an electronic device comprising, in this sequence, an anode, a first hole-transporting layer, a second hole-transporting layer, an emitting layer, and a cathode. The first hole-transporting layer contains a mixture of two different compounds.

Electronic devices in the context of this application are understood to mean what are called organic electronic devices, which contain organic semiconductor materials as functional materials. More particularly, these are understood to mean OLEDs (organic light-emitting diodes, organic electroluminescent devices). These are electronic devices which have one or more layers comprising organic compounds and emit light on application of electrical voltage. The construction and general principle of function of OLEDs are known to those skilled in the art.

A hole-transporting layer is understood to be a layer capable of transporting holes in operation of the electronic device. More particularly, it is a layer disposed between anode and the said emitting layer in an OLED containing an emitting layer.

In electronic devices, especially OLEDs, there is great interest in an improvement in the performance data, especially lifetime, efficiency, operating voltage and colour purity. In these aspects, it has not yet been possible to find any entirely satisfactory solution.

Hole-transporting layers have a great influence on the abovementioned performance data of the electronic devices. They may occur as an individual hole-transporting layer between anode and emitting layer, or occur in the form of multiple hole-transporting layers, for example 2 or 3 hole-transporting layers, between anode and emitting layer. The hole-transporting layers may, as well as their hole-transporting function, also have an electron-blocking function, meaning that they block the passage of electrons from the emitting layer to the anode. This function is particularly desirable in a hole-transporting layer that directly adjoins the emitting layer on the anode side.

Materials for hole-transporting layers that are known in the prior art are primarily amine compounds, especially triarylamine compounds. Examples of such triarylamine compounds are spirobifluoreneamines, fluoreneamines, indenofluoreneamines, phenanthreneamines, carbazoleamines, xantheneamines, spirodihydroacridineamines, biphenylamines and combinations of these structural elements having one or more amino groups, this being just a selection, and the person skilled in the art being aware of further structure classes.

It has now been found, surprisingly, that an electronic device containing anode, cathode, emitting layer, a first hole-transporting layer and a second hole-transporting layer, wherein the first hole-transporting layer contains a mixture of two different compounds, has better performance data than an electronic device according to the prior art in which the first hole-transporting layer is formed from a single compound. More particularly, the lifetime of such a device is improved compared to the abovementioned device according to the prior art.

The present application thus provides an electronic device comprising anode, cathode, emitting layer disposed between anode and cathode, a first hole-transporting layer disposed between anode and emitting layer and containing two different compounds conforming to identical or different formulae selected from formulae (I) and (II)

Formula (I)

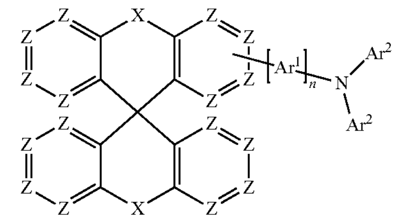

Formula (II)

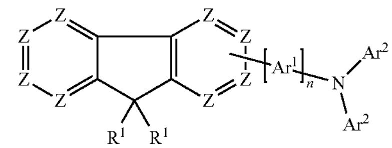

where

Z is the same or different at each instance and is selected from $CR^1$ and N, where Z is C when a

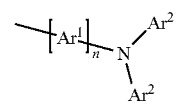

group is bonded thereto;

X is the same or different at each instance and is selected from single bond, O, S, $C(R^1)_2$ and $NR^1$;

$Ar^1$ and $Ar^2$ are the same or different at each instance and are selected from aromatic ring systems which have 6 to 40 aromatic ring atoms and are substituted by one or more $R^2$ radicals and heteroaromatic ring systems which have 5 to 40 aromatic ring atoms and are substituted by one or more $R^2$ radicals;

$R^1$ and $R^2$ are the same or different at each instance and are selected from H, D, F, Cl, Br, I, $C(=O)R^3$, CN, $Si(R^3)_3$, $N(R^3)_2$, $P(=O)(R^3)_2$, $OR^3$, $S(=O)R^3$, $S(=O)_2R^3$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^1$ or $R^2$ radicals may be joined to one another and may form a ring; where the alkyl, alkoxy, alkenyl and alkynyl groups mentioned and the aromatic ring systems and heteroaromatic ring systems mentioned are each substituted by $R^3$ radicals; and where one or more $CH_2$ groups in the alkyl, alkoxy, alkenyl and alkynyl groups mentioned may be replaced by $—R^3C{=}CR^3—$, —C≡C—, $Si(R^3)_2$, C═O, $C{=}NR^3$, —C(═O)O—, $—C(=O)NR^3—$, $NR^3$, $P(=O)(R^3)$, —O—, —S—, SO or $SO_2$;

$R^3$ is the same or different at each instance and is selected from H, D, F, Cl, Br, I, CN, alkyl or alkoxy groups having 1 to 20 carbon atoms, alkenyl or alkynyl groups having 2 to 20 carbon atoms, aromatic ring systems having 6 to 40 aromatic ring atoms and heteroaromatic ring systems having 5 to 40 aromatic ring atoms; where two or more $R^3$ radicals may be joined to one another and may form a ring; and where the alkyl, alkoxy, alkenyl and alkynyl groups, aromatic ring systems and heteroaromatic ring systems mentioned may be substituted by one or more radicals selected from F and CN;

n is 0, 1, 2, 3 or 4, where, when n=0, the $Ar^1$ group is absent and the nitrogen atom is bonded directly to the rest of the formula;

and a second hole-transporting layer disposed between the first hole-transporting layer and the emitting layer.

When n=2, two $Ar^1$ groups are bonded successfully in a row, as $-Ar^1-Ar^1-$.

When n=3, three $Ar^1$ groups are bonded successfully in a row, as $-Ar^1-Ar^1-Ar^1-$. When n=4, four $Ar^1$ groups are bonded successfully in a row, as $-Ar^1-Ar^1-Ar^1-Ar^1-$.

The definitions which follow are applicable to the chemical groups that are used in the present application. They are applicable unless any more specific definitions are given.

An aryl group in the context of this invention is understood to mean either a single aromatic cycle, i.e. benzene, or a fused aromatic polycycle, for example naphthalene, phenanthrene or anthracene. A fused aromatic polycycle in the context of the present application consists of two or more single aromatic cycles fused to one another. Fusion between cycles is understood here to mean that the cycles share at least one edge with one another. An aryl group in the context of this invention contains 6 to 40 aromatic ring atoms. An aryl group does not contain any heteroatoms as aromatic ring atoms.

A heteroaryl group in the context of this invention is understood to mean either a single heteroaromatic cycle, for example pyridine, pyrimidine or thiophene, or a fused heteroaromatic polycycle, for example quinoline or carbazole. A fused heteroaromatic polycycle in the context of the present application consists of two or more single aromatic or heteroaromatic cycles that are fused to one another, where at least one of the aromatic and heteroaromatic cycles is a heteroaromatic cycle. Fusion between cycles is understood here to mean that the cycles share at least one edge with one another. A heteroaryl group in the context of this invention contains 5 to 40 aromatic ring atoms of which at least one is a heteroatom. The heteroatoms of the heteroaryl group are preferably selected from N, O and S.

An aryl or heteroaryl group, each of which may be substituted by the abovementioned radicals, is especially understood to mean groups derived from benzene, naphthalene, anthracene, phenanthrene, pyrene, dihydropyrene, chrysene, perylene, triphenylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, benzimidazolo[1,2-a]benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aromatic ring system in the context of this invention is a system which does not necessarily contain solely aryl groups, but which may additionally contain one or more non-aromatic rings fused to at least one aryl group. These non-aromatic rings contain exclusively carbon atoms as ring atoms. Examples of groups covered by this definition are tetrahydronaphthalene, fluorene and spirobifluorene. In addition, the term "aromatic ring system" includes systems that consist of two or more aromatic ring systems joined to one another via single bonds, for example biphenyl, terphenyl, 7-phenyl-2-fluorenyl, quaterphenyl and 3,5-diphenyl-1-phenyl. An aromatic ring system in the context of this invention contains 6 to 40 carbon atoms and no heteroatoms in the ring system. The definition of "aromatic ring system" does not include heteroaryl groups.

A heteroaromatic ring system conforms to the abovementioned definition of an aromatic ring system, except that it must contain at least one heteroatom as ring atom. As is the case for the aromatic ring system, the heteroaromatic ring system need not contain exclusively aryl groups and heteroaryl groups, but may additionally contain one or more non-aromatic rings fused to at least one aryl or heteroaryl group. The non-aromatic rings may contain exclusively carbon atoms as ring atoms, or they may additionally contain one or more heteroatoms, where the heteroatoms are preferably selected from N, O and S. One example of such a heteroaromatic ring system is benzopyranyl. In addition, the term "heteroaromatic ring system" is understood to mean systems that consist of two or more aromatic or heteroaromatic ring systems that are bonded to one another via single bonds, for example 4,6-diphenyl-2-triazinyl. A heteroaromatic ring system in the context of this invention contains 5 to 40 ring atoms selected from carbon and heteroatoms, where at least one of the ring atoms is a heteroatom. The heteroatoms of the heteroaromatic ring system are preferably selected from N, O and S.

The terms "heteroaromatic ring system" and "aromatic ring system" as defined in the present application thus differ from one another in that an aromatic ring system cannot have a heteroatom as ring atom, whereas a heteroaromatic ring system must have at least one heteroatom as ring atom. This heteroatom may be present as a ring atom of a non-aromatic heterocyclic ring or as a ring atom of an aromatic heterocyclic ring.

In accordance with the above definitions, any aryl group is covered by the term "aromatic ring system", and any heteroaryl group is covered by the term "heteroaromatic ring system".

An aromatic ring system having 6 to 40 aromatic ring atoms or a heteroaromatic ring system having 5 to 40 aromatic ring atoms is especially understood to mean groups derived from the groups mentioned above under aryl groups and heteroaryl groups, and from biphenyl, terphenyl, quaterphenyl, fluorene, spirobifluorene, dihydrophenanthrene, dihydropyrene, tetrahydropyrene, indenofluorene, truxene, isotruxene, spirotruxene, spiroisotruxene, indenocarbazole, or from combinations of these groups.

In the context of the present invention, a straight-chain alkyl group having 1 to 20 carbon atoms and a branched or cyclic alkyl group having 3 to 20 carbon atoms and an alkenyl or alkynyl group having 2 to 40 carbon atoms in which individual hydrogen atoms or $CH_2$ groups may also be substituted by the groups mentioned above in the definition of the radicals are preferably understood to mean the methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl radicals.

An alkoxy or thioalkyl group having 1 to 20 carbon atoms in which individual hydrogen atoms or $CH_2$ groups may also be replaced by the groups mentioned above in the definition of the radicals is preferably understood to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The wording that two or more radicals together may form a ring, in the context of the present application, shall be understood to mean, inter alia, that the two radicals are joined to one another by a chemical bond. In addition, however, the abovementioned wording should also be understood to mean that, if one of the two radicals is hydrogen, the second radical binds to the position to which the hydrogen atom was bonded, forming a ring.

The electronic device is preferably an organic electroluminescent device (OLED).

Preferred anodes of the electronic device are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. $Al/Ni/NiO_x$, $Al/PtO_x$) may also be preferred. For some applications, at least one of the electrodes should be transparent or partly transparent in order to enable either the irradiation of the organic material (organic solar cell) or the emission of light (OLED, O-LASER). Preferred anode materials in this case are conductive mixed metal oxides. Particular preference is given to indium tin oxide (ITO) or indium zinc oxide (IZO). Preference is further given to conductive doped organic materials, especially conductive doped polymers. In addition, the anode may also consist of two or more layers, for example of an inner layer of ITO and an outer layer of a metal oxide, preferably tungsten oxide, molybdenum oxide or vanadium oxide.

Preferred cathodes of the electronic device are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag or Al, in which case combinations of the metals such as Ca/Ag, Mg/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). It is also possible to use lithium quinolinate (LiQ) for this purpose. The layer thickness of this layer is preferably between 0.5 and 5 nm.

The emitting layer of the device may be a fluorescent or phosphorescent emitting layer. The emitting layer of the device is preferably a fluorescent emitting layer, especially preferably a blue-fluorescing emitting layer. In fluorescent emitting layers, the emitter is preferably a singlet emitter, i.e. a compound that emits light from an excited singlet state in the operation of the device. In phosphorescent emitting layers, the emitter is preferably a triplet emitter, i.e. a compound that emits light from an excited triplet state in the operation of the device or from a state having a higher spin quantum number, for example a quintet state.

In a preferred embodiment, fluorescent emitting layers used are blue-fluorescing layers.

In a preferred embodiment, phosphorescent emitting layers used are green- or red-phosphorescing emitting layers.

Suitable phosphorescent emitters are especially compounds which, when suitably excited, emit light, preferably in the visible region, and also contain at least one atom of atomic number greater than 20, preferably greater than 38, and less than 84, more preferably greater than 56 and less than 80. Preference is given to using, as phosphorescent emitters, compounds containing copper, molybdenum, tungsten, rhenium, ruthenium, osmium, rhodium, iridium, palladium, platinum, silver, gold or europium, especially compounds containing iridium, platinum or copper.

In general, all phosphorescent complexes as used for phosphorescent OLEDs according to the prior art and as known to those skilled in the art in the field of organic electroluminescent devices are suitable for use in the devices of the invention.

Preferred compounds for use as phosphorescent emitters are shown in the following table:

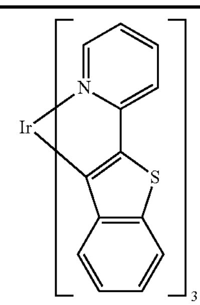

-continued
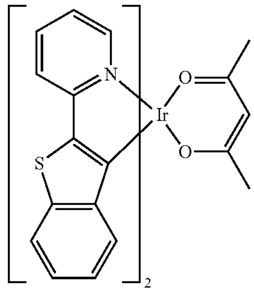
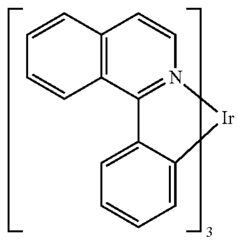
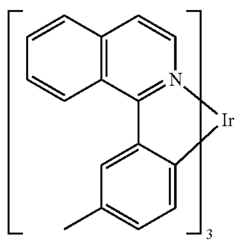
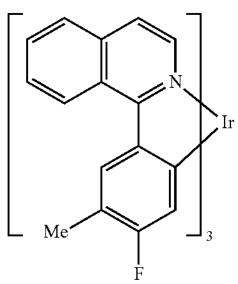
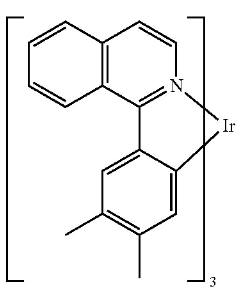

-continued
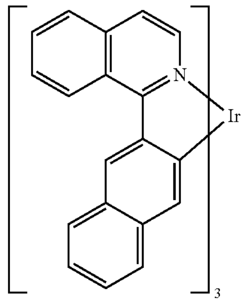
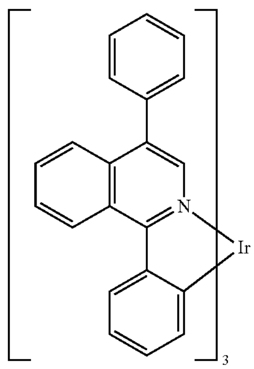
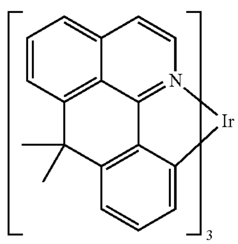
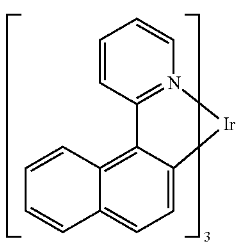
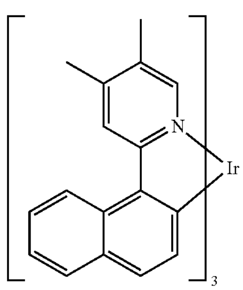

-continued
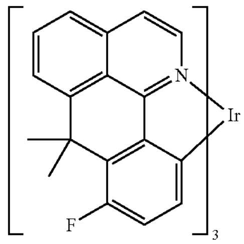
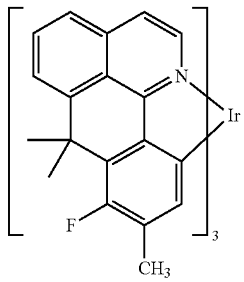
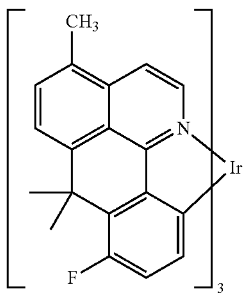
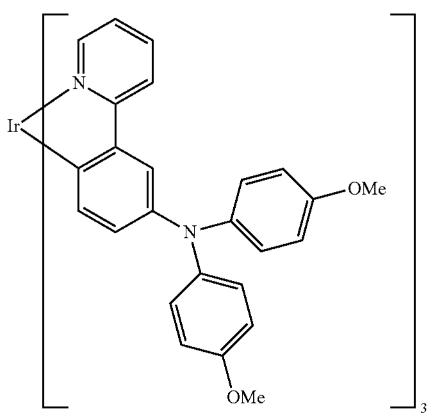
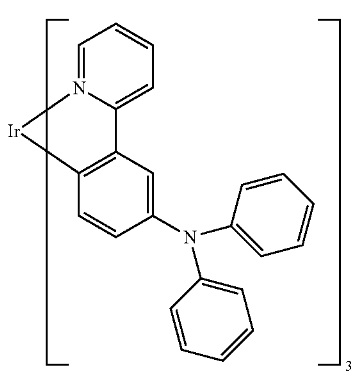

-continued
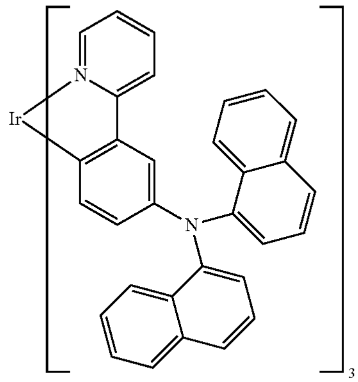
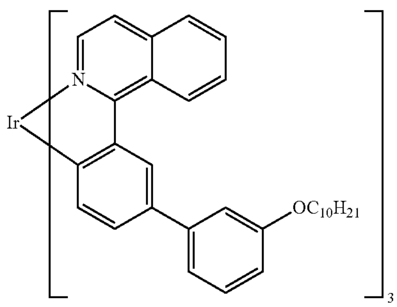
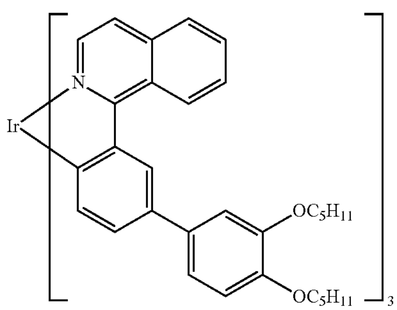
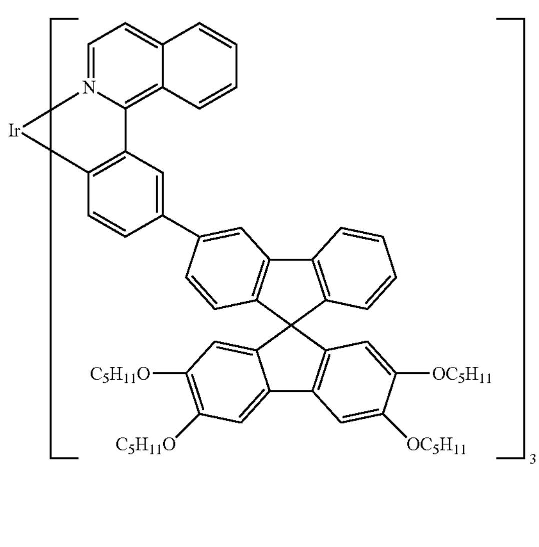

-continued
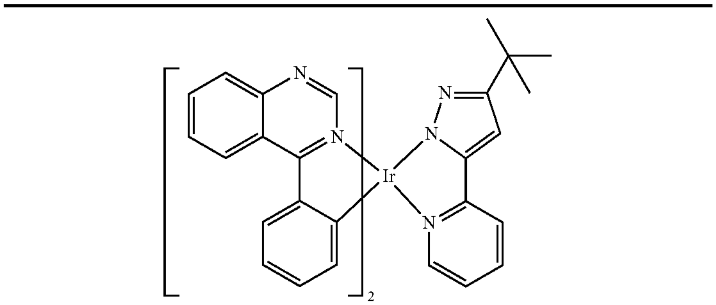
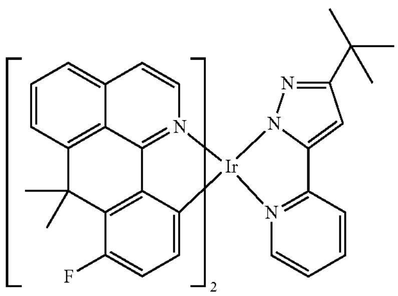
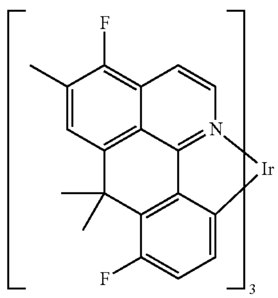
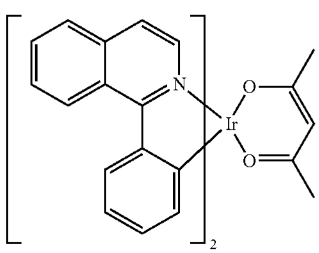
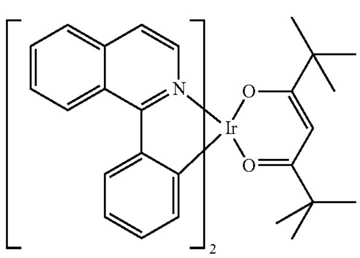

-continued
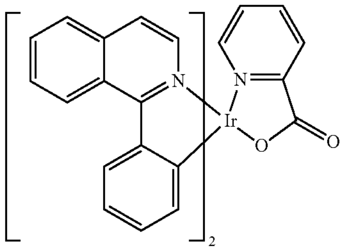
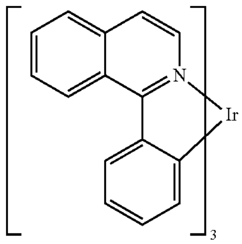
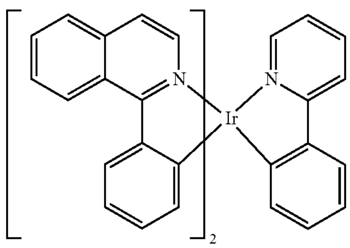
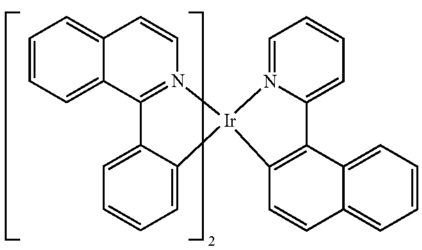
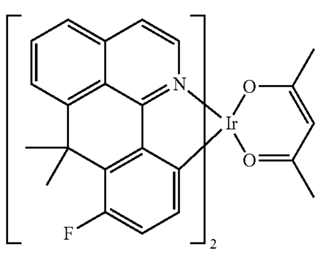
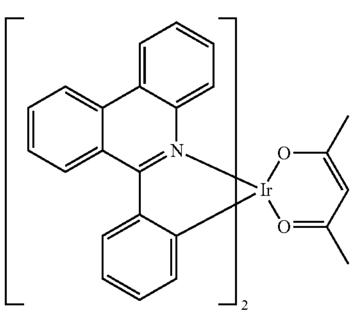

-continued
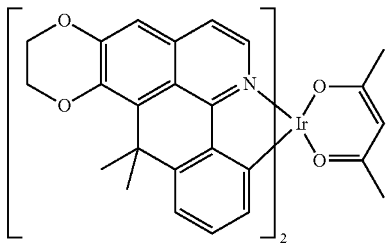
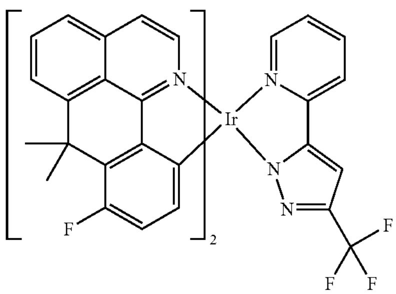
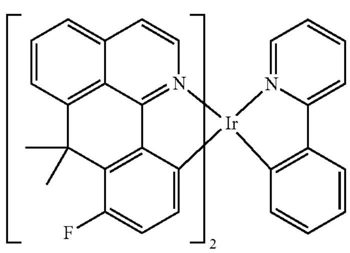
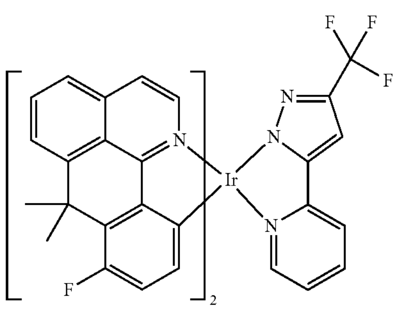
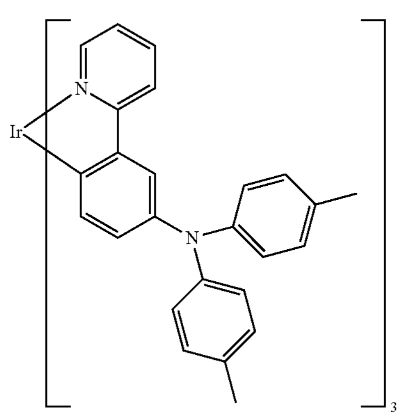

-continued
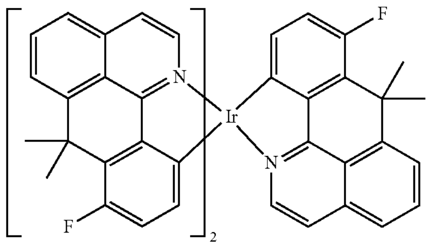
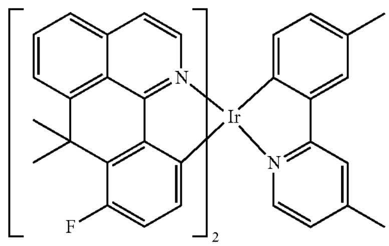
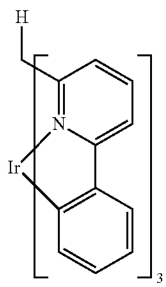
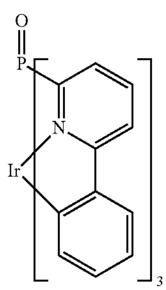
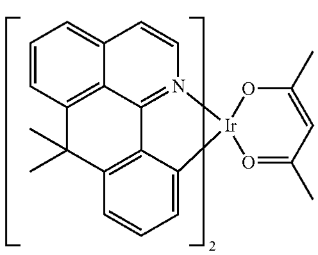
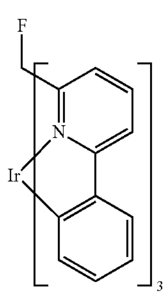

-continued
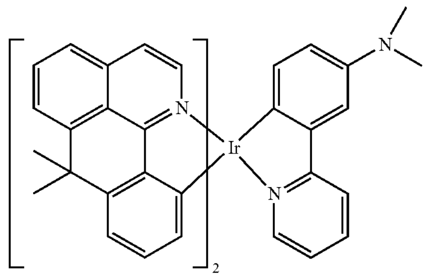
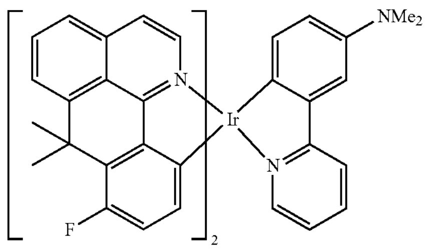
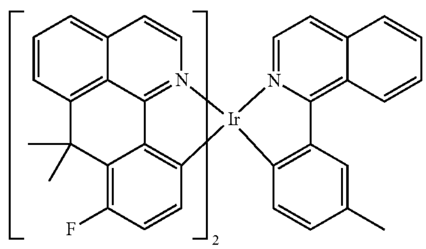
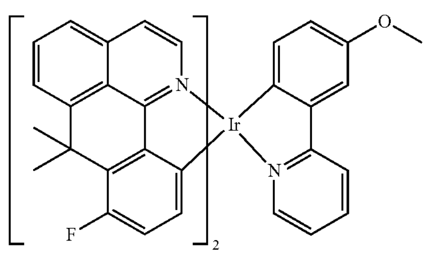
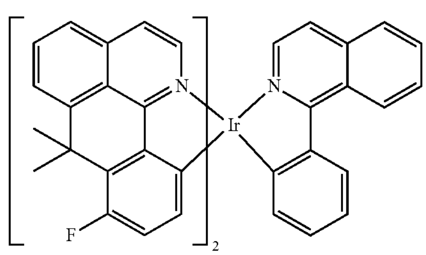
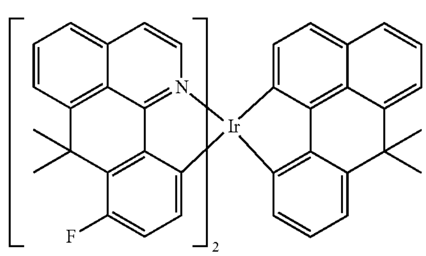

-continued
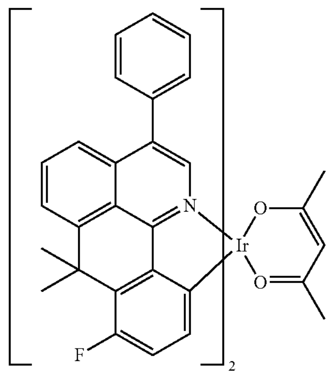
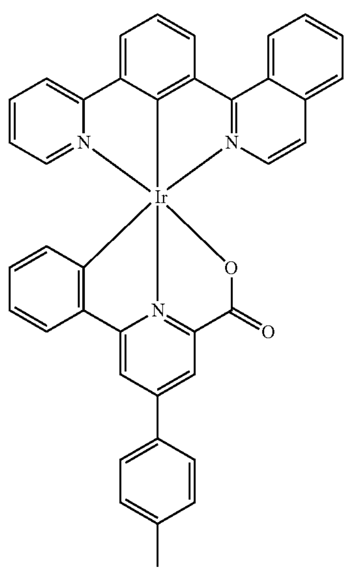
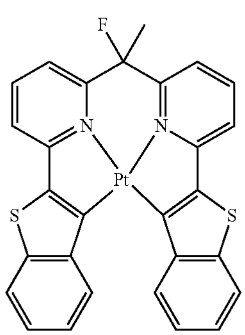

-continued
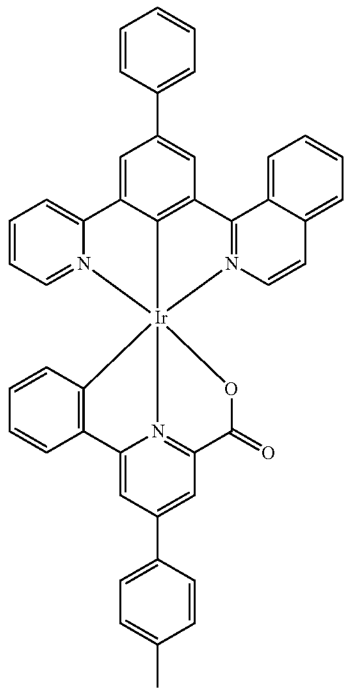
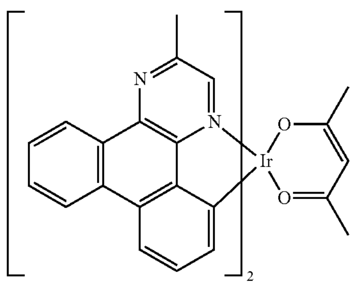
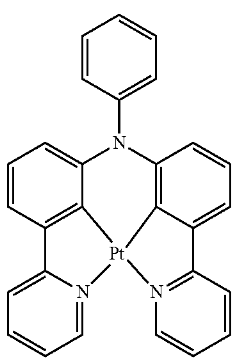
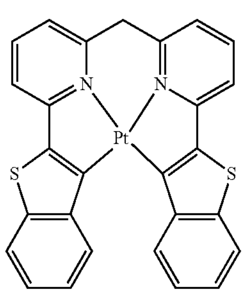

-continued
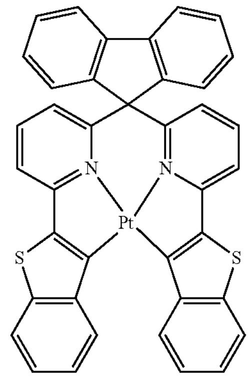
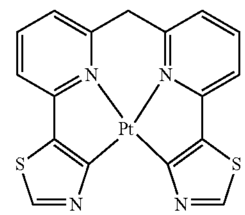
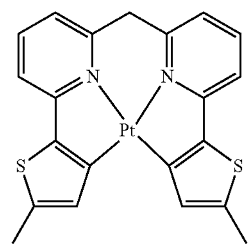
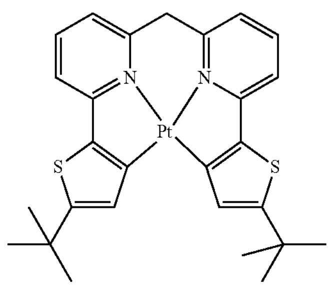
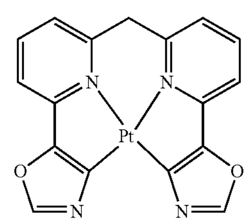
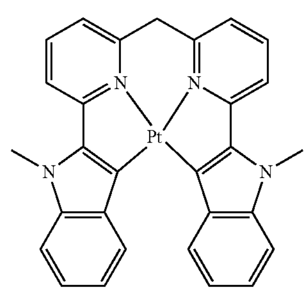

-continued
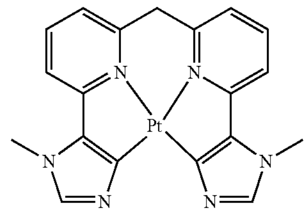
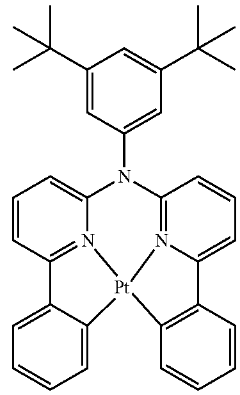
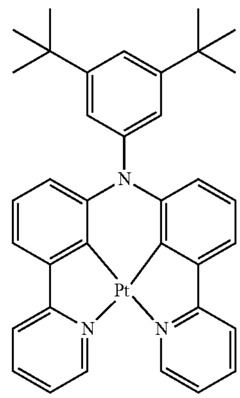
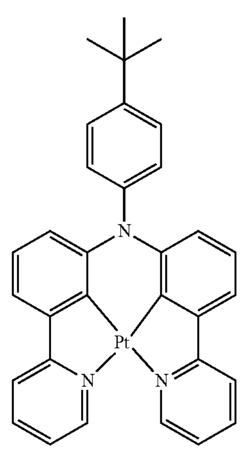

-continued
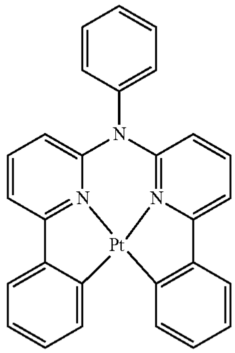
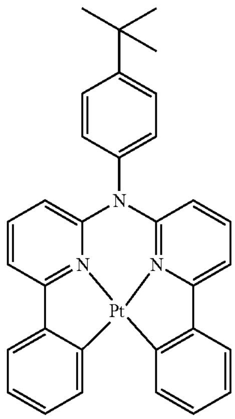
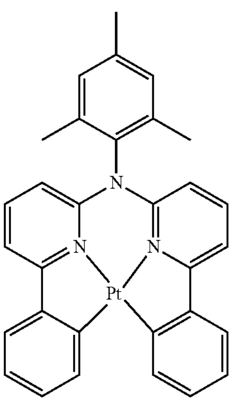
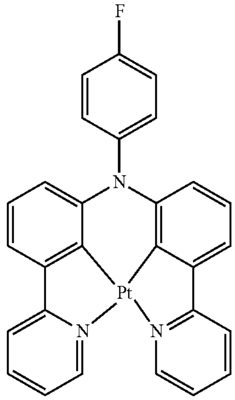

-continued
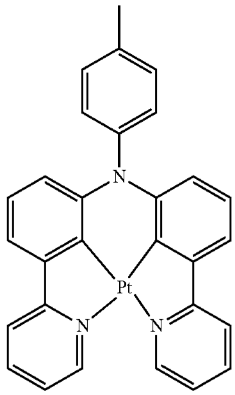
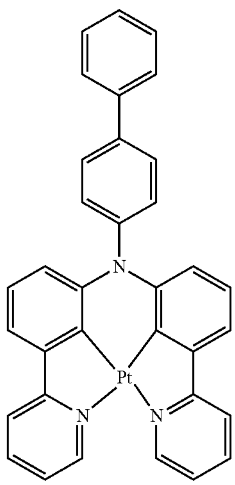
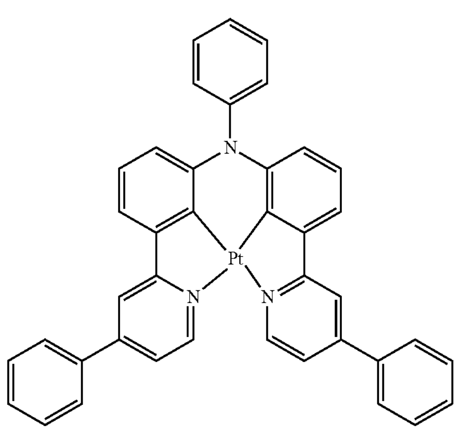

-continued
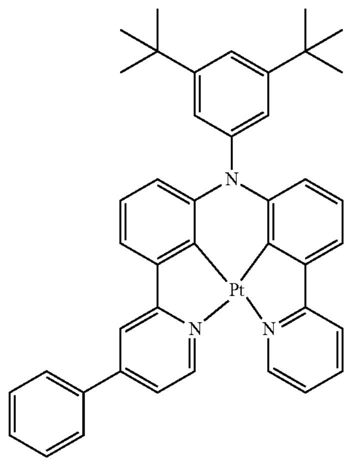
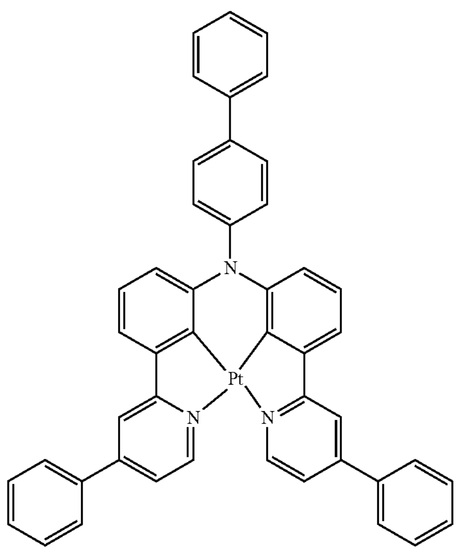
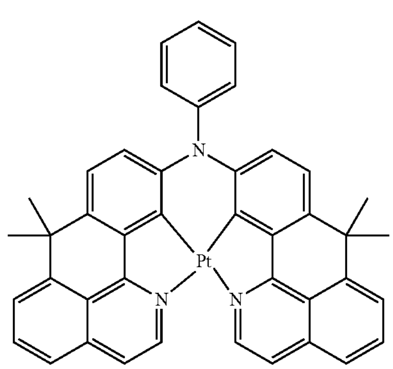

-continued
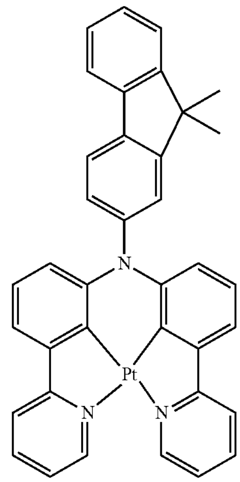
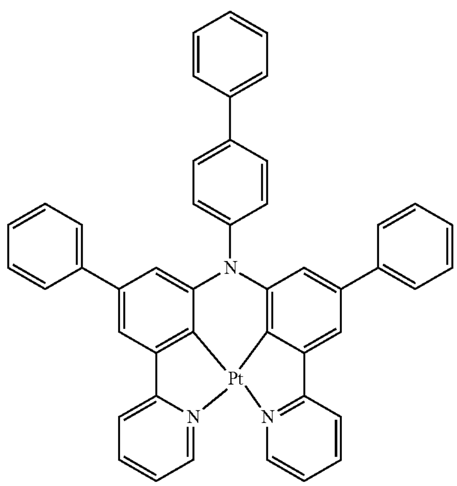
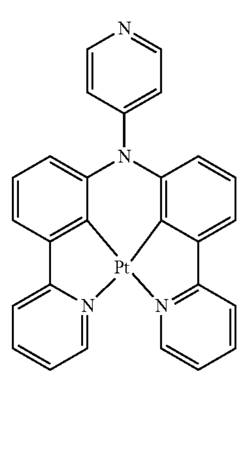

-continued
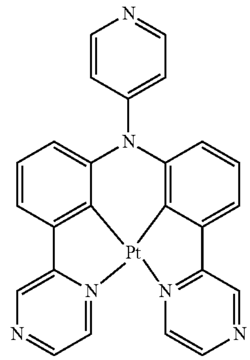
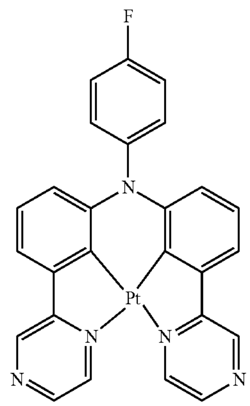
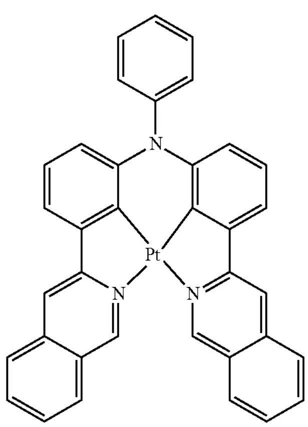
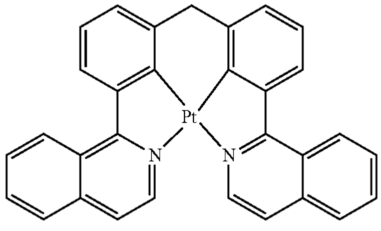

-continued
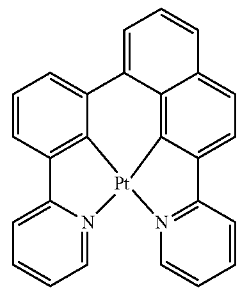
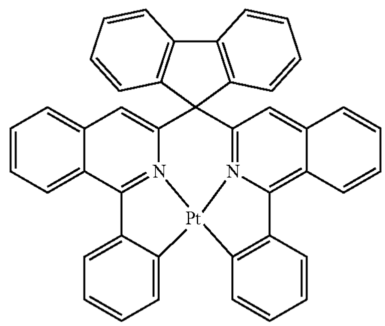
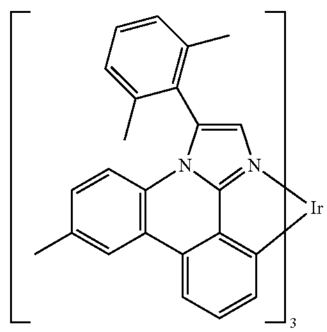
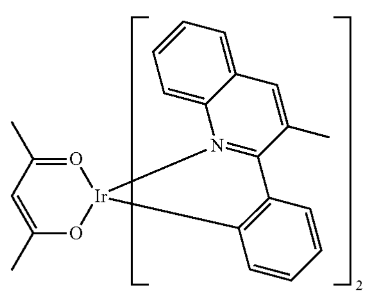
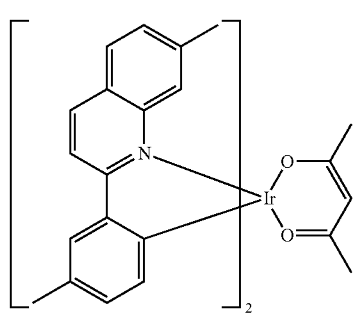

-continued
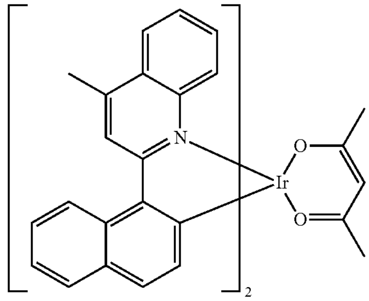
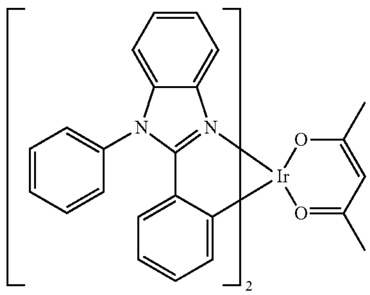
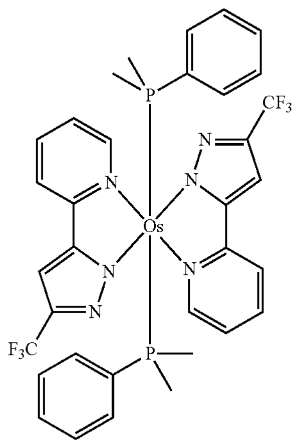
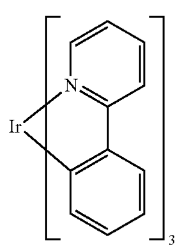
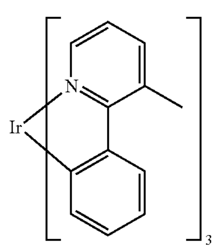

-continued
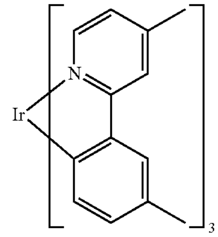
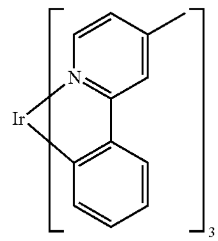
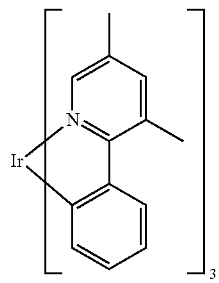
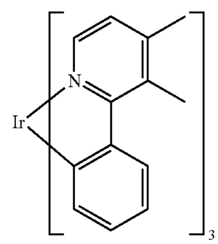
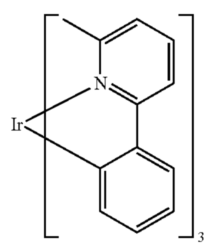
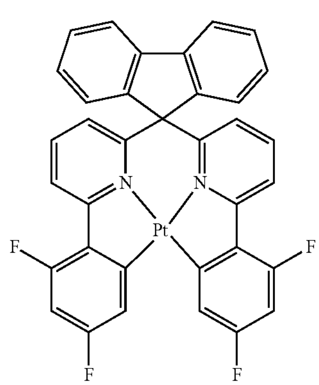

-continued
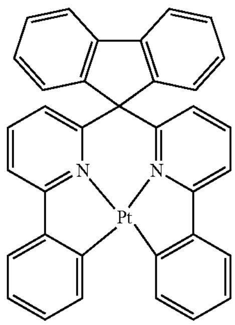
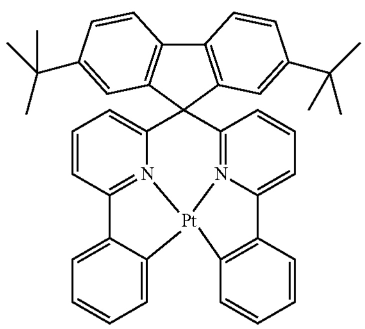
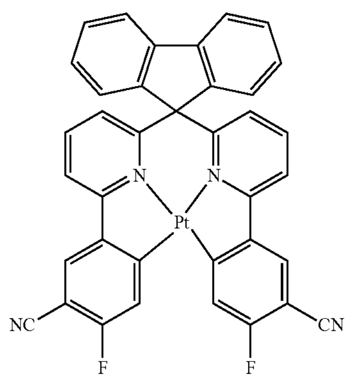
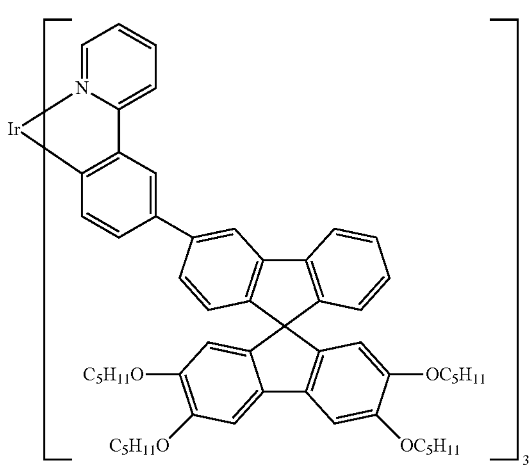

-continued
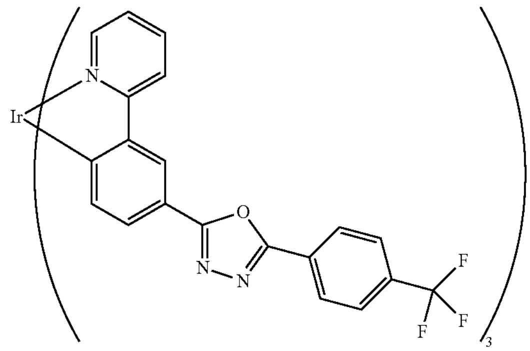
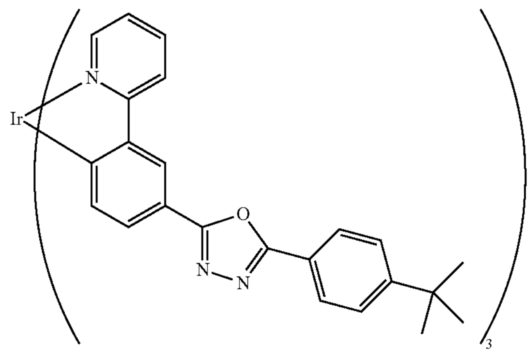
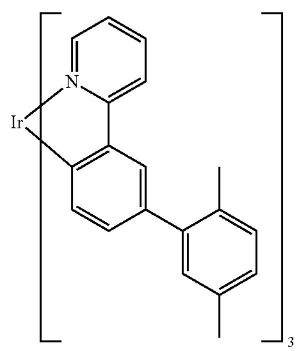
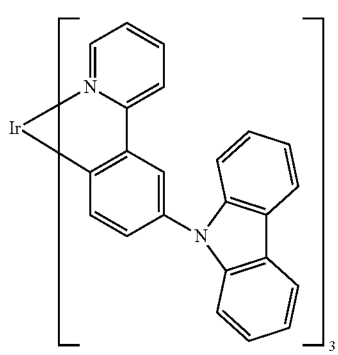

-continued
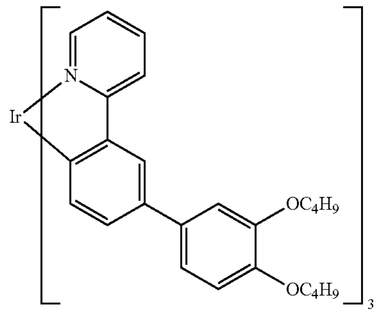
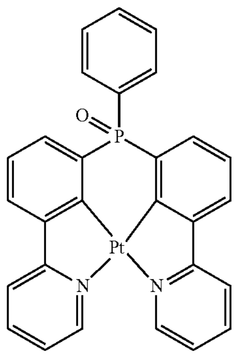
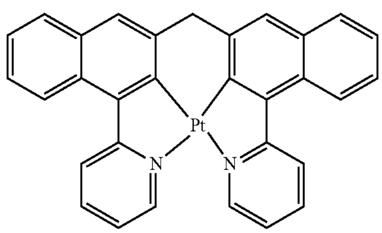
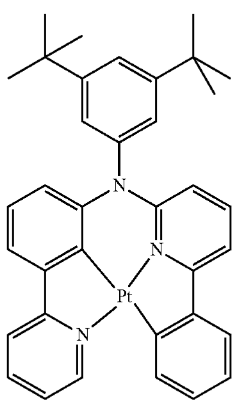
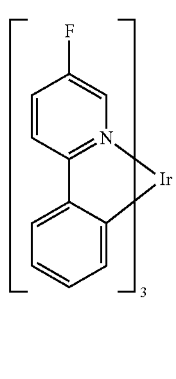

-continued
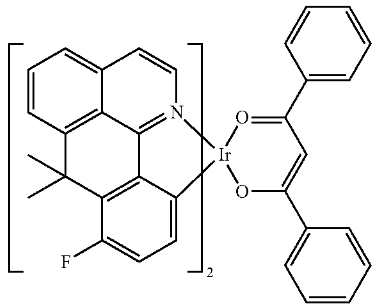
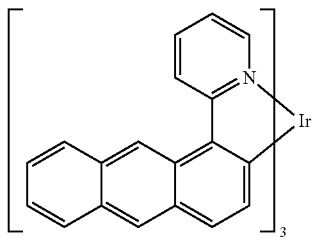
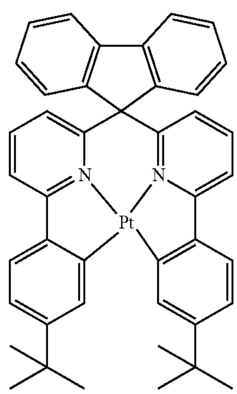
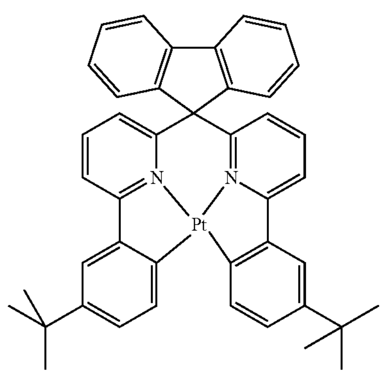

-continued
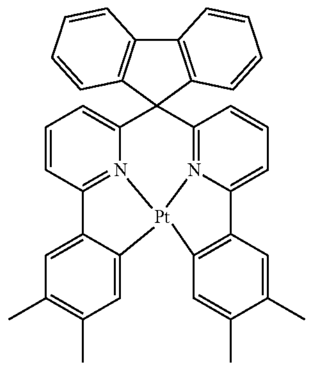
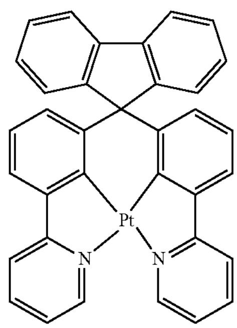
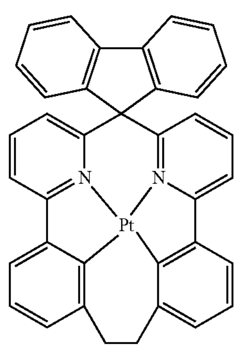
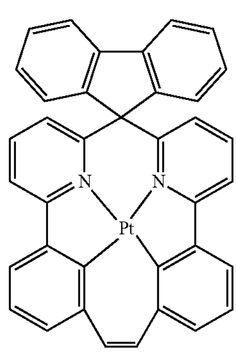

-continued
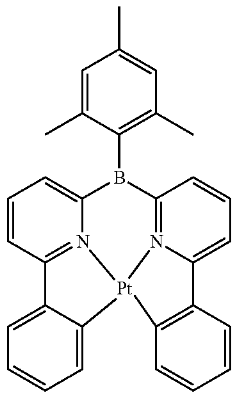
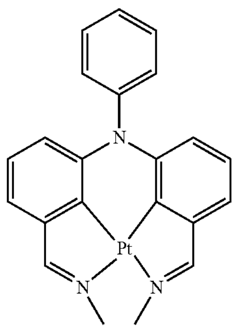
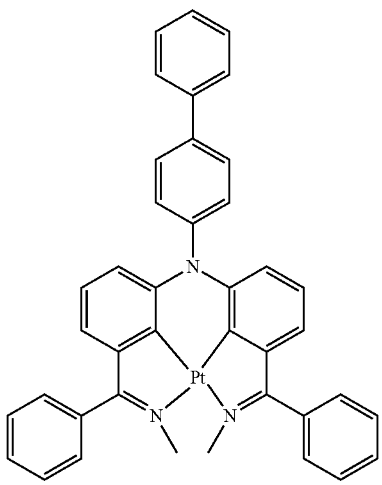
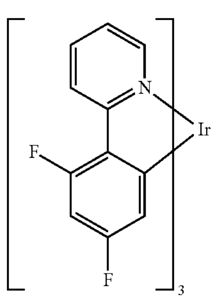

-continued
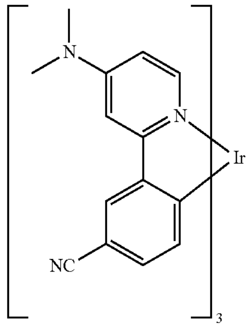
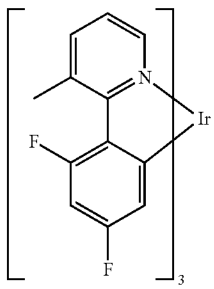
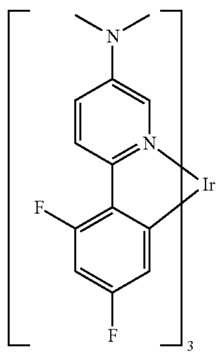
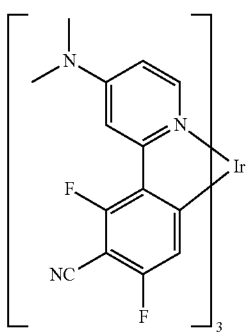
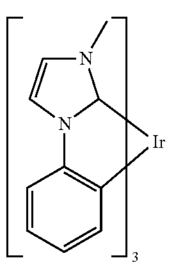

-continued
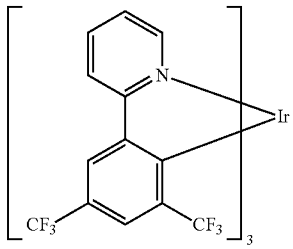
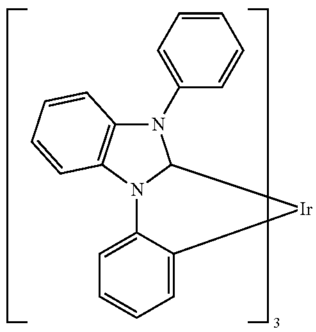
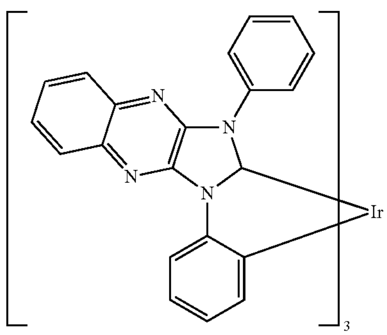
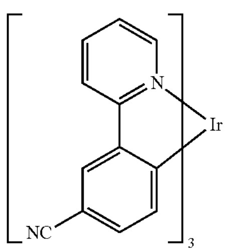
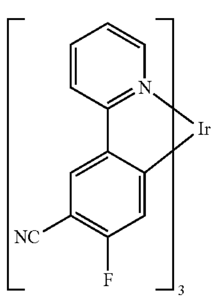

-continued
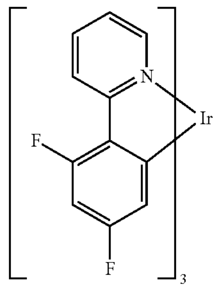
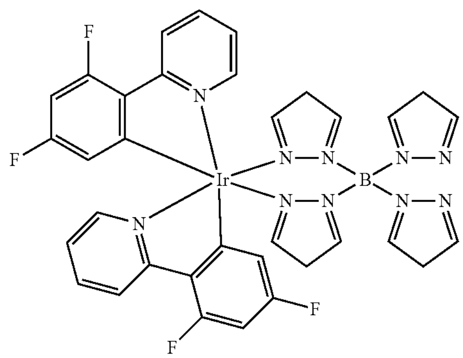
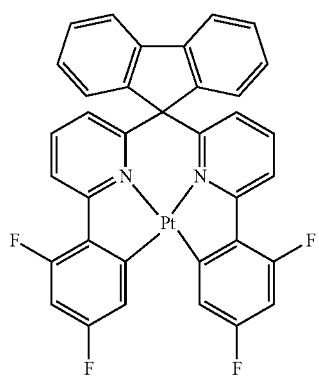
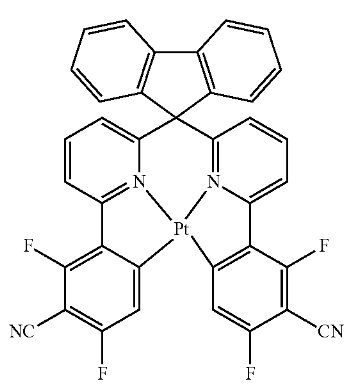

-continued
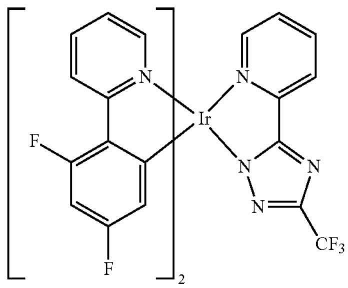
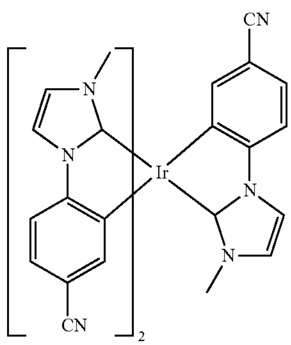
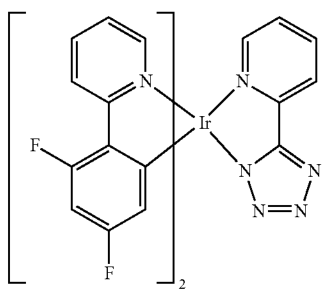
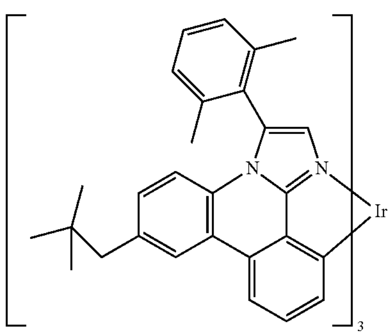
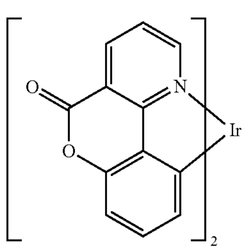

-continued
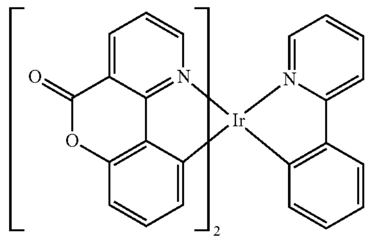
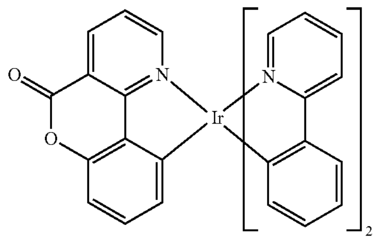
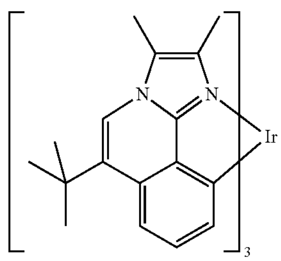
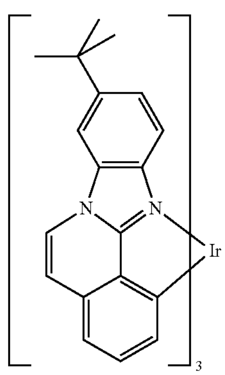
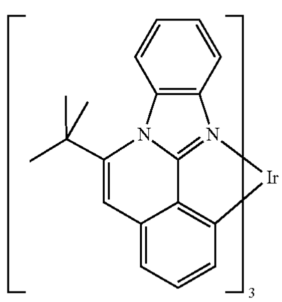

-continued
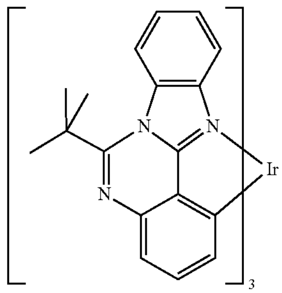
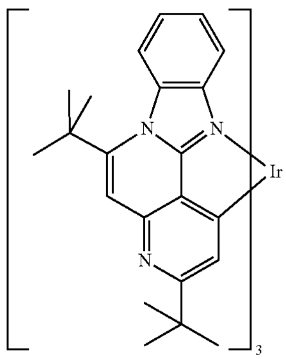
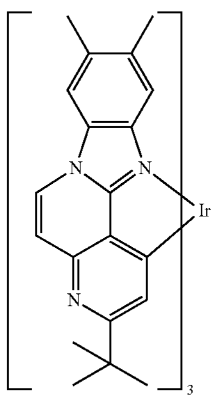
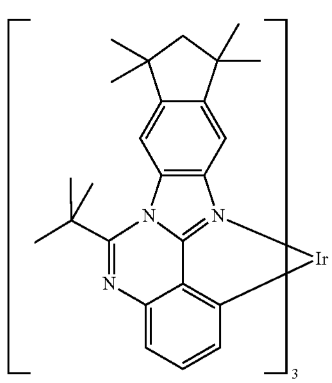

-continued
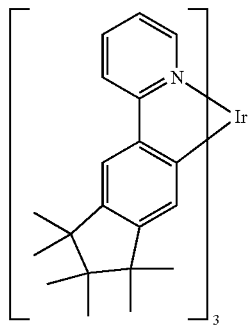
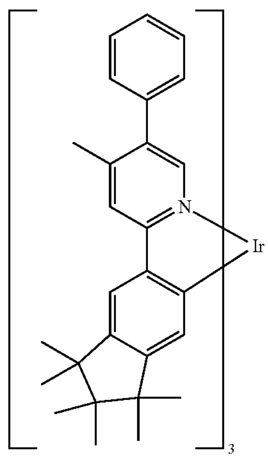
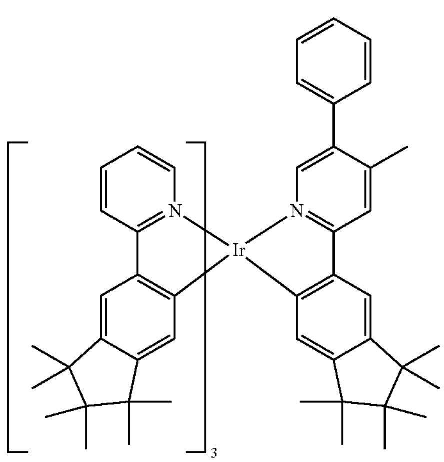
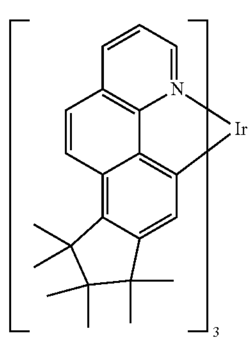

-continued
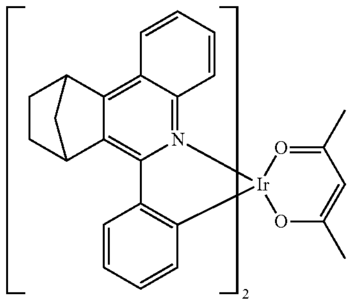
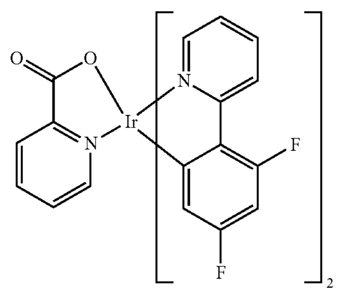
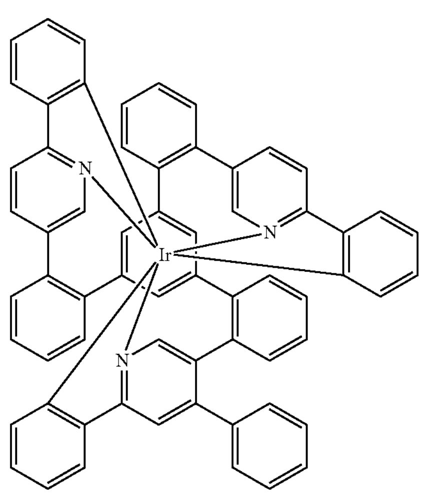

-continued
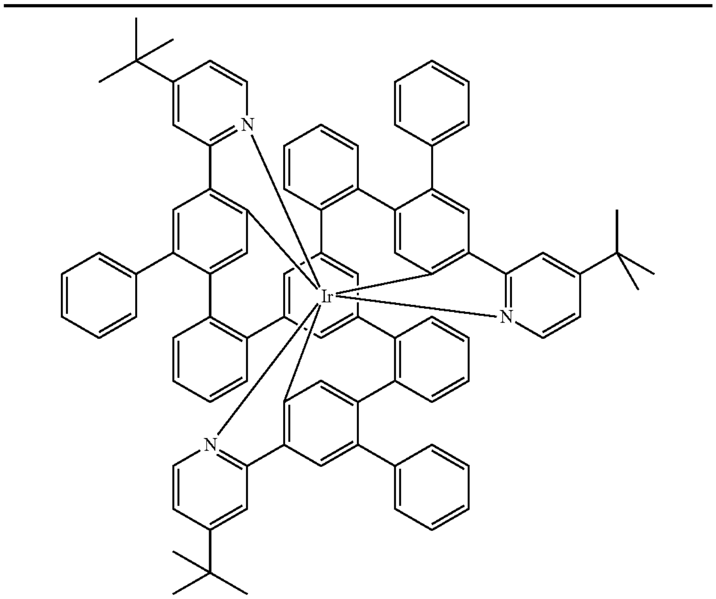
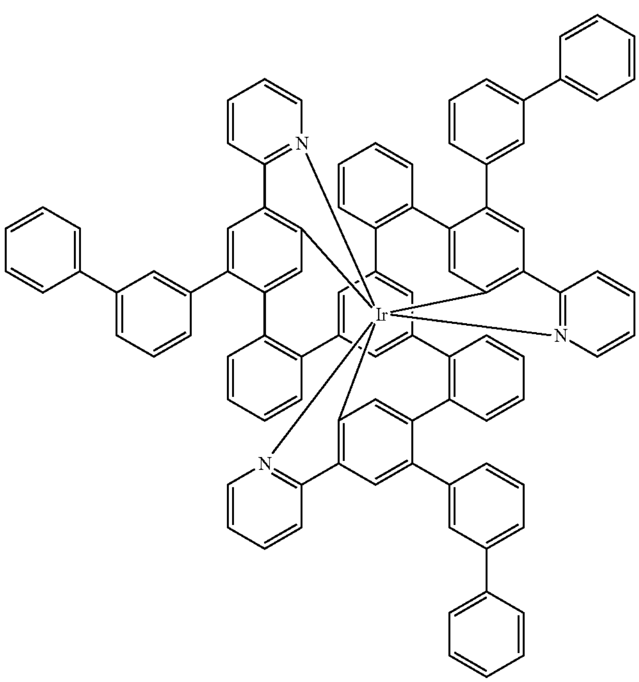

-continued
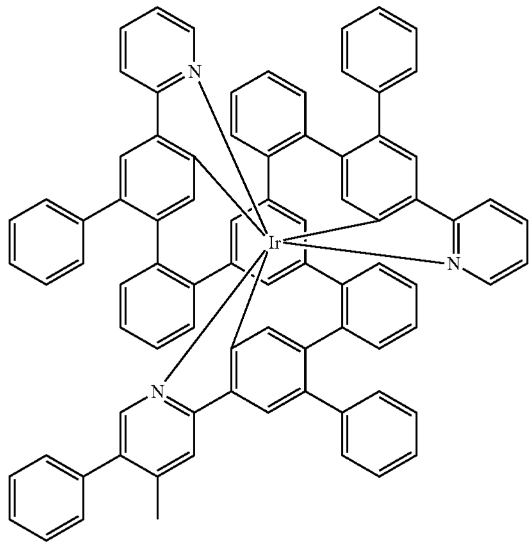
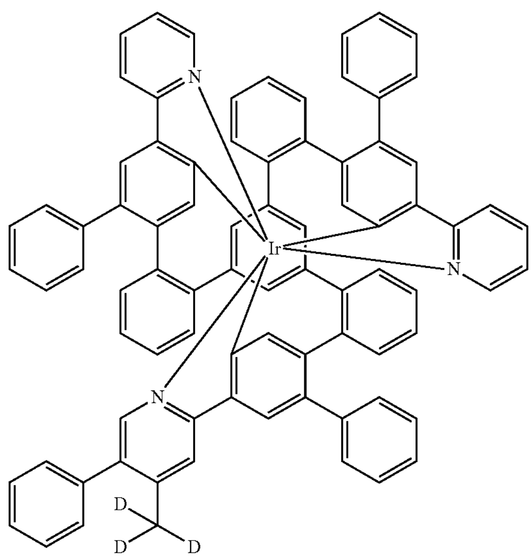
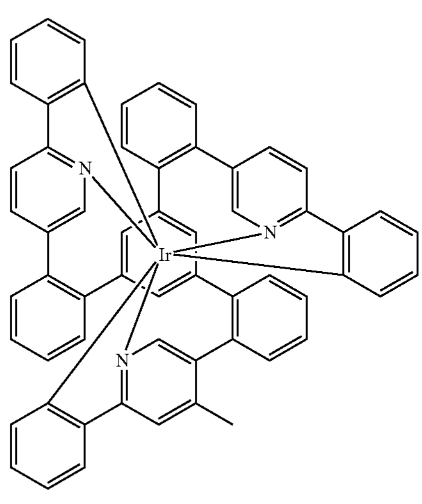

Preferred fluorescent emitting compounds are selected from the class of the arylamines. An arylamine or an aromatic amine in the context of this invention is understood to mean a compound containing three substituted or unsubstituted aromatic or heteroaromatic ring systems bonded directly to the nitrogen. Preferably, at least one of these aromatic or heteroaromatic ring systems is a fused ring system, more preferably having at least 14 aromatic ring atoms. Preferred examples of these are aromatic anthraceneamines, aromatic anthracenediamines, aromatic pyreneamines, aromatic pyrenediamines, aromatic chryseneamines or aromatic chrysenediamines. An aromatic anthraceneamine is understood to mean a compound in which a diarylamino group is bonded directly to an anthracene group, preferably in the 9 position. An aromatic anthracenediamine is understood to mean a compound in which two diarylamino groups are bonded directly to an anthracene group, preferably in the 9,10 positions. Aromatic pyreneamines, pyrenediamines, chryseneamines and chrysenediamines are defined analogously, where the diarylamino groups are bonded to the pyrene preferably in the 1 position or 1,6 positions. Further preferred emitting compounds are indenofluoreneamines or -diamines, benzoindenofluoreneamines or -diamines, and dibenzoindenofluoreneamines or -diamines, and indenofluorene derivatives having fused aryl groups. Likewise preferred are pyrenearylamines. Likewise preferred are benzoindenofluoreneamines, benzofluoreneamines, extended benzoindenofluorenes, phenoxazines, and fluorene derivatives joined to furan units or to thiophene units.

Preferred compounds for use as fluorescent emitters are shown in the following table:

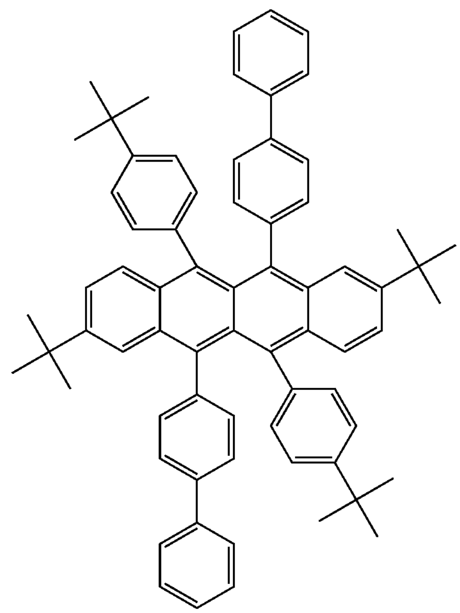 [SMILES: CC(C)(C)c1ccc(-c2c3ccc(C(C)(C)C)cc3c(-c3ccc(-c4ccccc4)cc3)c3c(-c4ccc(C(C)(C)C)cc4)c4ccc(C(C)(C)C)cc4c(-c4ccc(-c5ccccc5)cc4)c23)cc1]

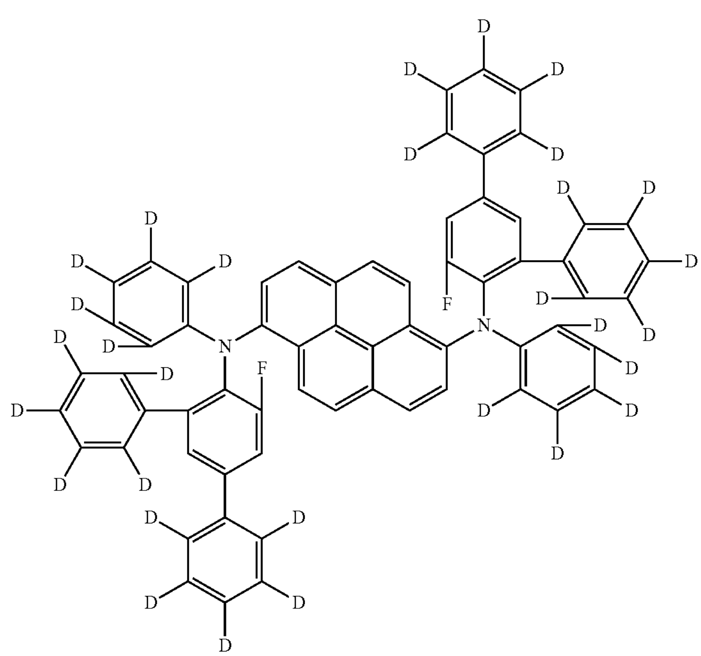 [SMILES: [2H]c1c([2H])c([2H])c(-c2cc(F)c(N(c3c([2H])c([2H])c([2H])c([2H])c3[2H])c3ccc4ccc5c(N(c6c(F)cc(-c7c([2H])c([2H])c([2H])c([2H])c7[2H])cc6-c6c([2H])c([2H])c([2H])c([2H])c6[2H])c6c([2H])c([2H])c([2H])c([2H])c6[2H])ccc6ccc3c4c65)c(-c3c([2H])c([2H])c([2H])c([2H])c3[2H])c2)c([2H])c1[2H]]

-continued
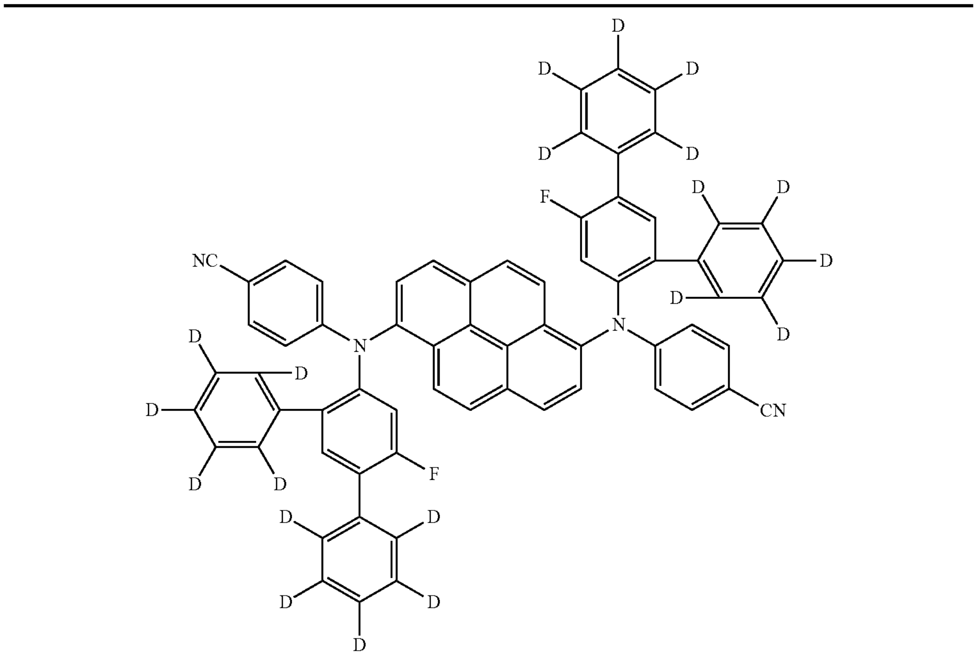
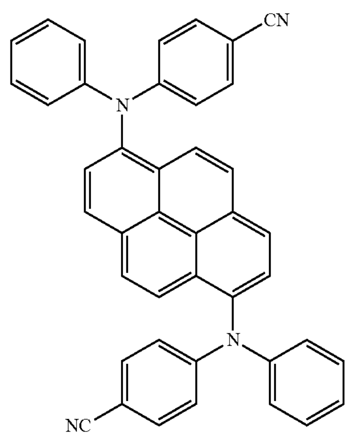 [SMILES: N#Cc1ccc(N(c2ccccc2)c2ccc3ccc4c(N(c5ccccc5)c5ccc(C#N)cc5)ccc5ccc2c3c54)cc1]
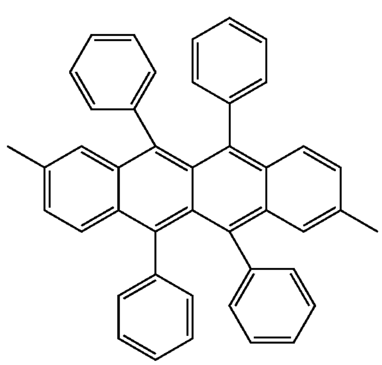

-continued
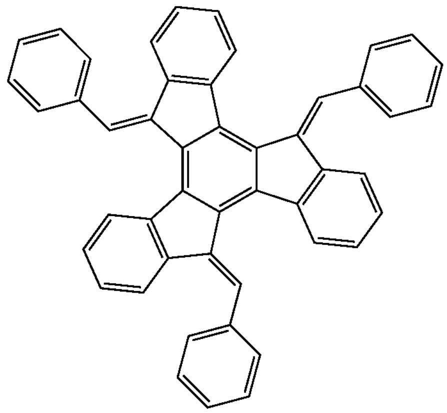 [SMILES: C(=C1/c2ccccc2-c2c1c1c(c3c2/C(=C/c2ccccc2)c2ccccc2-3)/C(=C/c2ccccc2)c2ccccc2-1)/c1ccccc1]
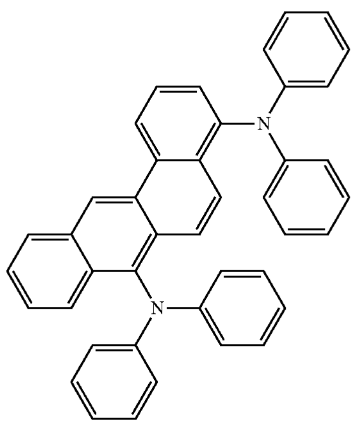 [SMILES: c1ccc(N(c2ccccc2)c2cccc3c2ccc2c(N(c4ccccc4)c4ccccc4)c4ccccc4cc23)cc1]
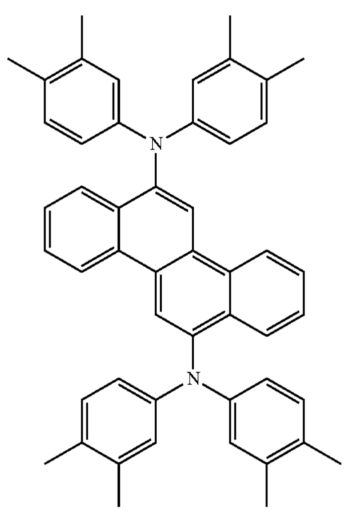

-continued
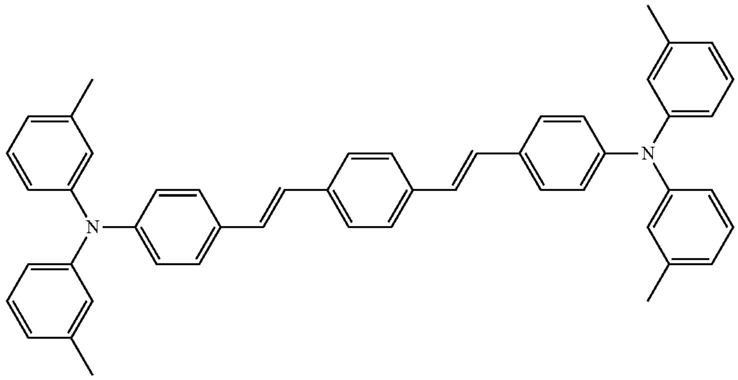 [SMILES: Cc1cccc(N(c2ccc(/C=C/c3ccc(/C=C/c4ccc(N(c5cccc(C)c5)c5cccc(C)c5)cc4)cc3)cc2)c2cccc(C)c2)c1]
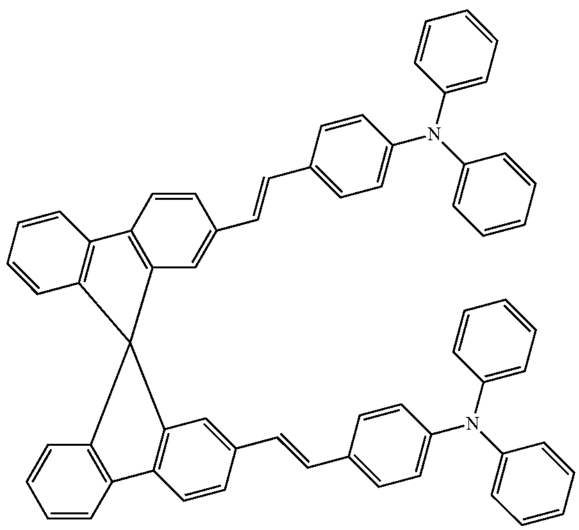 [SMILES: C(=C\c1ccc2c(c1)C1(c3ccccc3-2)c2ccccc2-c2ccc(/C=C/c3ccc(N(c4ccccc4)c4ccccc4)cc3)cc21)/c1ccc(N(c2ccccc2)c2ccccc2)cc1]
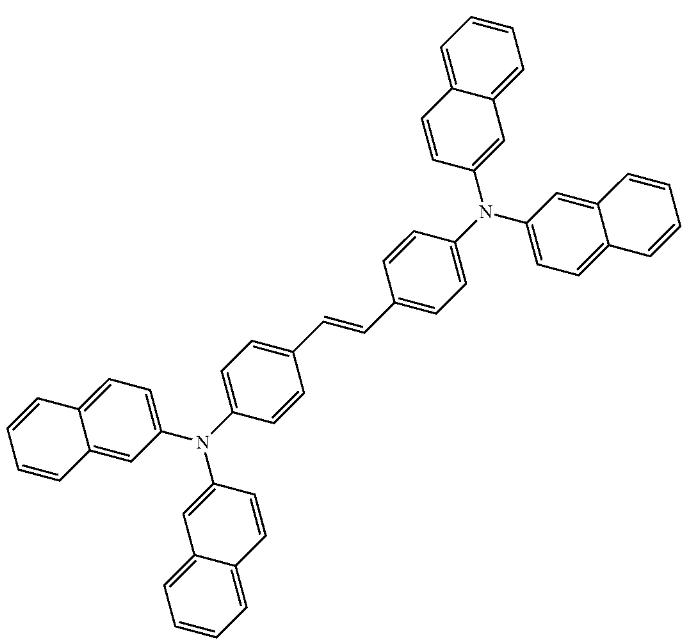 [SMILES: C(=C\c1ccc(N(c2ccc3ccccc3c2)c2ccc3ccccc3c2)cc1)/c1ccc(N(c2ccc3ccccc3c2)c2ccc3ccccc3c2)cc1]

-continued
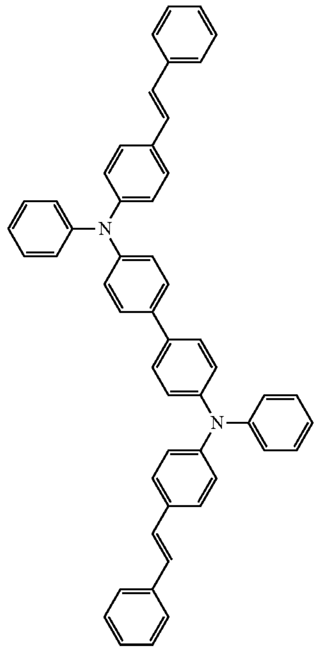 [SMILES: C(=C\c1ccc(N(c2ccccc2)c2ccc(-c3ccc(N(c4ccccc4)c4ccc(/C=C/c5ccccc5)cc4)cc3)cc2)cc1)/c1ccccc1]
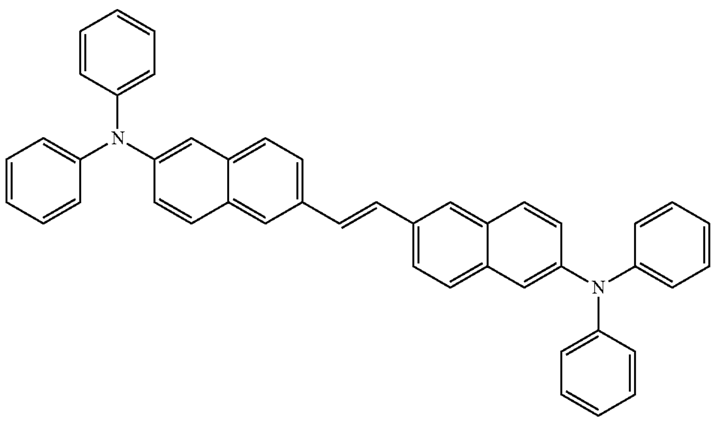 [SMILES: C(=C\c1ccc2cc(N(c3ccccc3)c3ccccc3)ccc2c1)/c1ccc2cc(N(c3ccccc3)c3ccccc3)ccc2c1]
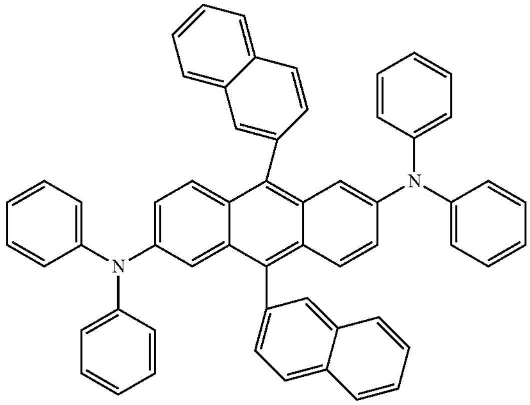 [SMILES: c1ccc(N(c2ccccc2)c2ccc3c(-c4ccc5ccccc5c4)c4cc(N(c5ccccc5)c5ccccc5)ccc4c(-c4ccc5ccccc5c4)c3c2)cc1]

-continued
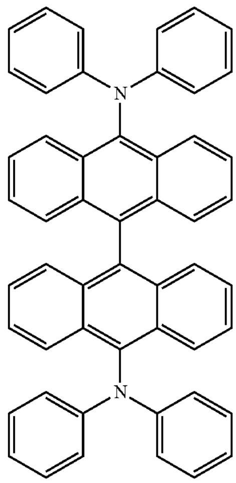 [SMILES: c1ccc(N(c2ccccc2)c2c3ccccc3c(-c3c4ccccc4c(N(c4ccccc4)c4ccccc4)c4ccccc34)c3ccccc23)cc1]
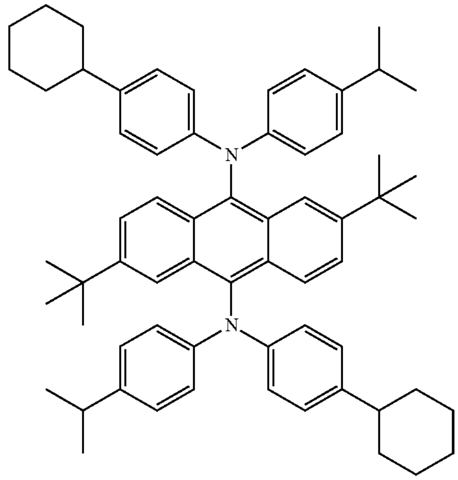 [SMILES: CC(C)c1ccc(N(c2ccc(C3CCCCC3)cc2)c2c3ccc(C(C)(C)C)cc3c(N(c3ccc(C(C)C)cc3)c3ccc(C4CCCCC4)cc3)c3ccc(C(C)(C)C)cc23)cc1]
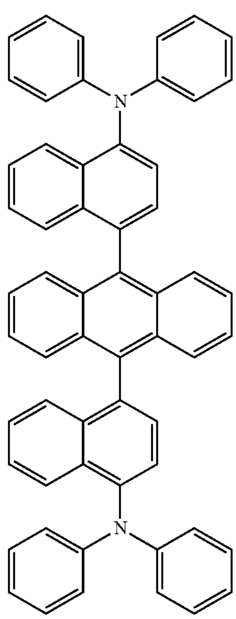 [SMILES: c1ccc(N(c2ccccc2)c2ccc(-c3c4ccccc4c(-c4ccc(N(c5ccccc5)c5ccccc5)c5ccccc45)c4ccccc34)c3ccccc23)cc1]

-continued
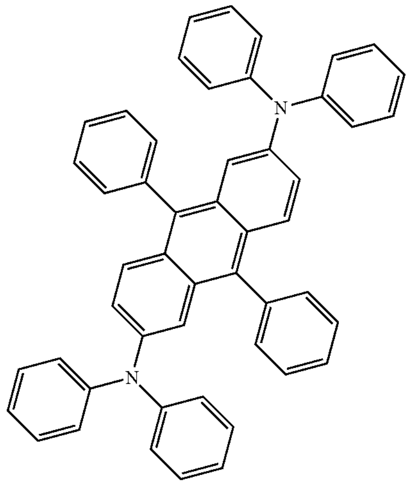 [SMILES: c1ccc(-c2c3ccc(N(c4ccccc4)c4ccccc4)cc3c(-c3ccccc3)c3ccc(N(c4ccccc4)c4ccccc4)cc23)cc1]
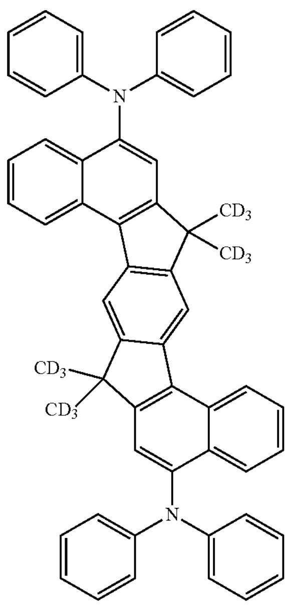 [SMILES: [2H]C([2H])([2H])C1(C([2H])([2H])[2H])c2cc3c(cc2-c2c1cc(N(c1ccccc1)c1ccccc1)c1ccccc21)C(C([2H])([2H])[2H])(C([2H])([2H])[2H])c1cc(N(c2ccccc2)c2ccccc2)c2ccccc2c1-3]
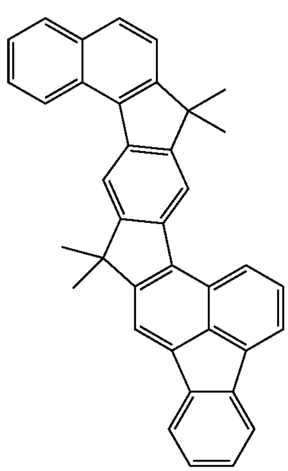 [SMILES: CC1(C)c2cc3c(cc2-c2c1ccc1ccccc21)C(C)(C)c1cc2c4c(cccc4c1-3)-c1ccccc1-2]

-continued
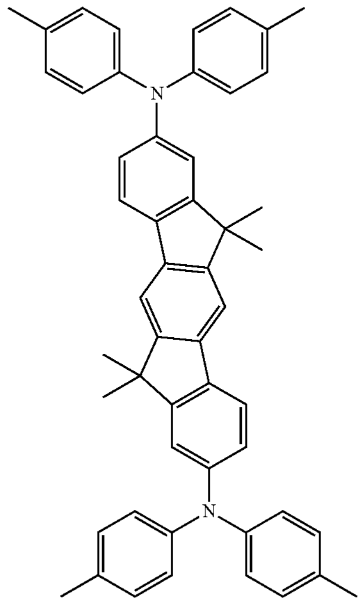
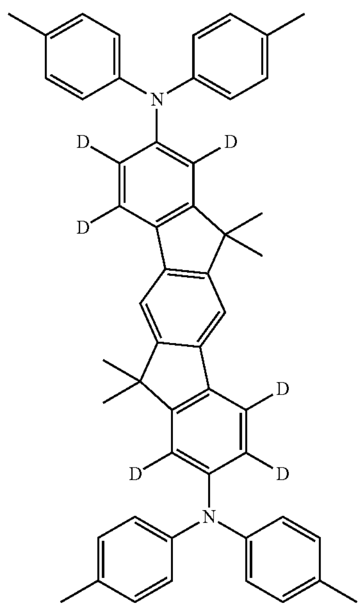
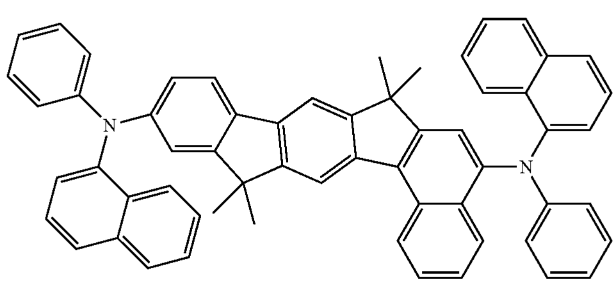 [SMILES: CC1(C)c2cc(N(c3ccccc3)c3cccc4ccccc34)ccc2-c2cc3c(cc21)-c1c(cc(N(c2ccccc2)c2cccc4ccccc24)c2ccccc12)C3(C)C]

-continued
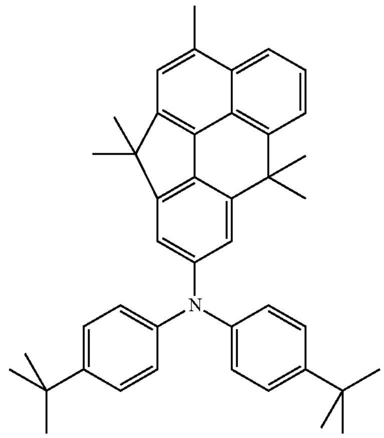 [SMILES: Cc1cc2c3c4c(cccc14)C(C)(C)c1cc(N(c4ccc(C(C)(C)C)cc4)c4ccc(C(C)(C)C)cc4)cc(c1-3)C2(C)C]
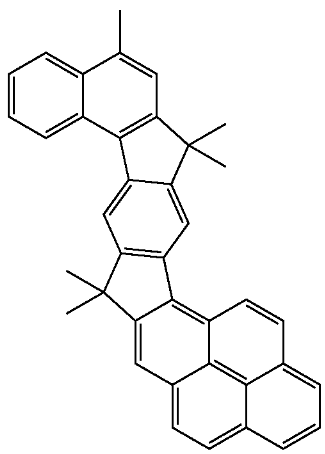 [SMILES: Cc1cc2c(c3ccccc13)-c1cc3c(cc1C2(C)C)-c1c(cc2ccc4cccc5ccc1c2c45)C3(C)C]
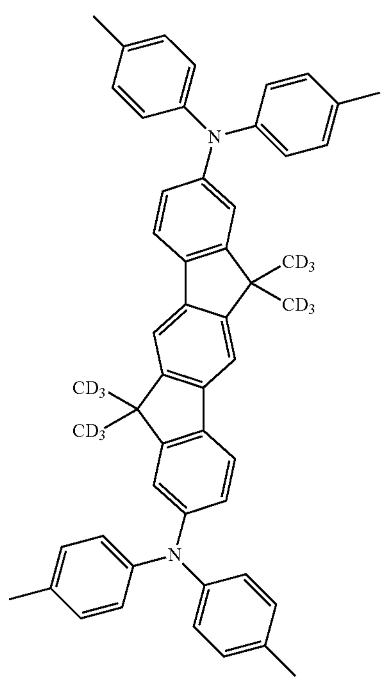

-continued
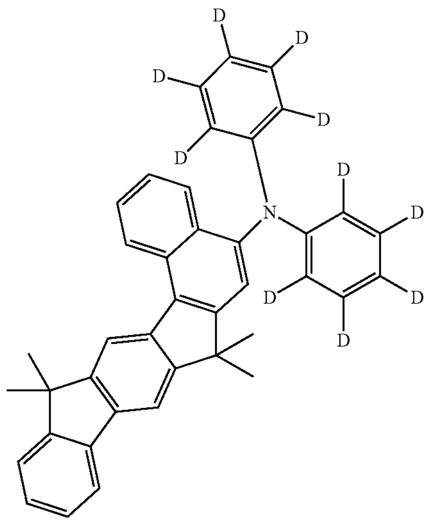 [SMILES: [2H]c1c([2H])c([2H])c(N(c2c([2H])c([2H])c([2H])c([2H])c2[2H])c2cc3c(c4ccccc24)-c2cc4c(cc2C3(C)C)-c2ccccc2C4(C)C)c([2H])c1[2H]]
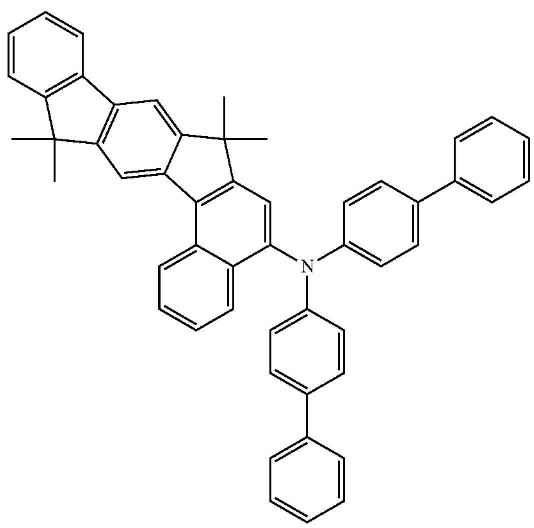 [SMILES: CC1(C)c2ccccc2-c2cc3c(cc21)-c1c(cc(N(c2ccc(-c4ccccc4)cc2)c2ccc(-c4ccccc4)cc2)c2ccccc12)C3(C)C]
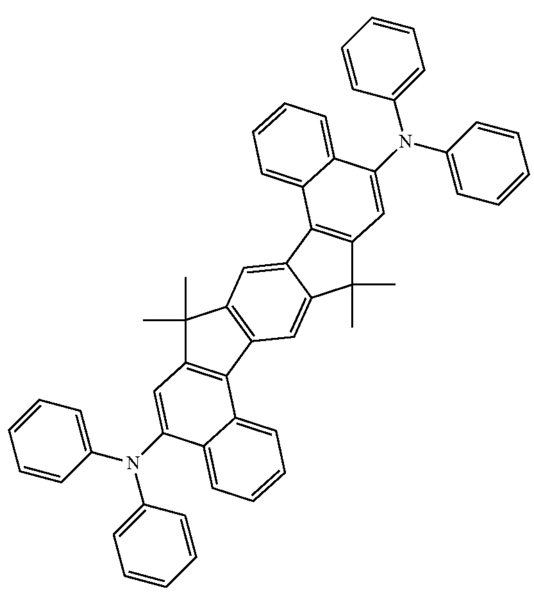 [SMILES: CC1(C)c2cc3c(cc2-c2c1cc(N(c1ccccc1)c1ccccc1)c1ccccc21)C(C)(C)c1cc(N(c2ccccc2)c2ccccc2)c2ccccc2c1-3]

-continued
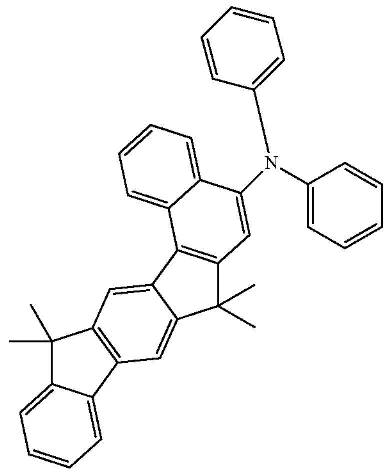 [SMILES: CC1(C)c2ccccc2-c2cc3c(cc21)-c1c(cc(N(c2ccccc2)c2ccccc2)c2ccccc12)C3(C)C]
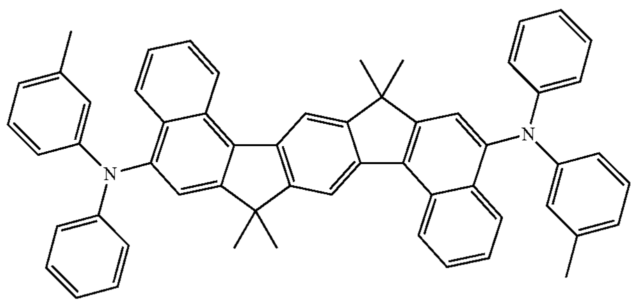 [SMILES: Cc1cccc(N(c2ccccc2)c2cc3c(c4ccccc24)-c2cc4c(cc2C3(C)C)-c2c(cc(N(c3ccccc3)c3cccc(C)c3)c3ccccc23)C4(C)C)c1]
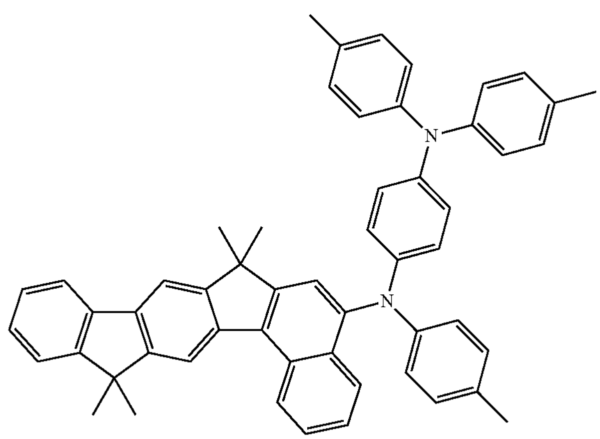 [SMILES: Cc1ccc(N(c2ccc(C)cc2)c2ccc(N(c3ccc(C)cc3)c3cc4c(c5ccccc35)-c3cc5c(cc3C4(C)C)-c3ccccc3C5(C)C)cc2)cc1]
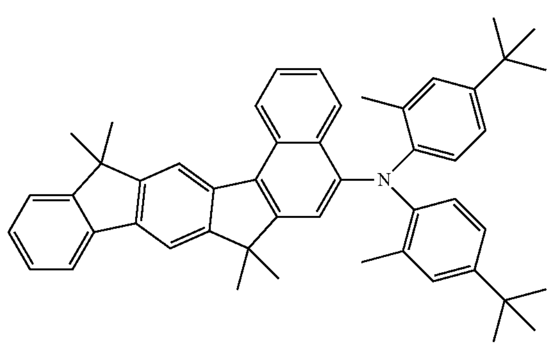 [SMILES: Cc1cc(C(C)(C)C)ccc1N(c1ccc(C(C)(C)C)cc1C)c1cc2c(c3ccccc13)-c1cc3c(cc1C2(C)C)-c1ccccc1C3(C)C]

-continued
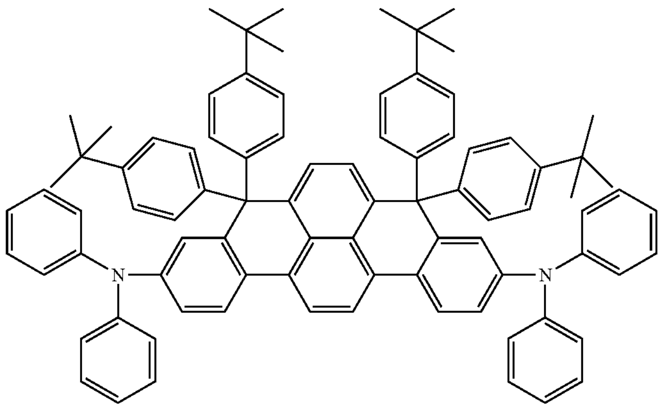 [SMILES: CC(C)(C)c1ccc(C2(c3ccc(C(C)(C)C)cc3)c3cc(N(c4ccccc4)c4ccccc4)ccc3-c3ccc4c5c(ccc2c35)C(c2ccc(C(C)(C)C)cc2)(c2ccc(C(C)(C)C)cc2)c2cc(N(c3ccccc3)c3ccccc3)ccc2-4)cc1]
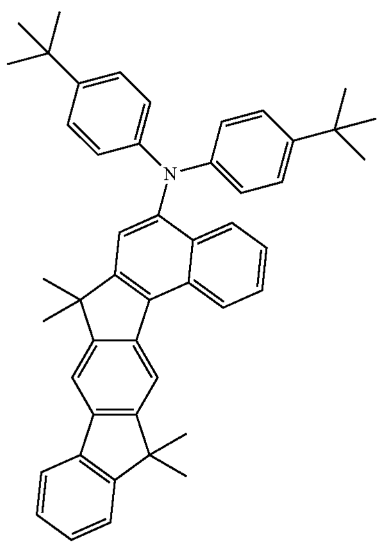 [SMILES: CC(C)(C)c1ccc(N(c2ccc(C(C)(C)C)cc2)c2cc3c(c4ccccc24)-c2cc4c(cc2C3(C)C)-c2ccccc2C4(C)C)cc1]
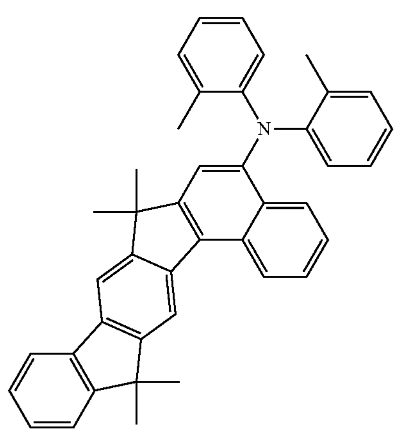 [SMILES: Cc1ccccc1N(c1ccccc1C)c1cc2c(c3ccccc13)-c1cc3c(cc1C2(C)C)-c1ccccc1C3(C)C]

-continued
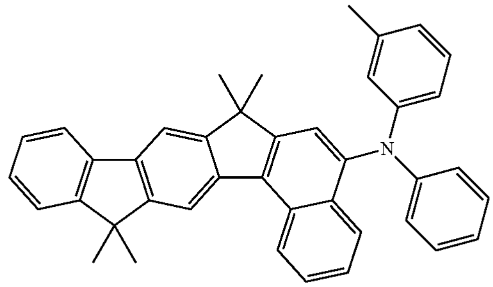 [SMILES: Cc1cccc(N(c2ccccc2)c2cc3c(c4ccccc24)-c2cc4c(cc2C3(C)C)-c2ccccc2C4(C)C)c1]
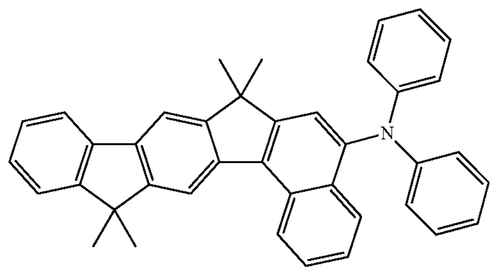 [SMILES: CC1(C)c2ccccc2-c2cc3c(cc21)-c1c(cc(N(c2ccccc2)c2ccccc2)c2ccccc12)C3(C)C]
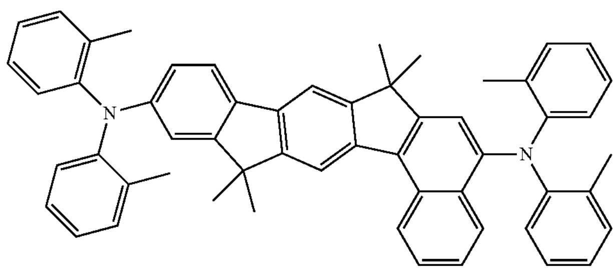 [SMILES: Cc1ccccc1N(c1ccc2c(c1)C(C)(C)c1cc3c(cc1-2)C(C)(C)c1cc(N(c2ccccc2C)c2ccccc2C)c2ccccc2c1-3)c1ccccc1C]
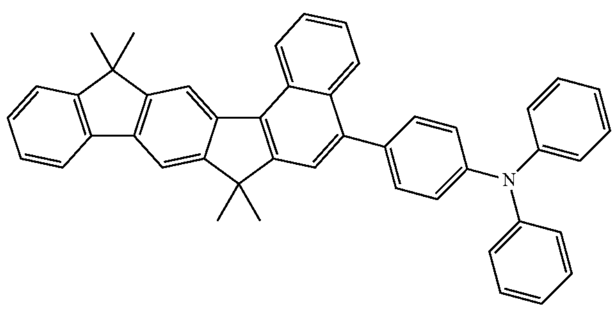 [SMILES: CC1(C)c2ccccc2-c2cc3c(cc21)-c1c(cc(-c2ccc(N(c4ccccc4)c4ccccc4)cc2)c2ccccc12)C3(C)C]
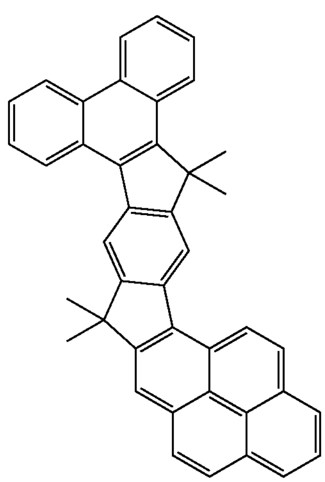 [SMILES: CC1(C)c2cc3c(cc2-c2c1cc1ccc4cccc5ccc2c1c45)C(C)(C)c1c-3c2ccccc2c2ccccc12]

-continued
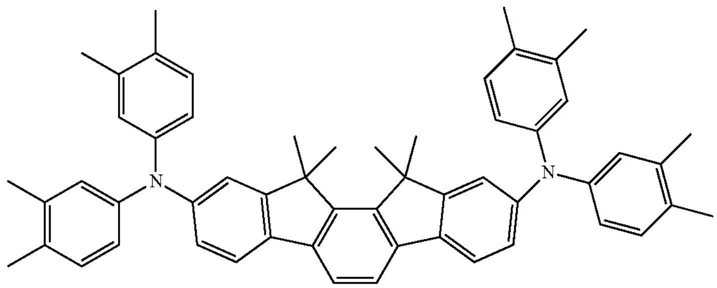
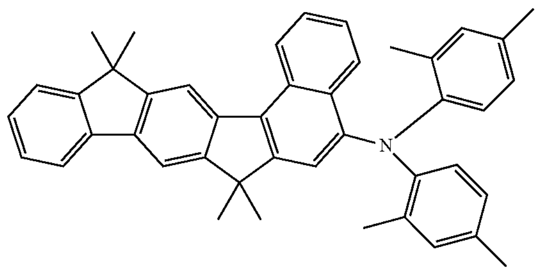 [SMILES: Cc1ccc(N(c2ccc(C)cc2C)c2cc3c(c4ccccc24)-c2cc4c(cc2C3(C)C)-c2ccccc2C4(C)C)c(C)c1]
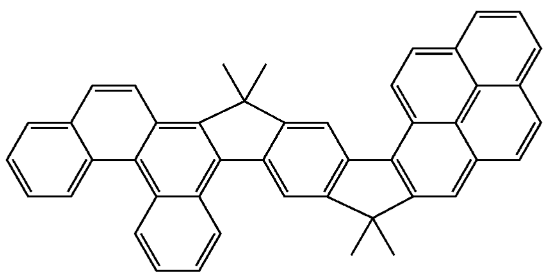 [SMILES: CC1(C)c2cc3c(cc2-c2c1cc1ccc4cccc5ccc2c1c45)C(C)(C)c1c-3c2ccccc2c2c1ccc1ccccc12]
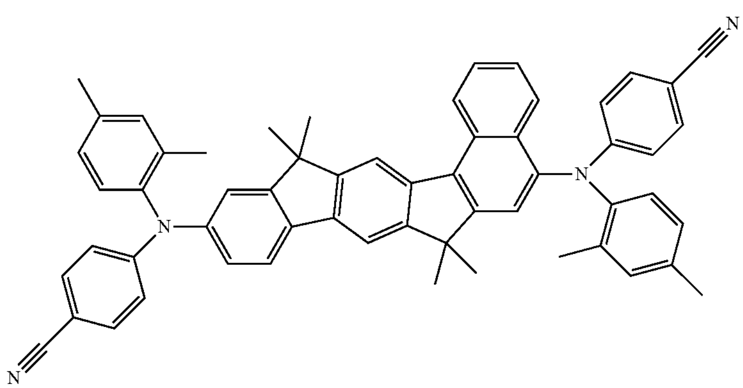 [SMILES: Cc1ccc(N(c2ccc(C#N)cc2)c2ccc3c(c2)C(C)(C)c2cc4c(cc2-3)C(C)(C)c2cc(N(c3ccc(C#N)cc3)c3ccc(C)cc3C)c3ccccc3c2-4)c(C)c1]
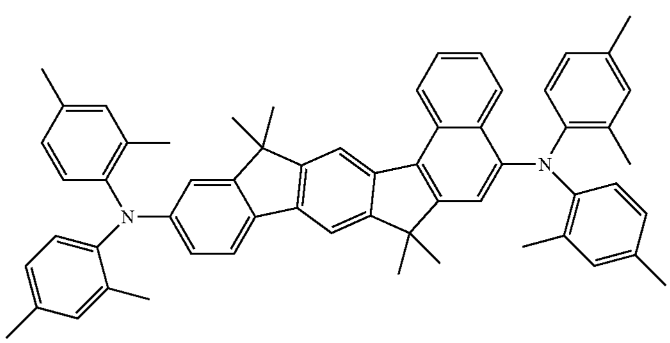

-continued
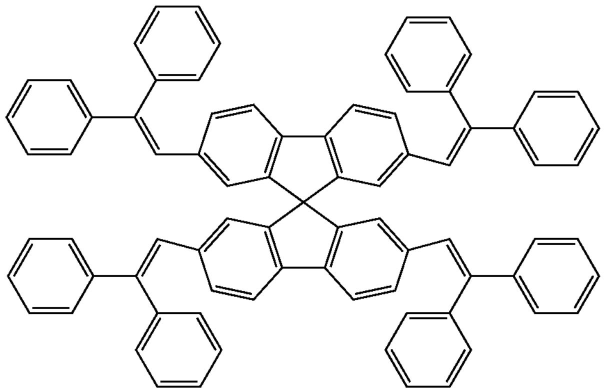 [SMILES: C(=C(c1ccccc1)c1ccccc1)c1ccc2c(c1)C1(c3cc(C=C(c4ccccc4)c4ccccc4)ccc3-2)c2cc(C=C(c3ccccc3)c3ccccc3)ccc2-c2ccc(C=C(c3ccccc3)c3ccccc3)cc21]
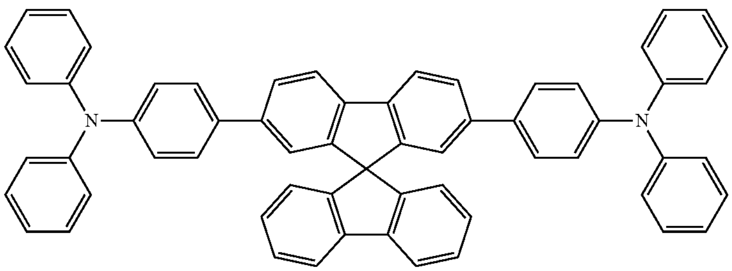 [SMILES: c1ccc(N(c2ccccc2)c2ccc(-c3ccc4c(c3)C3(c5ccccc5-c5ccccc53)c3cc(-c5ccc(N(c6ccccc6)c6ccccc6)cc5)ccc3-4)cc2)cc1]
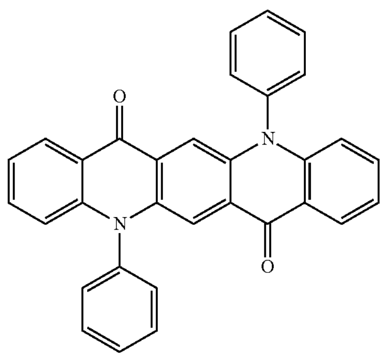 [SMILES: O=c1c2ccccc2n(-c2ccccc2)c2cc3c(=O)c4ccccc4n(-c4ccccc4)c3cc12]
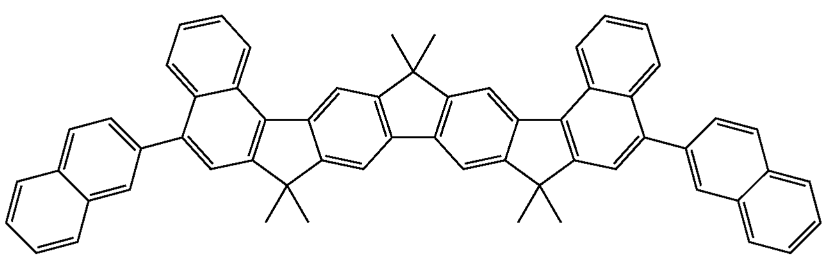 [SMILES: CC1(C)c2cc3c(cc2-c2cc4c(cc21)-c1c(cc(-c2ccc5ccccc5c2)c2ccccc12)C4(C)C)C(C)(C)c1cc(-c2ccc4ccccc4c2)c2ccccc2c1-3]
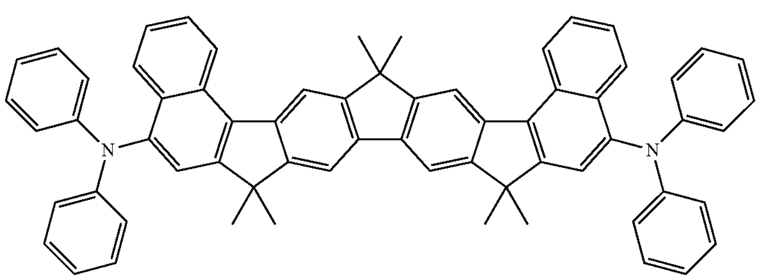 [SMILES: CC1(C)c2cc3c(cc2-c2cc4c(cc21)-c1c(cc(N(c2ccccc2)c2ccccc2)c2ccccc12)C4(C)C)C(C)(C)c1cc(N(c2ccccc2)c2ccccc2)c2ccccc2c1-3]

-continued
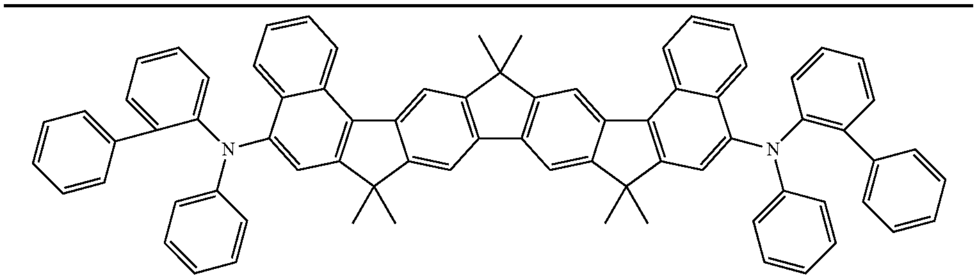
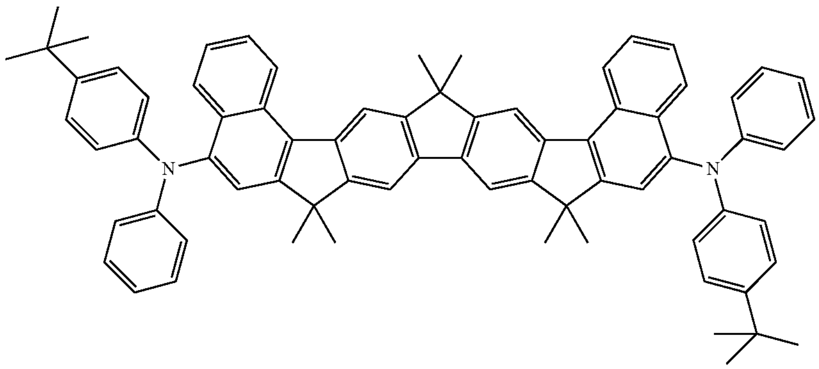 [SMILES: CC(C)(C)c1ccc(N(c2ccccc2)c2cc3c(c4ccccc24)-c2cc4c(cc2C3(C)C)-c2cc3c(cc2C4(C)C)-c2c(cc(N(c4ccccc4)c4ccc(C(C)(C)C)cc4)c4ccccc24)C3(C)C)cc1]
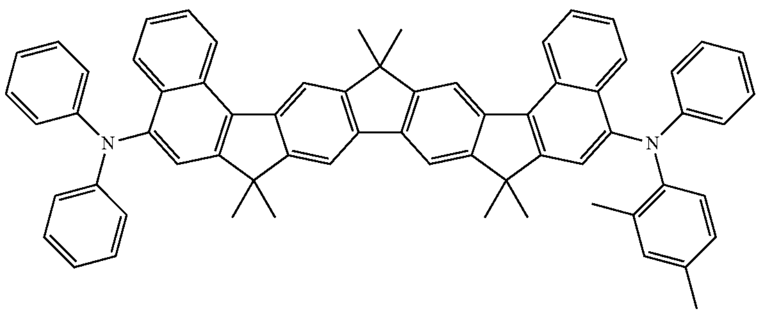 [SMILES: Cc1ccc(N(c2ccccc2)c2cc3c(c4ccccc24)-c2cc4c(cc2C3(C)C)-c2cc3c(cc2C4(C)C)-c2c(cc(N(c4ccccc4)c4ccccc4)c4ccccc24)C3(C)C)c(C)c1]
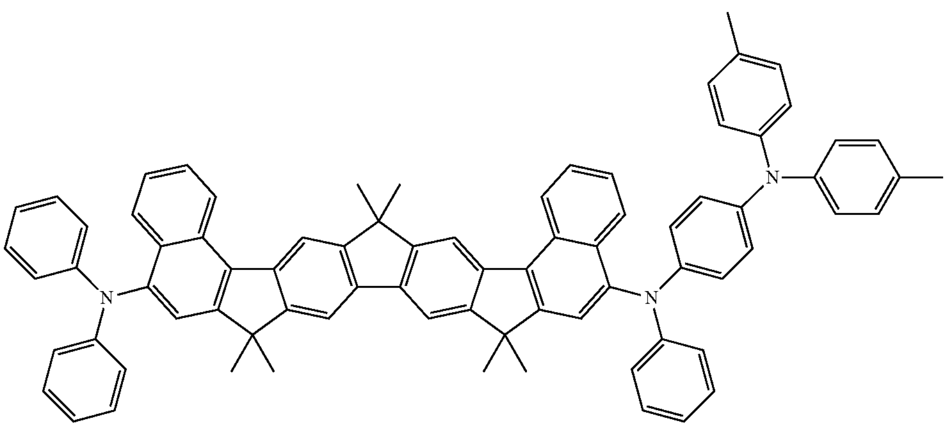 [SMILES: Cc1ccc(N(c2ccc(C)cc2)c2ccc(N(c3ccccc3)c3cc4c(c5ccccc35)-c3cc5c(cc3C4(C)C)-c3cc4c(cc3C5(C)C)-c3c(cc(N(c5ccccc5)c5ccccc5)c5ccccc35)C4(C)C)cc2)cc1]
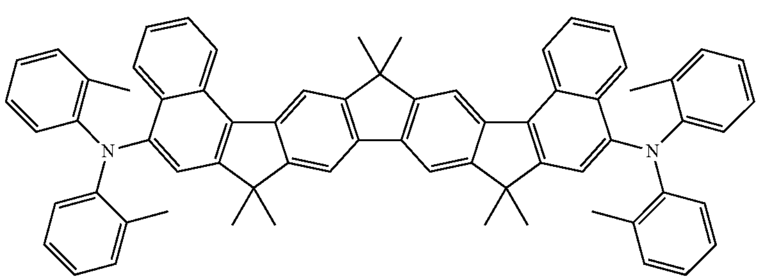 [SMILES: Cc1ccccc1N(c1ccccc1C)c1cc2c(c3ccccc13)-c1cc3c(cc1C2(C)C)-c1cc2c(cc1C3(C)C)-c1c(cc(N(c3ccccc3C)c3ccccc3C)c3ccccc13)C2(C)C]

-continued
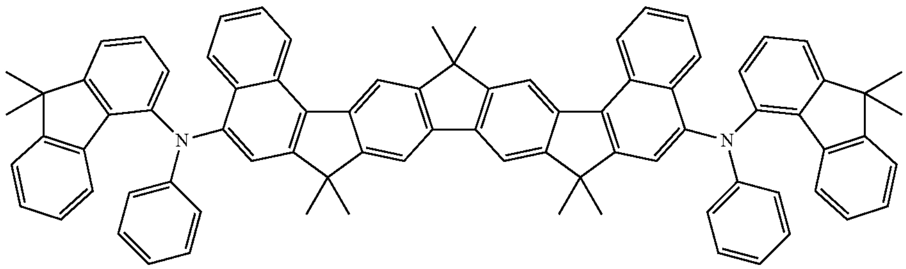
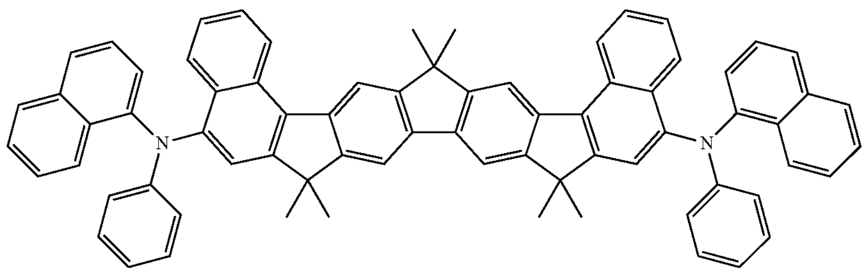 [SMILES: CC1(C)c2cc3c(cc2-c2cc4c(cc21)-c1c(cc(N(c2ccccc2)c2cccc5ccccc25)c2ccccc12)C4(C)C)C(C)(C)c1cc(N(c2ccccc2)c2cccc4ccccc24)c2ccccc2c1-3]
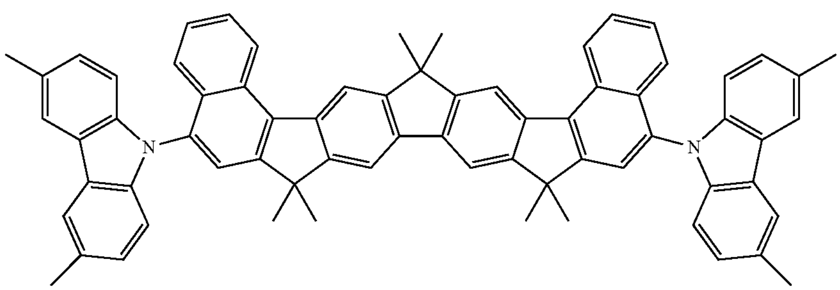
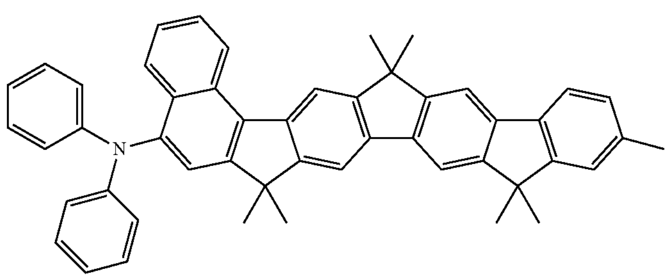 [SMILES: Cc1ccc2c(c1)C(C)(C)c1cc3c(cc1-2)C(C)(C)c1cc2c(cc1-3)C(C)(C)c1cc(N(c3ccccc3)c3ccccc3)c3ccccc3c1-2]
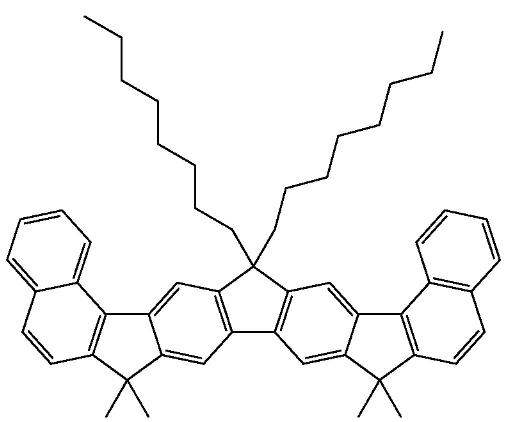 [SMILES: CCCCCCCCC1(CCCCCCCC)c2cc3c(cc2-c2cc4c(cc21)-c1c(ccc2ccccc12)C4(C)C)C(C)(C)c1ccc2ccccc2c1-3]

-continued
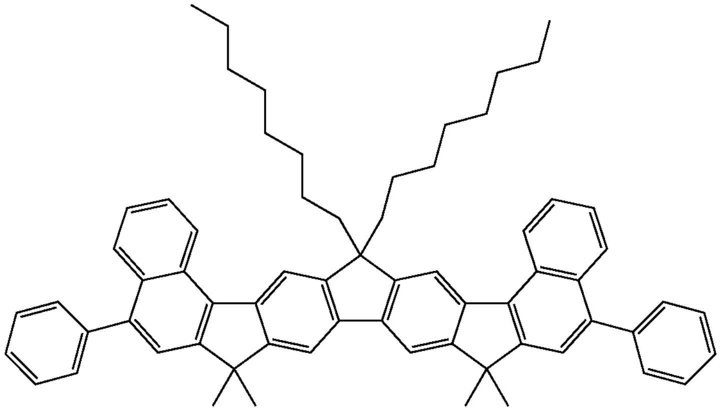 [SMILES: CCCCCCCCC1(CCCCCCCC)c2cc3c(cc2-c2cc4c(cc21)-c1c(cc(-c2ccccc2)c2ccccc12)C4(C)C)C(C)(C)c1cc(-c2ccccc2)c2ccccc2c1-3]
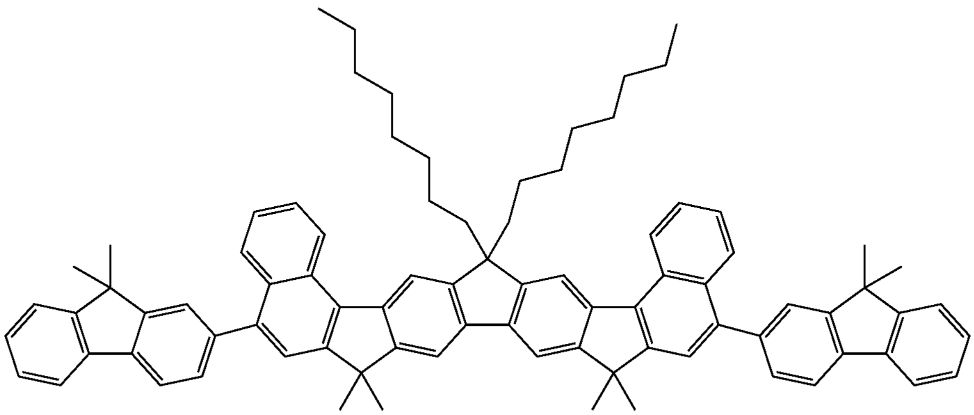 [SMILES: CCCCCCCCC1(CCCCCCCC)c2cc3c(cc2-c2cc4c(cc21)-c1c(cc(-c2ccc5c(c2)C(C)(C)c2ccccc2-5)c2ccccc12)C4(C)C)C(C)(C)c1cc(-c2ccc4c(c2)C(C)(C)c2ccccc2-4)c2ccccc2c1-3]
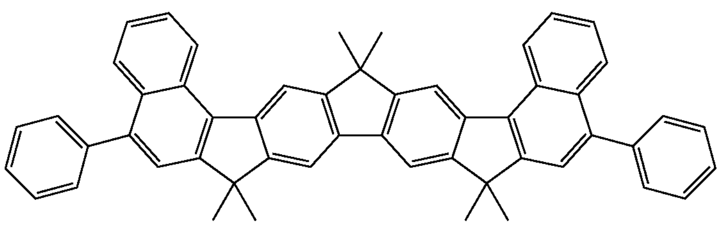 [SMILES: CC1(C)c2cc3c(cc2-c2cc4c(cc21)-c1c(cc(-c2ccccc2)c2ccccc12)C4(C)C)C(C)(C)c1cc(-c2ccccc2)c2ccccc2c1-3]
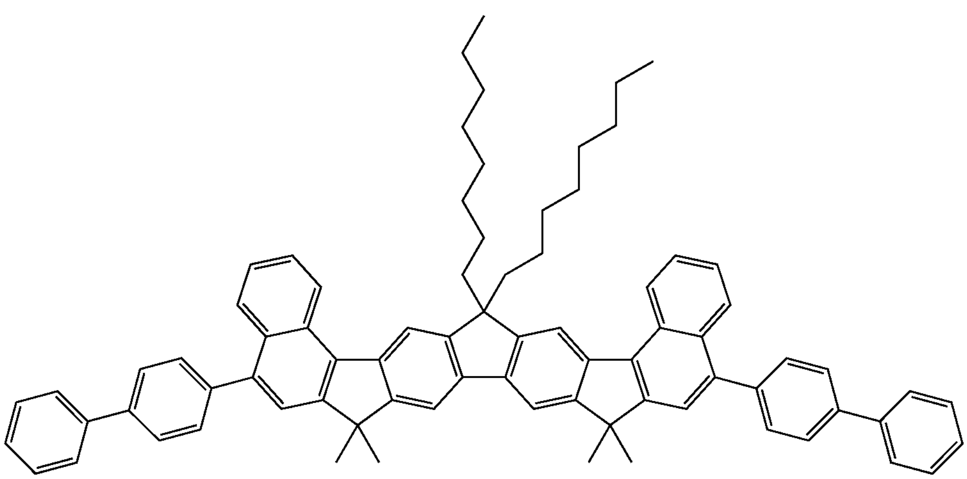 [SMILES: CCCCCCCCC1(CCCCCCCC)c2cc3c(cc2-c2cc4c(cc21)-c1c(cc(-c2ccc(-c5ccccc5)cc2)c2ccccc12)C4(C)C)C(C)(C)c1cc(-c2ccc(-c4ccccc4)cc2)c2ccccc2c1-3]

-continued
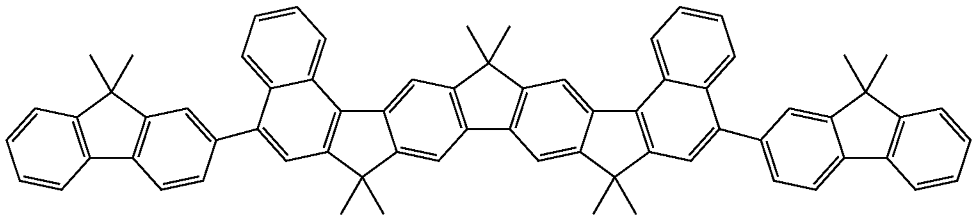 [SMILES: CC1(C)c2ccccc2-c2ccc(-c3cc4c(c5ccccc35)-c3cc5c(cc3C4(C)C)-c3cc4c(cc3C5(C)C)-c3c(cc(-c5ccc6c(c5)C(C)(C)c5ccccc5-6)c5ccccc35)C4(C)C)cc21]
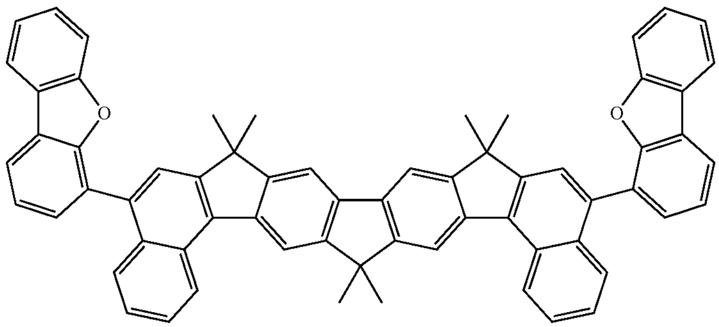 [SMILES: CC1(C)c2cc3c(cc2-c2cc4c(cc21)-c1c(cc(-c2cccc5c2oc2ccccc25)c2ccccc12)C4(C)C)C(C)(C)c1cc(-c2cccc4c2oc2ccccc24)c2ccccc2c1-3]
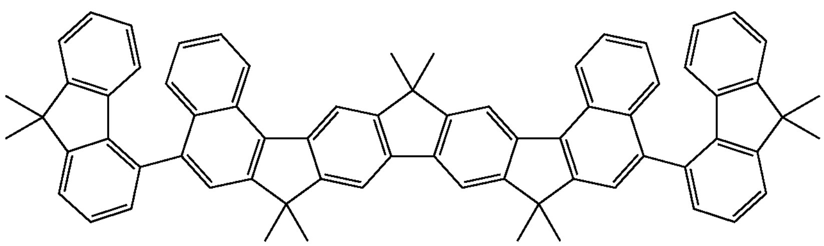
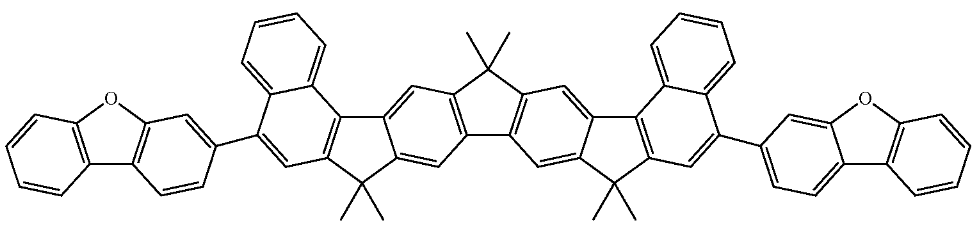 [SMILES: CC1(C)c2cc3c(cc2-c2cc4c(cc21)-c1c(cc(-c2ccc5c(c2)oc2ccccc25)c2ccccc12)C4(C)C)C(C)(C)c1cc(-c2ccc4c(c2)oc2ccccc24)c2ccccc2c1-3]
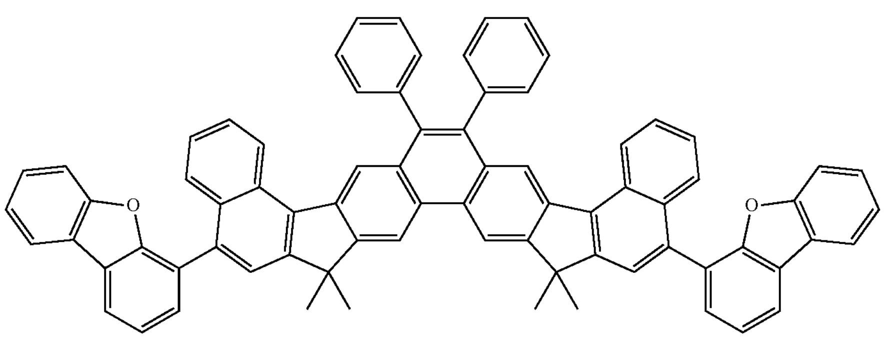 [SMILES: CC1(C)c2cc3c(cc2-c2c1cc(-c1cccc4c1oc1ccccc14)c1ccccc21)c(-c1ccccc1)c(-c1ccccc1)c1cc2c(cc13)C(C)(C)c1cc(-c3cccc4c3oc3ccccc34)c3ccccc3c1-2]

-continued

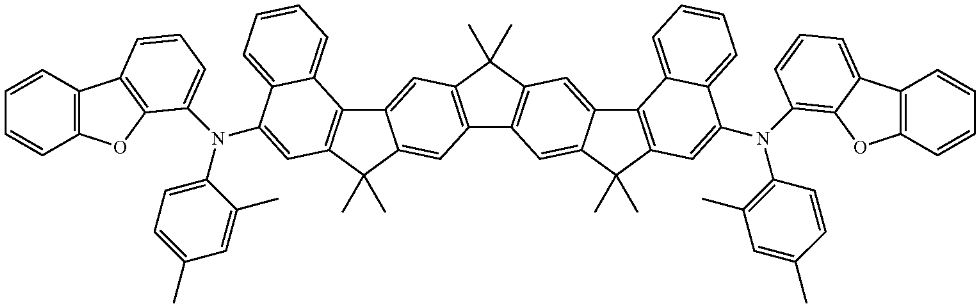 [SMILES: Cc1ccc(N(c2cc3c(c4ccccc24)-c2cc4c(cc2C3(C)C)-c2cc3c(cc2C4(C)C)-c2c(cc(N(c4ccc(C)cc4C)c4cccc5c4oc4ccccc45)c4ccccc24)C3(C)C)c2cccc3c2oc2ccccc23)c(C)c1]

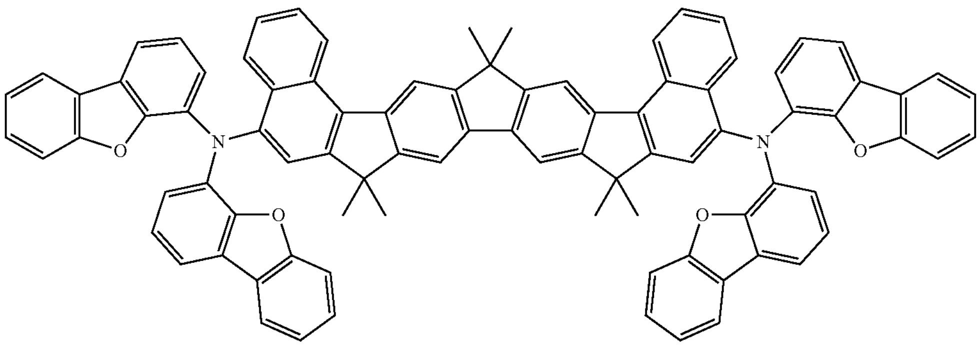 [SMILES: CC1(C)c2cc3c(cc2-c2cc4c(cc21)-c1c(cc(N(c2cccc5c2oc2ccccc25)c2cccc5c2oc2ccccc25)c2ccccc12)C4(C)C)C(C)(C)c1cc(N(c2cccc4c2oc2ccccc24)c2cccc4c2oc2ccccc24)c2ccccc2c1-3]

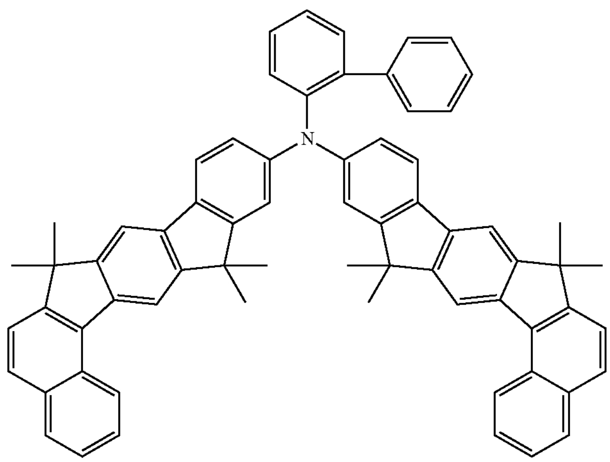 [SMILES: CC1(C)c2cc(N(c3ccc4c(c3)C(C)(C)c3cc5c(cc3-4)C(C)(C)c3ccc4ccccc4c3-5)c3ccccc3-c3ccccc3)ccc2-c2cc3c(cc21)-c1c(ccc2ccccc12)C3(C)C]

In a preferred embodiment, the emitting layer of the electronic device contains exactly one matrix compound. A matrix compound is understood to mean a compound that is not an emitting compound. This embodiment is especially preferred in the case of fluorescent emitting layers.

In an alternative preferred embodiment, the emitting layer of the electronic device contains exactly two or more, preferably exactly two, matrix compounds. This embodiment, which is also referred to as mixed matrix system, is especially preferred in the case of phosphorescent emitting layers.

The total proportion of all matrix materials in the case of a phosphorescent emitting layer is preferably between 50.0% and 99.9%, more preferably between 80.0% and 99.5% and most preferably between 85.0% and 97.0%.

The figure for the proportion in % is understood here to mean the proportion in % by volume in the case of layers that are applied from the gas phase, and the proportion in % by weight in the case of layers that are applied from solution.

Correspondingly, the proportion of the phosphorescent emitting compound is preferably between 0.1% and 50.0%, more preferably between 0.5% and 20.0%, and most preferably between 3.0% and 15.0%.

The total proportion of all matrix materials in the case of a fluorescent emitting layer is preferably between 50.0% and 99.9%, more preferably between 80.0% and 99.5% and most preferably between 90.0% and 99.0%.

Correspondingly, the proportion of the fluorescent emitting compound is between 0.1% and 50.0%, preferably between 0.5% and 20.0%, and more preferably between 1.0% and 10.0%.

Mixed matrix systems preferably comprise two or three different matrix materials, more preferably two different matrix materials. Preferably, in this case, one of the two materials is a material having properties including hole-transporting properties and the other material is a material having properties including electron-transporting properties. Further matrix materials that may be present in mixed matrix systems are compounds having a large energy difference between HOMO and LUMO (wide bandgap materials). The two different matrix materials may be present in a ratio of 1:50 to 1:1, preferably 1:20 to 1:1, more preferably 1:10 to 1:1 and most preferably 1:4 to 1:1. Preference is given to using mixed matrix systems in phosphorescent organic electroluminescent devices.

Preferred matrix materials for fluorescent emitting compounds are selected from the classes of the oligoarylenes (e.g. 2,2',7,7'-tetraphenylspirobifluorene), especially the oligoarylenes containing fused aromatic groups, the oligoarylenevinylenes, the polypodal metal complexes, the hole-conducting compounds, the electron-conducting compounds, especially ketones, phosphine oxides and sulfoxides; the atropisomers, the boronic acid derivatives and the benzanthracenes. Particularly preferred matrix materials are selected from the classes of the oligoarylenes comprising naphthalene, anthracene, benzanthracene and/or pyrene or atropisomers of these compounds, the oligoarylenevinylenes, the ketones, the phosphine oxides and the sulfoxides. Very particularly preferred matrix materials are selected from the classes of the oligoarylenes comprising anthracene, benzanthracene, benzophenanthrene and/or pyrene or atropisomers of these compounds. An oligoarylene in the context of this invention shall be understood to mean a compound in which at least three aryl or arylene groups are bonded to one another.

Preferred matrix materials for fluorescent emitting compounds are shown in the following table:

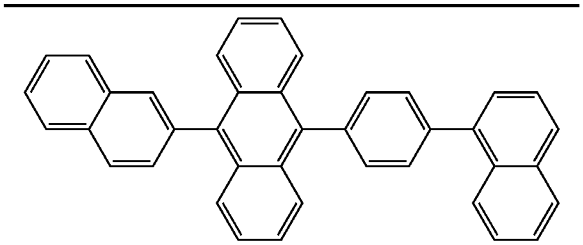

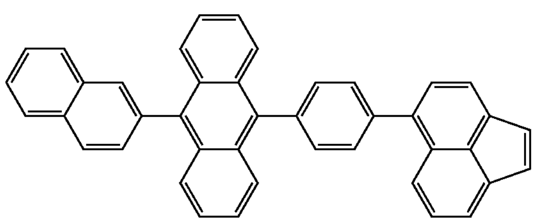 [SMILES: C1=Cc2ccc(-c3ccc(-c4c5ccccc5c(-c5ccc6ccccc6c5)c5ccccc45)cc3)c3cccc1c23]

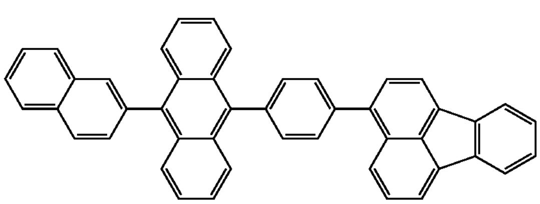 [SMILES: c1ccc2c(c1)-c1cccc3c(-c4ccc(-c5c6ccccc6c(-c6ccc7ccccc7c6)c6ccccc56)cc4)ccc-2c13]

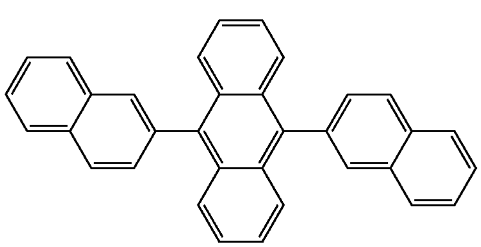 [SMILES: c1ccc2cc(-c3c4ccccc4c(-c4ccc5ccccc5c4)c4ccccc34)ccc2c1]

-continued

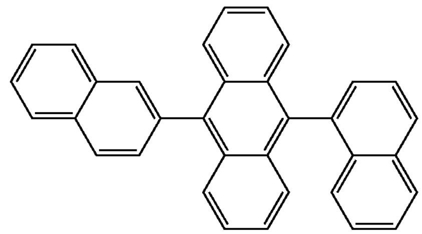 [SMILES: c1ccc2cc(-c3c4ccccc4c(-c4cccc5ccccc45)c4ccccc34)ccc2c1]

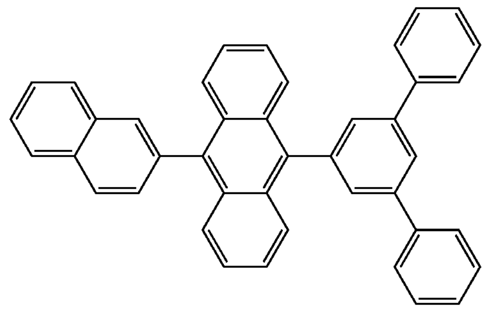 [SMILES: c1ccc(-c2cc(-c3ccccc3)cc(-c3c4ccccc4c(-c4ccc5ccccc5c4)c4ccccc34)c2)cc1]

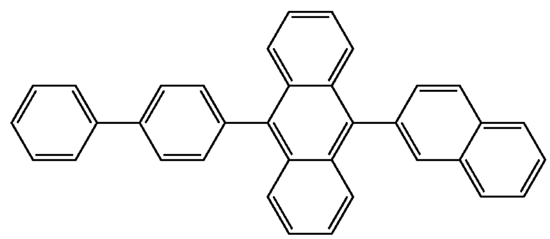 [SMILES: c1ccc(-c2ccc(-c3c4ccccc4c(-c4ccc5ccccc5c4)c4ccccc34)cc2)cc1]

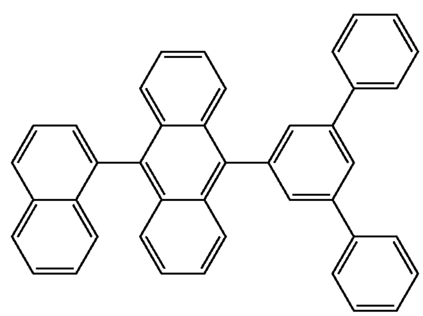 [SMILES: c1ccc(-c2cc(-c3ccccc3)cc(-c3c4ccccc4c(-c4cccc5ccccc45)c4ccccc34)c2)cc1]

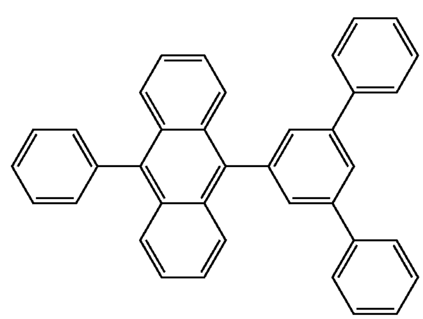 [SMILES: c1ccc(-c2cc(-c3ccccc3)cc(-c3c4ccccc4c(-c4ccccc4)c4ccccc34)c2)cc1]

-continued
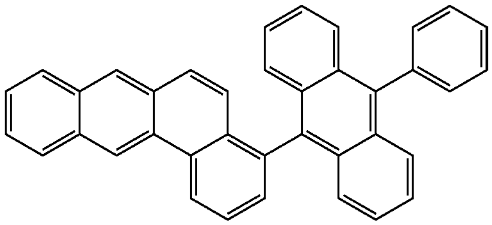 [SMILES: c1ccc(-c2c3ccccc3c(-c3cccc4c3ccc3cc5ccccc5cc34)c3ccccc23)cc1]
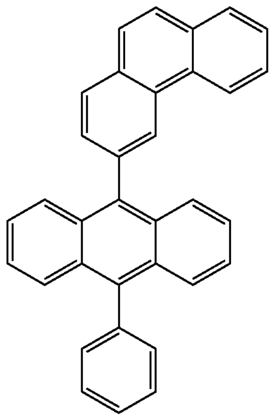 [SMILES: c1ccc(-c2c3ccccc3c(-c3ccc4ccc5ccccc5c4c3)c3ccccc23)cc1]
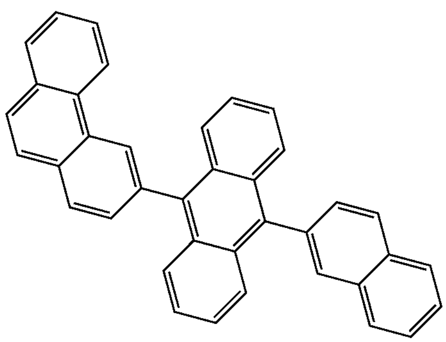 [SMILES: c1ccc2cc(-c3c4ccccc4c(-c4ccc5ccc6ccccc6c5c4)c4ccccc34)ccc2c1]
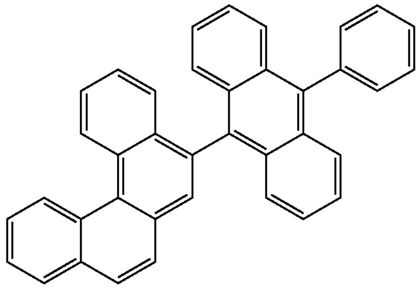 [SMILES: c1ccc(-c2c3ccccc3c(-c3cc4ccc5ccccc5c4c4ccccc34)c3ccccc23)cc1]
-continued
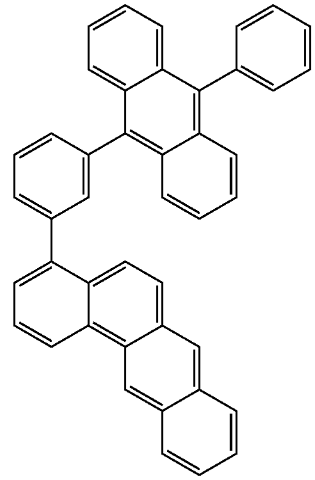 [SMILES: c1ccc(-c2c3ccccc3c(-c3cccc(-c4cccc5c4ccc4cc6ccccc6cc45)c3)c3ccccc23)cc1]
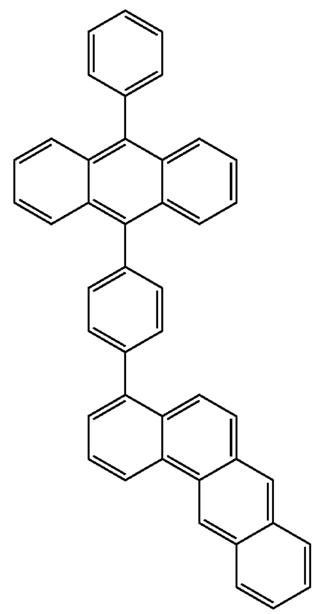 [SMILES: c1ccc(-c2c3ccccc3c(-c3ccc(-c4cccc5c4ccc4cc6ccccc6cc45)cc3)c3ccccc23)cc1]
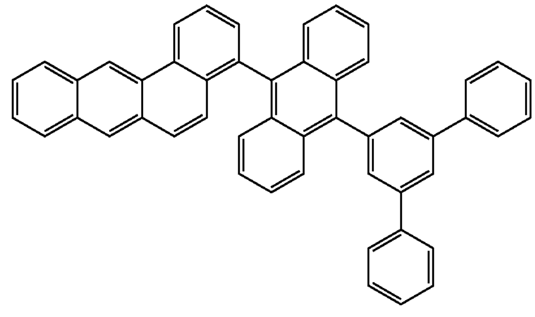 [SMILES: c1ccc(-c2cc(-c3ccccc3)cc(-c3c4ccccc4c(-c4cccc5c4ccc4cc6ccccc6cc45)c4ccccc34)c2)cc1]

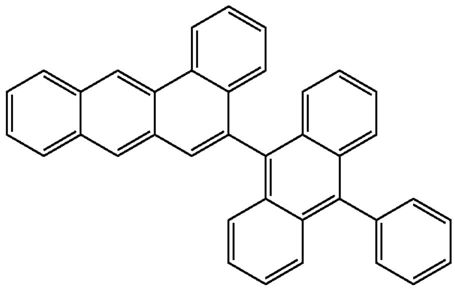 [SMILES: c1ccc(-c2c3ccccc3c(-c3cc4cc5ccccc5cc4c4ccccc34)c3ccccc23)cc1]
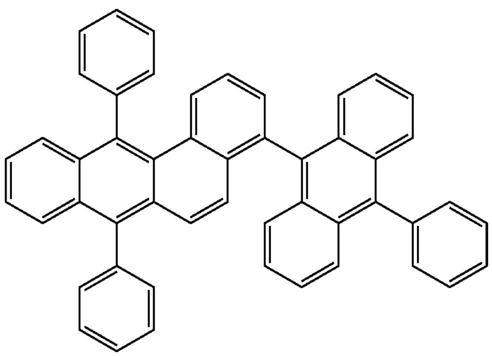 [SMILES: c1ccc(-c2c3ccccc3c(-c3cccc4c3ccc3c(-c5ccccc5)c5ccccc5c(-c5ccccc5)c34)c3ccccc23)cc1]
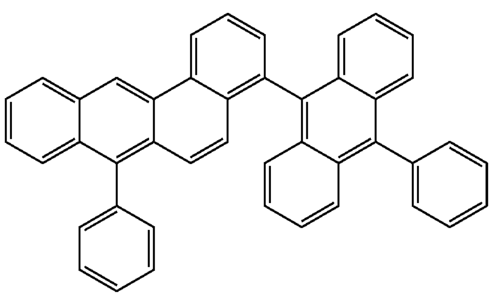 [SMILES: c1ccc(-c2c3ccccc3c(-c3cccc4c3ccc3c(-c5ccccc5)c5ccccc5cc34)c3ccccc23)cc1]
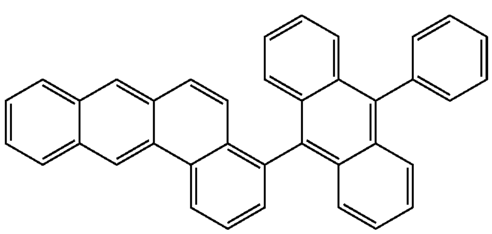 [SMILES: c1ccc(-c2c3ccccc3c(-c3cccc4c3ccc3cc5ccccc5cc34)c3ccccc23)cc1]
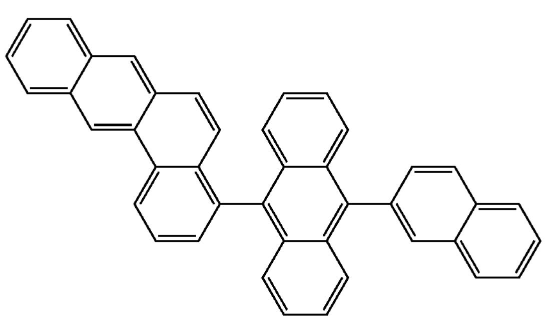 [SMILES: c1ccc2cc(-c3c4ccccc4c(-c4cccc5c4ccc4cc6ccccc6cc45)c4ccccc34)ccc2c1]
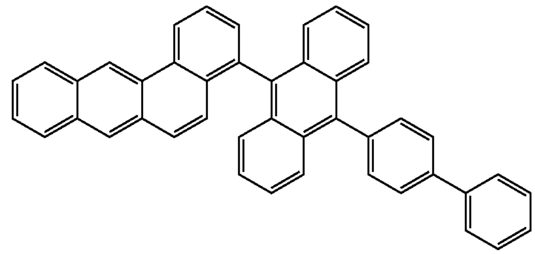 [SMILES: c1ccc(-c2ccc(-c3c4ccccc4c(-c4cccc5c4ccc4cc6ccccc6cc45)c4ccccc34)cc2)cc1]
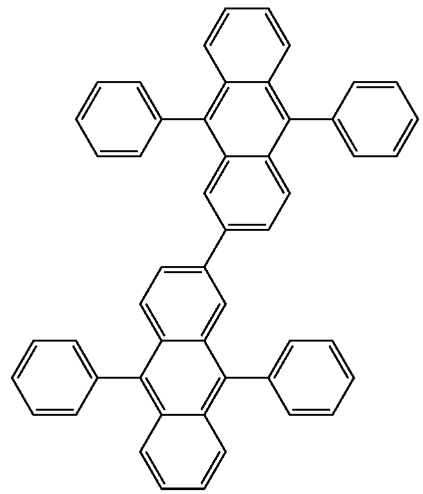 [SMILES: c1ccc(-c2c3ccccc3c(-c3ccccc3)c3cc(-c4ccc5c(-c6ccccc6)c6ccccc6c(-c6ccccc6)c5c4)ccc23)cc1]
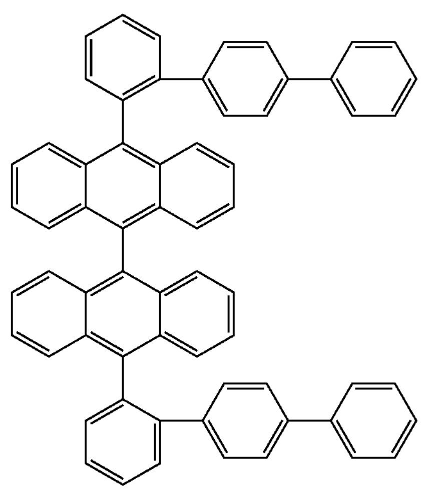 [SMILES: c1ccc(-c2ccc(-c3ccccc3-c3c4ccccc4c(-c4c5ccccc5c(-c5ccccc5-c5ccc(-c6ccccc6)cc5)c5ccccc45)c4ccccc34)cc2)cc1]
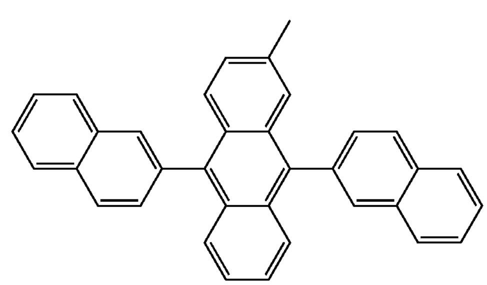 [SMILES: Cc1ccc2c(-c3ccc4ccccc4c3)c3ccccc3c(-c3ccc4ccccc4c3)c2c1]

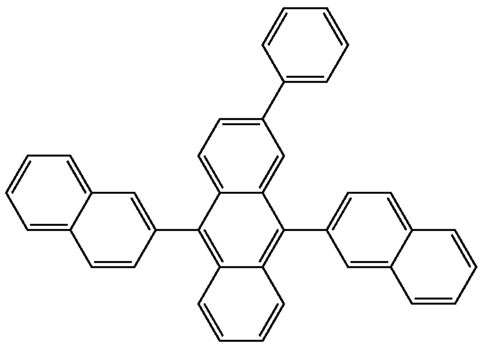 [SMILES: c1ccc(-c2ccc3c(-c4ccc5ccccc5c4)c4ccccc4c(-c4ccc5ccccc5c4)c3c2)cc1]
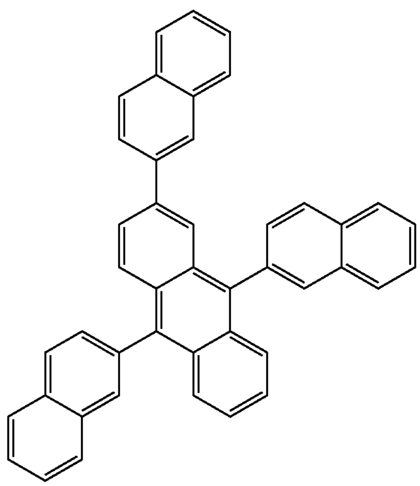 [SMILES: c1ccc2cc(-c3ccc4c(-c5ccc6ccccc6c5)c5ccccc5c(-c5ccc6ccccc6c5)c4c3)ccc2c1]
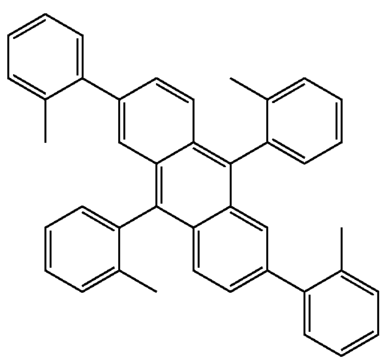 [SMILES: Cc1ccccc1-c1ccc2c(-c3ccccc3C)c3cc(-c4ccccc4C)ccc3c(-c3ccccc3C)c2c1]
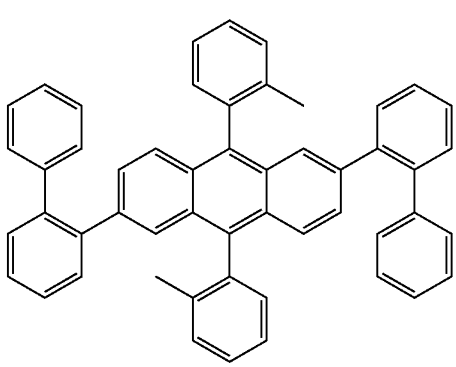 [SMILES: Cc1ccccc1-c1c2ccc(-c3ccccc3-c3ccccc3)cc2c(-c2ccccc2C)c2ccc(-c3ccccc3-c3ccccc3)cc12]
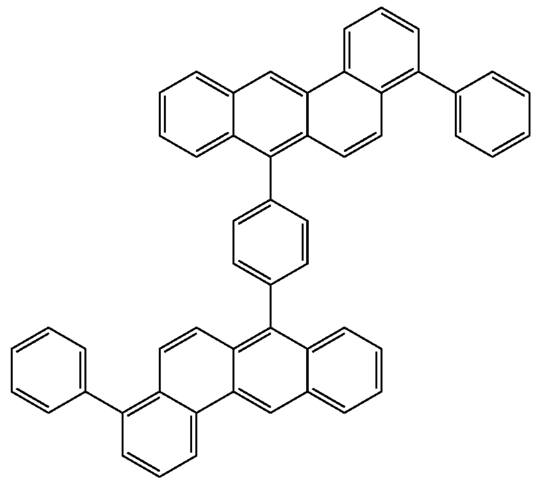 [SMILES: c1ccc(-c2cccc3c2ccc2c(-c4ccc(-c5c6ccccc6cc6c5ccc5c(-c7ccccc7)cccc56)cc4)c4ccccc4cc23)cc1]
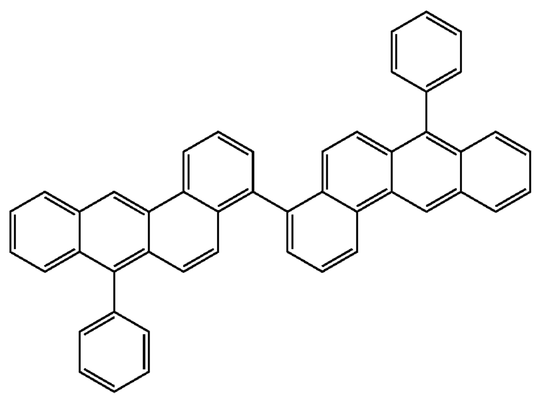 [SMILES: c1ccc(-c2c3ccccc3cc3c2ccc2c(-c4cccc5c4ccc4c(-c6ccccc6)c6ccccc6cc45)cccc23)cc1]
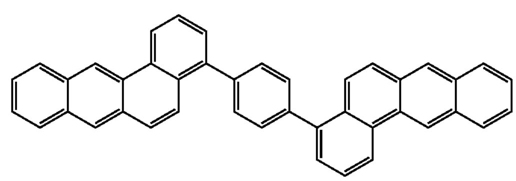 [SMILES: c1ccc2cc3c(ccc4c(-c5ccc(-c6cccc7c6ccc6cc8ccccc8cc67)cc5)cccc43)cc2c1]
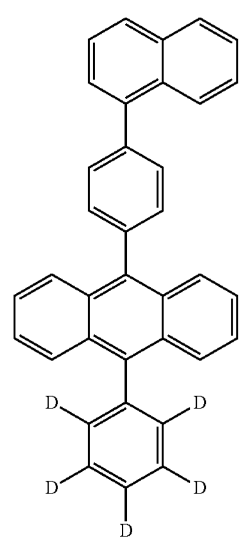 [SMILES: [2H]c1c([2H])c([2H])c(-c2c3ccccc3c(-c3ccc(-c4cccc5ccccc45)cc3)c3ccccc23)c([2H])c1[2H]]
D
D
D
D
D

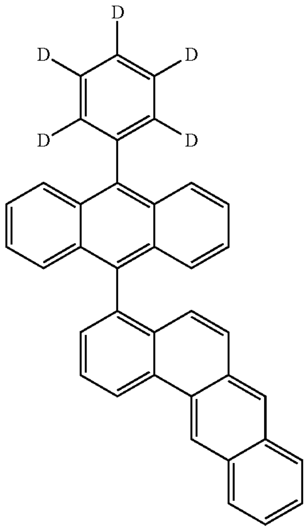 [SMILES: [2H]c1c([2H])c([2H])c(-c2c3ccccc3c(-c3cccc4c3ccc3cc5ccccc5cc34)c3ccccc23)c([2H])c1[2H]]
D
D
D
D
D
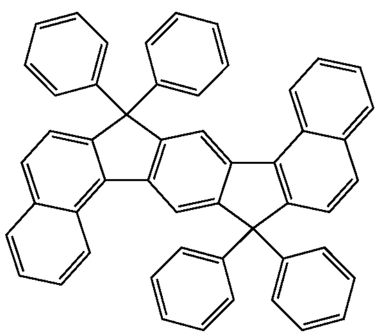 [SMILES: c1ccc(C2(c3ccccc3)c3cc4c(cc3-c3c2ccc2ccccc32)C(c2ccccc2)(c2ccccc2)c2ccc3ccccc3c2-4)cc1]
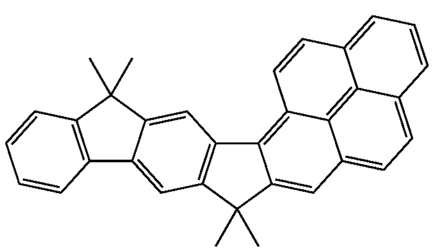 [SMILES: CC1(C)c2ccccc2-c2cc3c(cc21)-c1c(cc2ccc4cccc5ccc1c2c45)C3(C)C]
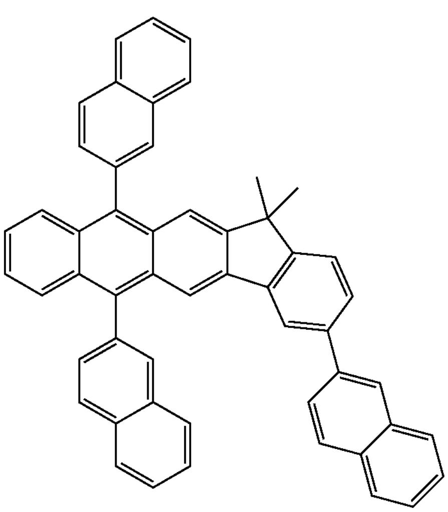 [SMILES: CC1(C)c2ccc(-c3ccc4ccccc4c3)cc2-c2cc3c(-c4ccc5ccccc5c4)c4ccccc4c(-c4ccc5ccccc5c4)c3cc21]
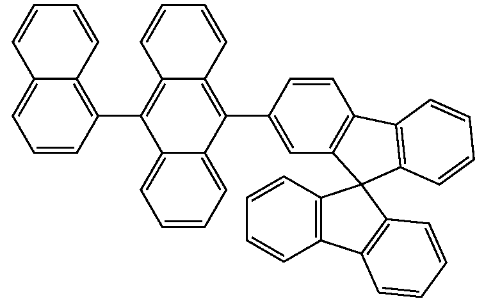 [SMILES: c1ccc2c(c1)-c1ccccc1C21c2ccccc2-c2ccc(-c3c4ccccc4c(-c4cccc5ccccc45)c4ccccc34)cc21]
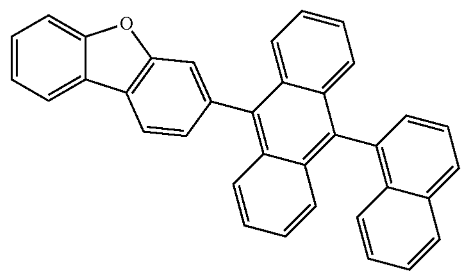 [SMILES: c1ccc2c(-c3c4ccccc4c(-c4ccc5c(c4)oc4ccccc45)c4ccccc34)cccc2c1]
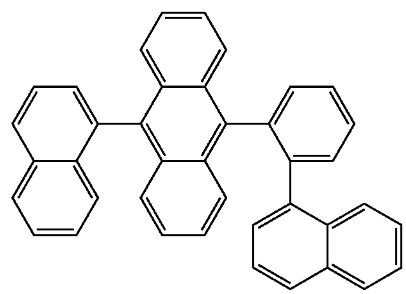 [SMILES: c1ccc(-c2c3ccccc3c(-c3cccc4ccccc34)c3ccccc23)c(-c2cccc3ccccc23)c1]
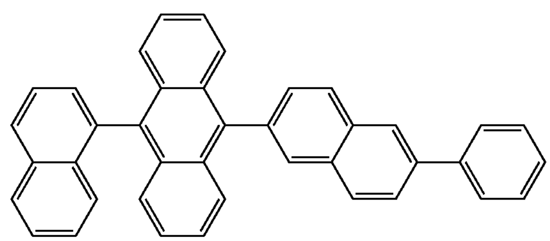 [SMILES: c1ccc(-c2ccc3cc(-c4c5ccccc5c(-c5cccc6ccccc56)c5ccccc45)ccc3c2)cc1]
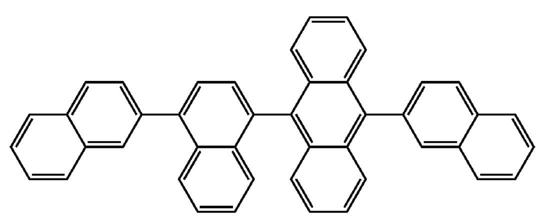 [SMILES: c1ccc2cc(-c3ccc(-c4c5ccccc5c(-c5ccc6ccccc6c5)c5ccccc45)c4ccccc34)ccc2c1]
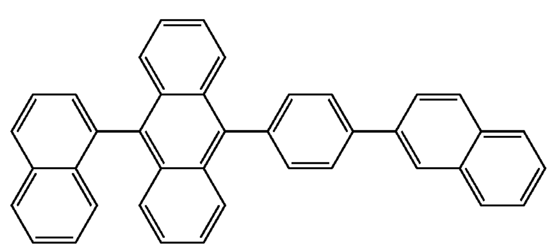 [SMILES: c1ccc2cc(-c3ccc(-c4c5ccccc5c(-c5cccc6ccccc56)c5ccccc45)cc3)ccc2c1]

-continued
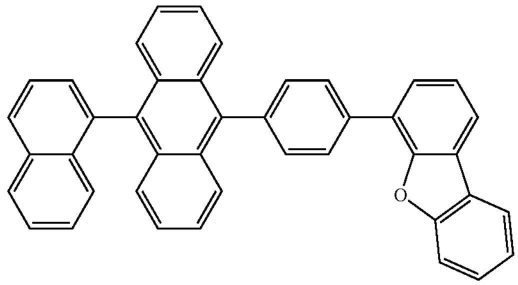 [SMILES: c1ccc2c(-c3c4ccccc4c(-c4ccc(-c5cccc6c5oc5ccccc56)cc4)c4ccccc34)cccc2c1]
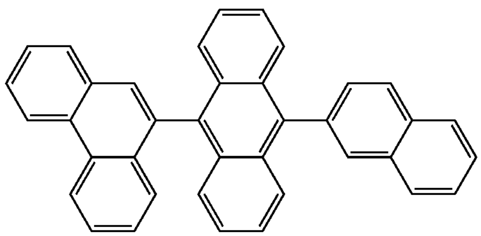 [SMILES: c1ccc2cc(-c3c4ccccc4c(-c4cc5ccccc5c5ccccc45)c4ccccc34)ccc2c1]
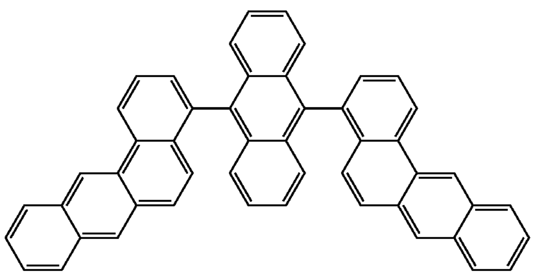 [SMILES: c1ccc2cc3c(ccc4c(-c5c6ccccc6c(-c6cccc7c6ccc6cc8ccccc8cc67)c6ccccc56)cccc43)cc2c1]
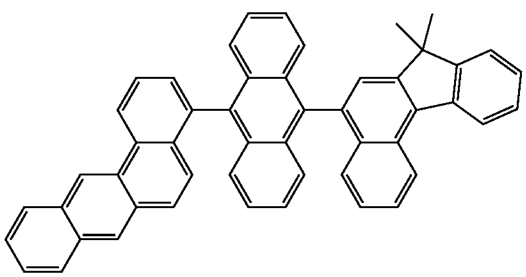 [SMILES: CC1(C)c2ccccc2-c2c1cc(-c1c3ccccc3c(-c3cccc4c3ccc3cc5ccccc5cc34)c3ccccc13)c1ccccc21]
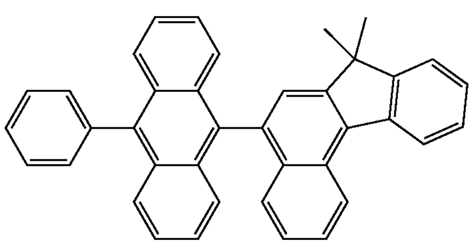 [SMILES: CC1(C)c2ccccc2-c2c1cc(-c1c3ccccc3c(-c3ccccc3)c3ccccc13)c1ccccc21]
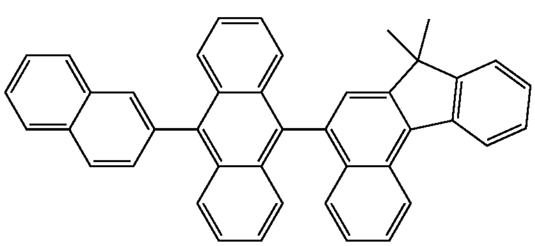 [SMILES: CC1(C)c2ccccc2-c2c1cc(-c1c3ccccc3c(-c3ccc4ccccc4c3)c3ccccc13)c1ccccc21]
-continued
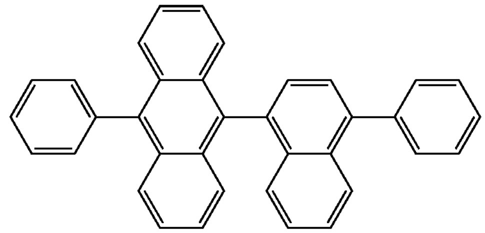 [SMILES: c1ccc(-c2ccc(-c3c4ccccc4c(-c4ccccc4)c4ccccc34)c3ccccc23)cc1]
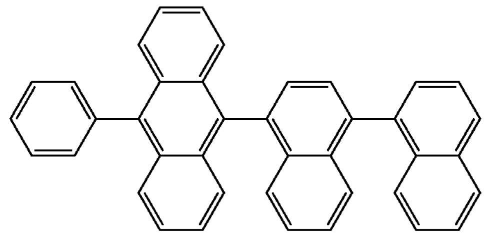 [SMILES: c1ccc(-c2c3ccccc3c(-c3ccc(-c4cccc5ccccc45)c4ccccc34)c3ccccc23)cc1]
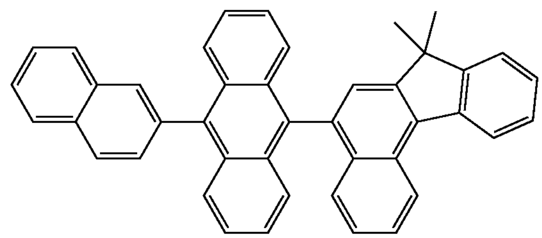 [SMILES: CC1(C)c2ccccc2-c2c1cc(-c1c3ccccc3c(-c3ccc4ccccc4c3)c3ccccc13)c1ccccc21]
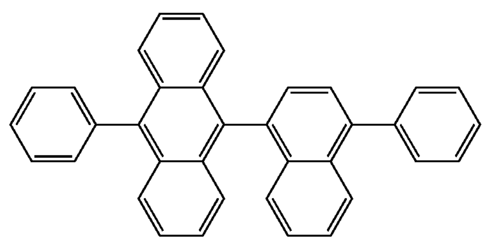 [SMILES: c1ccc(-c2ccc(-c3c4ccccc4c(-c4ccccc4)c4ccccc34)c3ccccc23)cc1]
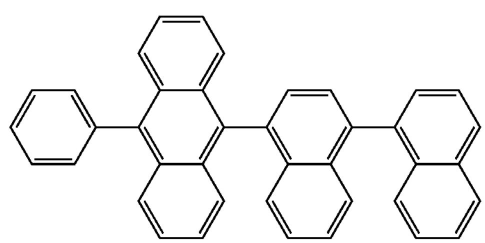 [SMILES: c1ccc(-c2c3ccccc3c(-c3ccc(-c4cccc5ccccc45)c4ccccc34)c3ccccc23)cc1]
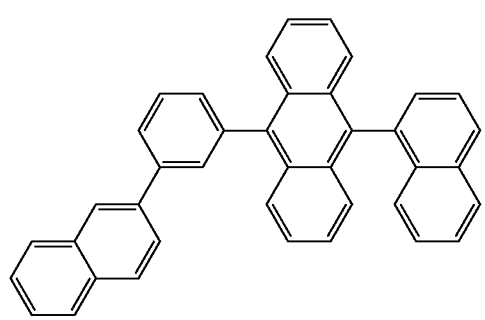 [SMILES: c1cc(-c2ccc3ccccc3c2)cc(-c2c3ccccc3c(-c3cccc4ccccc34)c3ccccc23)c1]

-continued

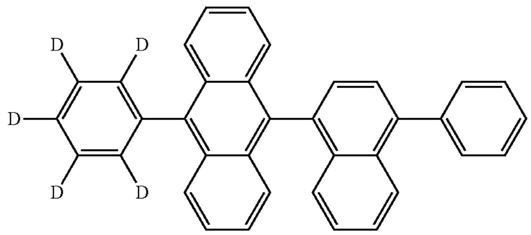 [SMILES: [2H]c1c([2H])c([2H])c(-c2c3ccccc3c(-c3ccc(-c4ccccc4)c4ccccc34)c3ccccc23)c([2H])c1[2H]]

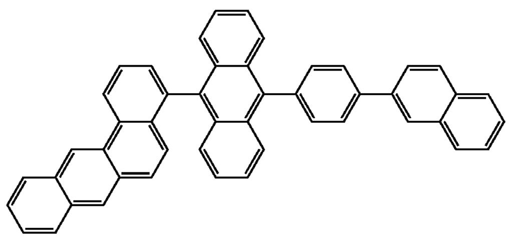 [SMILES: c1ccc2cc(-c3ccc(-c4c5ccccc5c(-c5cccc6c5ccc5cc7ccccc7cc56)c5ccccc45)cc3)ccc2c1]

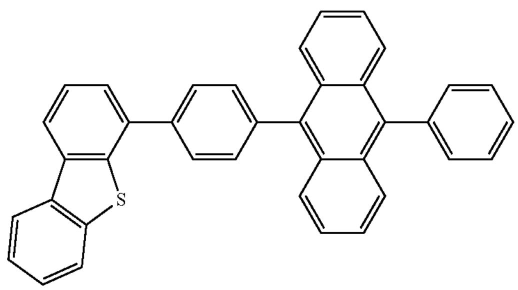 [SMILES: c1ccc(-c2c3ccccc3c(-c3ccc(-c4cccc5c4sc4ccccc45)cc3)c3ccccc23)cc1]

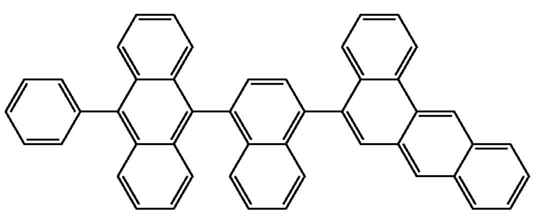 [SMILES: c1ccc(-c2c3ccccc3c(-c3ccc(-c4cc5cc6ccccc6cc5c5ccccc45)c4ccccc34)c3ccccc23)cc1]

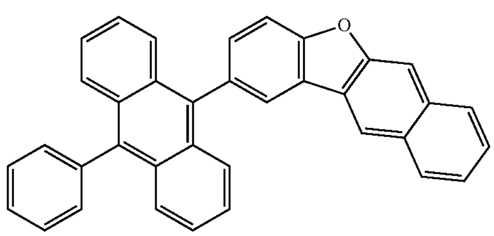 [SMILES: c1ccc(-c2c3ccccc3c(-c3ccc4oc5cc6ccccc6cc5c4c3)c3ccccc23)cc1]

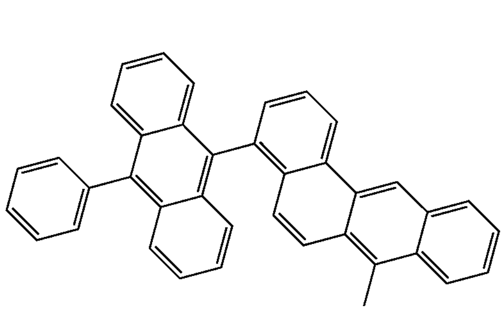 [SMILES: Cc1c2ccccc2cc2c1ccc1c(-c3c4ccccc4c(-c4ccccc4)c4ccccc34)cccc12]

-continued

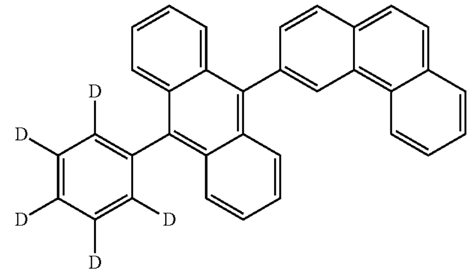 [SMILES: [2H]c1c([2H])c([2H])c(-c2c3ccccc3c(-c3ccc4ccc5ccccc5c4c3)c3ccccc23)c([2H])c1[2H]]

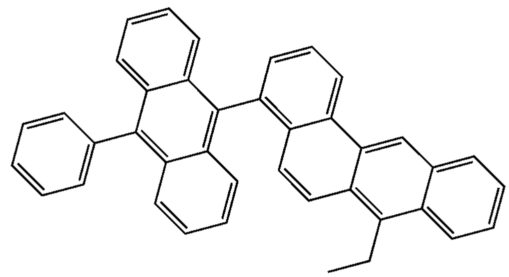 [SMILES: CCc1c2ccccc2cc2c1ccc1c(-c3c4ccccc4c(-c4ccccc4)c4ccccc34)cccc12]

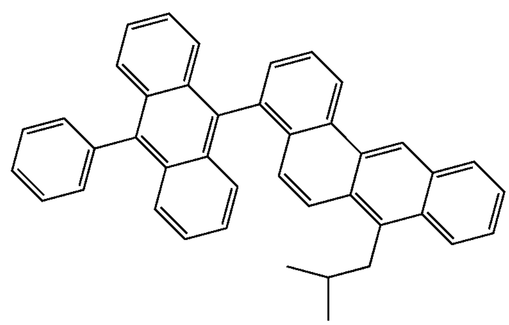 [SMILES: CC(C)Cc1c2ccccc2cc2c1ccc1c(-c3c4ccccc4c(-c4ccccc4)c4ccccc34)cccc12]

Preferred matrix materials for phosphorescent emitters are aromatic ketones, aromatic phosphine oxides or aromatic sulfoxides or sulfones, triarylamines, carbazole derivatives, e.g. CBP (N,N-biscarbazolylbiphenyl), indolocarbazole derivatives, indenocarbazole derivatives, azacarbazole derivatives, bipolar matrix materials, silanes, azaboroles or boronic esters, triazine derivatives, zinc complexes, diazasilole or tetraazasilole derivatives, diazaphosphole derivatives, bridged carbazole derivatives, triphenylene derivatives, or lactams.

In a preferred embodiment, the electronic device contains exactly one emitting layer.

In an alternative preferred embodiment, the electronic device contains multiple emitting layers, preferably 2, 3 or 4 emitting layers. This is especially preferable for white-emitting electronic devices.

More preferably, the emitting layers in this case have several emission maxima between 380 nm and 750 nm overall, such that the electronic device emits white light, in other words, various emitting compounds which can fluoresce or phosphoresce and which emit blue, green, yellow, orange or red light are used in the emitting layers. Especially preferred are three-layer systems, i.e. systems having three emitting layers, wherein one of the three layers in each case shows blue emission, one of the three layers in each case shows green emission, and one of the three layers in each case shows orange or red emission. For the production of white light, rather than a plurality of colour-emitting emitter compounds, it is also possible to use an individual emitter compound which emits over a broad wavelength range.

In a preferred embodiment of the invention, the electronic device comprises two or three, preferably three, identical or different layer sequences stacked one on top of another, where each of the layer sequences comprises the following layers: hole injection layer, hole-transporting layer, electron blocker layer, emitting layer, and electron transport layer, and where at least one, preferably all, of the layer sequences contain(s) the following layers:

an emitting layer disposed between anode and cathode, a first hole-transporting layer disposed between anode and emitting layer and containing two different compounds conforming to identical or different formulae selected from formulae (I) and (II), and a second hole-transporting layer disposed between the first hole-transporting layer and the emitting layer.

A double layer composed of adjoining n-CGL and p-CGL is preferably arranged between the layer sequences in each case, where the n-CGL is disposed on the anode side and the p-CGL correspondingly on the cathode side. CGL here stands for charge generation layer. Materials for use in such layers are known to the person skilled in the art. Preference is given to using a p-doped amine in the p-CGL, more preferably a material selected from the preferred structure classes of hole transport materials that are mentioned below.

The first hole-transporting layer preferably has a layer thickness of 20 nm to 300 nm, more preferably of 30 nm to 250 nm. It is further preferable that the first hole-transporting layer has a layer thickness of not more than 250 nm.

Preferably, the first hole-transporting layer contains exactly 2, 3 or 4, preferably exactly 2 or 3, most preferably exactly 2, different compounds conforming to identical or different formulae selected from formulae (I) and (II).

Preferably, the first hole-transporting layer consists of compounds conforming to identical or different formulae selected from formulae (I) and (II). "Consist of" is understood here to mean that no further compounds are present in the layer, not counting minor impurities as typically occur in the production process for OLEDs as further compounds in the layer.

In an alternative preferred embodiment, in addition to the compounds conforming to identical or different formulae selected from formulae (I) and (II), it contains a p-dopant.

p-Dopants used according to the present invention are preferably those organic electron acceptor compounds capable of oxidizing one or more of the other compounds in the mixture.

Particularly preferred p-dopants are quinodimethane compounds, azaindenofluorenediones, azaphenalenes, azatriphenylenes, $I_2$, metal halides, preferably transition metal halides, metal oxides, preferably metal oxides containing at least one transition metal or a metal of main group 3, and transition metal complexes, preferably complexes of Cu, Co, Ni, Pd and Pt with ligands containing at least one oxygen atom as bonding site. Preference is further given to transition metal oxides as dopants, preferably oxides of rhenium, molybdenum and tungsten, more preferably $Re_2O_7$, $MoO_3$, $WO_3$ and $ReO_3$. Still further preference is given to complexes of bismuth in the (III) oxidation state, more particularly bismuth(III) complexes with electron-deficient ligands, more particularly carboxylate ligands.

The p-dopants are preferably in substantially homogeneous distribution in the p-doped layer. This can be achieved, for example, by co-evaporation of the p-dopant and the hole transport material matrix. The p-dopant is preferably present in a proportion of 1% to 10% in the p-doped layer.

Preferred p-dopants are especially the following compounds:

(D-1)

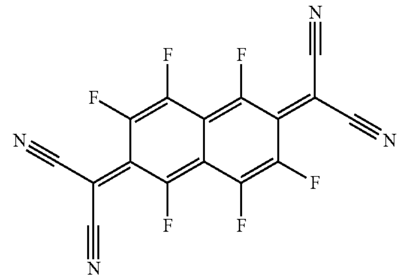

(D-2)

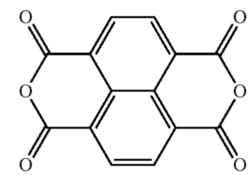

(D-3)

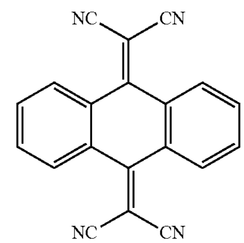

(D-4)

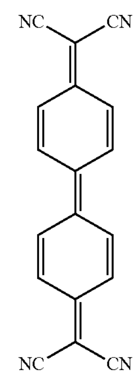

(D-5)

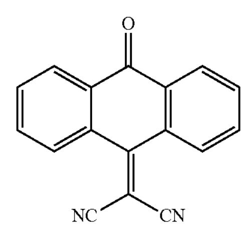

(D-6)

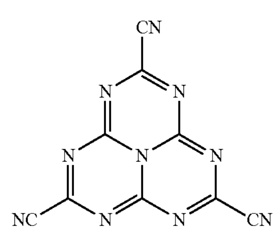

-continued (D-7)

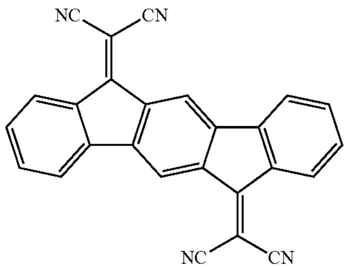

(D-8)

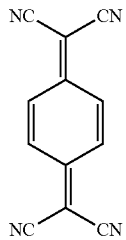

(D-9)

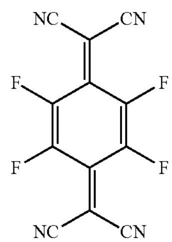

(D-10)

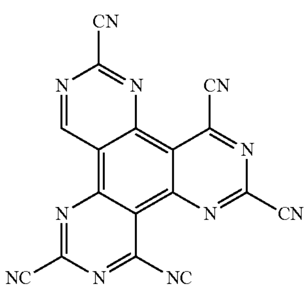

(D-11)

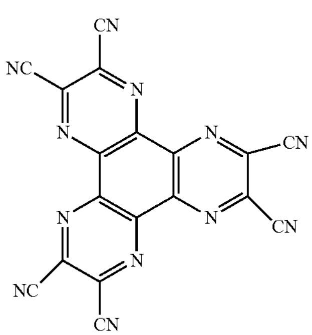

-continued (D-12)

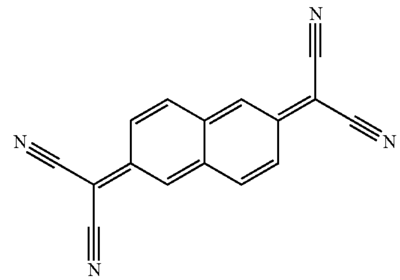

(D-13)

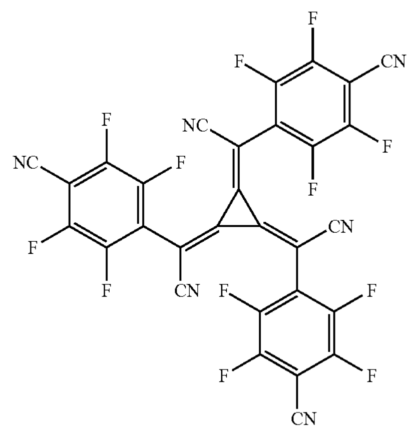

In a preferred embodiment of the invention, the first hole-transporting layer contains two different compounds that conform to a formula (I).

The two different compounds conforming to identical or different formulae selected from formulae (I) and (II) are preferably each present in the first hole-transporting layer in a proportion of at least 5%. They are more preferably present in a proportion of at least 10%. It is preferable that one of the compounds is present in a higher proportion than the other compound, more preferably in a proportion two to five times as high as the proportion of the other compound. This is the case especially when the first hole-transporting layer contains exactly two compounds conforming to identical or different formulae selected from formulae (I) and (II). Preferably, the proportion in the layer is 15% to 35% for one of the compounds, and the proportion in the layer is 65% to 85% for the other of the two compounds.

Among the formulae (I) and (II), preference is given to formula (I).

Formulae (I) and/or (II) are subject to one or more, preferably all, preferences selected from the following preferences:

In a preferred embodiment, the compounds have a single amino group. An amino group is understood to mean a group having a nitrogen atom having three binding partners. This is preferably understood to mean a group in which three groups selected from aromatic and heteroaromatic groups bind to a nitrogen atom.

In an alternative preferred embodiment, the compounds have exactly two amino groups.

Z is preferably $CR^1$, where Z is C when a

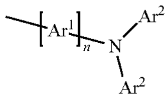

group is bonded thereto,

X is preferably a single bond;

$Ar^1$ is preferably the same or different at each instance and is selected from divalent groups derived from benzene, biphenyl, terphenyl, naphthalene, fluorene, indenofluorene, indenocarbazole, spirobifluorene, dibenzofuran, dibenzothiophene, and carbazole, each of which are substituted by one or more $R^2$ radicals. Most preferably, $Ar^1$ is the same or different at each instance and is a divalent group derived from benzene which is substituted in each case by one or more $R^2$ radicals. $Ar^1$ groups may be the same or different at each instance.

Index n is preferably 0, 1 or 2, more preferably 0 or 1, and most preferably 0.

Preferred $-(Ar^1)_n-$ groups in the case that n=1 conform to the following formulae:

$Ar^1$-1

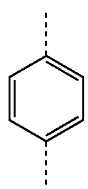

$Ar^1$-2

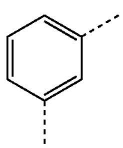

$Ar^1$-3

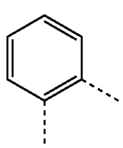

$Ar^1$-4

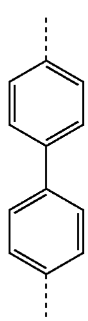

-continued $Ar^1$-5

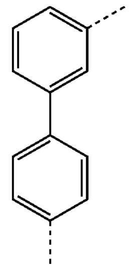

$Ar^1$-6

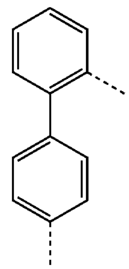

$Ar^1$-7

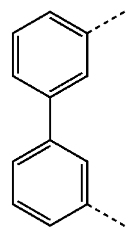

$Ar^1$-8

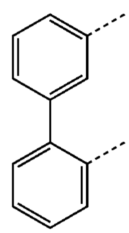

$Ar^1$-9

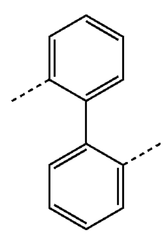

$Ar^1$-10

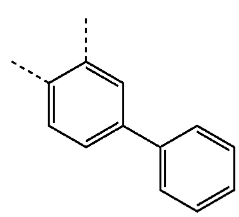

-continued
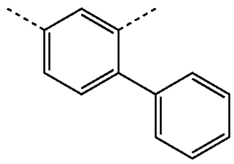
$Ar^{1}$-11
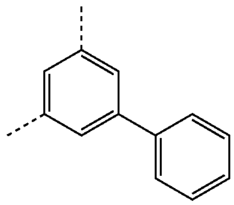
$Ar^{1}$-12
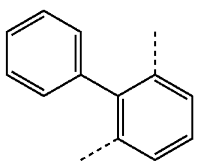
$Ar^{1}$-13
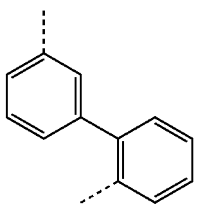
$Ar^{1}$-14
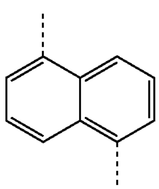
$Ar^{1}$-15
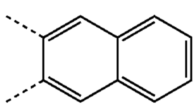
$Ar^{1}$-16
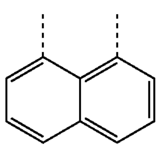
$Ar^{1}$-17
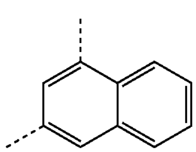
$Ar^{1}$-18
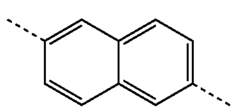
$Ar^{1}$-19
-continued
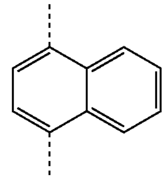
$Ar^{1}$-20
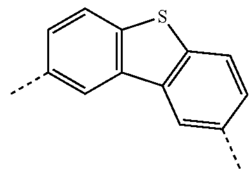
$Ar^{1}$-21
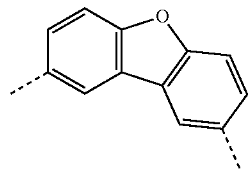
$Ar^{1}$-22
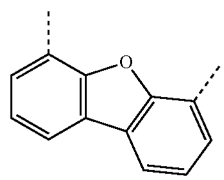
$Ar^{1}$-23
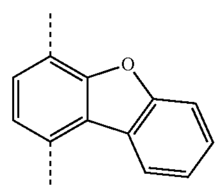
$Ar^{1}$-24
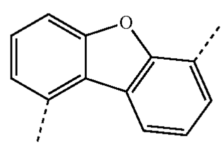
$Ar^{1}$-25
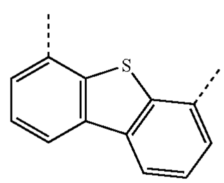
$Ar^{1}$-26
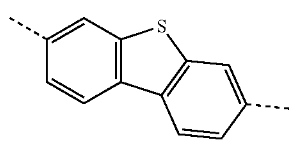
$Ar^{1}$-27
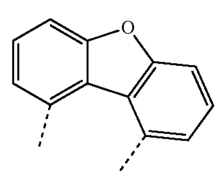
$Ar^{1}$-28

-continued
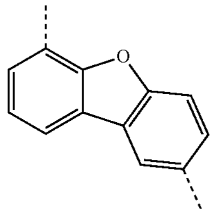
Ar$^{1}$-29
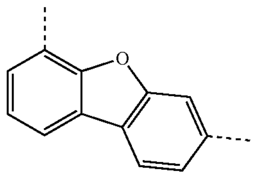
Ar$^{1}$-30
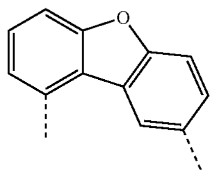
Ar$^{1}$-31
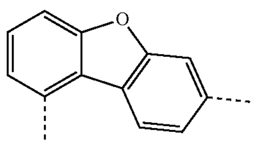
Ar$^{1}$-32
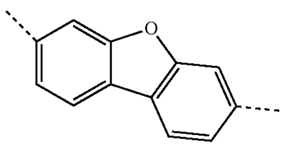
Ar$^{1}$-33
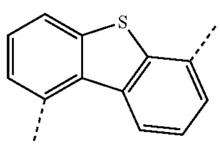
Ar$^{1}$-34
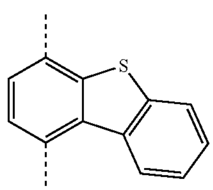
Ar$^{1}$-35
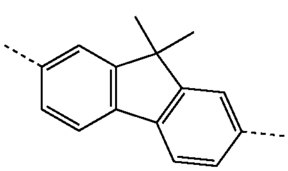
Ar$^{1}$-36
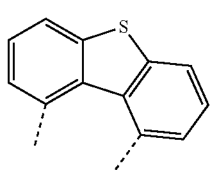
Ar$^{1}$-37
-continued
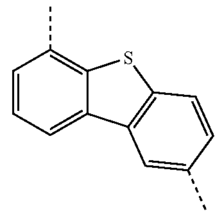
Ar$^{1}$-38
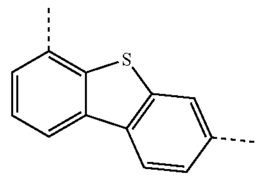
Ar$^{1}$-39
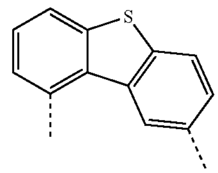
Ar$^{1}$-40
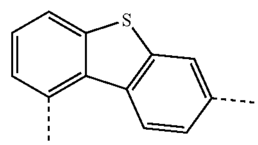
Ar$^{1}$-41
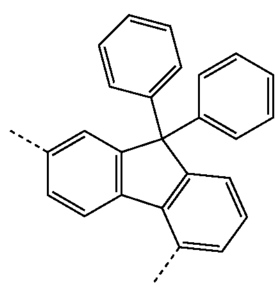
Ar$^{1}$-42
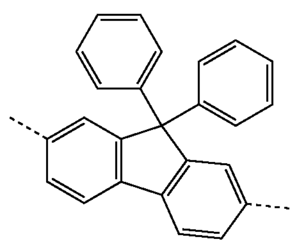
Ar$^{1}$-43
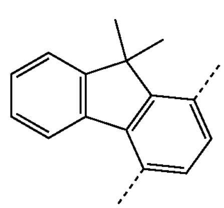
Ar$^{1}$-44

-continued
Ar$^1$-45
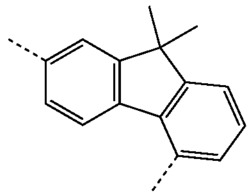
Ar$^1$-46
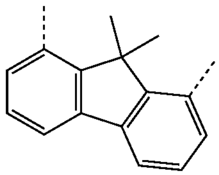
Ar$^1$-47
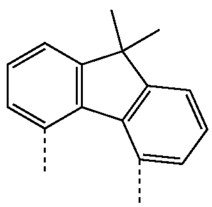
Ar$^1$-48
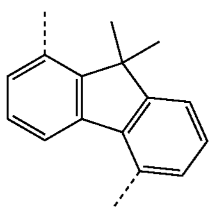
Ar$^1$-49
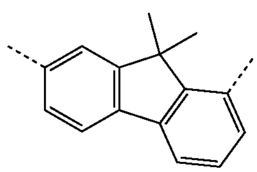
Ar$^1$-50
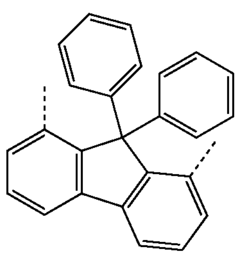
Ar$^1$-51
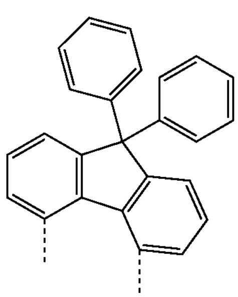
-continued
Ar$^1$-52
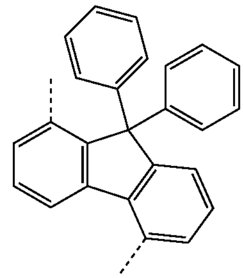
Ar$^1$-53
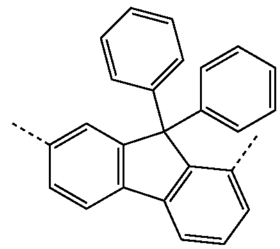
Ar$^1$-54
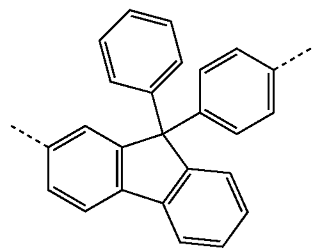
Ar$^1$-55
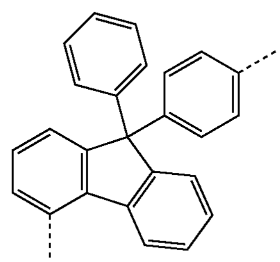
Ar$^1$-56
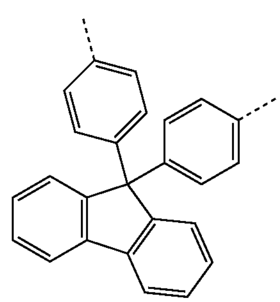

-continued
Ar$^{1}$-57
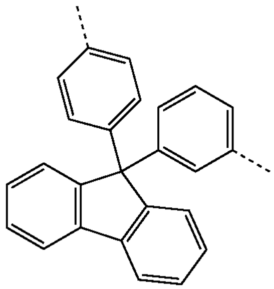
Ar$^{1}$-58
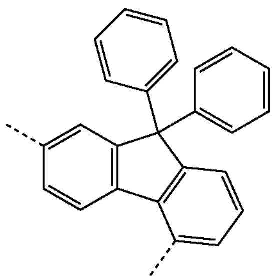
Ar$^{1}$-59
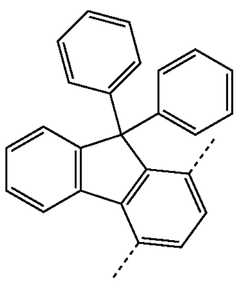
Ar$^{1}$-60
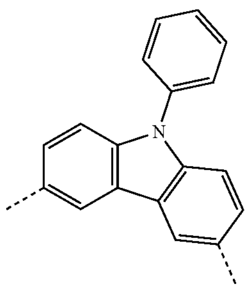
Ar$^{1}$-61
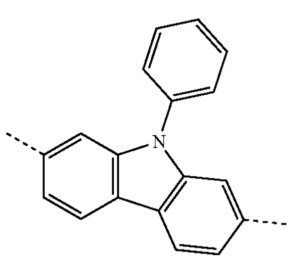
-continued
Ar$^{1}$-62
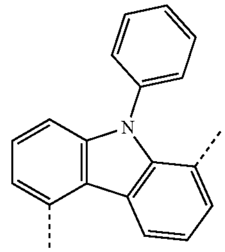
Ar$^{1}$-63
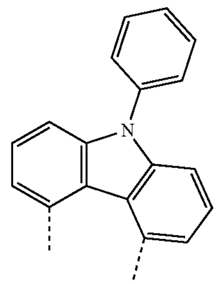
Ar$^{1}$-64
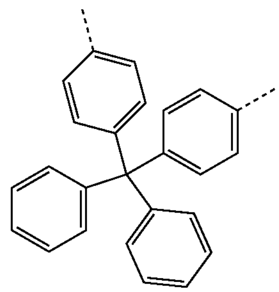
Ar$^{1}$-65
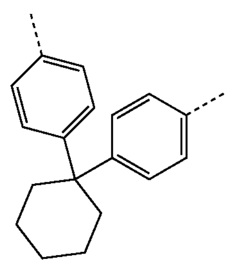
Ar$^{1}$-66
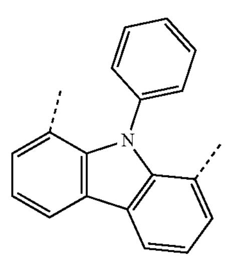

-continued
Ar1-67
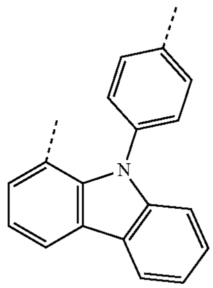
Ar1-68
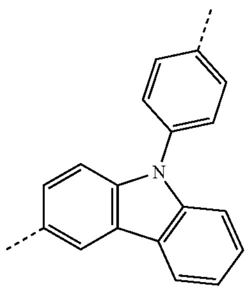
Ar1-69
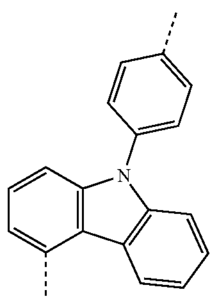
Ar1-70
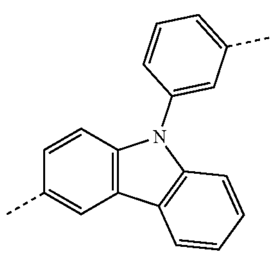
Ar1-71
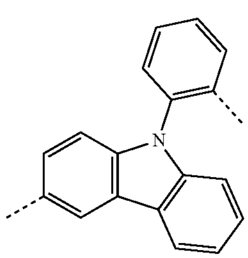
-continued
Ar1-72
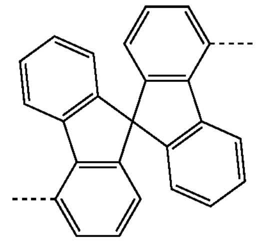
Ar1-73
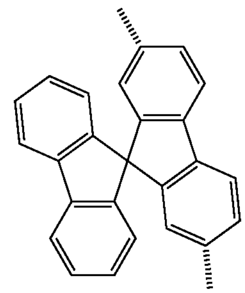
Ar1-74
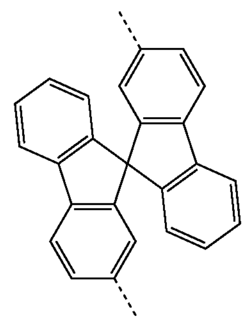
Ar1-75
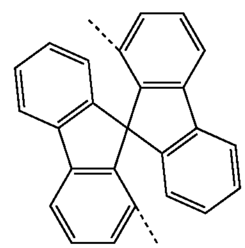
Ar1-76
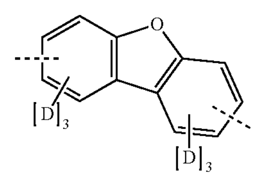
Ar1-77
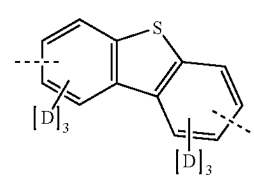

-continued

Ar[1]-78

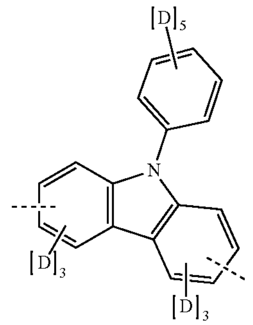

Ar[1]-79

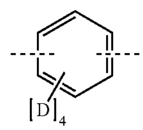

Ar[1]-80

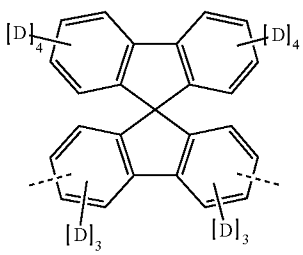

Ar[1]-81

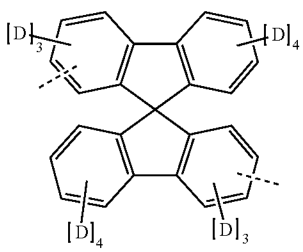

Ar[1]-82

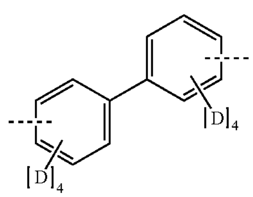

where the dotted lines represent the bonds to the rest of the formula, and where the groups at the positions shown as unsubstituted are each substituted by $R^2$ radicals, where the $R^2$ radicals in these positions are preferably H.

$Ar^2$ groups are preferably the same or different at each instance and are selected from monovalent groups derived from benzene, biphenyl, terphenyl, quaterphenyl, naphthalene, fluorene, especially 9,9'-dimethylfluorene and 9,9'-diphenylfluorene, 9-silafluorene, especially 9,9'-dimethyl-9-silafluorene and 9,9'-diphenyl-9-silafluorene, benzofluorene, spirobifluorene, indenofluorene, indenocarbazole, dibenzofuran, dibenzothiophene, benzocarbazole, carbazole, benzofuran, benzothiophene, indole, quinoline, pyridine, pyrimidine, pyrazine, pyridazine and triazine, where the monovalent groups are each substituted by one or more $R^2$ radicals. Alternatively, the $Ar^2$ groups are the same or different at each instance and may preferably be selected from combinations of groups derived from benzene, biphenyl, terphenyl, quaterphenyl, naphthalene, fluorene, especially 9,9'-dimethylfluorene and 9,9'-diphenylfluorene, 9-silafluorene, especially 9,9'-dimethyl-9-silafluorene and 9,9'-diphenyl-9-silafluorene, benzofluorene, spirobifluorene, indenofluorene, indenocarbazole, dibenzofuran, dibenzothiophene, carbazole, benzofuran, benzothiophene, indole, quinoline, pyridine, pyrimidine, pyrazine, pyridazine and triazine, where the groups are each substituted by one or more $R^2$ radicals.

Particularly preferred $Ar^2$ groups are the same or different at each instance and are selected from phenyl, biphenyl, terphenyl, quaterphenyl, naphthyl, fluorenyl, especially 9,9'-dimethylfluorenyl and 9,9'-diphenylfluorenyl, benzofluorenyl, spirobifluorenyl, indenofluorenyl, indenocarbazolyl, dibenzofuranyl, dibenzothiophenyl, carbazolyl, benzofuranyl, benzothiophenyl, benzofused dibenzofuranyl, benzofused dibenzothiophenyl, naphthyl-substituted phenyl, fluorenyl-substituted phenyl, spirobifluorenyl-substituted phenyl, dibenzofuranyl-substituted phenyl, dibenzothiophenyl-substituted phenyl, carbazolyl-substituted phenyl, pyridyl-substituted phenyl, pyrimidyl-substituted phenyl, and triazinyl-substituted phenyl, where the groups mentioned are each substituted by one or more $R^2$ radicals.

Particularly preferred $Ar^2$ groups are the same or different and are selected from the following formulae:

Ar[2]-1

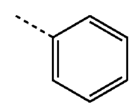

Ar[2]-2

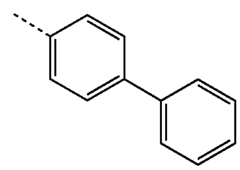

Ar[2]-3

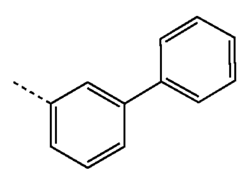

Ar[2]-4

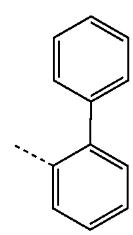

Ar[2]-5

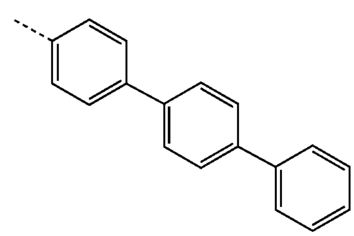

-continued
Ar$^2$-6
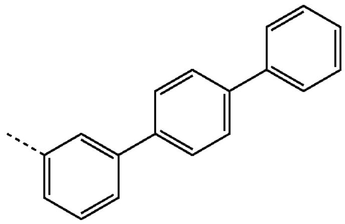
Ar$^2$-7
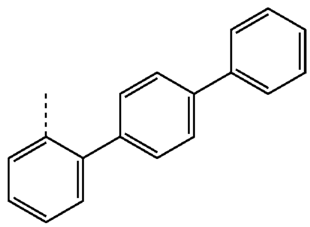
Ar$^2$-8
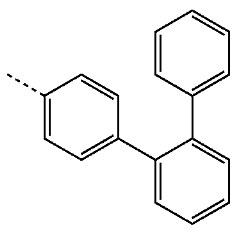
Ar$^2$-9
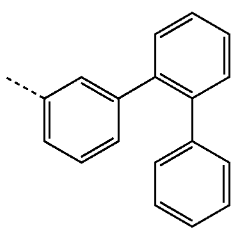
Ar$^2$-10
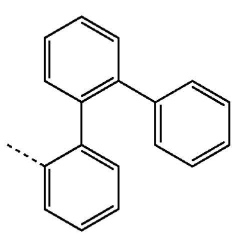
Ar$^2$-11
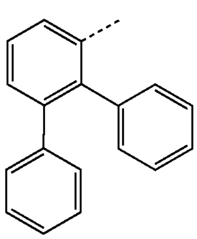
-continued
Ar$^2$-12
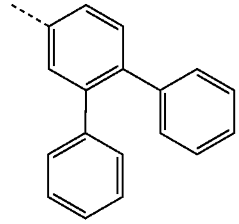
Ar$^2$-13
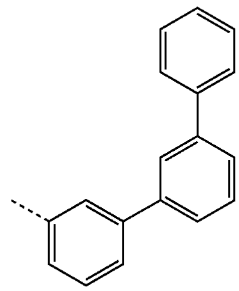
Ar$^2$-14
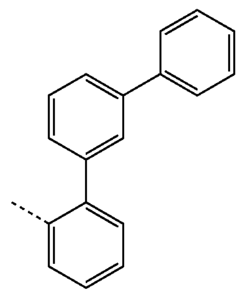
Ar$^2$-15
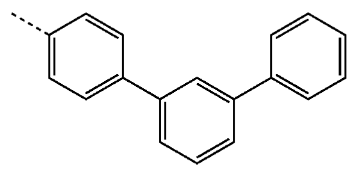
Ar$^2$-16
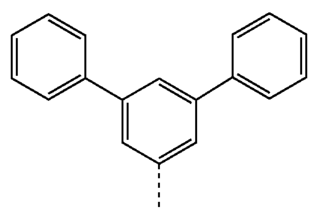
Ar$^2$-17
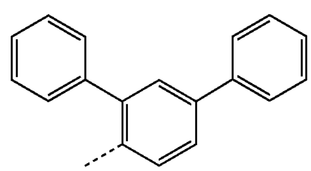
Ar$^2$-18
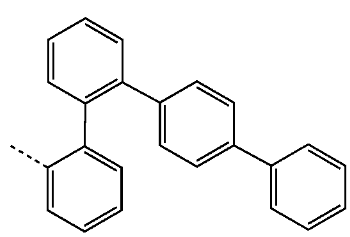

-continued
Ar2-19
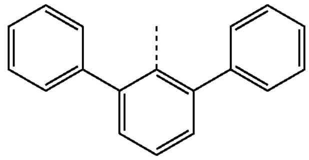
Ar2-20
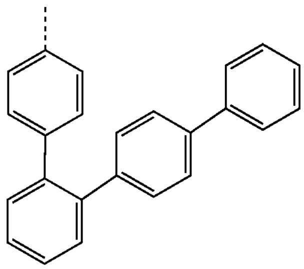
Ar2-21
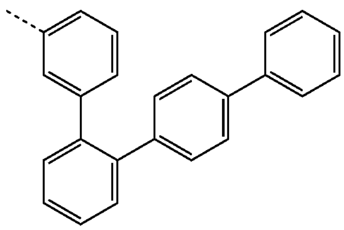
Ar2-22
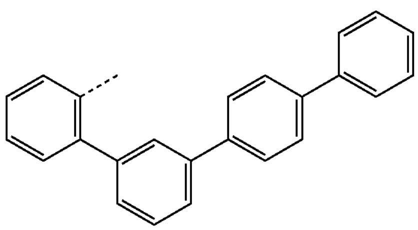
Ar2-23
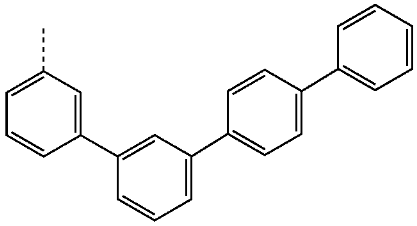
Ar2-24
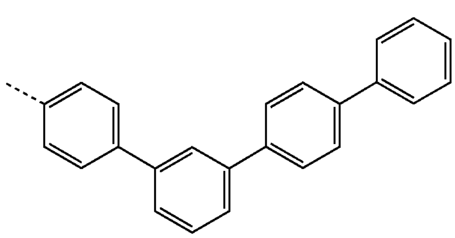
-continued
Ar2-25
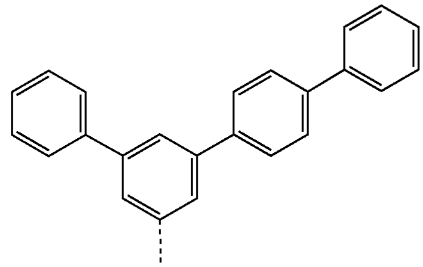
Ar2-26
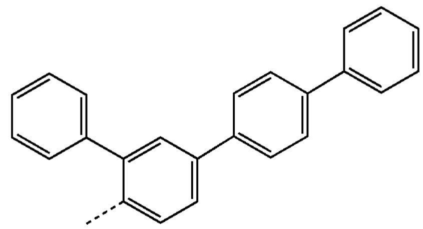
Ar2-27
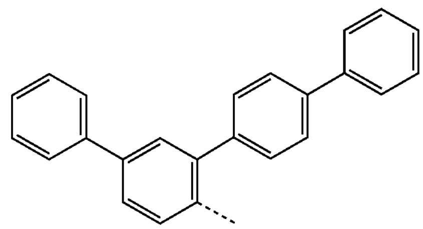
Ar2-28
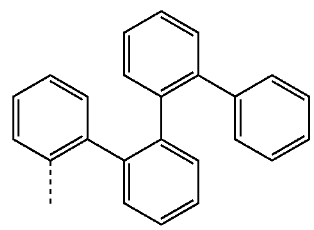
Ar2-29
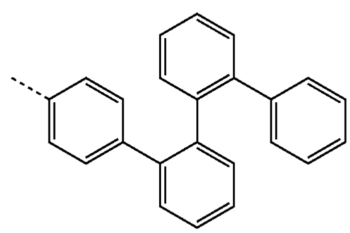
Ar2-30
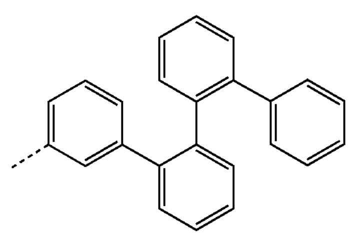

-continued
Ar$^2$-31
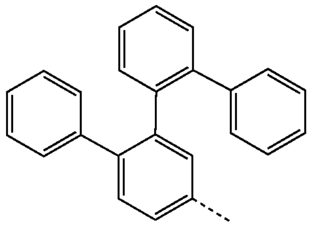
Ar$^2$-32
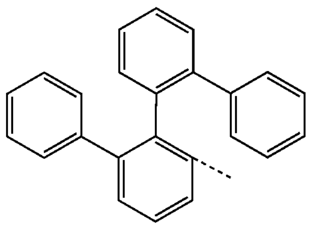
Ar$^2$-33
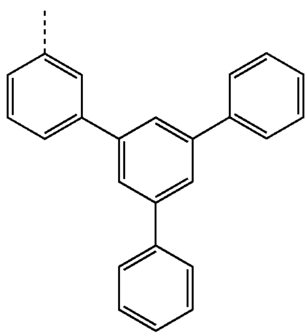
Ar$^2$-34
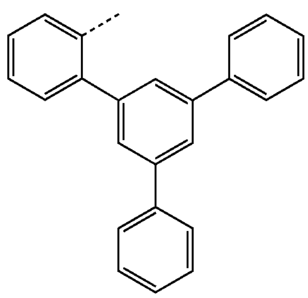
Ar$^2$-35
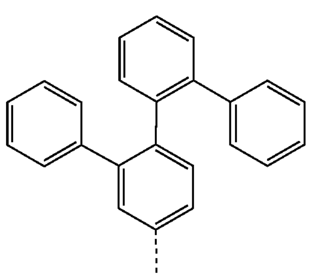
Ar$^2$-36
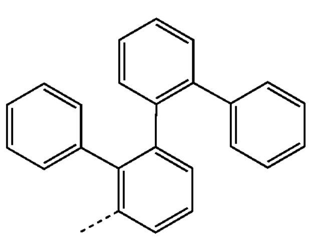
-continued
Ar$^2$-37
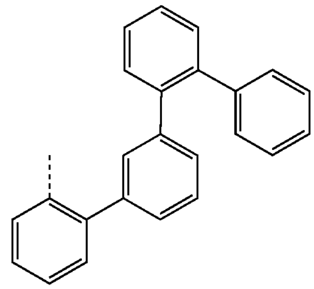
Ar$^2$-38
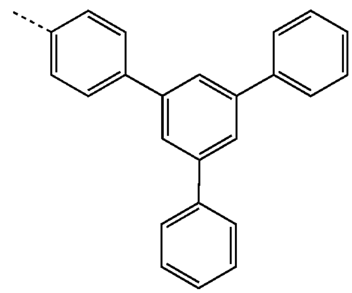
Ar$^2$-39
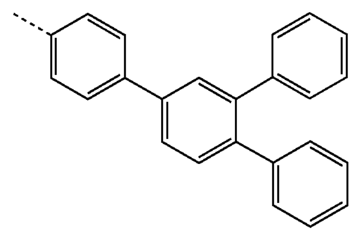
Ar$^2$-40
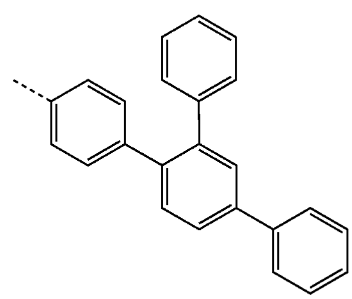
Ar$^2$-41
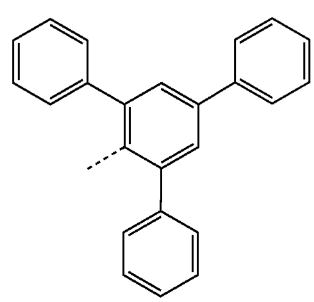

-continued
Ar²-42
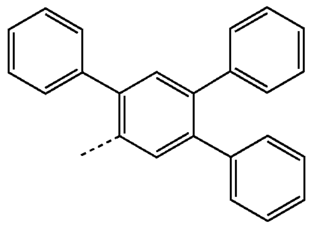
Ar²-43
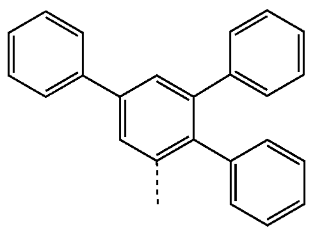
Ar²-44
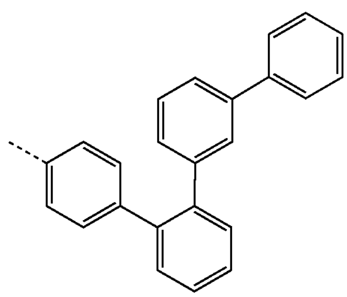
Ar²-45
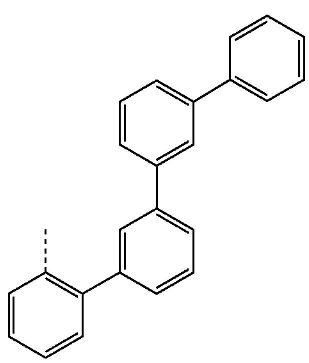
Ar²-46
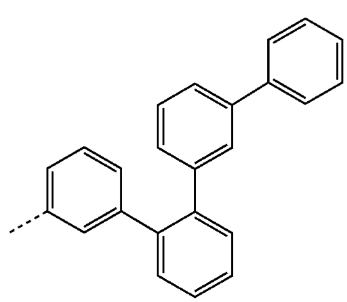
-continued
Ar²-47
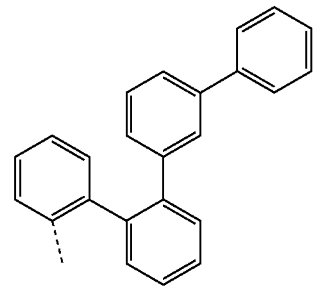
Ar²-48
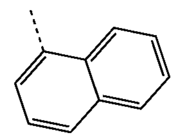
Ar²-49
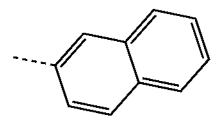
Ar²-50
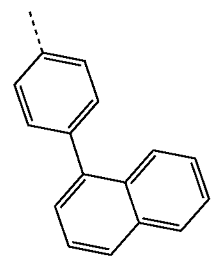
Ar²-51
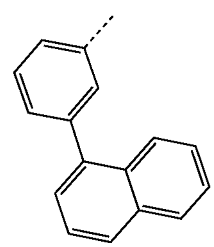
Ar²-52
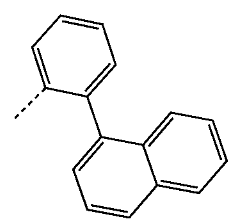
Ar²-53
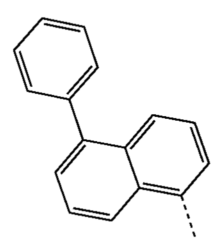

-continued
Ar2-54
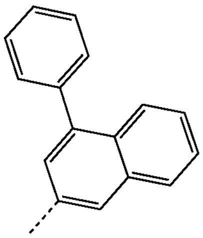
Ar2-55
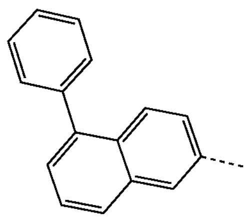
Ar2-56
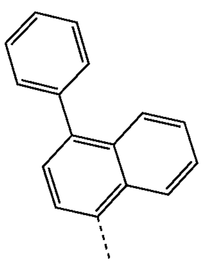
Ar2-57
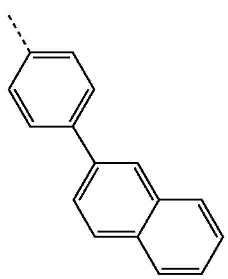
Ar2-58
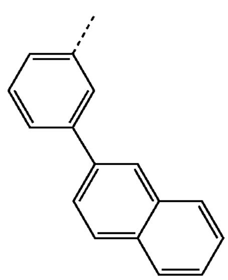
Ar2-59
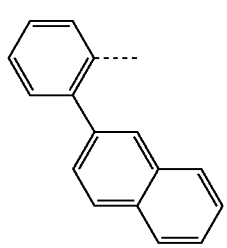
-continued
Ar2-60
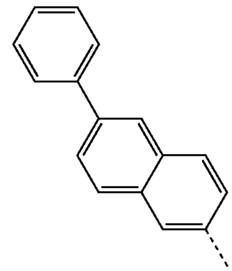
Ar2-61
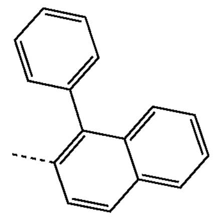
Ar2-62
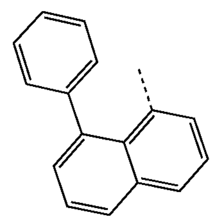
Ar2-63
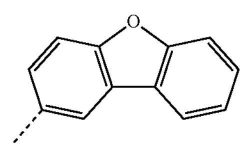
Ar2-64
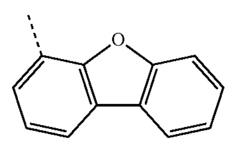
Ar2-65
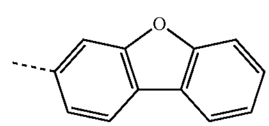
Ar2-66
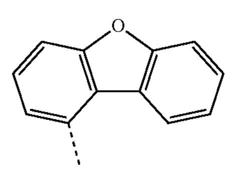
Ar2-67
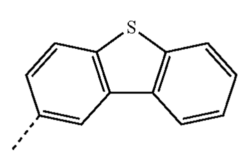
Ar2-68
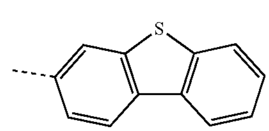

Ar$^2$-69
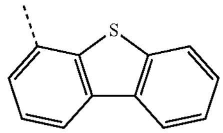
Ar$^2$-70
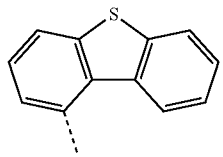
Ar$^2$-71
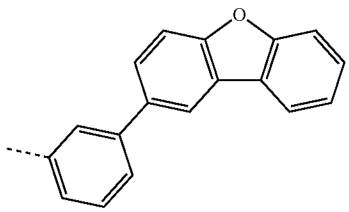
Ar$^2$-72
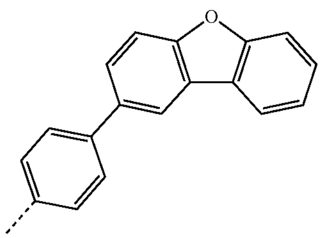
Ar$^2$-73
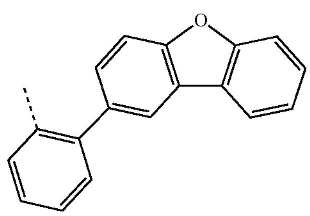
Ar$^2$-74
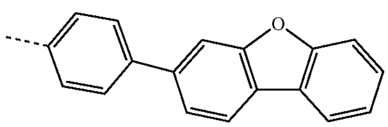
Ar$^2$-75
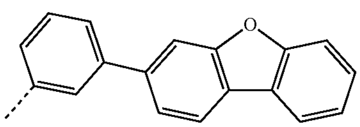
Ar$^2$-76
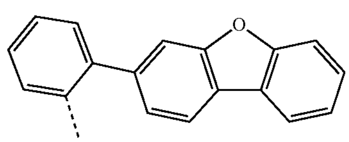
Ar$^2$-77
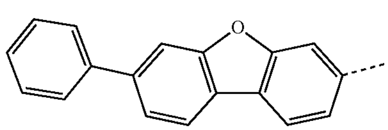
Ar$^2$-78
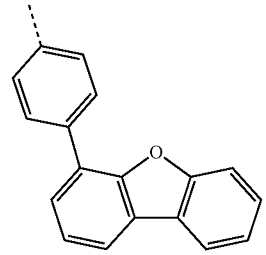
Ar$^2$-79
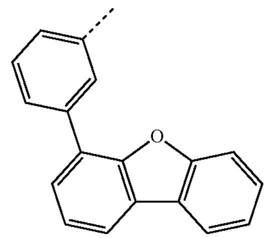
Ar$^2$-80
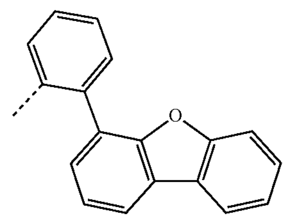
Ar$^2$-81
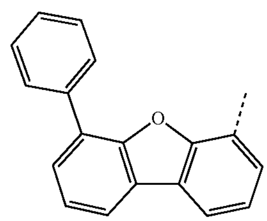
Ar$^2$-82
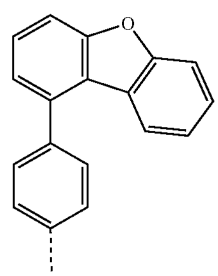
Ar$^2$-83
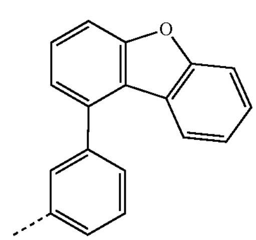

Ar2-84
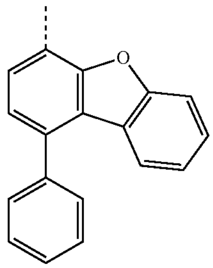
Ar2-85
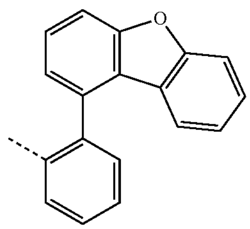
Ar2-86
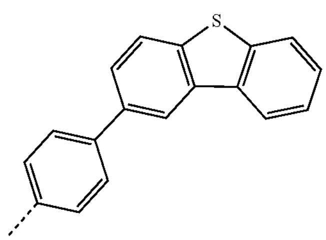
Ar2-87
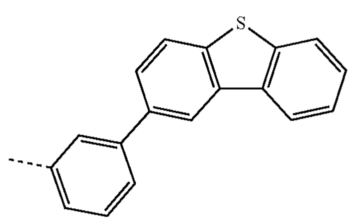
Ar2-88
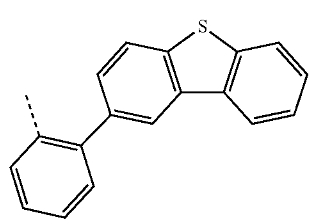
Ar2-89
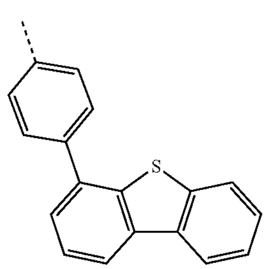
Ar2-90
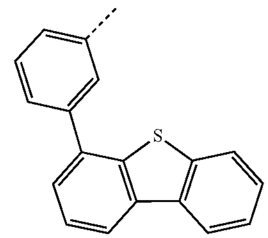
Ar2-91
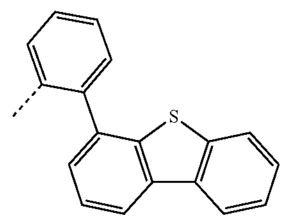
Ar2-92
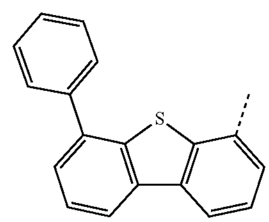
Ar2-93
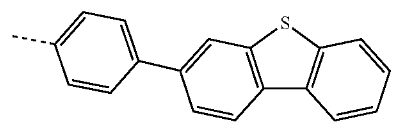
Ar2-94
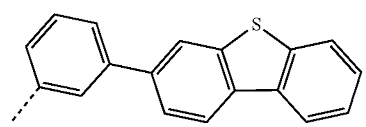
Ar2-95
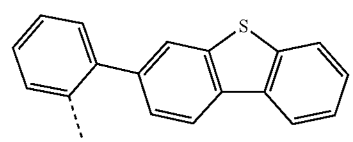
Ar2-96
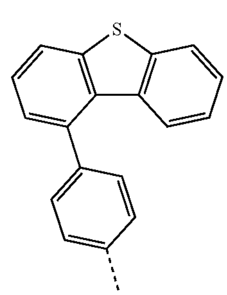

-continued
Ar2-97
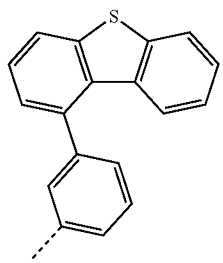
Ar2-98
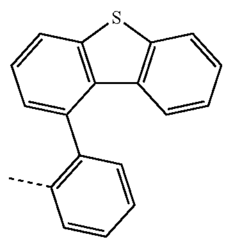
Ar2-99
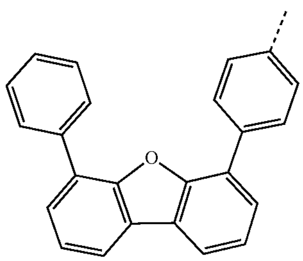
Ar2-100
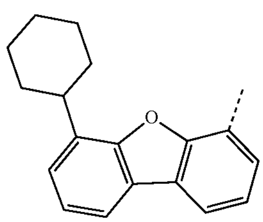
Ar2-101
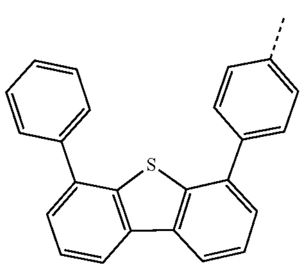
Ar2-102
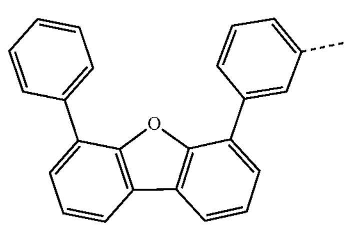
-continued
Ar2-103
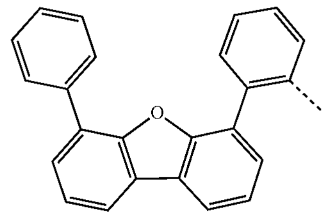
Ar2-104
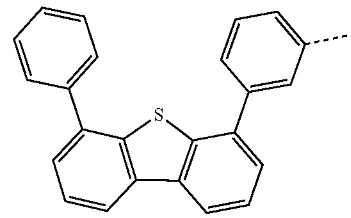
Ar2-105
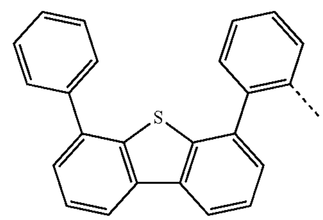
Ar2-106
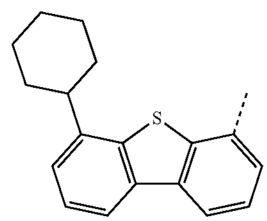
Ar2-107
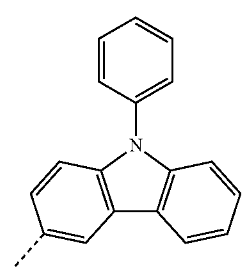
Ar2-108
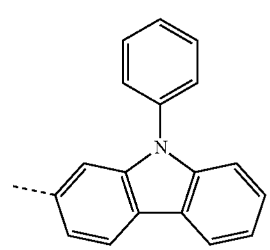

$Ar^2$-109
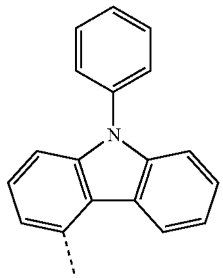
$Ar^2$-110
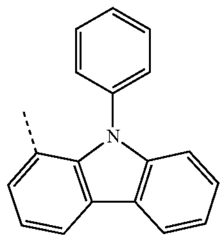
$Ar^2$-111
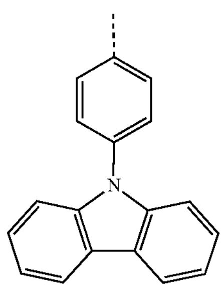
$Ar^2$-112
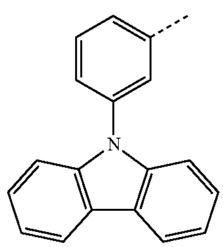
$Ar^2$-113
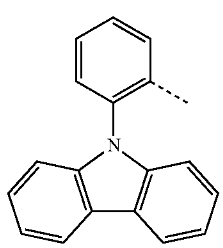
$Ar^2$-114
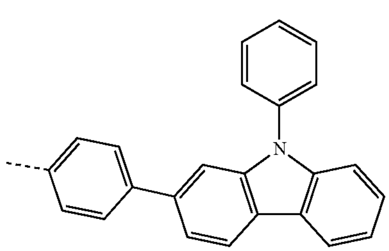
$Ar^2$-115
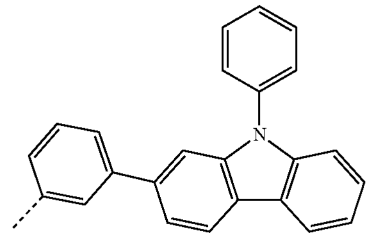
$Ar^2$-116
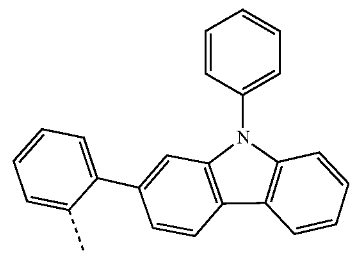
$Ar^2$-117
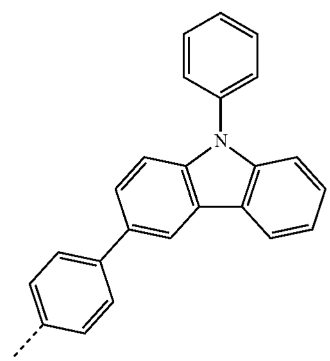
$Ar^2$-118
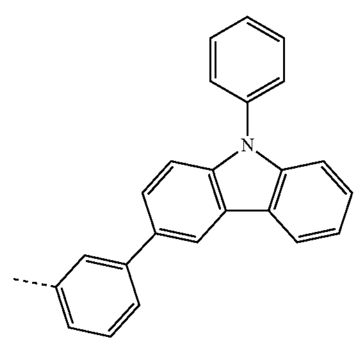
$Ar^2$-119
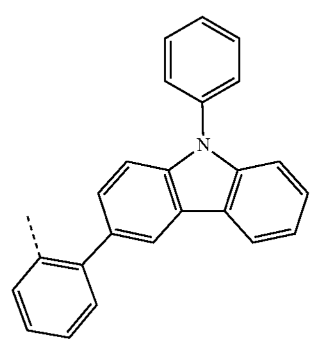

-continued
$Ar^2$-120
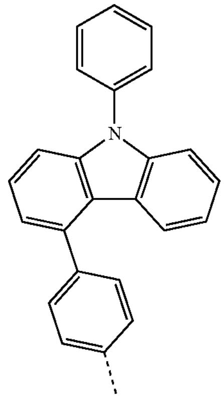
$Ar^2$-121
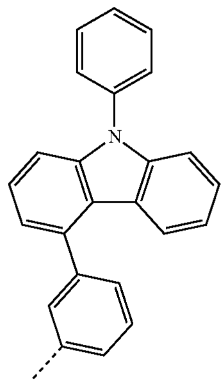
$Ar^2$-122
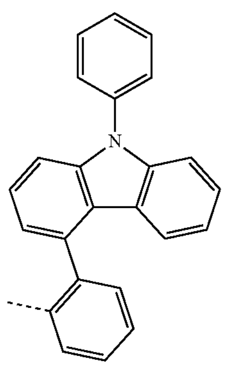
$Ar^2$-123
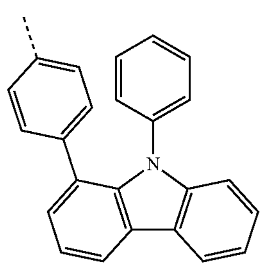
-continued
$Ar^2$-124
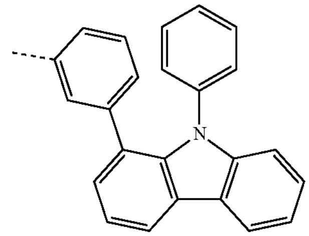
$Ar^2$-125
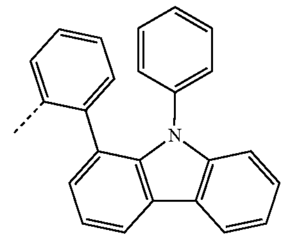
$Ar^2$-126
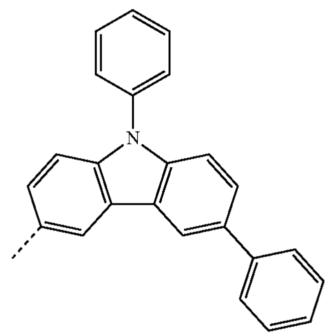
$Ar^2$-127
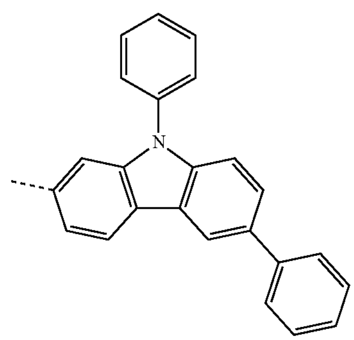
$Ar^2$-128
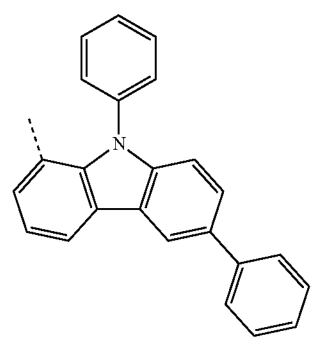

Ar[2]-129
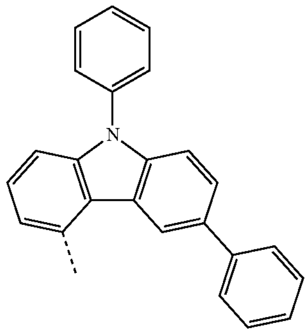
Ar[2]-130
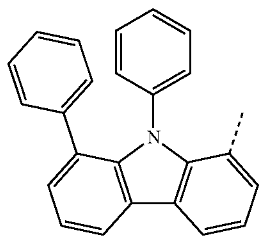
Ar[2]-131
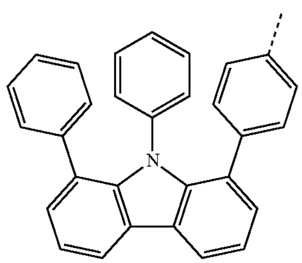
Ar[2]-132
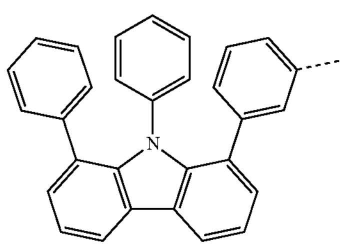
Ar[2]-133
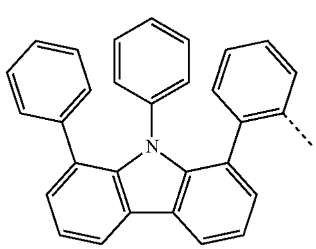
Ar[2]-134
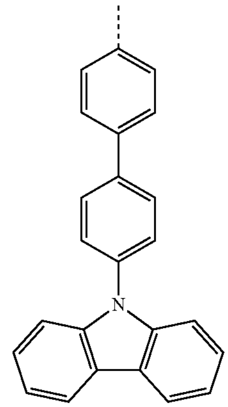
Ar[2]-135
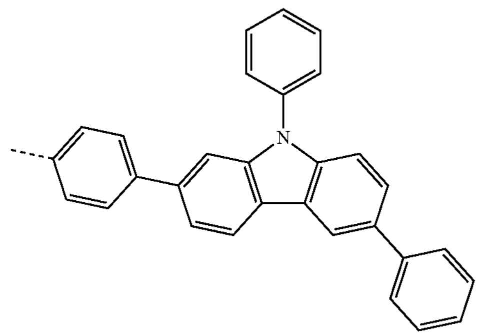
Ar[2]-136
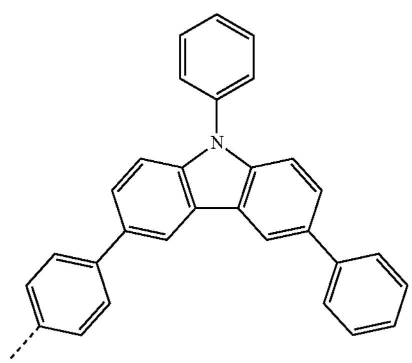
Ar[2]-137
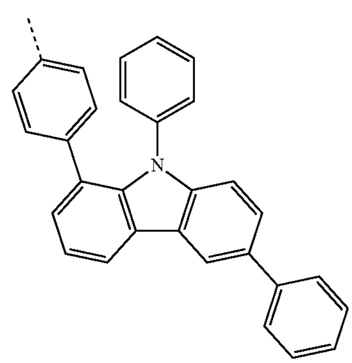

-continued
Ar$^2$-138
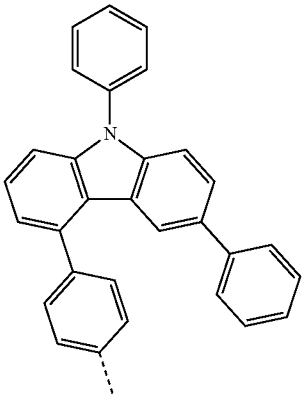
Ar$^2$-139
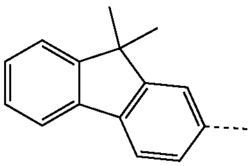
Ar$^2$-140
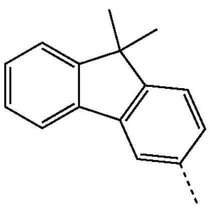
Ar$^2$-141
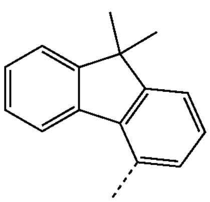
Ar$^2$-142
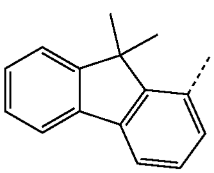
Ar$^2$-143
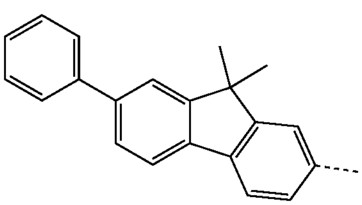
Ar$^2$-144
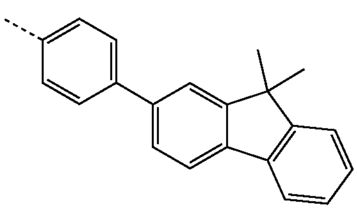
-continued
Ar$^2$-145
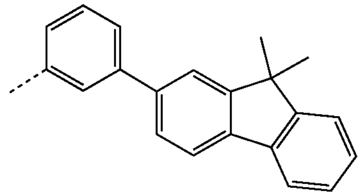
Ar$^2$-146
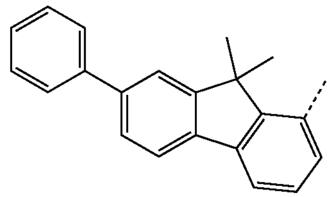
Ar$^2$-147
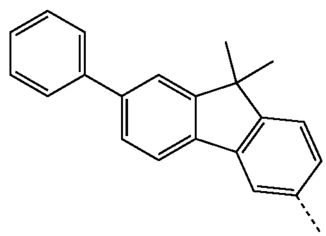
Ar$^2$-148
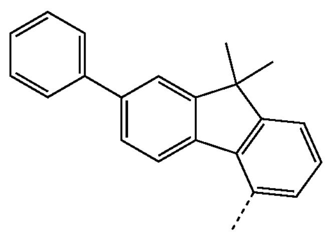
Ar$^2$-149
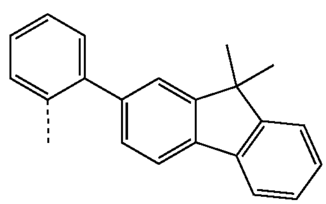
Ar$^2$-150
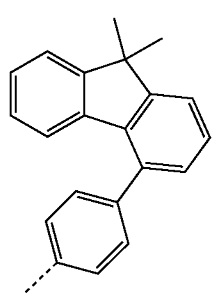

-continued
Ar$^2$-151
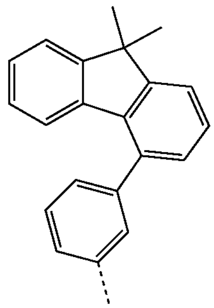
Ar$^2$-152
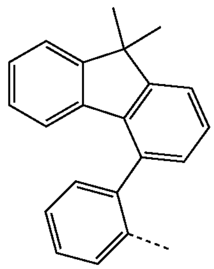
Ar$^2$-153
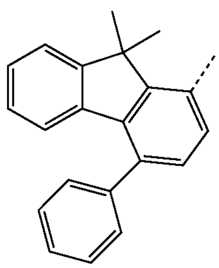
Ar$^2$-154
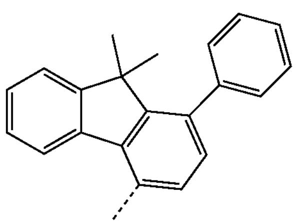
Ar$^2$-155
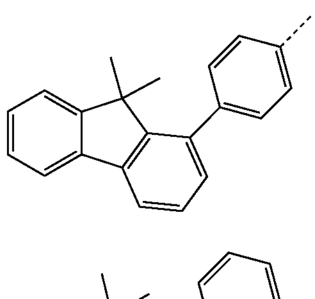
Ar$^2$-156
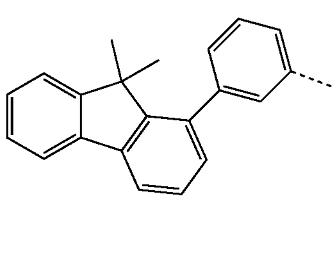
-continued
Ar$^2$-157
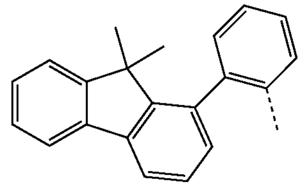
Ar$^2$-158
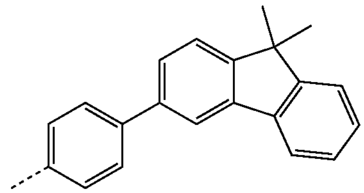
Ar$^2$-159
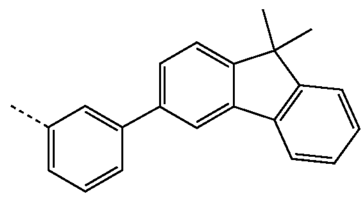
Ar$^2$-160
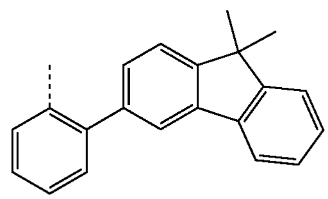
Ar$^2$-161
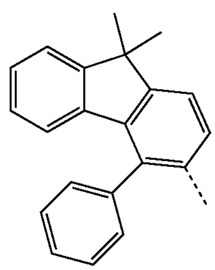
Ar$^2$-162
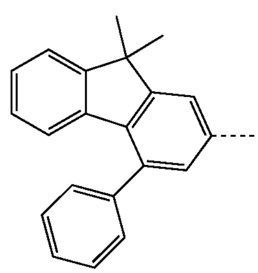
Ar$^2$-163
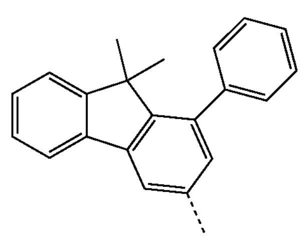

-continued
Ar2-164
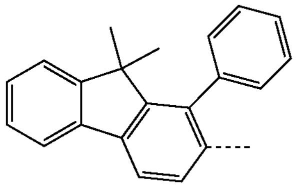
Ar2-165
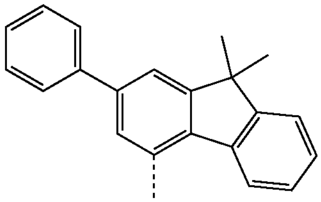
Ar2-166
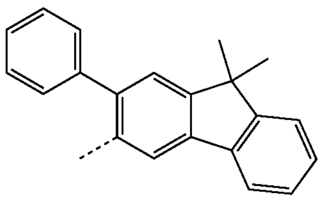
Ar2-167
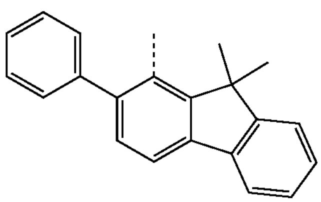
Ar2-168
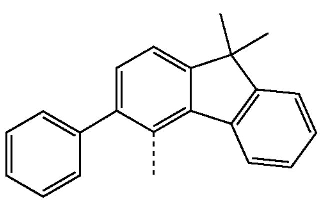
Ar2-169
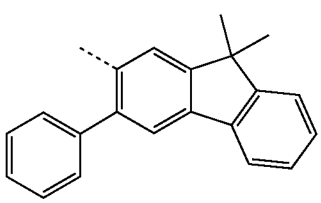
Ar2-170
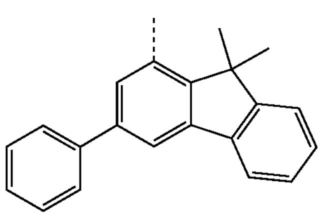
-continued
Ar2-171
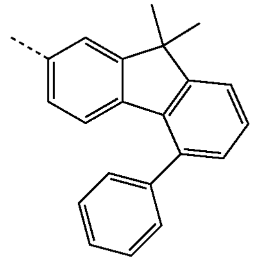
Ar2-172
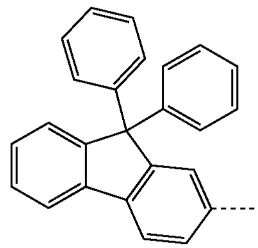
Ar2-173
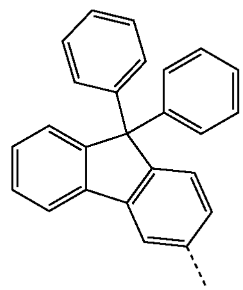
Ar2-174
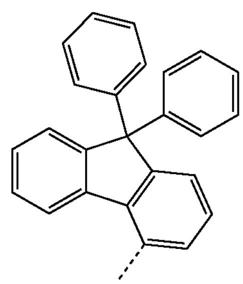
Ar2-175
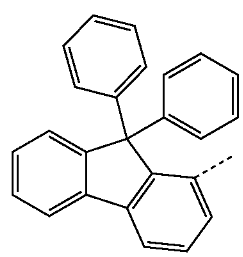
Ar2-176
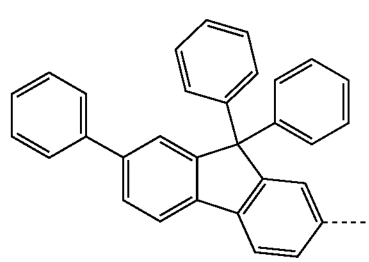

$Ar^2$-177
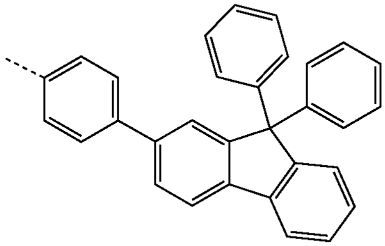
$Ar^2$-178
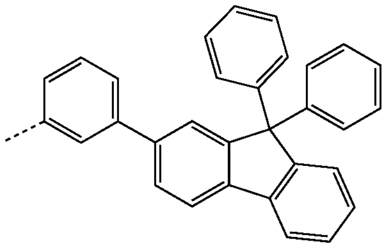
$Ar^2$-179
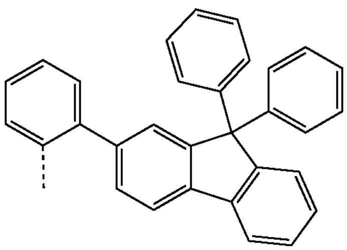
$Ar^2$-180
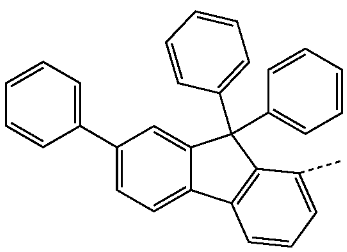
$Ar^2$-181
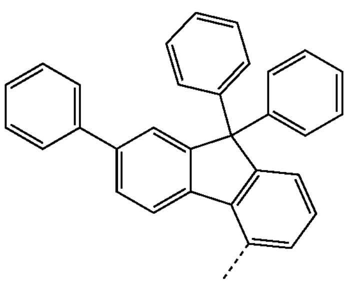
$Ar^2$-182
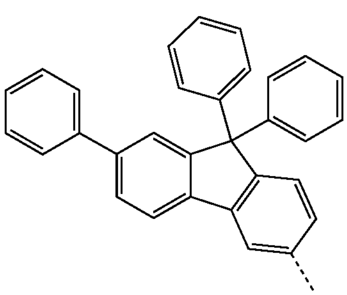
$Ar^2$-183
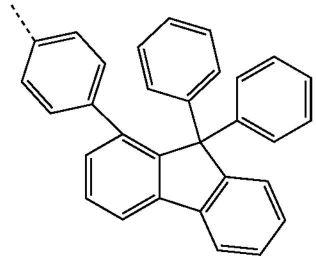
$Ar^2$-184
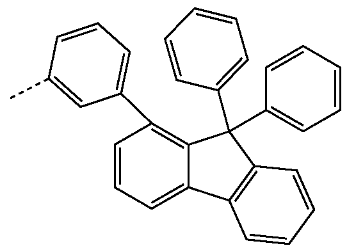
$Ar^2$-185
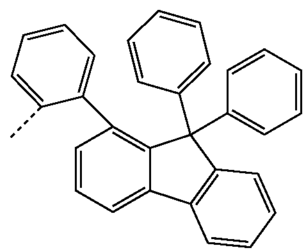
$Ar^2$-186
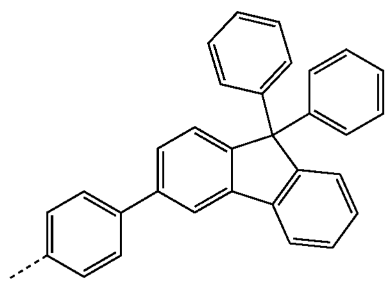
$Ar^2$-187
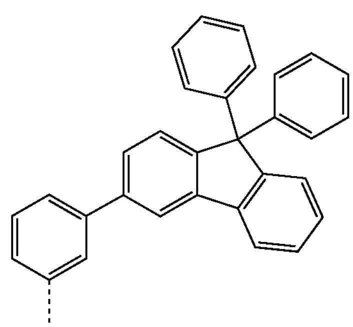

Ar2-188
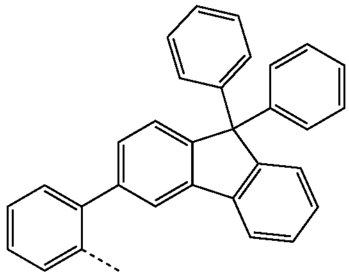
Ar2-189
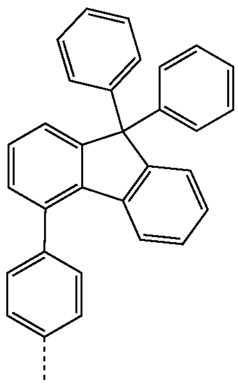
Ar2-190
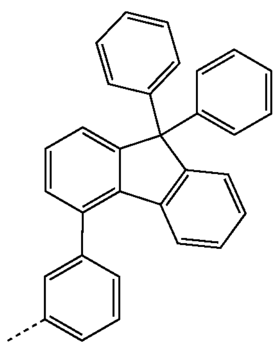
Ar2-191
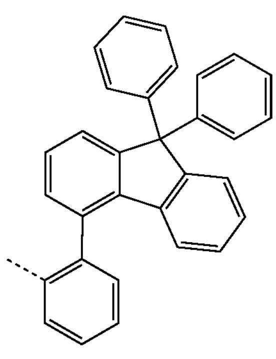
Ar2-192
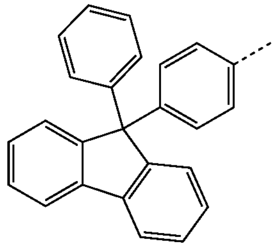
Ar2-193
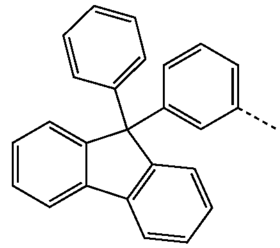
Ar2-194
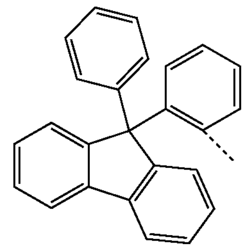
Ar2-195
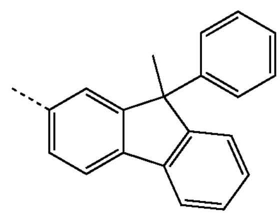
Ar2-196
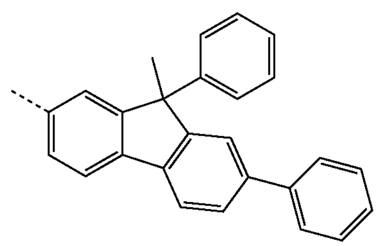
Ar2-197
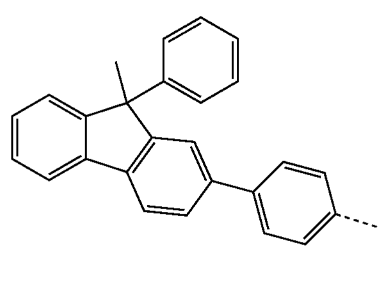
Ar2-198
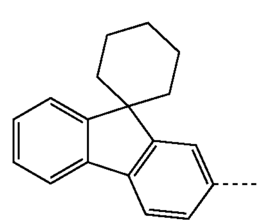

-continued
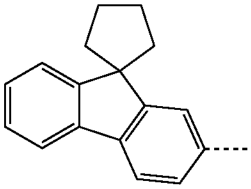
Ar$^2$-199
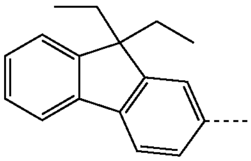
Ar$^2$-200
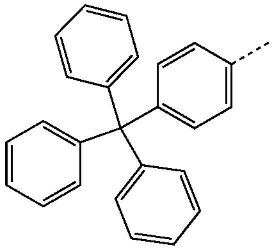
Ar$^2$-201
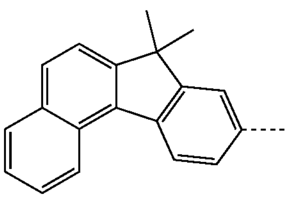
Ar$^2$-202
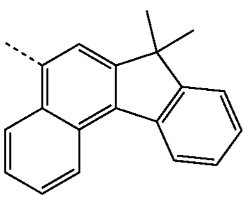
Ar$^2$-203
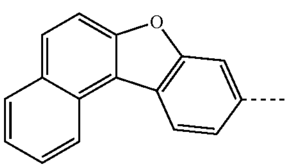
Ar$^2$-204
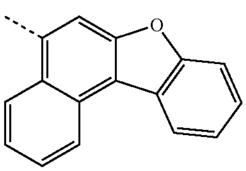
Ar$^2$-205
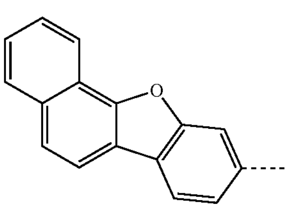
Ar$^2$-206
-continued
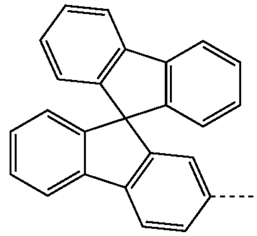
Ar$^2$-207
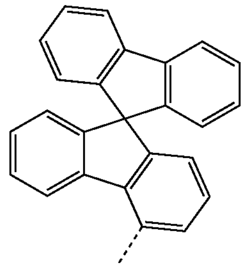
Ar$^2$-208
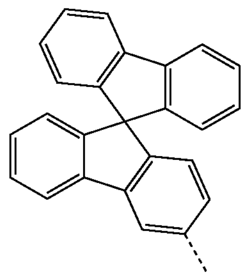
Ar$^2$-209
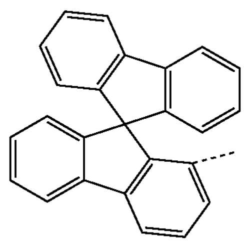
Ar$^2$-210
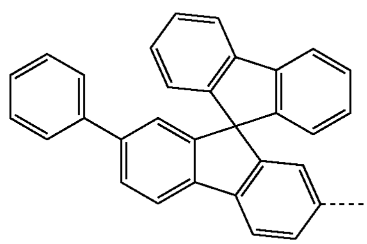
Ar$^2$-211
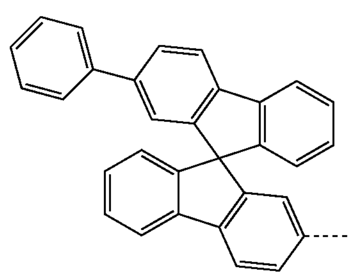
Ar$^2$-212

-continued
Ar²-213
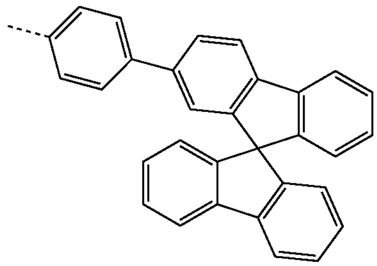
Ar²-214
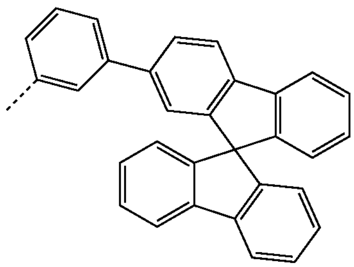
Ar²-215
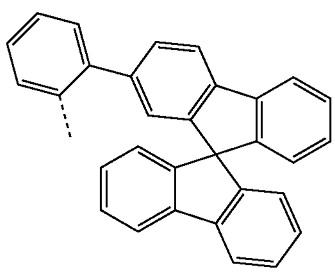
Ar²-216
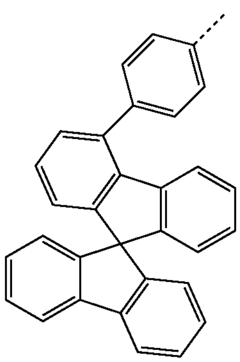
Ar²-217
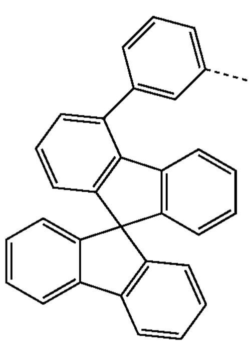
-continued
Ar²-218
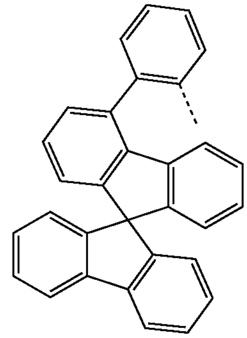
Ar²-219
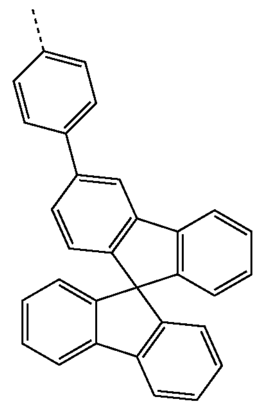
Ar²-220
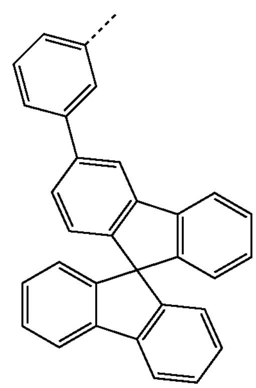
Ar²-221
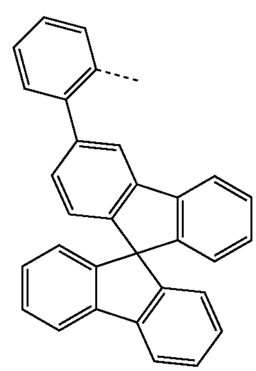

-continued
$Ar^2$-222
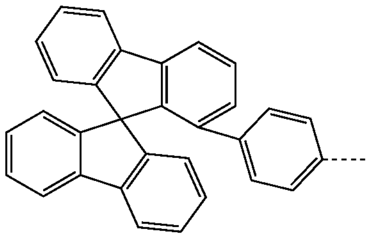
$Ar^2$-223
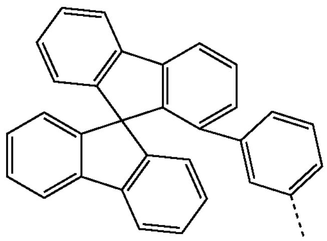
$Ar^2$-224
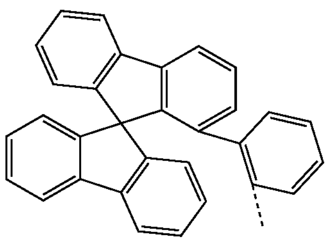
$Ar^2$-225
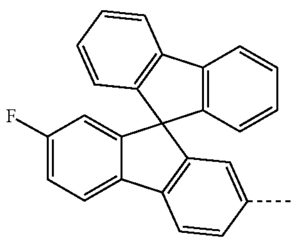
$Ar^2$-226
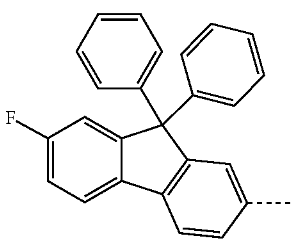
$Ar^2$-227
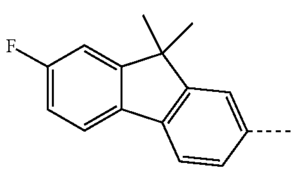
$Ar^2$-228
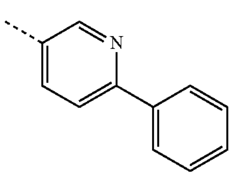
-continued
$Ar^2$-229
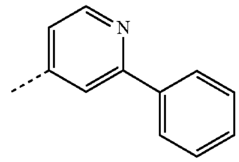
$Ar^2$-230
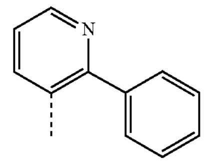
$Ar^2$-231
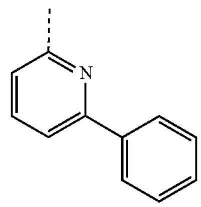
$Ar^2$-232
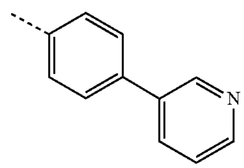
$Ar^2$-233
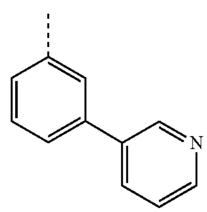
$Ar^2$-234
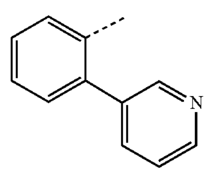
$Ar^2$-235
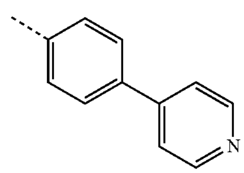
$Ar^2$-236
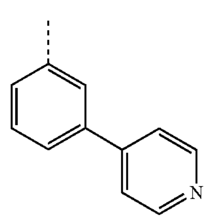

$Ar^2$-237
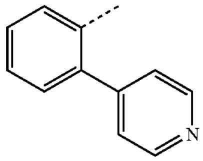
$Ar^2$-238
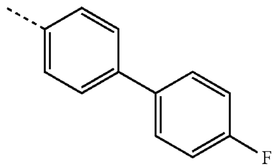
$Ar^2$-239
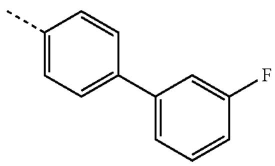
$Ar^2$-240
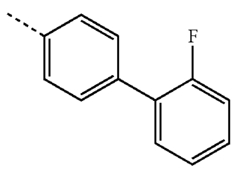
$Ar^2$-241
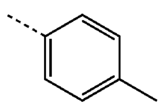
$Ar^2$-242
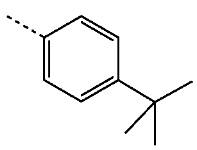
$Ar^2$-243
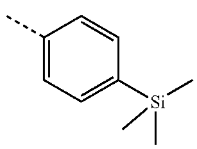
$Ar^2$-244
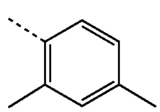
$Ar^2$-245
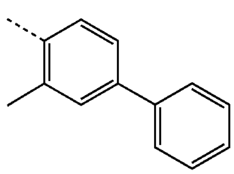
$Ar^2$-246
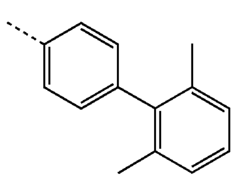
$Ar^2$-247
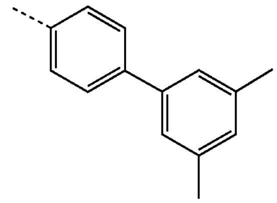
$Ar^2$-248
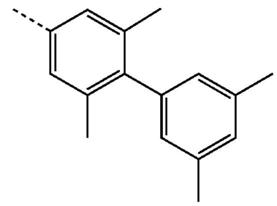
$Ar^2$-250
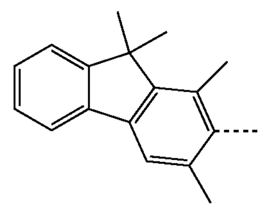
$Ar^2$-251
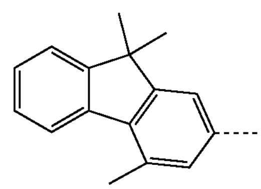
$Ar^2$-252
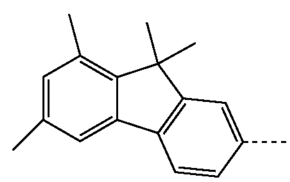
$Ar^2$-253
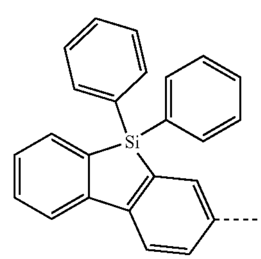
$Ar^2$-254
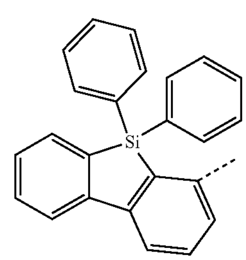

-continued
Ar$^2$-255
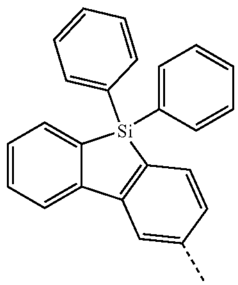
Ar$^2$-256
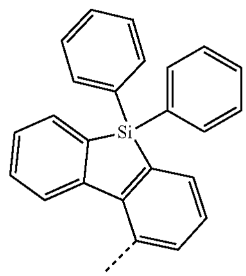
Ar$^2$-257
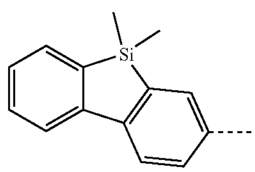
Ar$^2$-258
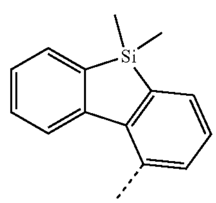
Ar$^2$-259
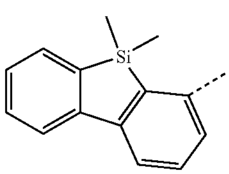
Ar$^2$-260
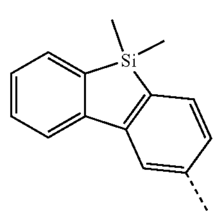
Ar$^2$-261
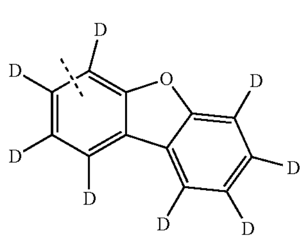
-continued
Ar$^2$-262
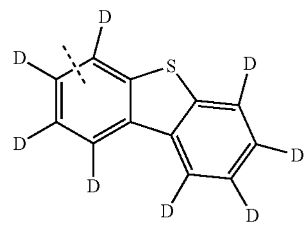
Ar$^2$-263
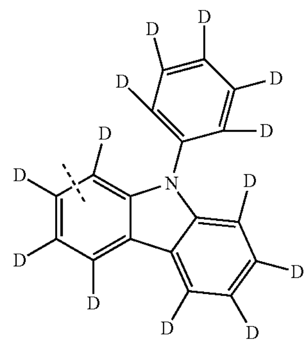
Ar$^2$-264
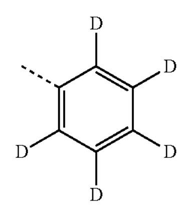
Ar$^2$-265
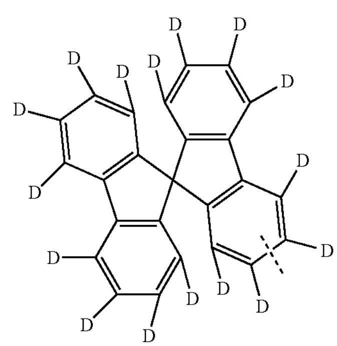
Ar$^2$-266
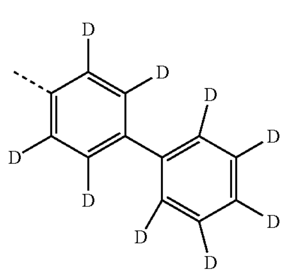

-continued

Ar²-267

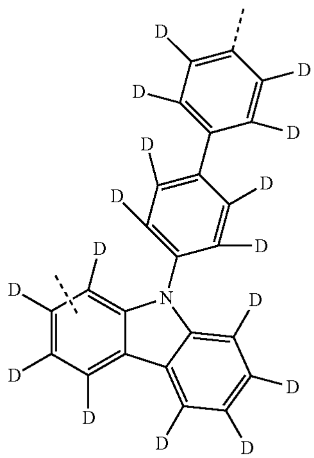

Ar²-268

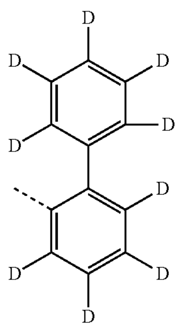

Ar²-269

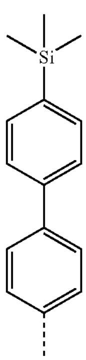

Ar²-270

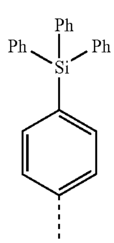

-continued

Ar²-271

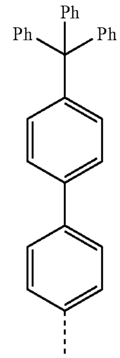

Ar²-272

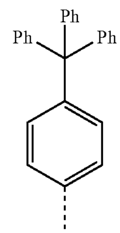

where the groups at the positions shown as unsubstituted are substituted by $R^2$ radicals, where $R^2$ in these positions is preferably H, and where the dotted bond is the bond to the amine nitrogen atom.

Preferably, $R^1$ and $R^2$ are the same or different at each instance and are selected from H, D, F, CN, $Si(R^3)_3$, $N(R^3)_2$, straight-chain alkyl or alkoxy groups having 1 to 20 carbon atoms, branched or cyclic alkyl or alkoxy groups having 3 to 20 carbon atoms, aromatic ring systems having 6 to 40 aromatic ring atoms and heteroaromatic ring systems having 5 to 40 aromatic ring atoms; where the alkyl and alkoxy groups mentioned, the aromatic ring systems mentioned and the heteroaromatic ring systems mentioned are each substituted by $R^3$ radicals; and where one or more $CH_2$ groups in the alkyl or alkoxy groups mentioned may be replaced by —C≡C—, $R^3C{=}CR^3$—, $Si(R^3)_2$, C═O, C═$NR^3$, —$NR^3$—, —O—, —S—, —C(═O)O— or —C(═O)$NR^3$—.

More preferably, $R^1$ is the same or different at each instance and is selected from H, D, F, CN, aromatic ring systems having 6 to 40 aromatic ring atoms, and heteroaromatic ring systems having 5 to 40 aromatic ring atoms; where the aromatic ring systems mentioned and the heteroaromatic ring systems mentioned are each substituted by $R^3$ radicals.

More preferably, $R^2$ is the same or different at each instance and is selected from H, D, F, CN, $Si(R^3)_4$, straight-chain alkyl groups having 1 to 10 carbon atoms, branched or cyclic alkyl groups having 3 to 20 carbon atoms, aromatic ring systems having 6 to 40 aromatic ring atoms and heteroaromatic ring systems having 5 to 40 aromatic ring atoms, where the alkyl groups mentioned, the aromatic ring systems mentioned and the heteroaromatic ring systems mentioned are each substituted by $R^3$ radicals.

It is particularly preferable that:

Z is $CR^1$, where Z is C when a

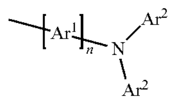

group is bonded thereto;

X is a single bond;

$Ar^1$ is the same or different at each instance and is a divalent group derived from benzene which is substituted in each case by one or more $R^2$ radicals;

index n is 0 or 1;

$Ar^2$ is the same or different at each instance and is selected from the abovementioned formulae $Ar^2$-1 to $Ar^2$-272;

$R^1$ is the same or different at each instance and is selected from H, D, F, CN, aromatic ring systems having 6 to 40 aromatic ring atoms, and heteroaromatic ring systems having 5 to 40 aromatic ring atoms; where the aromatic ring systems mentioned and the heteroaromatic ring systems mentioned are each substituted by $R^3$ radicals;

$R^2$ is the same or different at each instance and is selected from H, D, F, CN, $Si(R^3)_4$, straight-chain alkyl groups having 1 to 10 carbon atoms, branched or cyclic alkyl groups having 3 to 20 carbon atoms, aromatic ring systems having 6 to 40 aromatic ring atoms and heteroaromatic ring systems having 5 to 40 aromatic ring atoms, where the alkyl groups mentioned, the aromatic ring systems mentioned and the heteroaromatic ring systems mentioned are each substituted by $R^3$ radicals.

Formula (I) preferably conforms to a formula (I-1)

Formula (I-1)

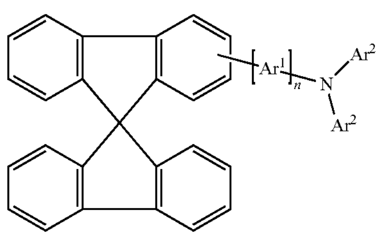

where the groups that occur are as defined above and are preferably defined according to their preferred embodiments, and where the unoccupied positions on the spirobifluorene are substituted by $R^1$ radicals.

Formula (II) preferably conforms to a formula (II-1)

Formula (II-1)

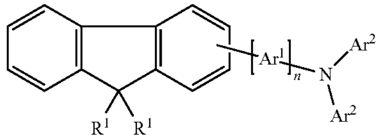

where the groups that occur are as defined above and are preferably defined according to their preferred embodiments, and where the unoccupied positions on the fluorene are substituted by $R^1$ radicals.

Preferred embodiments of compounds of the formula (I) are the compounds cited as example structures in WO2015/158411, WO2011/006574, WO2013/120577, WO2016/078738, WO2017/012687, WO2012/034627, WO2013/139431, WO2017/102063, WO2018/069167, WO2014/072017, WO2017/102064, WO2017/016632, WO2013/083216 and WO2017/133829.

Preferred embodiments of compounds of the formula (II) are the compounds cited as example structures in WO2014/015937, WO2014/015938, WO2014/015935 and WO2015/082056.

Hereinafter, one of the two different compounds in the first hole-transporting layer that conform to identical or different formulae selected from formulae (I) and (II) is referred to as HTM-1, and the other of the two different compounds in the first hole-transporting layer that conform to identical or different formulae selected from formulae (I) and (II) is referred to as HTM-2.

In a preferred embodiment, HTM-1 conforms to a formula selected from formulae (I-1-A) and (II-1-A)

Formula (I-1-A)

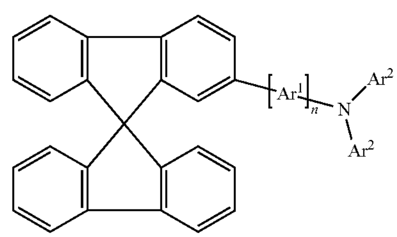

Formula (II-1-A)

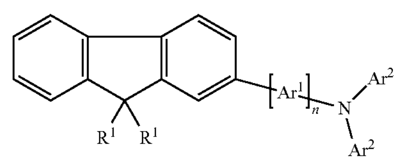

and

HTM-2 conforms to a formula selected from formulae (I-1-B), (I-1-C), (I-1-D), (II-1-B), (II-1-C), and (II-1-D)

Formula (I-1-B)

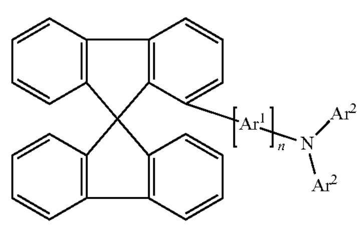

Formula (I-1-C)

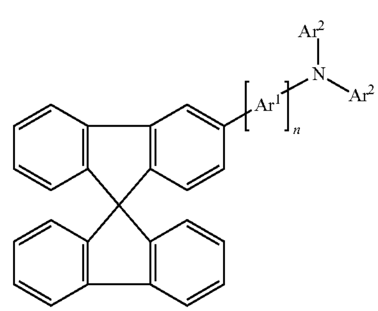

-continued

Formula (I-1-D)

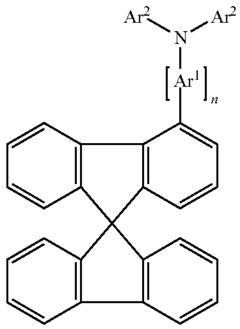

Formula (II-1-B)

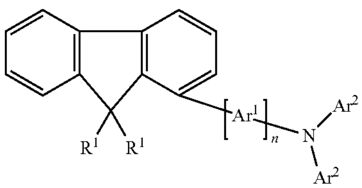

Formula (II-1-C)

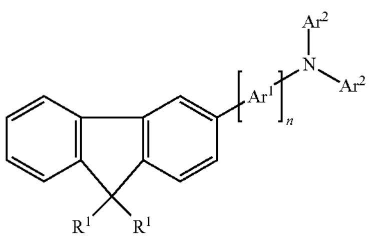

Formula (II-1-D)

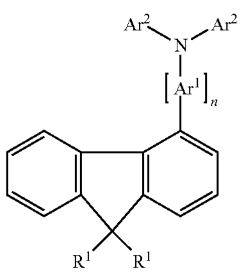

where the groups that occur in the formulae (I-1-A) to (I-1-D) and (II-1-A) to (II-1-D) are as defined above and are preferably defined according to their preferred embodiments, and where the unoccupied positions on the spirobifluorene and fluorene are each substituted by $R^1$ radicals. More preferably, HTM-2 conforms to a formula (I-1-B) or (I-1-D), most preferably to a formula (I-1-D). In an alternative preferred embodiment, HTM-2 conforms to a formula (II-1-B) or (II-1-D), most preferably to a formula (II-1-D).

Preferably, HTM-1 is present in the first hole-transporting layer in a proportion five to two times as high as the proportion of HTM-2 in the layer.

Preferably, HTM-1 is present in the layer in a proportion of 50%-95%, more preferably in a proportion of 60%-90%, and most preferably in a proportion of 65%-85%.

Preferably, HTM-2 is present in the layer in a proportion of 5%-50%, more preferably in a proportion of 10%-40%, and most preferably in a proportion of 15%-35%.

Preferably, HTM-1 is present in the layer in a proportion of 65% to 85%, and HTM-2 is present in the layer in a proportion of 15% to 35%.

In a preferred embodiment, HTM-1 has a HOMO of −4.8 eV to −5.2 eV, and HTM-2 has a HOMO of −5.1 eV to −5.4 eV. More preferably, HTM-1 has a HOMO of −5.0 to −5.2 eV, and HTM-2 has a HOMO of −5.1 to −5.3 eV. It is further preferable that HTM-1 has a higher HOMO than HTM-2. More preferably, HTM-1 has a HOMO higher than HTM-2 by 0.02 to 0.3 eV. "Higher HOMO" is understood here to mean that the value in eV is less negative.

The HOMO energy level is determined by means of cyclic voltammetry (CV), by the method described at page 28 line 1 to page 29 line 21 of the published specification WO 2011/032624.

Preferred embodiments of compounds HTM-1 are shown in the following table:

HTM-1-1

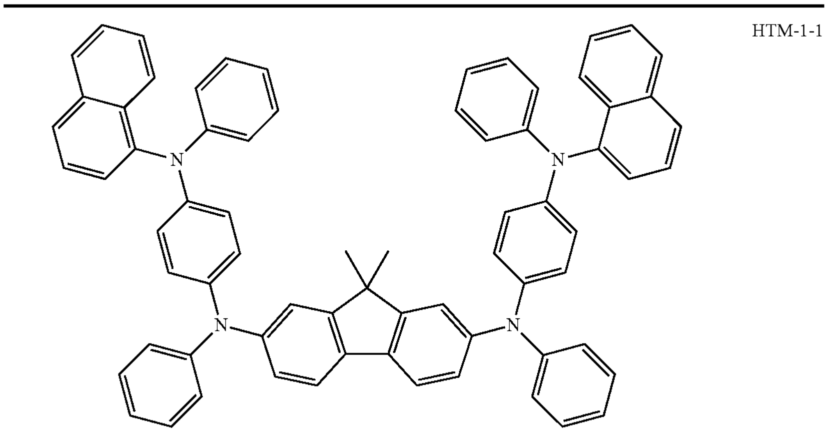

-continued
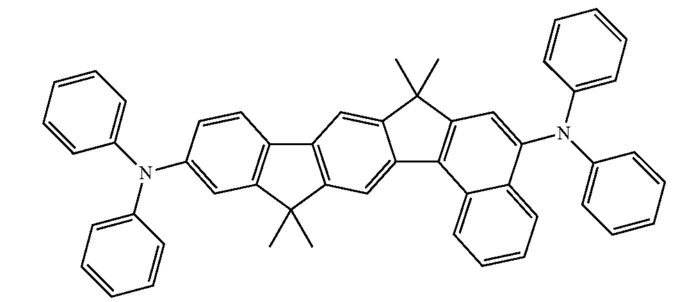 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]
HTM-1-2
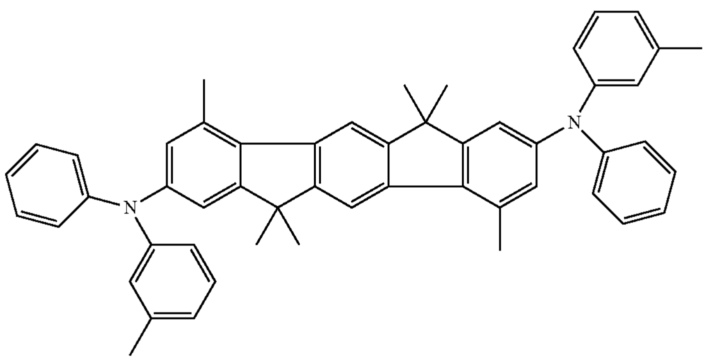 [SMILES: Cc1cccc(N(c2ccccc2)c2cc(C)c3c(c2)C(C)(C)c2cc4c(cc2-3)C(C)(C)c2cc(N(c3ccccc3)c3cccc(C)c3)cc(C)c2-4)c1]
HTM-1-3
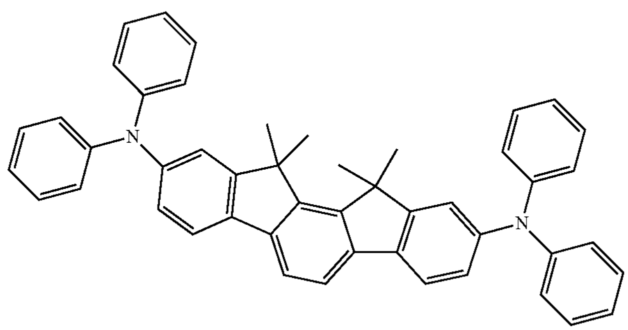 [SMILES: CC1(C)c2cc(N(c3ccccc3)c3ccccc3)ccc2-c2ccc3c(c21)C(C)(C)c1cc(N(c2ccccc2)c2ccccc2)ccc1-3]
HTM-1-4
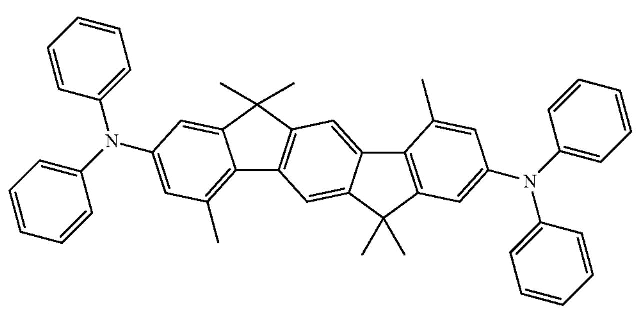 [SMILES: Cc1cc(N(c2ccccc2)c2ccccc2)cc2c1-c1cc3c(cc1C2(C)C)-c1c(C)cc(N(c2ccccc2)c2ccccc2)cc1C3(C)C]
HTM-1-5
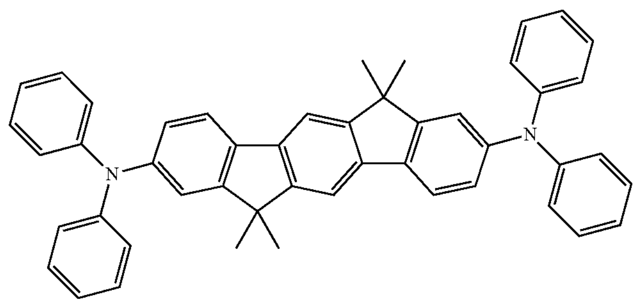 [SMILES: CC1(C)c2cc(N(c3ccccc3)c3ccccc3)ccc2-c2cc3c(cc21)-c1ccc(N(c2ccccc2)c2ccccc2)cc1C3(C)C]
HTM-1-6

-continued
HTM-1-7
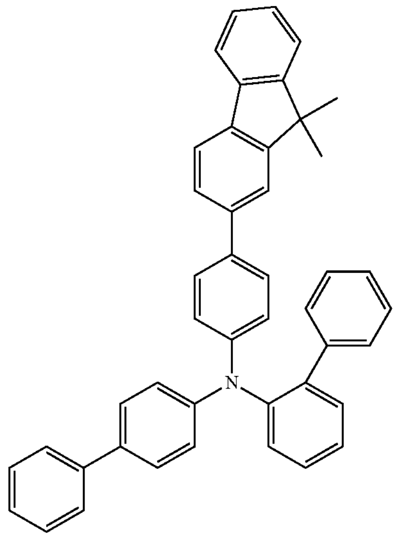 [SMILES: CC1(C)c2ccccc2-c2ccc(-c3ccc(N(c4ccc(-c5ccccc5)cc4)c4ccccc4-c4ccccc4)cc3)cc21]
HTM-1-8
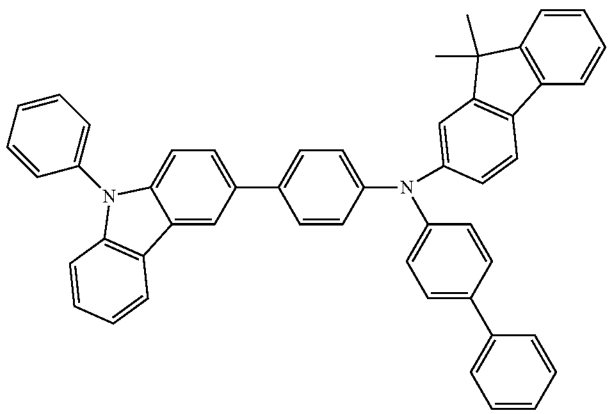 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]
HTM-1-9
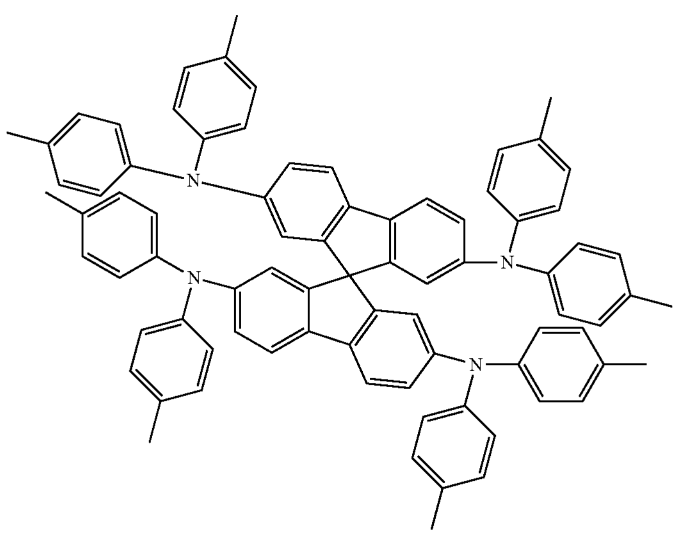

-continued
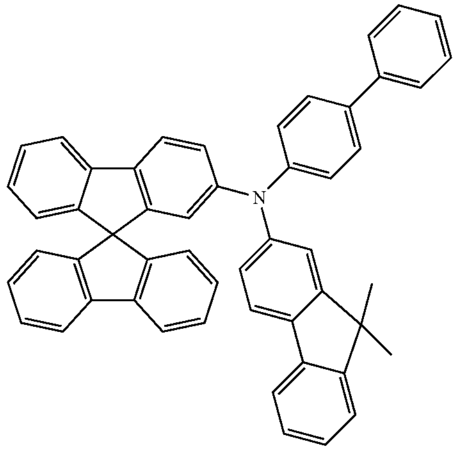 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]
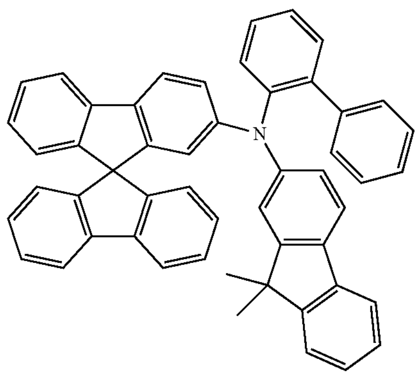 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
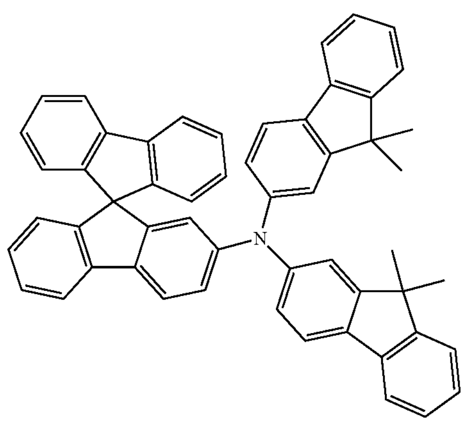 [SMILES: CC1(C)c2ccccc2-c2ccc(N(c3ccc4c(c3)C(C)(C)c3ccccc3-4)c3ccc4c(c3)C3(c5ccccc5-c5ccccc53)c3ccccc3-4)cc21]
HTM-1-10
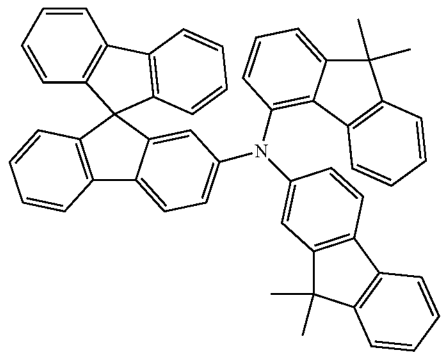 [SMILES: CC1(C)c2ccccc2-c2ccc(N(c3ccc4c(c3)C3(c5ccccc5-c5ccccc53)c3ccccc3-4)c3cccc4c3-c3ccccc3C4(C)C)cc21]

-continued
HTM-1-11
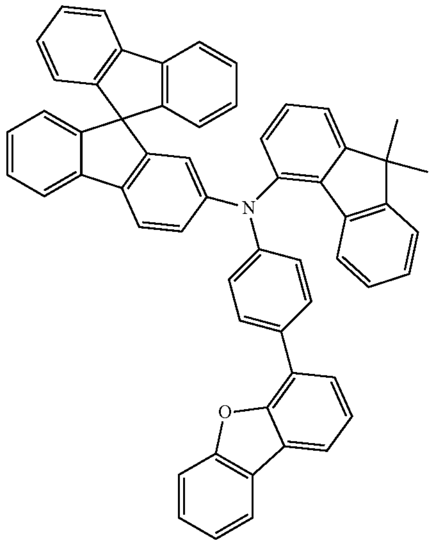 [SMILES: CC1(C)c2ccccc2-c2c(N(c3ccc(-c4cccc5c4oc4ccccc45)cc3)c3ccc4c(c3)C3(c5ccccc5-c5ccccc53)c3ccccc3-4)cccc21]
HTM-1-12
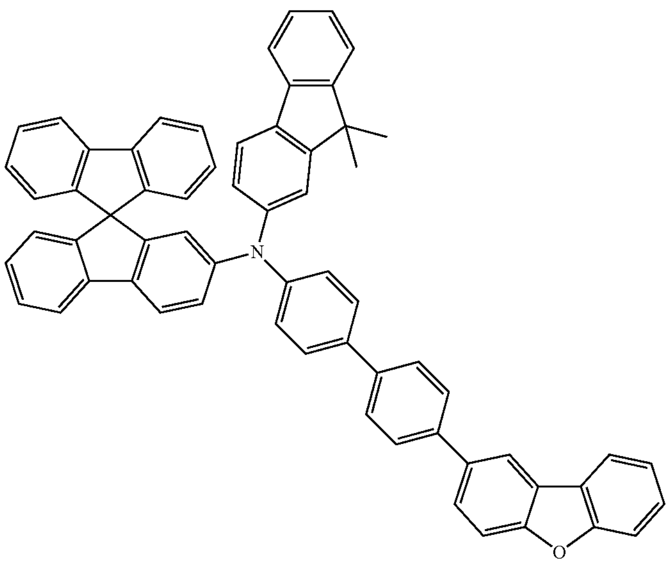
HTM-1-13
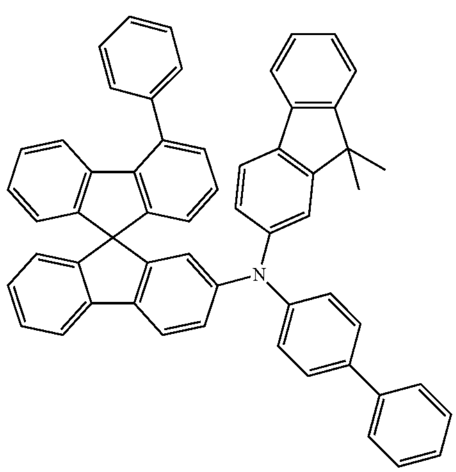

-continued
HTM-1-14
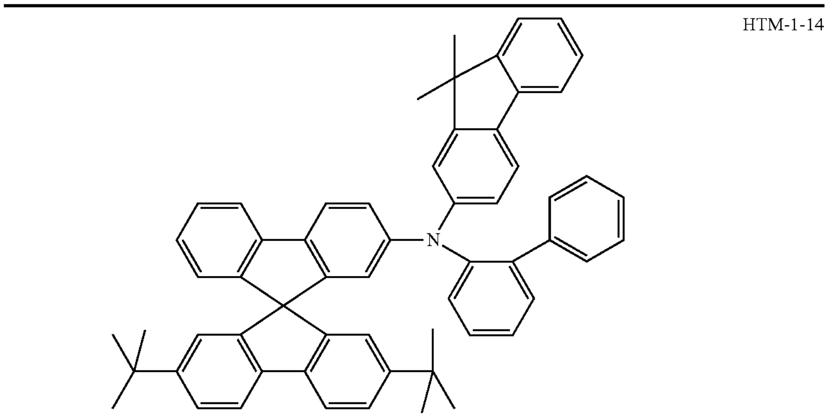
HTM-1-15
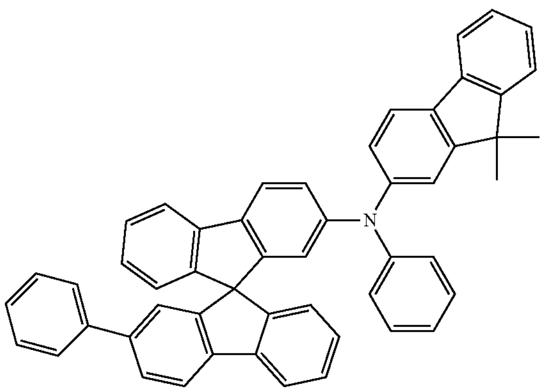 [SMILES: CC1(C)c2ccccc2-c2ccc(N(c3ccccc3)c3ccc4c(c3)C3(c5ccccc5-c5ccc(-c6ccccc6)cc53)c3ccccc3-4)cc21]
HTM-1-16
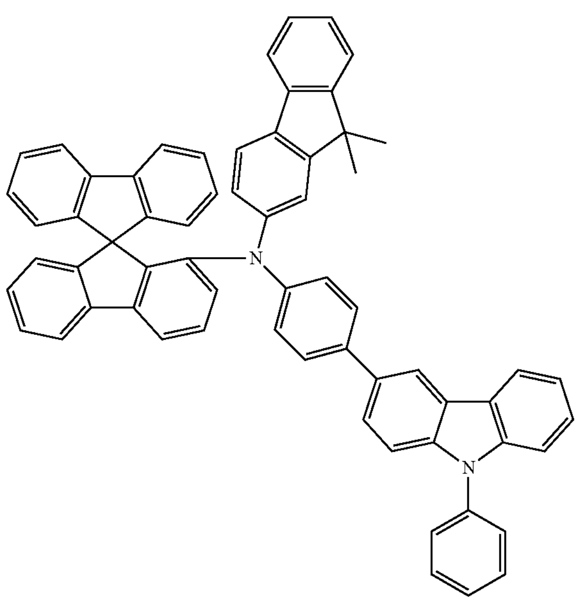

-continued
HTM-1-17
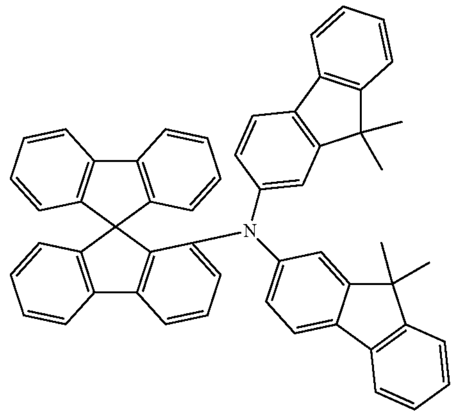
HTM-1-18
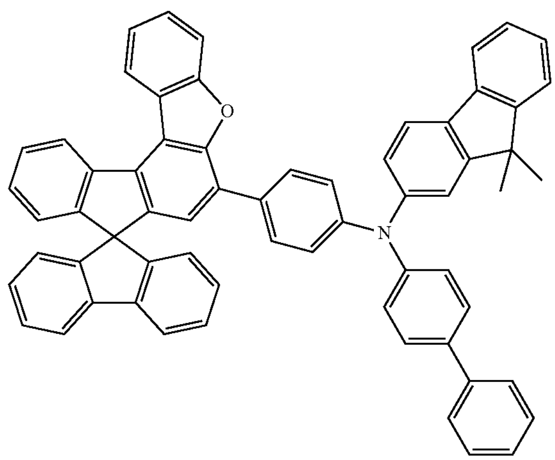
HTM-1-19
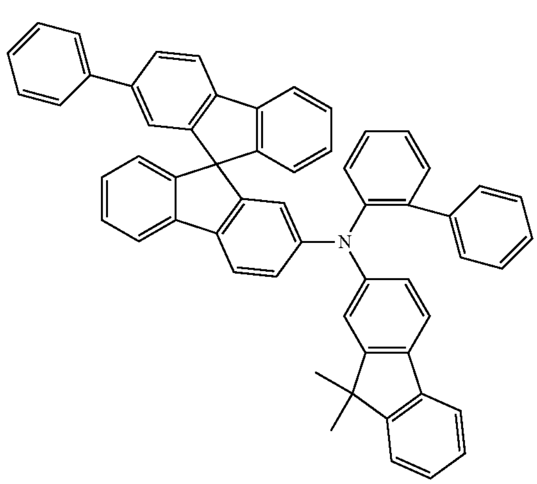 [SMILES: CC1(C)c2ccccc2-c2ccc(N(c3ccc4c(c3)C3(c5ccccc5-c5ccc(-c6ccccc6)cc53)c3ccccc3-4)c3ccccc3-c3ccccc3)cc21]

-continued
HTM-1-20
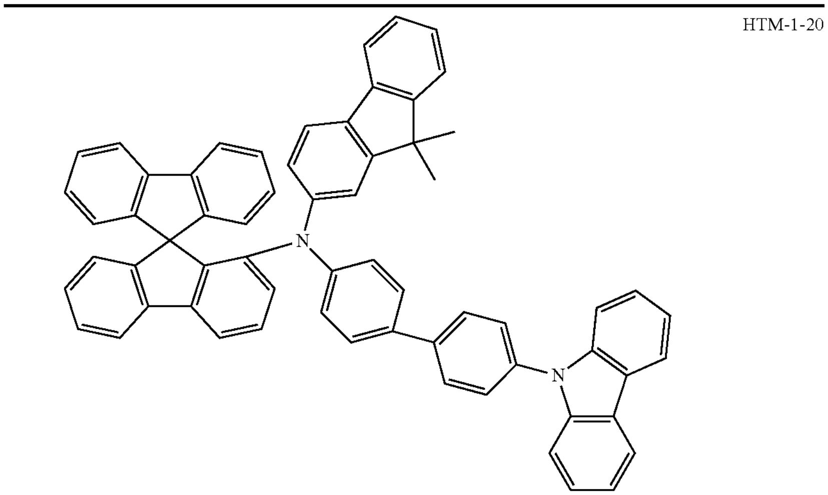
Preferred embodiments of compounds HTM-2 are shown in the following table:
HTM-2-1
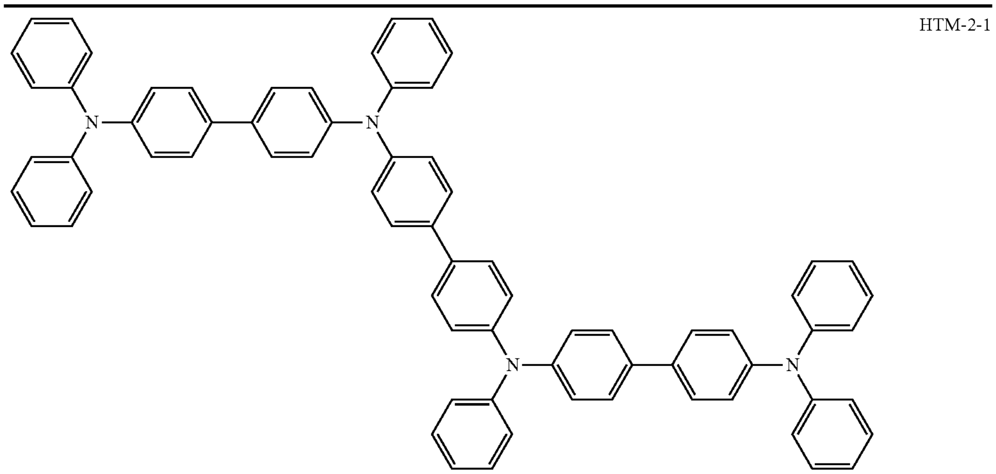
HTM-2-2
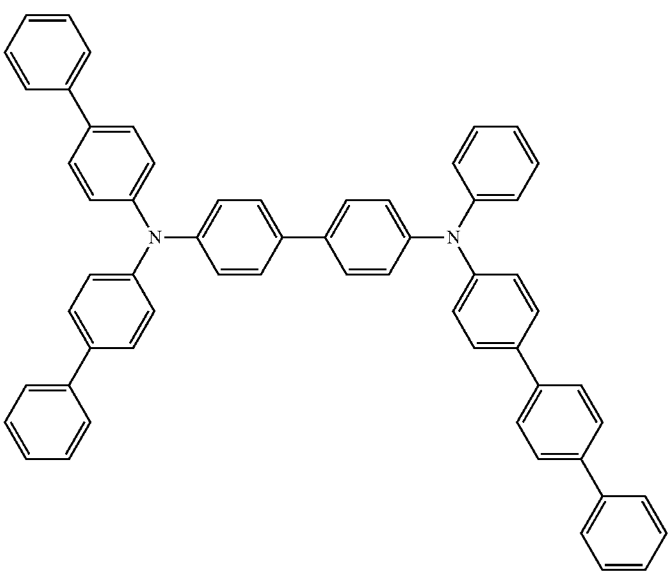 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]

-continued
HTM-2-3
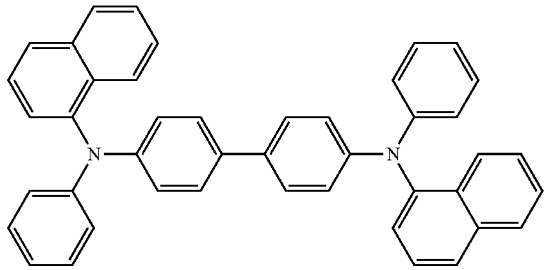 [SMILES: c1ccc(N(c2ccc(-c3ccc(N(c4ccccc4)c4cccc5ccccc45)cc3)cc2)c2cccc3ccccc23)cc1]
HTM-2-4
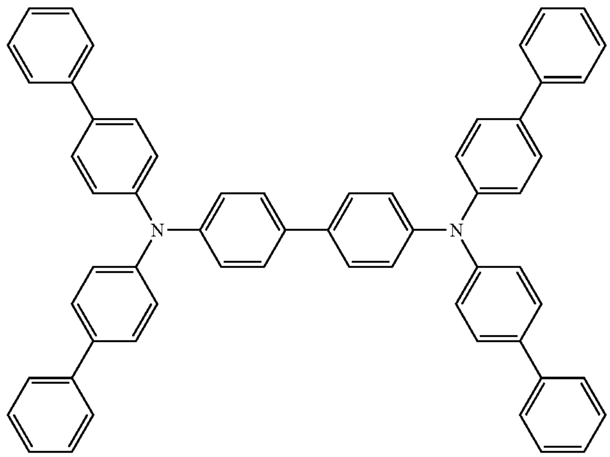 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
HTM-2-5
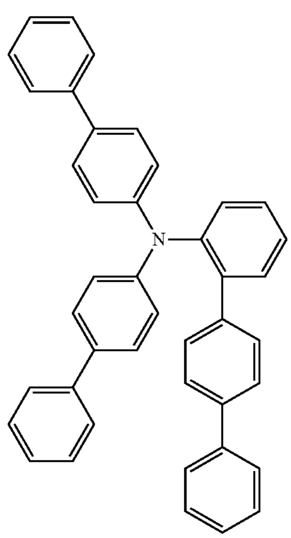 [SMILES: c1ccc(-c2ccc(-c3ccccc3N(c3ccc(-c4ccccc4)cc3)c3ccc(-c4ccccc4)cc3)cc2)cc1]

-continued
HTM-2-6
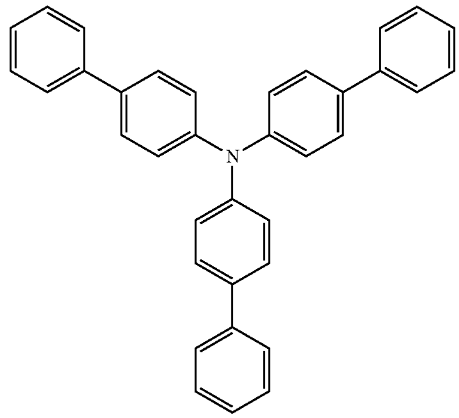 [SMILES: c1ccc(-c2ccc(N(c3ccc(-c4ccccc4)cc3)c3ccc(-c4ccccc4)cc3)cc2)cc1]
HTM-2-7
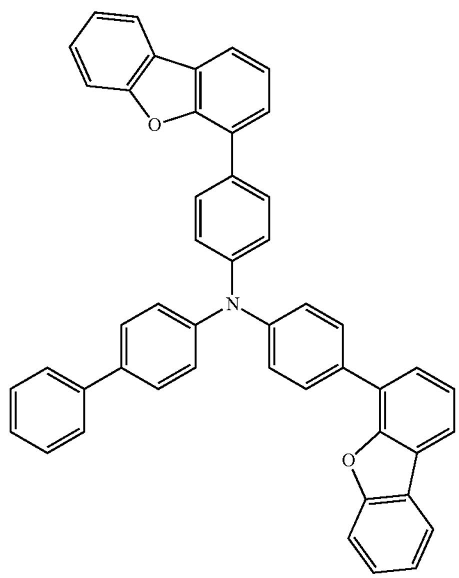 [SMILES: c1ccc(-c2ccc(N(c3ccc(-c4cccc5c4oc4ccccc45)cc3)c3ccc(-c4cccc5c4oc4ccccc45)cc3)cc2)cc1]
HTM-2-8
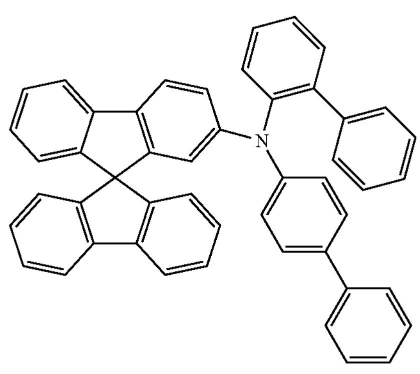 [SMILES: c1ccc(-c2ccc(N(c3ccc4c(c3)C3(c5ccccc5-c5ccccc53)c3ccccc3-4)c3ccccc3-c3ccccc3)cc2)cc1]

-continued
HTM-2-9
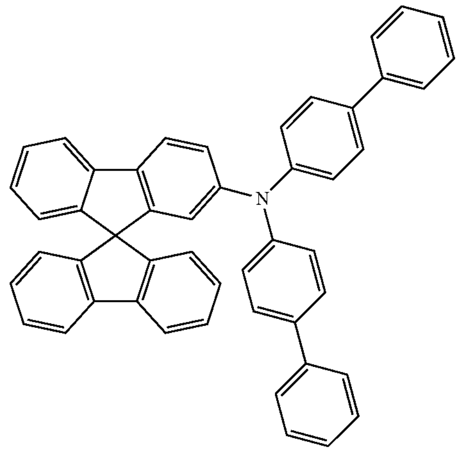 [SMILES: c1ccc(-c2ccc(N(c3ccc(-c4ccccc4)cc3)c3ccc4c(c3)C3(c5ccccc5-c5ccccc53)c3ccccc3-4)cc2)cc1]
HTM-2-10
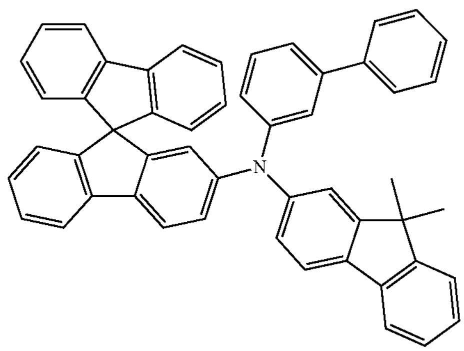 [SMILES: CC1(C)c2ccccc2-c2ccc(N(c3cccc(-c4ccccc4)c3)c3ccc4c(c3)C3(c5ccccc5-c5ccccc53)c3ccccc3-4)cc21]
HTM-2-11
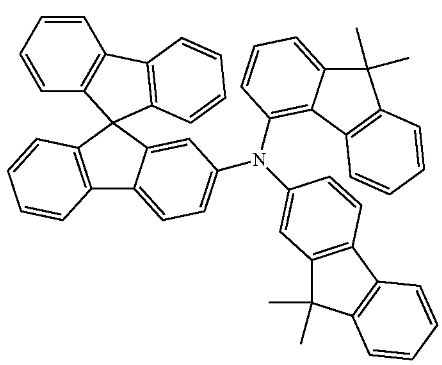 [SMILES: CC1(C)c2ccccc2-c2ccc(N(c3ccc4c(c3)C3(c5ccccc5-c5ccccc53)c3ccccc3-4)c3cccc4c3-c3ccccc3C4(C)C)cc21]
HTM-2-12
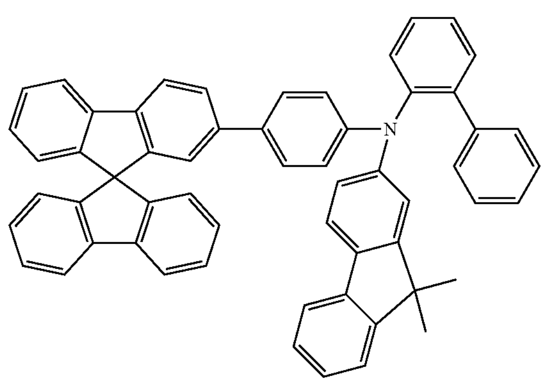 [SMILES: CC1(C)c2ccccc2-c2ccc(N(c3ccc(-c4ccc5c(c4)C4(c6ccccc6-c6ccccc64)c4ccccc4-5)cc3)c3ccccc3-c3ccccc3)cc21]

-continued
HTM-2-13
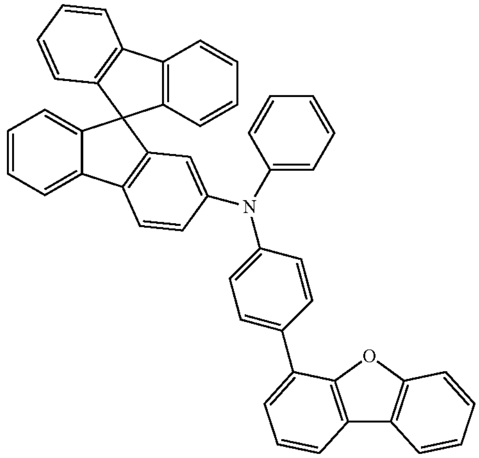 [SMILES: c1ccc(N(c2ccc(-c3cccc4c3oc3ccccc34)cc2)c2ccc3c(c2)C2(c4ccccc4-c4ccccc42)c2ccccc2-3)cc1]
HTM-2-14
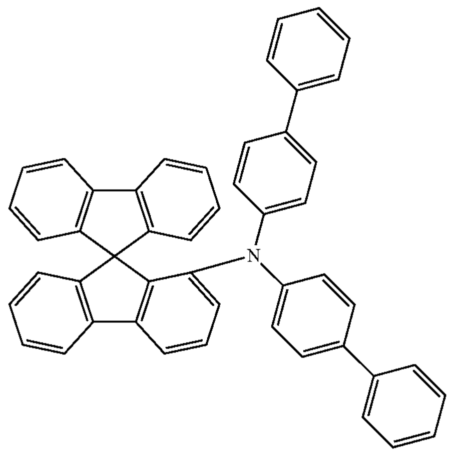 [SMILES: c1ccc(-c2ccc(N(c3ccc(-c4ccccc4)cc3)c3cccc4c3C3(c5ccccc5-c5ccccc53)c3ccccc3-4)cc2)cc1]
HTM-2-15
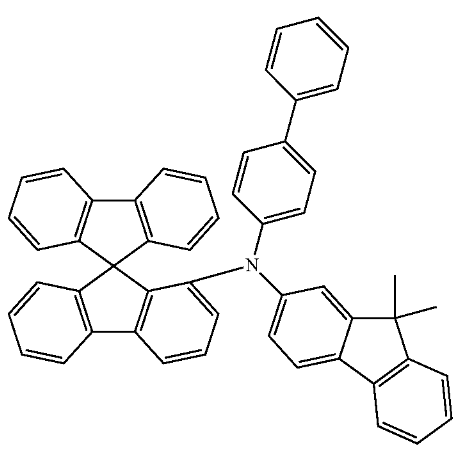 [SMILES: CC1(C)c2ccccc2-c2ccc(N(c3ccc(-c4ccccc4)cc3)c3cccc4c3C3(c5ccccc5-c5ccccc53)c3ccccc3-4)cc21]

-continued
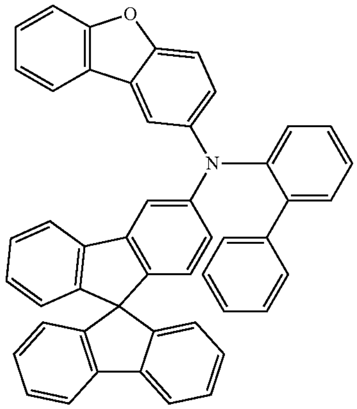 [SMILES: c1ccc(-c2ccccc2N(c2ccc3c(c2)-c2ccccc2C32c3ccccc3-c3ccccc32)c2ccc3oc4ccccc4c3c2)cc1]
HTM-2-16
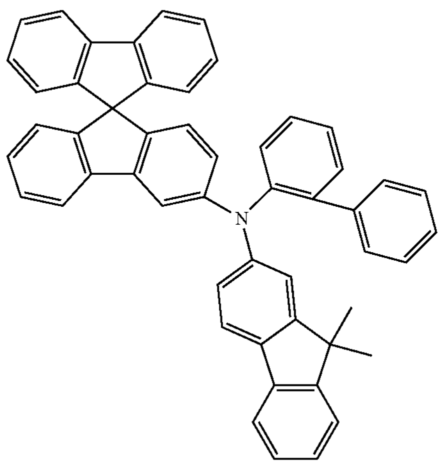 [SMILES: CC1(C)c2ccccc2-c2ccc(N(c3ccc4c(c3)-c3ccccc3C43c4ccccc4-c4ccccc43)c3ccccc3-c3ccccc3)cc21]
HTM-2-17
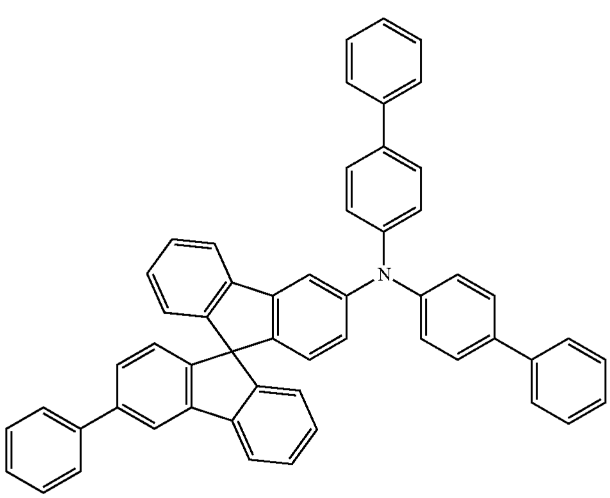 [SMILES: c1ccc(-c2ccc(N(c3ccc(-c4ccccc4)cc3)c3ccc4c(c3)-c3ccccc3C43c4ccccc4-c4cc(-c5ccccc5)ccc43)cc2)cc1]
HTM-2-18

-continued
HTM-2-19
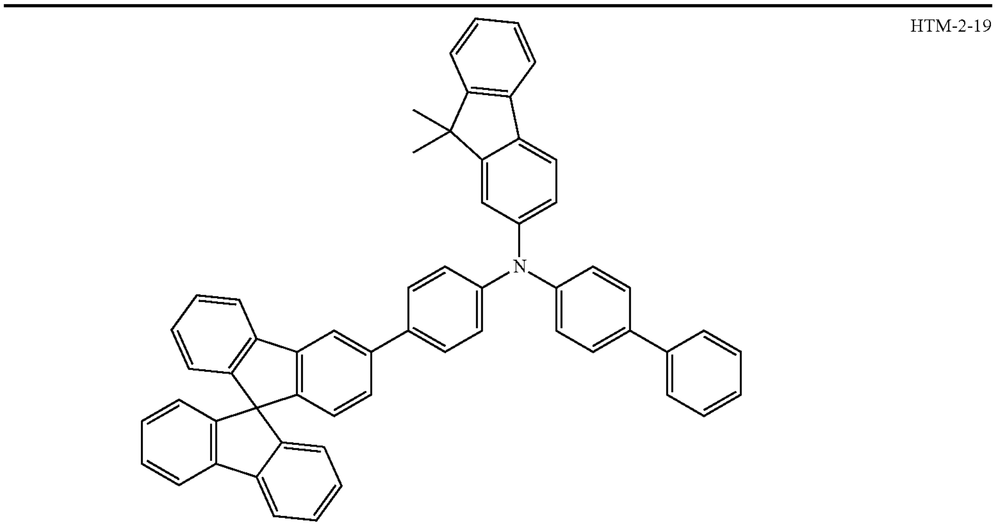
HTM-2-20
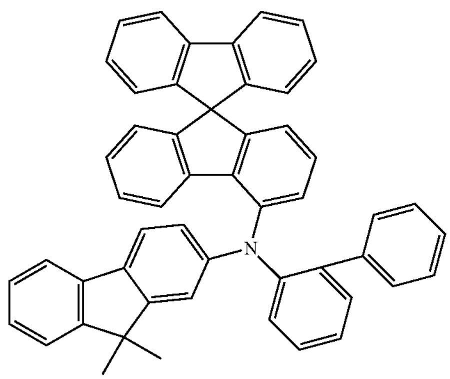 [SMILES: CC1(C)c2ccccc2-c2ccc(N(c3ccccc3-c3ccccc3)c3cccc4c3-c3ccccc3C43c4ccccc4-c4ccccc43)cc21]
HTM-2-21
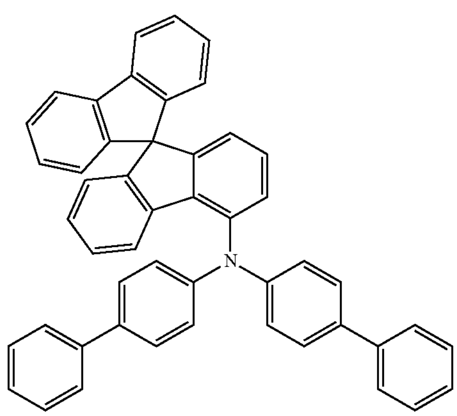 [SMILES: c1ccc(-c2ccc(N(c3ccc(-c4ccccc4)cc3)c3cccc4c3-c3ccccc3C43c4ccccc4-c4ccccc43)cc2)cc1]

-continued
HTM-2-22
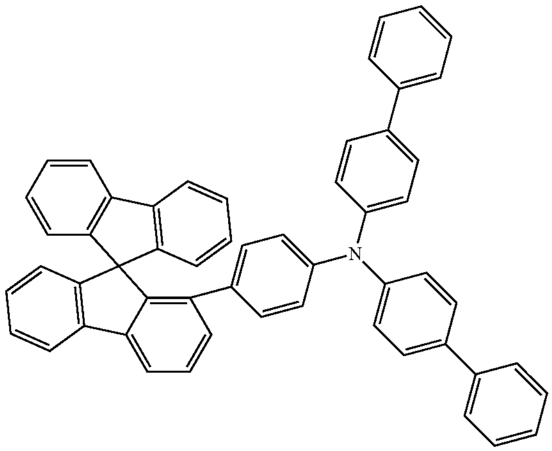 [SMILES: c1ccc(-c2ccc(N(c3ccc(-c4ccccc4)cc3)c3ccc(-c4cccc5c4C4(c6ccccc6-c6ccccc64)c4ccccc4-5)cc3)cc2)cc1]
HTM-2-23
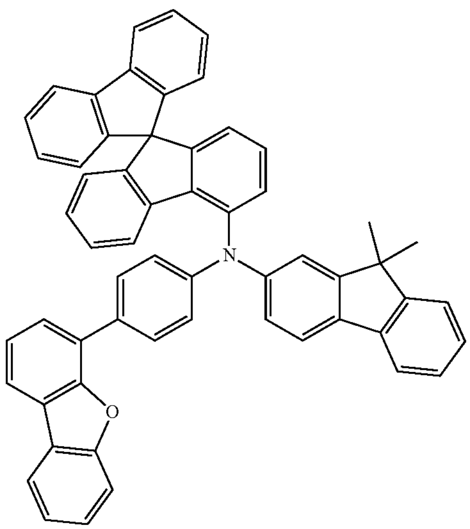 [SMILES: CC1(C)c2ccccc2-c2ccc(N(c3ccc(-c4cccc5c4oc4ccccc45)cc3)c3cccc4c3-c3ccccc3C43c4ccccc4-c4ccccc43)cc21]
HTM-2-24
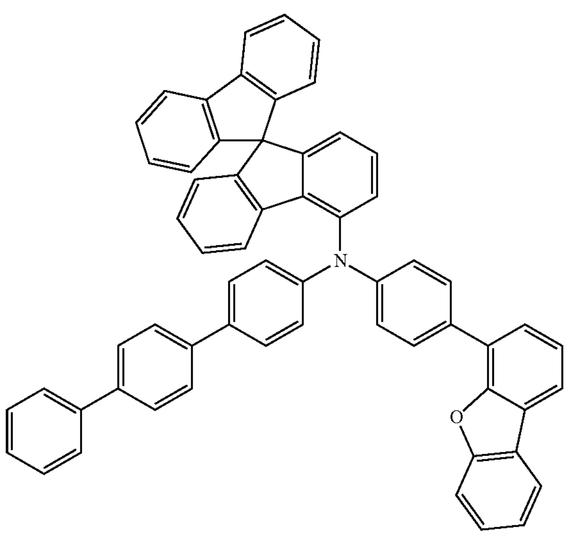 [SMILES: c1ccc(-c2ccc(-c3ccc(N(c4ccc(-c5cccc6c5oc5ccccc56)cc4)c4cccc5c4-c4ccccc4C54c5ccccc5-c5ccccc54)cc3)cc2)cc1]

-continued
HTM-2-25
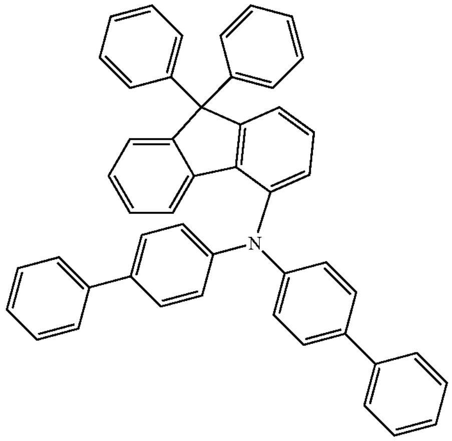 [SMILES: c1ccc(-c2ccc(N(c3ccc(-c4ccccc4)cc3)c3cccc4c3-c3ccccc3C4(c3ccccc3)c3ccccc3)cc2)cc1]
HTM-2-26
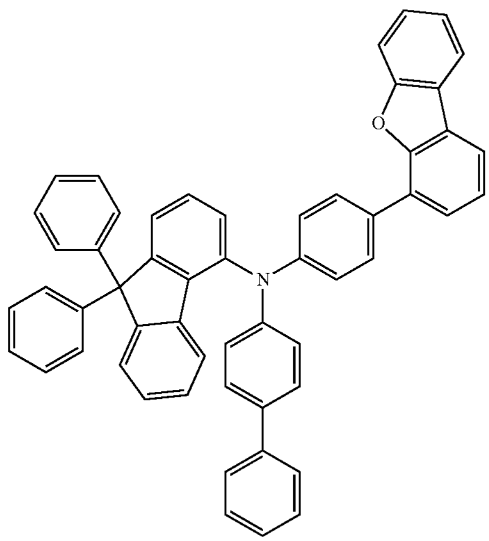 [SMILES: c1ccc(-c2ccc(N(c3ccc(-c4cccc5c4oc4ccccc45)cc3)c3cccc4c3-c3ccccc3C4(c3ccccc3)c3ccccc3)cc2)cc1]
HTM-2-27
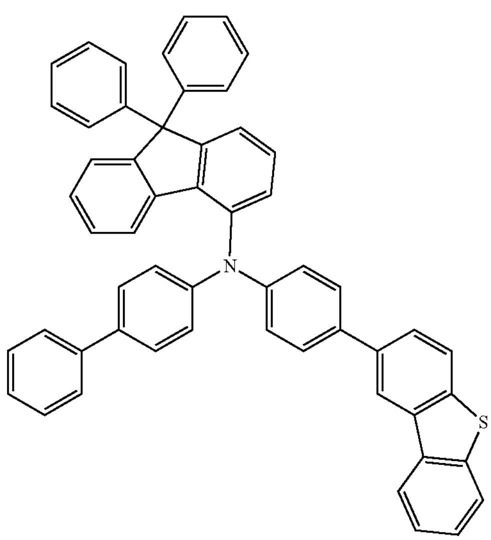 [SMILES: c1ccc(-c2ccc(N(c3ccc(-c4ccc5sc6ccccc6c5c4)cc3)c3cccc4c3-c3ccccc3C4(c3ccccc3)c3ccccc3)cc2)cc1]

-continued
HTM-2-28
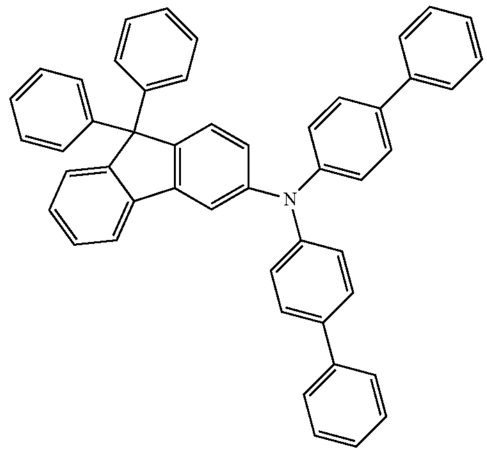 [SMILES: c1ccc(-c2ccc(N(c3ccc(-c4ccccc4)cc3)c3ccc4c(c3)-c3ccccc3C4(c3ccccc3)c3ccccc3)cc2)cc1]
HTM-2-29
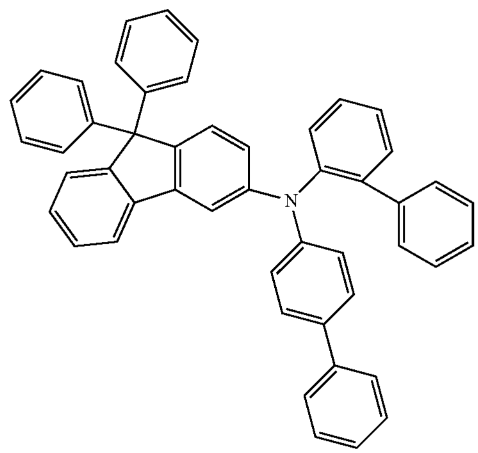 [SMILES: c1ccc(-c2ccc(N(c3ccc4c(c3)-c3ccccc3C4(c3ccccc3)c3ccccc3)c3ccccc3-c3ccccc3)cc2)cc1]
HTM-2-30
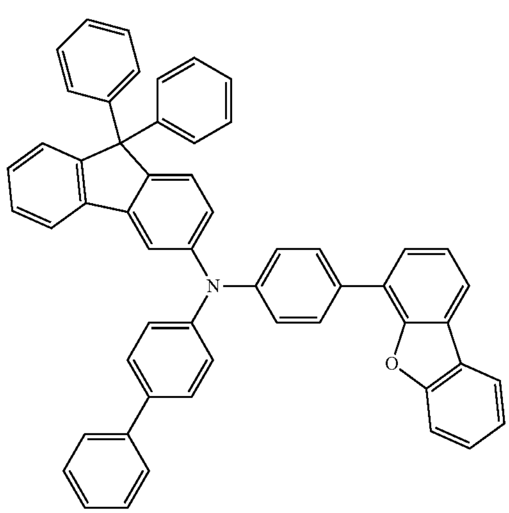 [SMILES: c1ccc(-c2ccc(N(c3ccc(-c4cccc5c4oc4ccccc45)cc3)c3ccc4c(c3)-c3ccccc3C4(c3ccccc3)c3ccccc3)cc2)cc1]

-continued
HTM-2-31
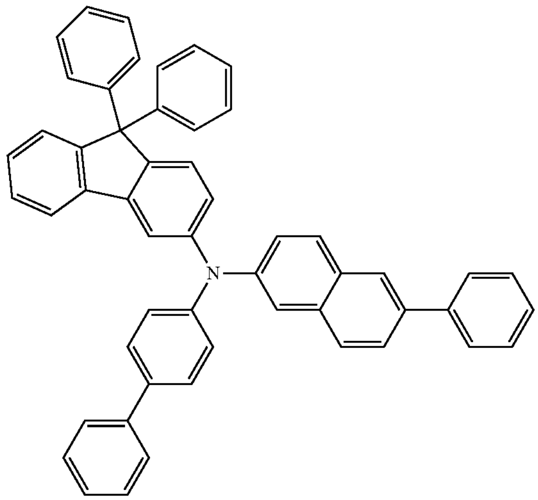 [SMILES: c1ccc(-c2ccc(N(c3ccc4c(c3)-c3ccccc3C4(c3ccccc3)c3ccccc3)c3ccc4cc(-c5ccccc5)ccc4c3)cc2)cc1]
HTM-2-32
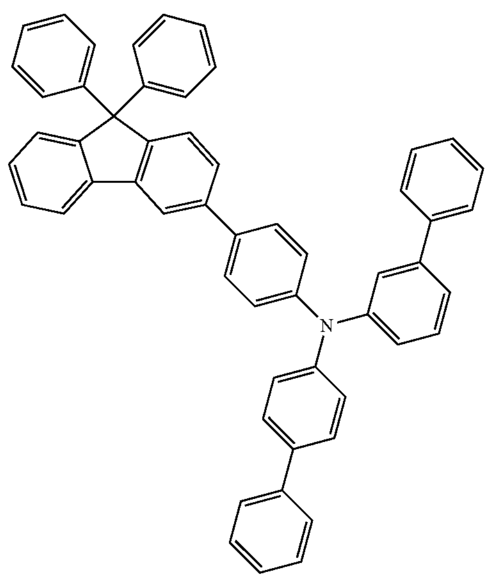 [SMILES: c1ccc(-c2ccc(N(c3ccc(-c4ccc5c(c4)-c4ccccc4C5(c4ccccc4)c4ccccc4)cc3)c3cccc(-c4ccccc4)c3)cc2)cc1]

-continued
HTM-2-33
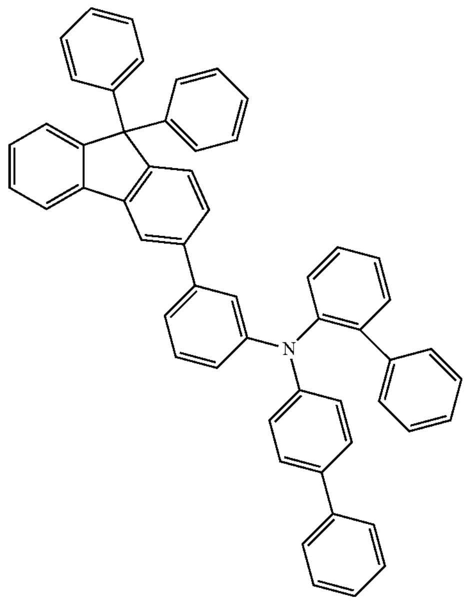 [SMILES: c1ccc(-c2ccc(N(c3cccc(-c4ccc5c(c4)-c4ccccc4C5(c4ccccc4)c4ccccc4)c3)c3ccccc3-c3ccccc3)cc2)cc1]
HTM-2-34
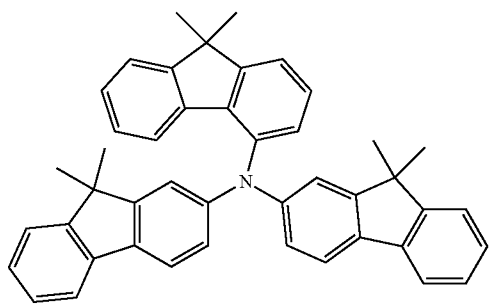 [SMILES: CC1(C)c2ccccc2-c2ccc(N(c3ccc4c(c3)C(C)(C)c3ccccc3-4)c3cccc4c3-c3ccccc3C4(C)C)cc21]
HTM-2-35
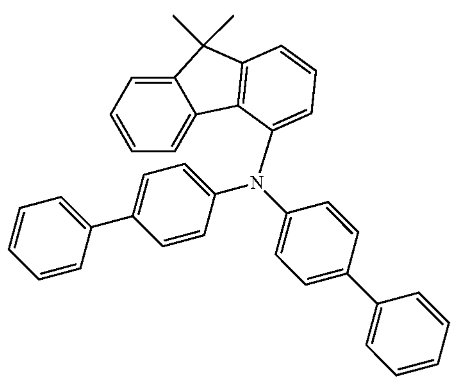 [SMILES: CC1(C)c2ccccc2-c2c(N(c3ccc(-c4ccccc4)cc3)c3ccc(-c4ccccc4)cc3)cccc21]
HTM-2-36
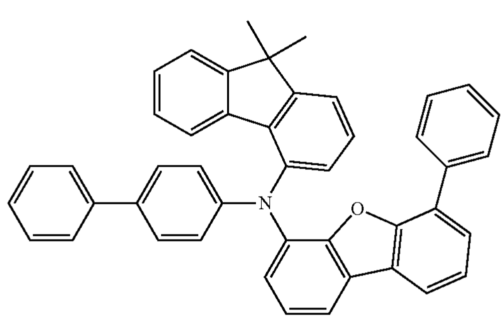 [SMILES: CC1(C)c2ccccc2-c2c(N(c3ccc(-c4ccccc4)cc3)c3cccc4c3oc3c(-c5ccccc5)cccc34)cccc21]

-continued
HTM-2-37
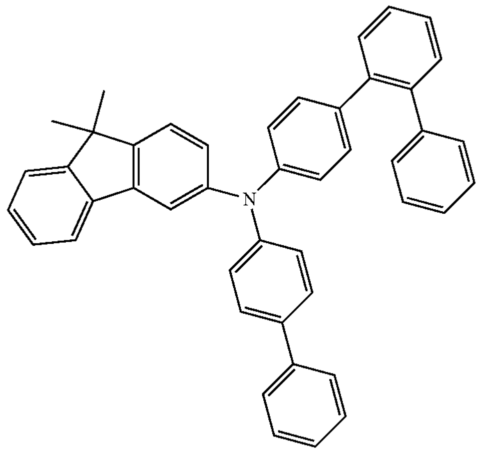 [SMILES: CC1(C)c2ccccc2-c2cc(N(c3ccc(-c4ccccc4)cc3)c3ccc(-c4ccccc4-c4ccccc4)cc3)ccc21]
HTM-2-38
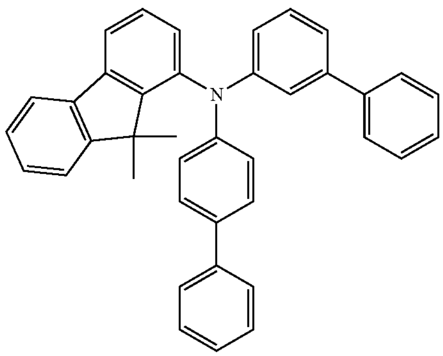 [SMILES: CC1(C)c2ccccc2-c2cccc(N(c3ccc(-c4ccccc4)cc3)c3cccc(-c4ccccc4)c3)c21]
HTM-2-39
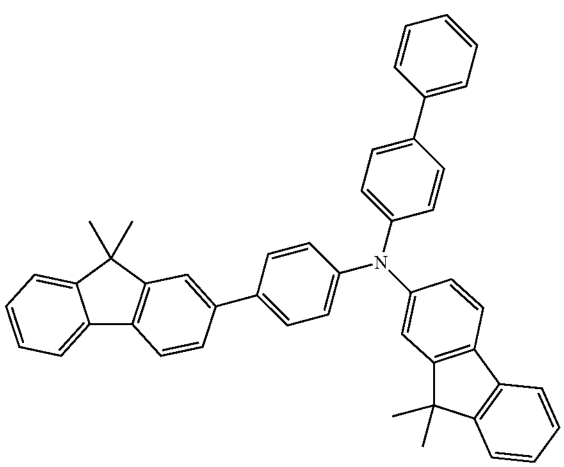 [SMILES: CC1(C)c2ccccc2-c2ccc(-c3ccc(N(c4ccc(-c5ccccc5)cc4)c4ccc5c(c4)C(C)(C)c4ccccc4-5)cc3)cc21]

-continued
HTM-2-40
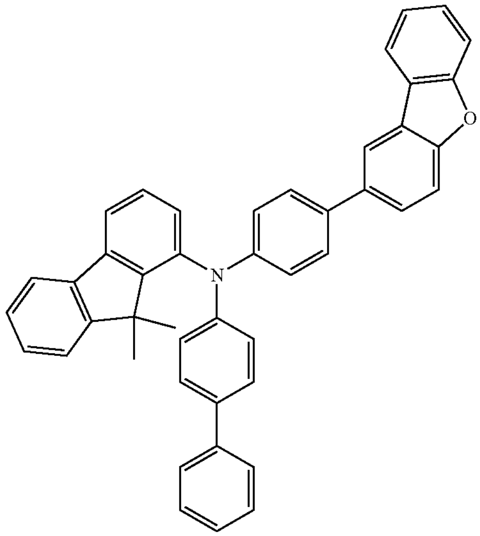 [SMILES: CC1(C)c2ccccc2-c2cccc(N(c3ccc(-c4ccccc4)cc3)c3ccc(-c4ccc5oc6ccccc6c5c4)cc3)c21]
HTM-2-41
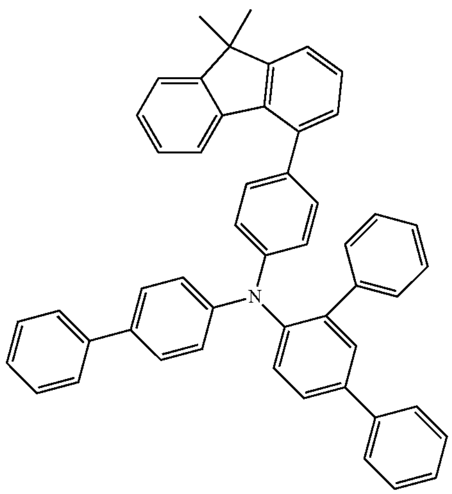 [SMILES: CC1(C)c2ccccc2-c2c(-c3ccc(N(c4ccc(-c5ccccc5)cc4)c4ccc(-c5ccccc5)cc4-c4ccccc4)cc3)cccc21]
HTM-2-42
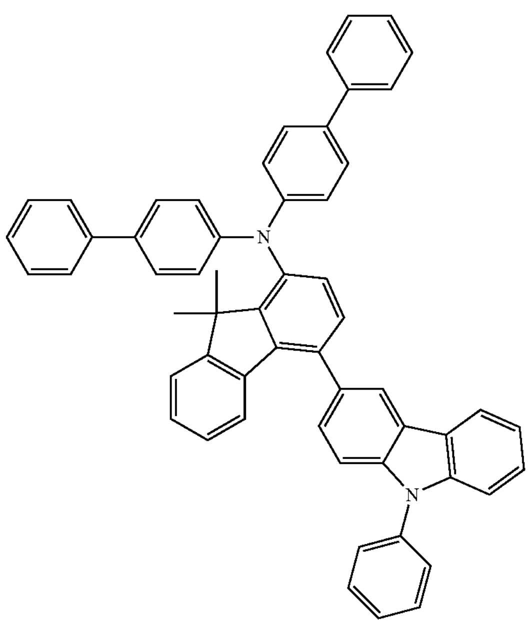 [SMILES: CC1(C)c2ccccc2-c2c(-c3ccc4c(c3)c3ccccc3n4-c3ccccc3)ccc(N(c3ccc(-c4ccccc4)cc3)c3ccc(-c4ccccc4)cc3)c21]

-continued
HTM-2-43
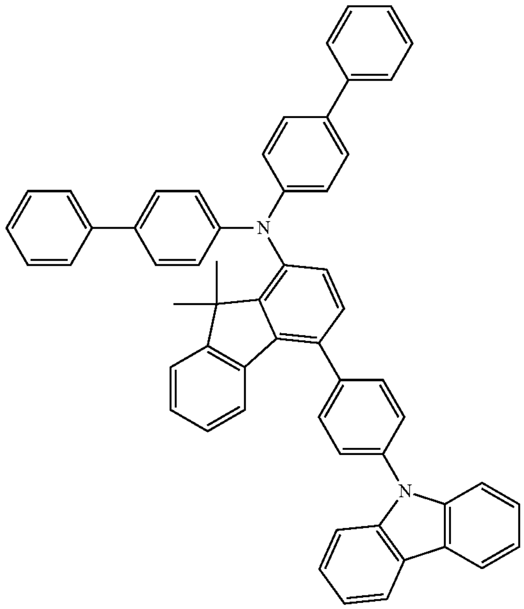 [SMILES: CC1(C)c2ccccc2-c2c(-c3ccc(-n4c5ccccc5c5ccccc54)cc3)ccc(N(c3ccc(-c4ccccc4)cc3)c3ccc(-c4ccccc4)cc3)c21]
HTM-2-44
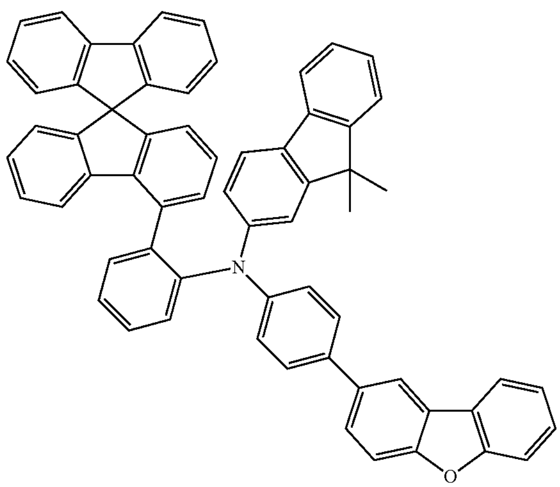 [SMILES: CC1(C)c2ccccc2-c2ccc(N(c3ccc(-c4ccc5oc6ccccc6c5c4)cc3)c3ccccc3-c3cccc4c3-c3ccccc3C43c4ccccc4-c4ccccc43)cc21]
HTM-2-45
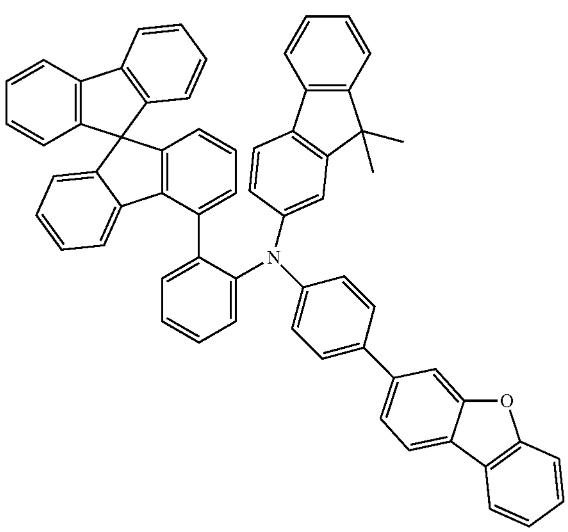 [SMILES: CC1(C)c2ccccc2-c2ccc(N(c3ccc(-c4ccc5c(c4)oc4ccccc45)cc3)c3ccccc3-c3cccc4c3-c3ccccc3C43c4ccccc4-c4ccccc43)cc21]

-continued
HTM-2-46
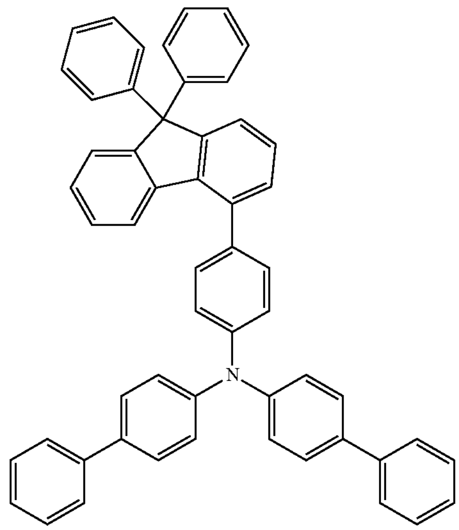 [SMILES: c1ccc(-c2ccc(N(c3ccc(-c4ccccc4)cc3)c3ccc(-c4cccc5c4-c4ccccc4C5(c4ccccc4)c4ccccc4)cc3)cc2)cc1]
HTM-2-47
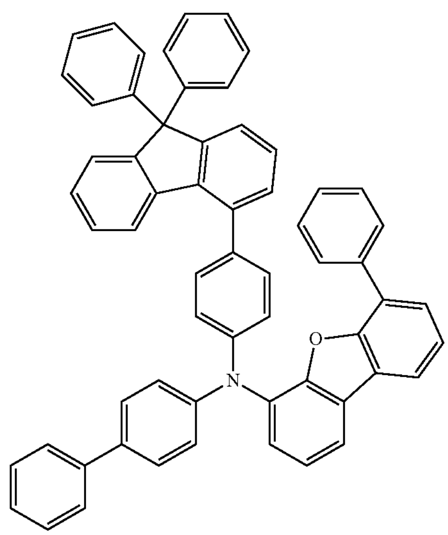 [SMILES: c1ccc(-c2ccc(N(c3ccc(-c4cccc5c4-c4ccccc4C5(c4ccccc4)c4ccccc4)cc3)c3cccc4c3oc3c(-c5ccccc5)cccc34)cc2)cc1]
HTM-2-48
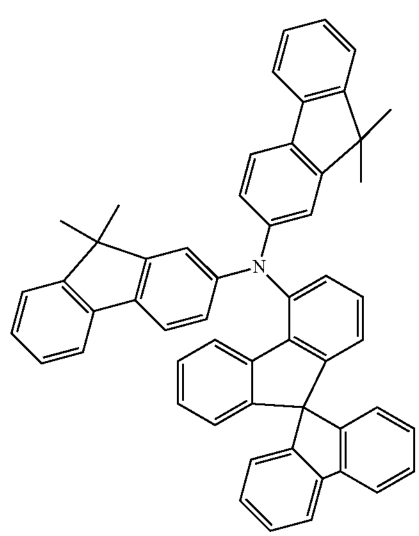 [SMILES: CC1(C)c2ccccc2-c2ccc(N(c3ccc4c(c3)C(C)(C)c3ccccc3-4)c3cccc4c3-c3ccccc3C43c4ccccc4-c4ccccc43)cc21]

The second hole-transporting layer preferably directly adjoins the emitting layer on the anode side. It is further preferable that it directly adjoins the first hole-transporting layer on the cathode side.

The second hole-transporting layer preferably has a thickness of 2 nm to 100 nm, more preferably a thickness of 5 to 40 nm.

The second hole-transporting layer preferably contains a compound of a formula (I-1-B), (I-1-D), (II-1-B) or (II-1-D), more preferably of a formula (I-1-D) or (II-1-D), as defined above. In an alternative preferred embodiment, the second hole-transporting layer contains a compound of a formula (III)

Formula (III)

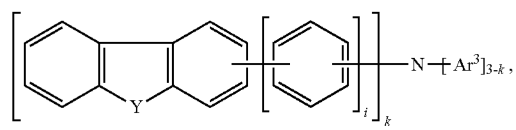

where:

- Y is the same or different at each instance and is selected from O, S and $NR^1$;
- $Ar^3$ is the same or different at each instance and is selected from phenyl, biphenyl and terphenyl, each of which is substituted by $R^1$ radicals;
- k is 1, 2 or 3;
- i is the same or different at each instance and is selected from 0, 1, 2 and 3;
- and where the formulae are each substituted by an $R^1$ radical at the unoccupied positions.

Preferably, in formula (III), Y is the same or different at each instance and is selected from O and S, more preferably from O. Further preferably, k is 1 or 2. Further preferably, i is the same or different at each instance and is selected from 1 and 2, more preferably 1.

It is preferable that the second hole-transporting layer consists of a single compound.

Apart from cathode, anode, emitting layer, first hole-transporting layer and second hole-transporting layer, the electronic device preferably also contains further layers. These are preferably selected from in each case one or more hole injection layers, hole transport layers, hole blocker layers, electron transport layers, electron injection layers, electron blocker layers, exciton blocker layers, interlayers, charge generation layers and/or organic or inorganic p/n junctions. However, it should be pointed out that not necessarily every one of these layers need be present. More particularly, it is preferable that the electronic device contains one or more layers selected from electron transport layers and electron injection layers that are disposed between the emitting layer and the anode. More preferably, the electronic device contains, between the emitting layer and the cathode, in this sequence, one or more electron transport layers, preferably a single electron transport layer, and a single electron injection layer, where the electron injection layer mentioned preferably directly adjoins the cathode.

It is especially preferable that the electronic device contains, between the anode and the first hole-transporting layer, a hole injection layer directly adjoining the anode. The hole injection layer preferably contains a hexaazatriphenylene derivative, as described in US 2007/0092755, or another highly electron-deficient and/or Lewis-acidic compound, in pure form, i.e. not in a mixture with another compound. Examples of such compounds include bismuth complexes, especially Bi(III) complexes, especially Bi(III) carboxylates such as the abovementioned compound D-13.

In an alternative preferred embodiment, the hole injection layer contains a mixture of a p-dopant, as described above, and a hole transport material. The p-dopant is preferably present here in a proportion of 1% to 10% in the hole injection layer. The hole transport material here is preferably selected from material classes known to the person skilled in the art for hole transport materials for OLEDs, especially triarylamines.

The sequence of layers in the electronic device is preferably as follows:

anode-
hole injection layer-
first hole-transporting layer-
optionally further hole transport layer(s)-
second hole-transporting layer-
emitting layer-
optionally hole blocker layer-
electron transport layer-
electron injection layer-
cathode-.

Materials for the hole injection layer and the further hole-transporting layers optionally present are preferably selected from indenofluoreneamine derivatives, amine derivatives, hexaazatriphenylene derivatives, amine derivatives with fused aromatic systems, monobenzoindenofluoreneamines, dibenzoindenofluoreneamines, spirobifluoreneamines, fluoreneamines, spirodibenzopyranamines, dihydroacridine derivatives, spirodibenzofurans and spirodibenzothiophenes, phenanthrenediarylamines, spirotribenzotropolones, spirobifluorenes having meta-phenyldiamine groups, spirobisacridines, xanthenediarylamines, and 9,10-dihydroanthracene spiro compounds having diarylamino groups.

Preferred specific compounds for use in the hole injection layer and in the other hole-transporting layers optionally present are shown in the following table:

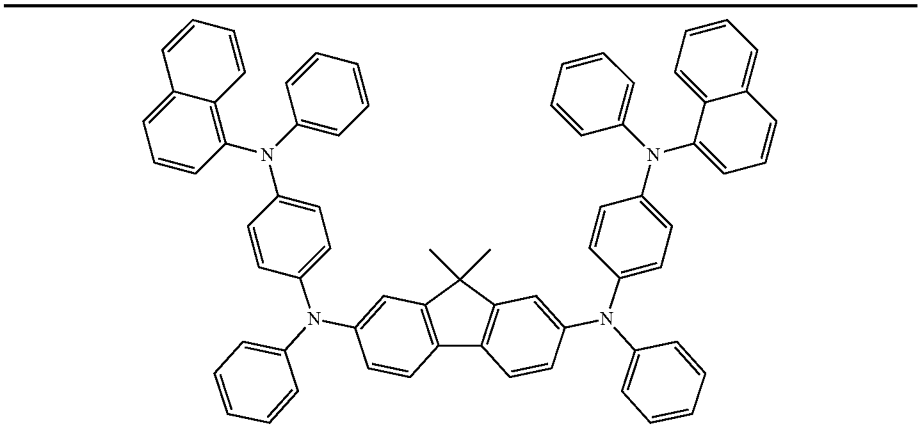
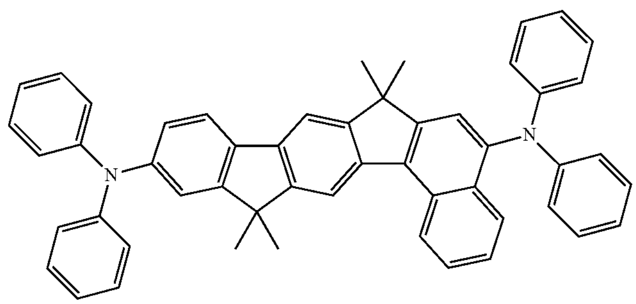 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]
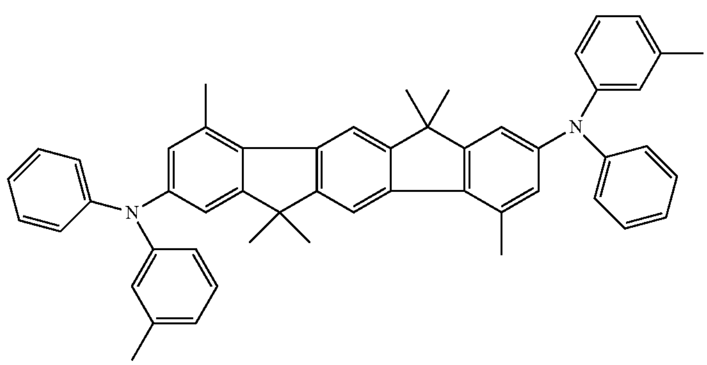 [SMILES: Cc1cccc(N(c2ccccc2)c2cc(C)c3c(c2)C(C)(C)c2cc4c(cc2-3)C(C)(C)c2cc(N(c3ccccc3)c3cccc(C)c3)cc(C)c2-4)c1]
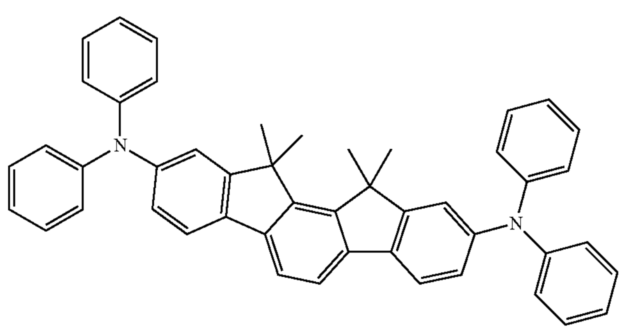 [SMILES: CC1(C)c2cc(N(c3ccccc3)c3ccccc3)ccc2-c2ccc3c(c21)C(C)(C)c1cc(N(c2ccccc2)c2ccccc2)ccc1-3]

-continued
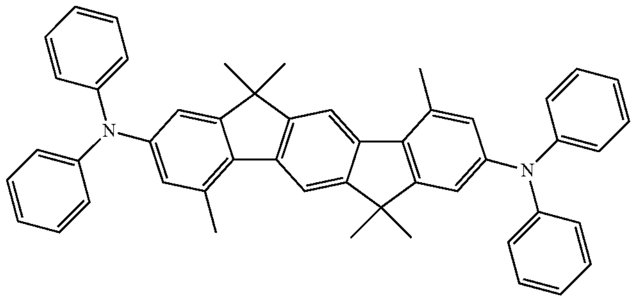 [SMILES: Cc1cc(N(c2ccccc2)c2ccccc2)cc2c1-c1cc3c(cc1C2(C)C)-c1c(C)cc(N(c2ccccc2)c2ccccc2)cc1C3(C)C]
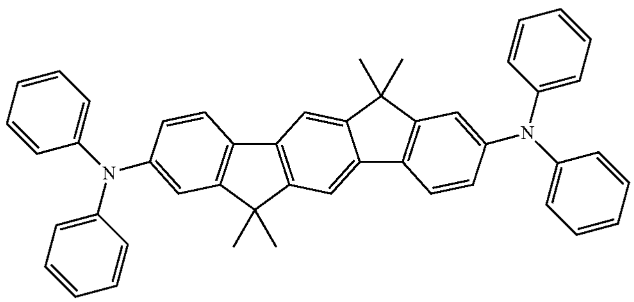 [SMILES: CC1(C)c2cc(N(c3ccccc3)c3ccccc3)ccc2-c2cc3c(cc21)-c1ccc(N(c2ccccc2)c2ccccc2)cc1C3(C)C]
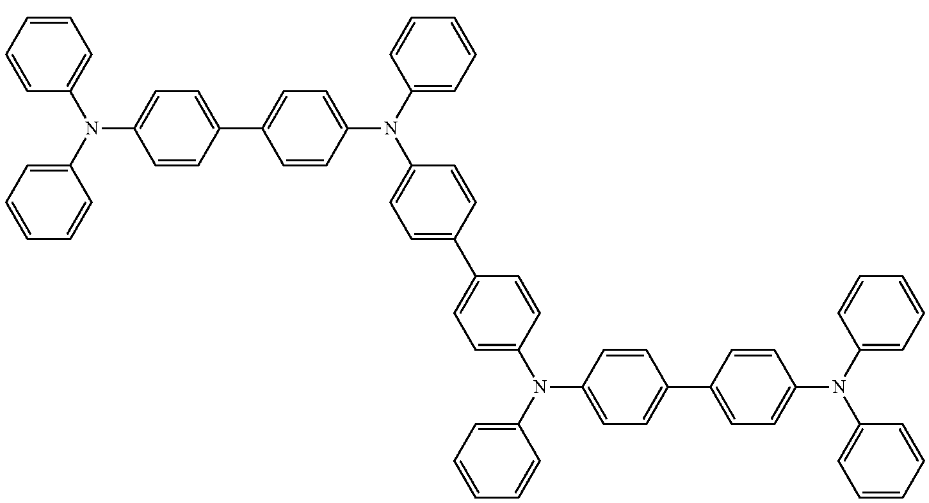 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]

-continued
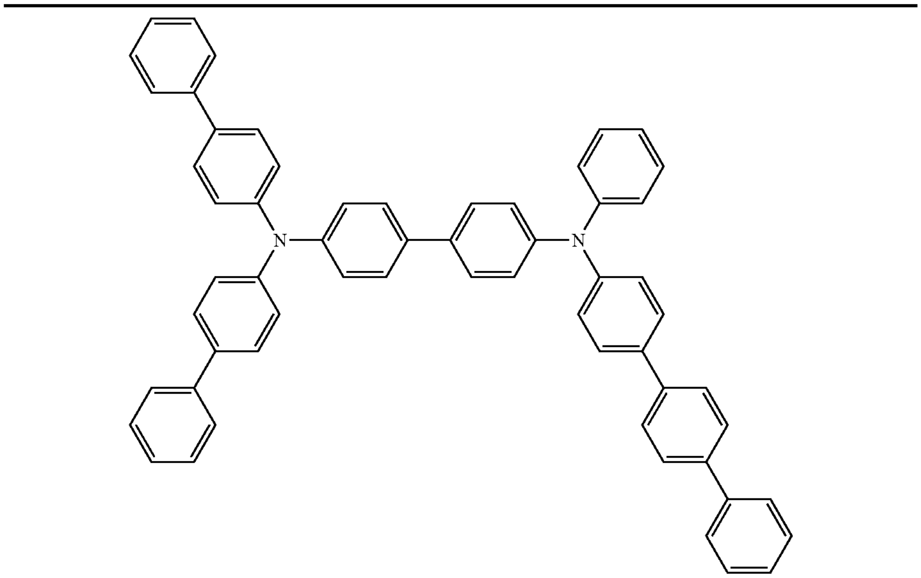
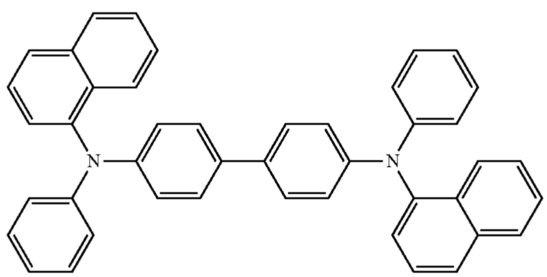 [SMILES: c1ccc(N(c2ccc(-c3ccc(N(c4ccccc4)c4cccc5ccccc45)cc3)cc2)c2cccc3ccccc23)cc1]
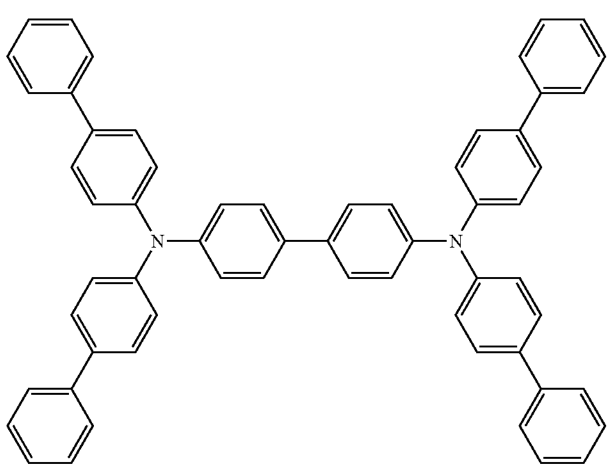 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

-continued
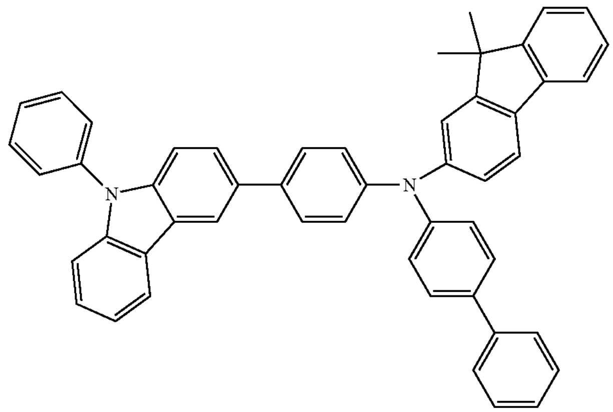 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]
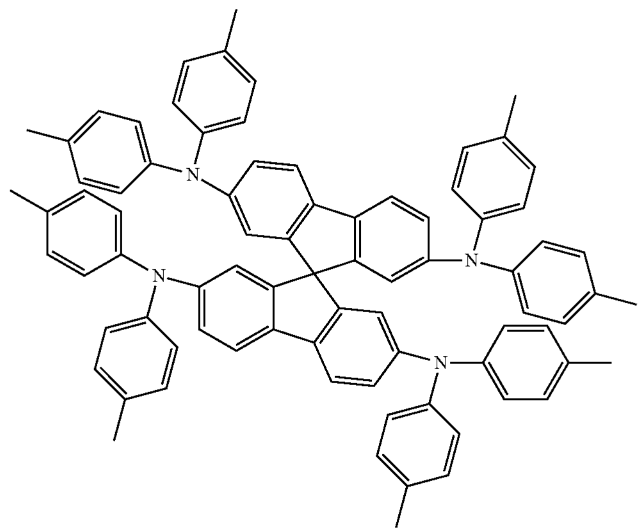
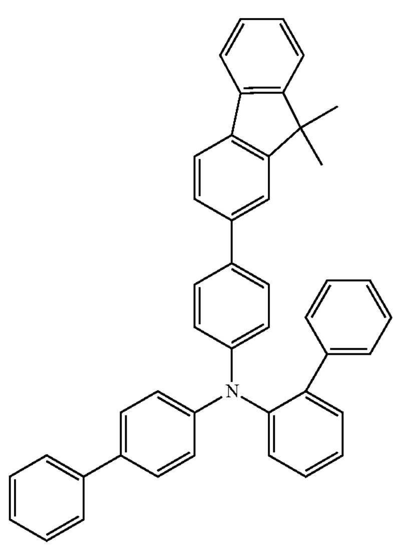 [SMILES: CC1(C)c2ccccc2-c2ccc(-c3ccc(N(c4ccc(-c5ccccc5)cc4)c4ccccc4-c4ccccc4)cc3)cc21]

-continued
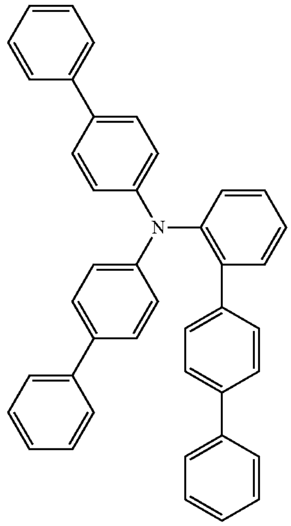 [SMILES: c1ccc(-c2ccc(-c3ccccc3N(c3ccc(-c4ccccc4)cc3)c3ccc(-c4ccccc4)cc3)cc2)cc1]
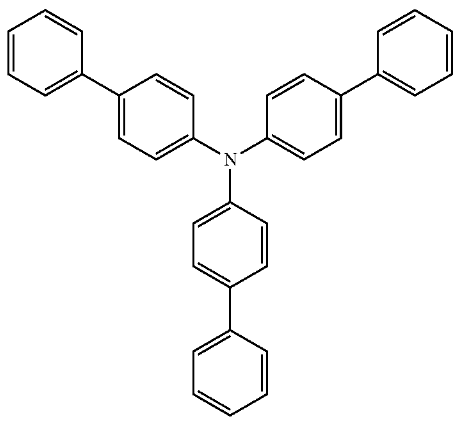 [SMILES: c1ccc(-c2ccc(N(c3ccc(-c4ccccc4)cc3)c3ccc(-c4ccccc4)cc3)cc2)cc1]
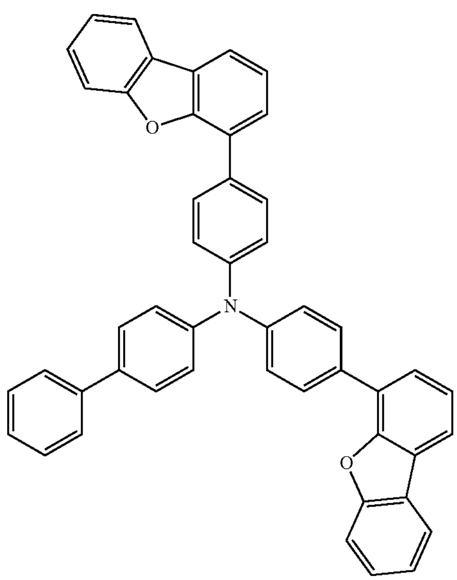 [SMILES: c1ccc(-c2ccc(N(c3ccc(-c4cccc5c4oc4ccccc45)cc3)c3ccc(-c4cccc5c4oc4ccccc45)cc3)cc2)cc1]

-continued
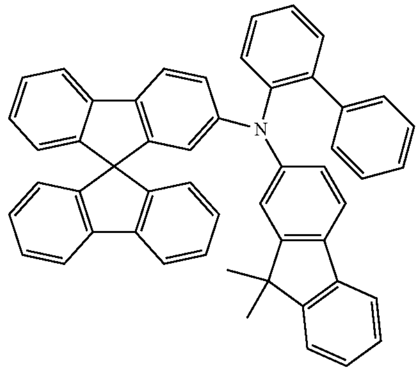 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
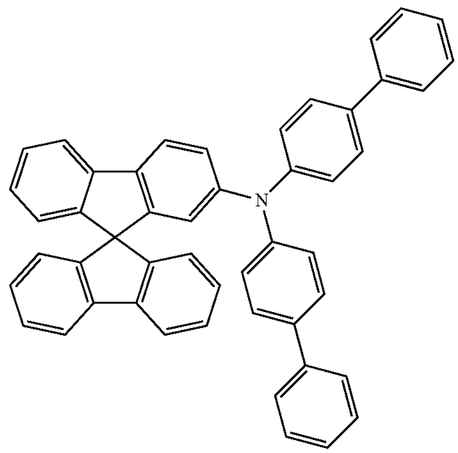 [SMILES: c1ccc(-c2ccc(N(c3ccc(-c4ccccc4)cc3)c3ccc4c(c3)C3(c5ccccc5-c5ccccc53)c3ccccc3-4)cc2)cc1]
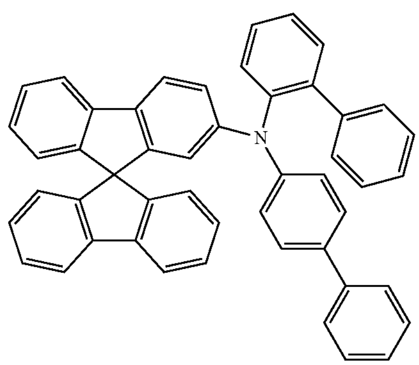 [SMILES: c1ccc(-c2ccc(N(c3ccc4c(c3)C3(c5ccccc5-c5ccccc53)c3ccccc3-4)c3ccccc3-c3ccccc3)cc2)cc1]
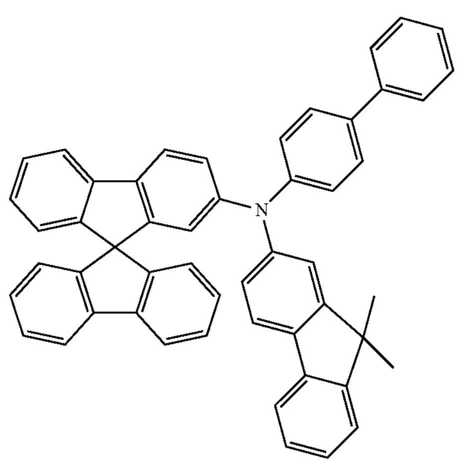 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

-continued
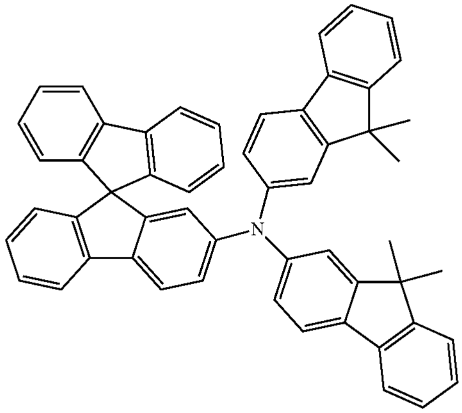 [SMILES: CC1(C)c2ccccc2-c2ccc(N(c3ccc4c(c3)C(C)(C)c3ccccc3-4)c3ccc4c(c3)C3(c5ccccc5-c5ccccc53)c3ccccc3-4)cc21]
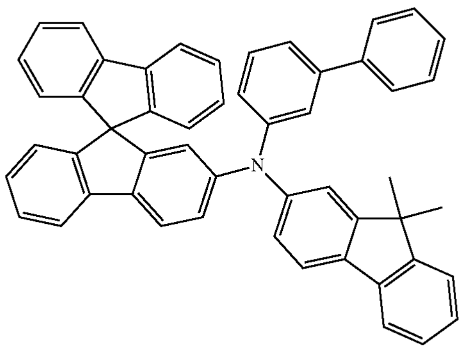 [SMILES: CC1(C)c2ccccc2-c2ccc(N(c3cccc(-c4ccccc4)c3)c3ccc4c(c3)C3(c5ccccc5-c5ccccc53)c3ccccc3-4)cc21]
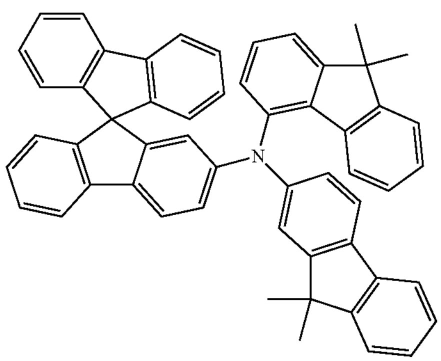 [SMILES: CC1(C)c2ccccc2-c2ccc(N(c3ccc4c(c3)C3(c5ccccc5-c5ccccc53)c3ccccc3-4)c3cccc4c3-c3ccccc3C4(C)C)cc21]
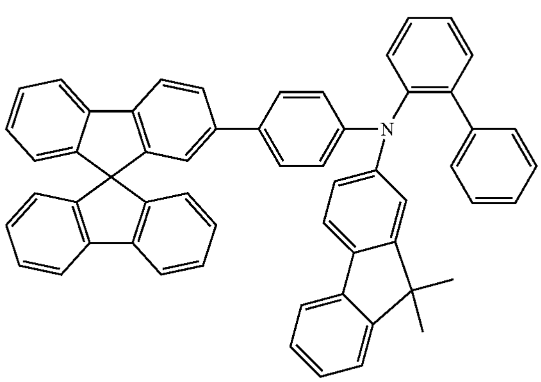 [SMILES: CC1(C)c2ccccc2-c2ccc(N(c3ccc(-c4ccc5c(c4)C4(c6ccccc6-c6ccccc64)c4ccccc4-5)cc3)c3ccccc3-c3ccccc3)cc21]

-continued
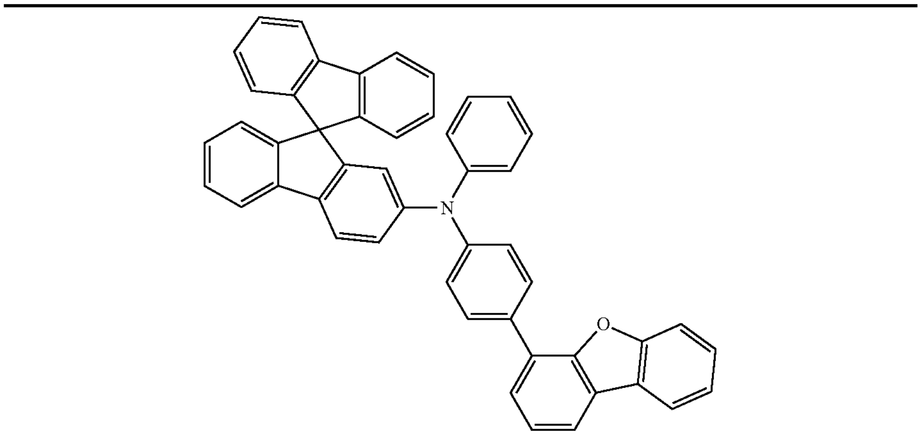
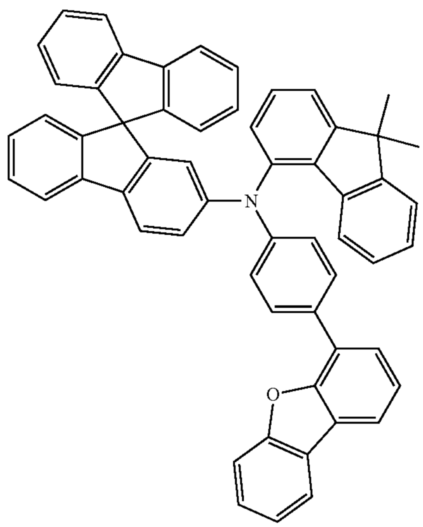 [SMILES: CC1(C)c2ccccc2-c2c(N(c3ccc(-c4cccc5c4oc4ccccc45)cc3)c3ccc4c(c3)C3(c5ccccc5-c5ccccc53)c3ccccc3-4)cccc21]
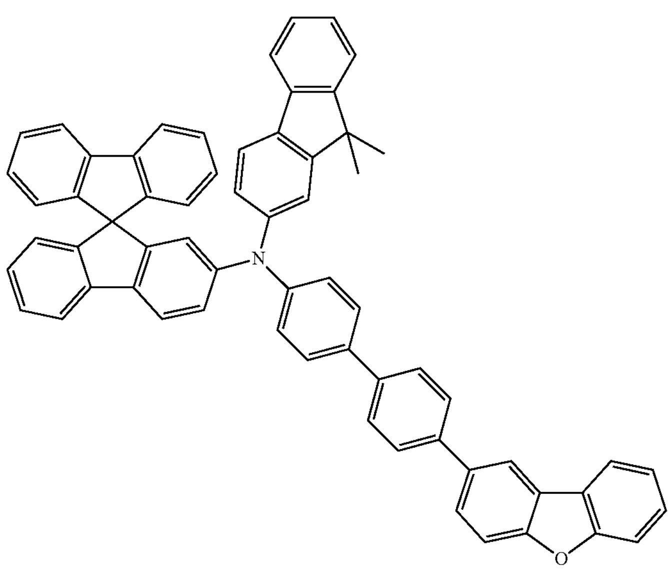

-continued
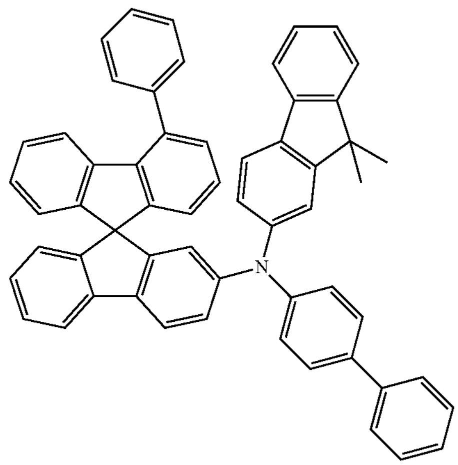
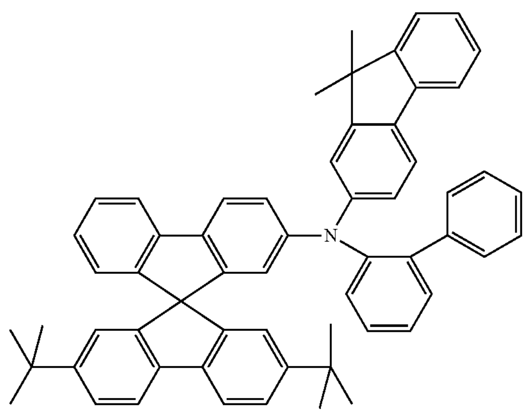 [SMILES: CC(C)(C)c1ccc2c(c1)C1(c3ccccc3-c3ccc(N(c4ccc5c(c4)C(C)(C)c4ccccc4-5)c4ccccc4-c4ccccc4)cc31)c1cc(C(C)(C)C)ccc1-2]
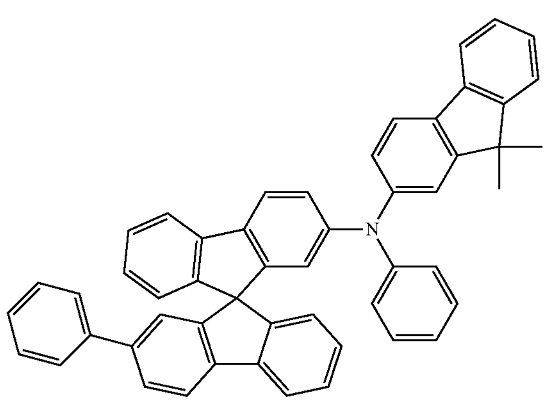 [SMILES: CC1(C)c2ccccc2-c2ccc(N(c3ccccc3)c3ccc4c(c3)C3(c5ccccc5-c5ccc(-c6ccccc6)cc53)c3ccccc3-4)cc21]

-continued
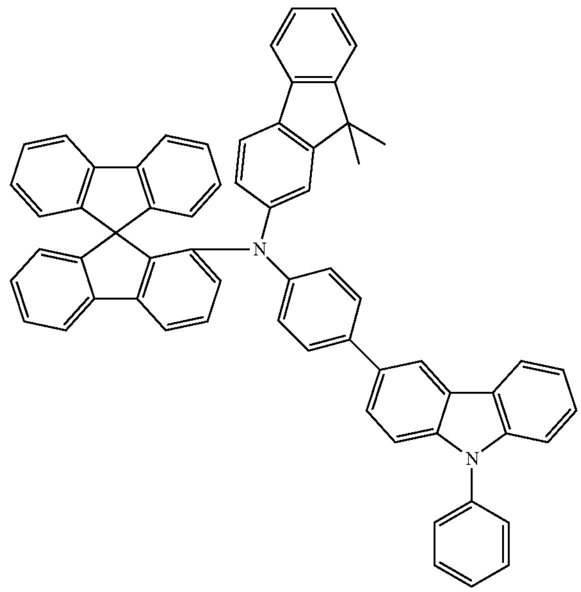 [SMILES: CC1(C)c2ccccc2-c2ccc(N(c3ccc(-c4ccc5c(c4)c4ccccc4n5-c4ccccc4)cc3)c3cccc4c3C3(c5ccccc5-c5ccccc53)c3ccccc3-4)cc21]
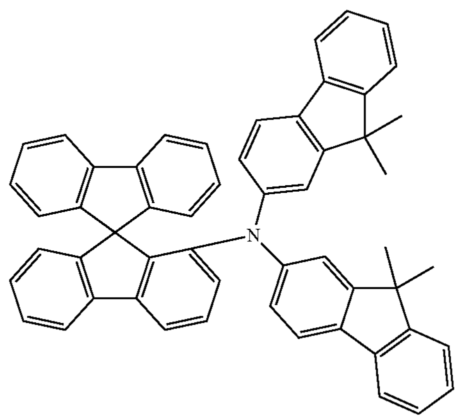 [SMILES: CC1(C)c2ccccc2-c2ccc(N(c3ccc4c(c3)C(C)(C)c3ccccc3-4)c3cccc4c3C3(c5ccccc5-c5ccccc53)c3ccccc3-4)cc21]
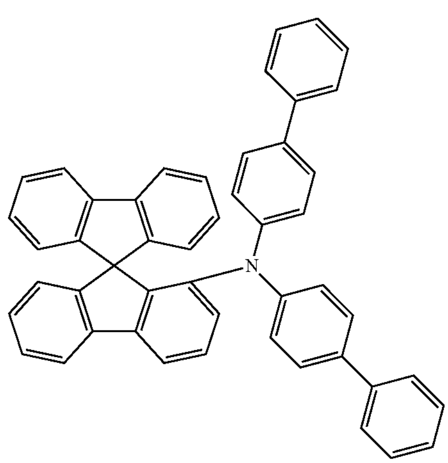 [SMILES: c1ccc(-c2ccc(N(c3ccc(-c4ccccc4)cc3)c3cccc4c3C3(c5ccccc5-c5ccccc53)c3ccccc3-4)cc2)cc1]

-continued
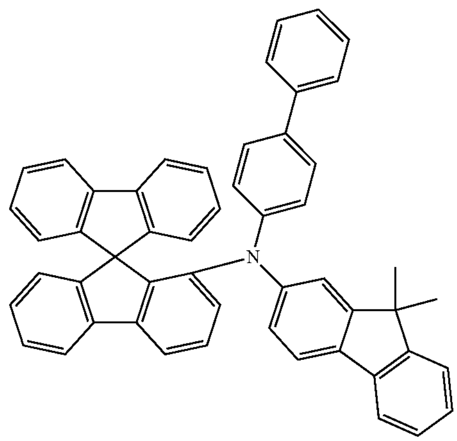 [SMILES: CC1(C)c2ccccc2-c2ccc(N(c3ccc(-c4ccccc4)cc3)c3cccc4c3C3(c5ccccc5-c5ccccc53)c3ccccc3-4)cc21]
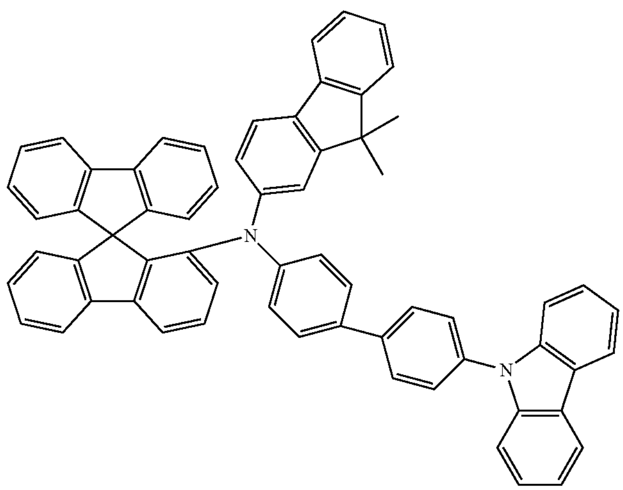 [SMILES: CC1(C)c2ccccc2-c2ccc(N(c3ccc(-c4ccc(-n5c6ccccc6c6ccccc65)cc4)cc3)c3cccc4c3C3(c5ccccc5-c5ccccc53)c3ccccc3-4)cc21]
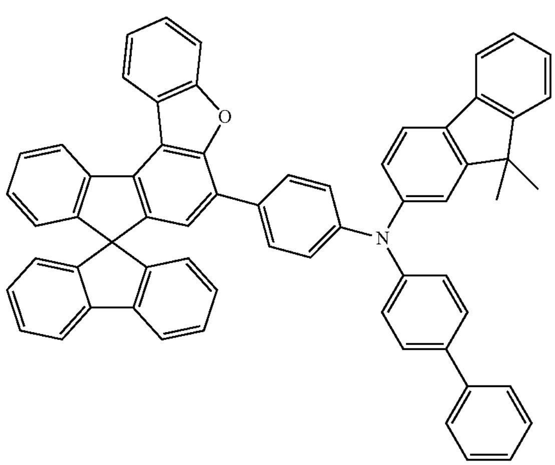 [SMILES: CC1(C)c2ccccc2-c2ccc(N(c3ccc(-c4ccccc4)cc3)c3ccc(-c4cc5c(c6c4oc4ccccc46)-c4ccccc4C54c5ccccc5-c5ccccc54)cc3)cc21]

-continued
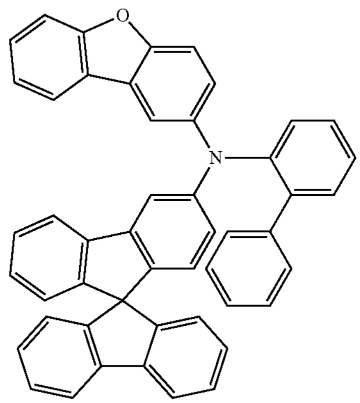 [SMILES: c1ccc(-c2ccccc2N(c2ccc3c(c2)-c2ccccc2C32c3ccccc3-c3ccccc32)c2ccc3oc4ccccc4c3c2)cc1]
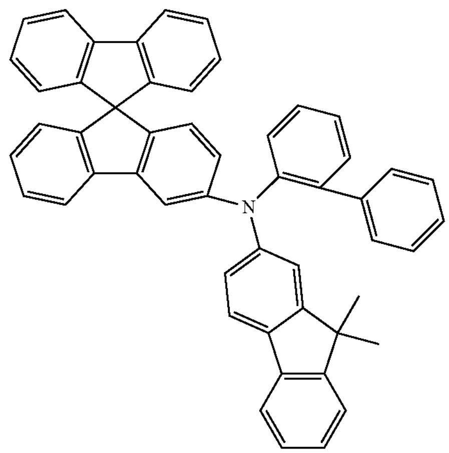 [SMILES: CC1(C)c2ccccc2-c2ccc(N(c3ccc4c(c3)-c3ccccc3C43c4ccccc4-c4ccccc43)c3ccccc3-c3ccccc3)cc21]
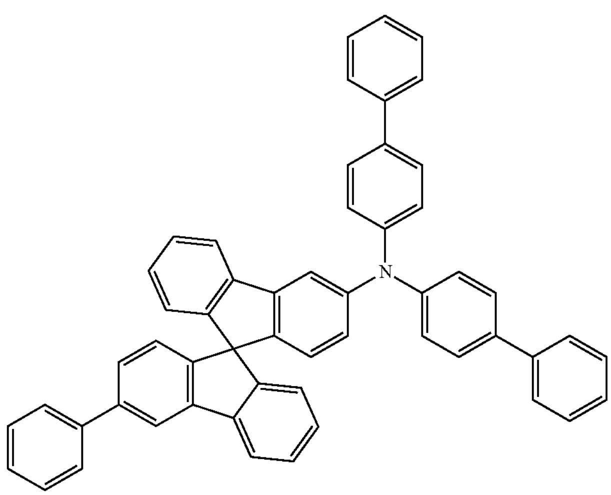 [SMILES: c1ccc(-c2ccc(N(c3ccc(-c4ccccc4)cc3)c3ccc4c(c3)-c3ccccc3C43c4ccccc4-c4cc(-c5ccccc5)ccc43)cc2)cc1]

-continued
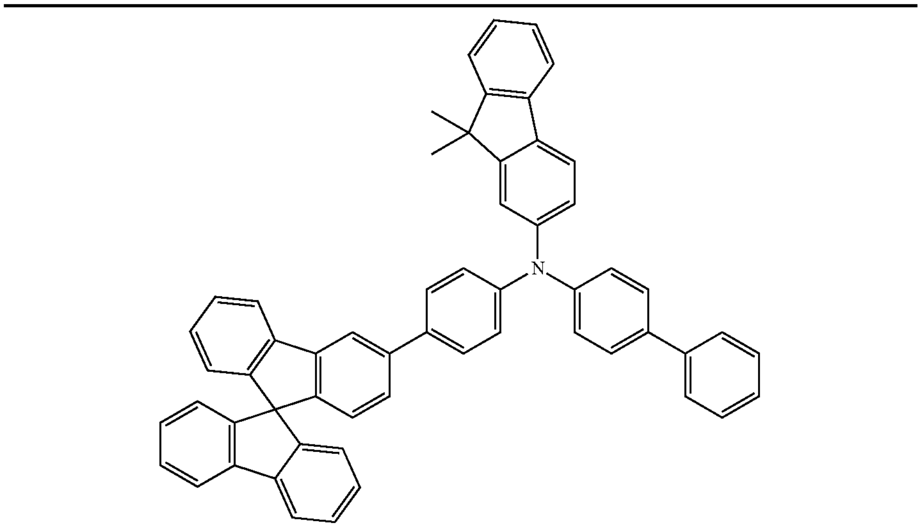
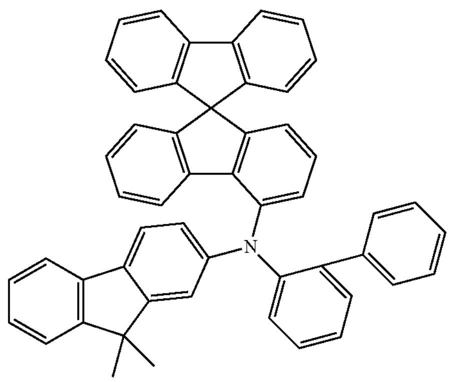 [SMILES: CC1(C)c2ccccc2-c2ccc(N(c3ccccc3-c3ccccc3)c3cccc4c3-c3ccccc3C43c4ccccc4-c4ccccc43)cc21]
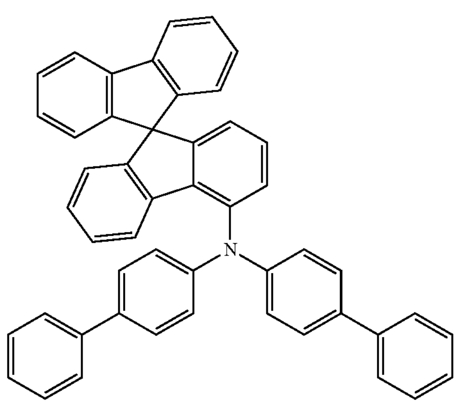 [SMILES: c1ccc(-c2ccc(N(c3ccc(-c4ccccc4)cc3)c3cccc4c3-c3ccccc3C43c4ccccc4-c4ccccc43)cc2)cc1]

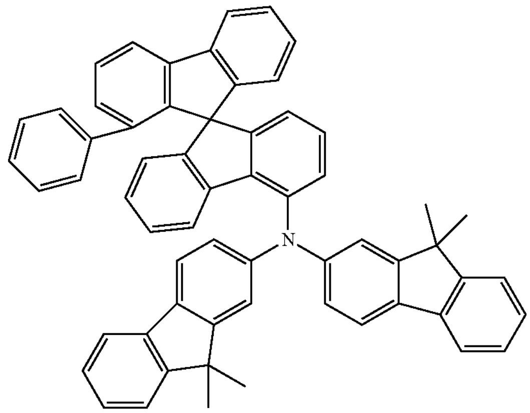 [SMILES: CC1(C)c2ccccc2-c2ccc(N(c3ccc4c(c3)C(C)(C)c3ccccc3-4)c3cccc4c3-c3ccccc3C43c4ccccc4-c4cccc(-c5ccccc5)c43)cc21]
N
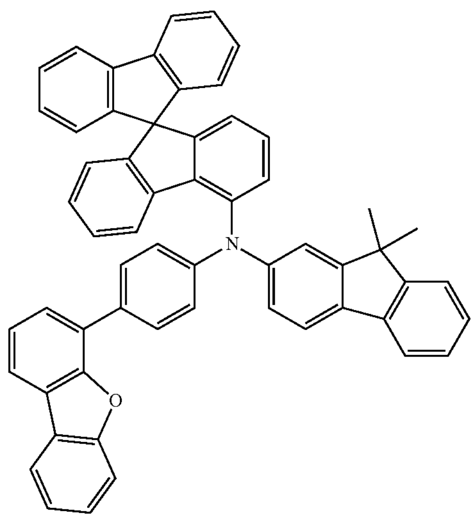 [SMILES: CC1(C)c2ccccc2-c2ccc(N(c3ccc(-c4cccc5c4oc4ccccc45)cc3)c3cccc4c3-c3ccccc3C43c4ccccc4-c4ccccc43)cc21]
N
O
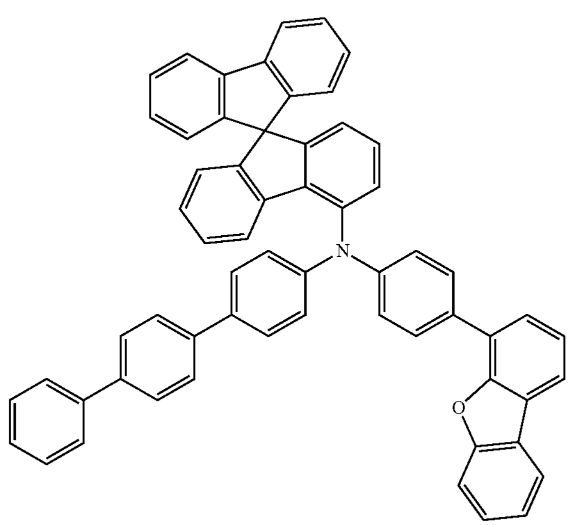 [SMILES: c1ccc(-c2ccc(-c3ccc(N(c4ccc(-c5cccc6c5oc5ccccc56)cc4)c4cccc5c4-c4ccccc4C54c5ccccc5-c5ccccc54)cc3)cc2)cc1]
N
O

-continued
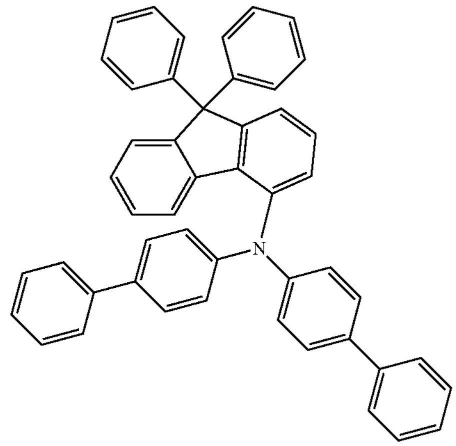 [SMILES: c1ccc(-c2ccc(N(c3ccc(-c4ccccc4)cc3)c3cccc4c3-c3ccccc3C4(c3ccccc3)c3ccccc3)cc2)cc1]
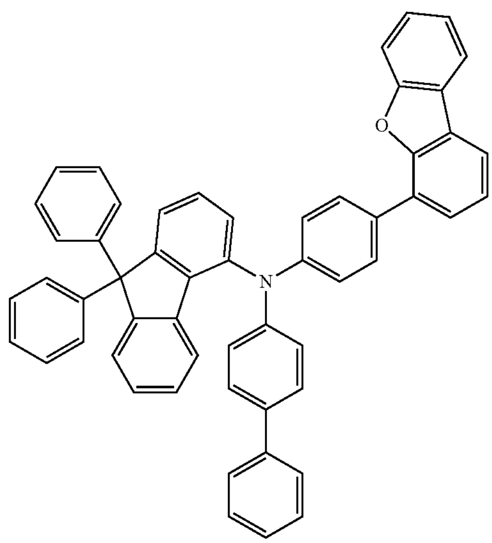 [SMILES: c1ccc(-c2ccc(N(c3ccc(-c4cccc5c4oc4ccccc45)cc3)c3cccc4c3-c3ccccc3C4(c3ccccc3)c3ccccc3)cc2)cc1]
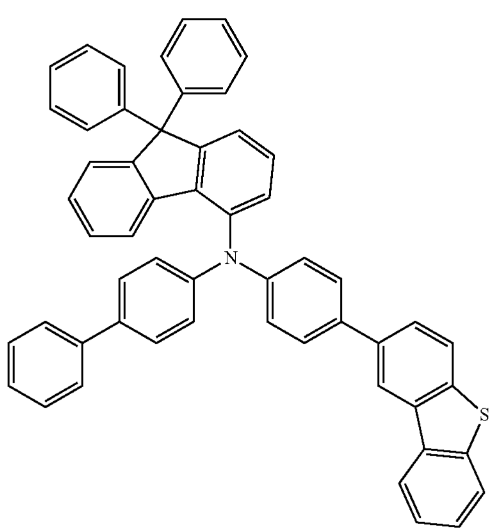 [SMILES: c1ccc(-c2ccc(N(c3ccc(-c4ccc5sc6ccccc6c5c4)cc3)c3cccc4c3-c3ccccc3C4(c3ccccc3)c3ccccc3)cc2)cc1]

-continued
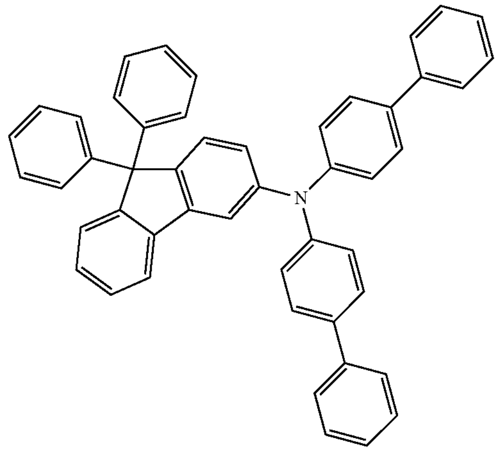 [SMILES: c1ccc(-c2ccc(N(c3ccc(-c4ccccc4)cc3)c3ccc4c(c3)-c3ccccc3C4(c3ccccc3)c3ccccc3)cc2)cc1]
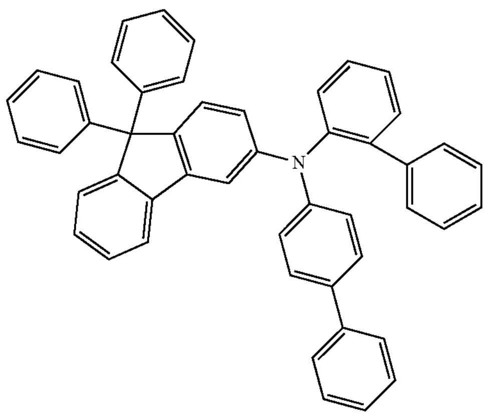 [SMILES: c1ccc(-c2ccc(N(c3ccc4c(c3)-c3ccccc3C4(c3ccccc3)c3ccccc3)c3ccccc3-c3ccccc3)cc2)cc1]
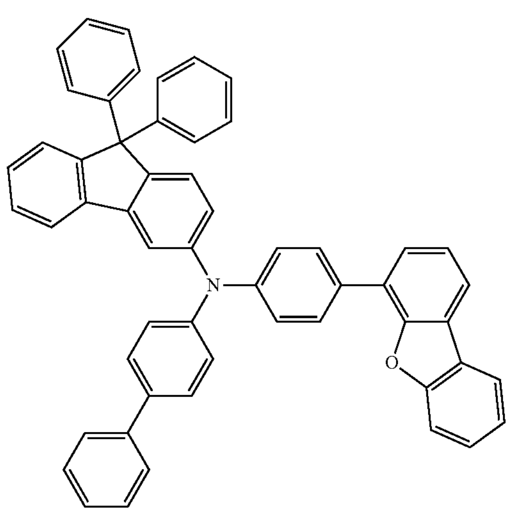 [SMILES: c1ccc(-c2ccc(N(c3ccc(-c4cccc5c4oc4ccccc45)cc3)c3ccc4c(c3)-c3ccccc3C4(c3ccccc3)c3ccccc3)cc2)cc1]

-continued
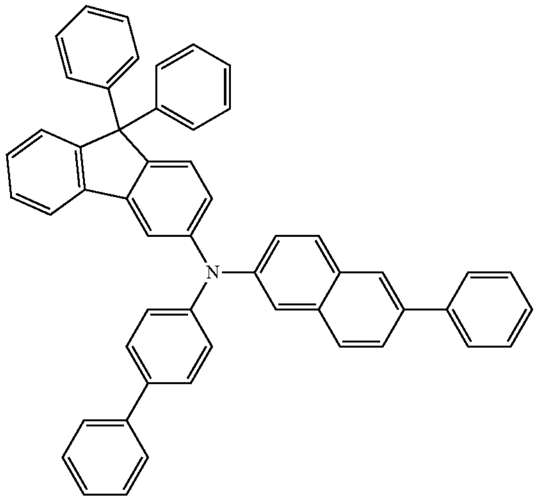 [SMILES: c1ccc(-c2ccc(N(c3ccc4c(c3)-c3ccccc3C4(c3ccccc3)c3ccccc3)c3ccc4cc(-c5ccccc5)ccc4c3)cc2)cc1]
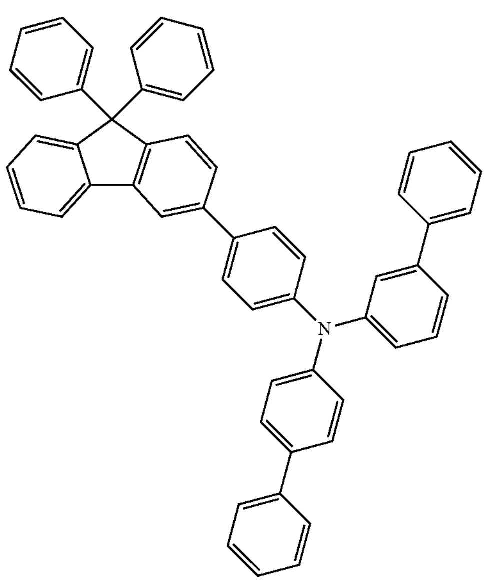 [SMILES: c1ccc(-c2ccc(N(c3ccc(-c4ccc5c(c4)-c4ccccc4C5(c4ccccc4)c4ccccc4)cc3)c3cccc(-c4ccccc4)c3)cc2)cc1]

-continued
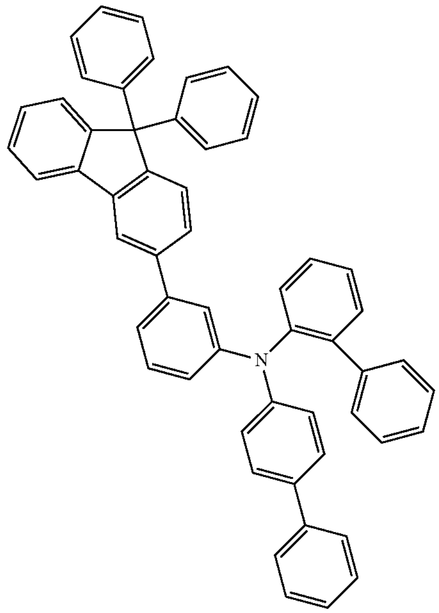 [SMILES: c1ccc(-c2ccc(N(c3cccc(-c4ccc5c(c4)-c4ccccc4C5(c4ccccc4)c4ccccc4)c3)c3ccccc3-c3ccccc3)cc2)cc1]
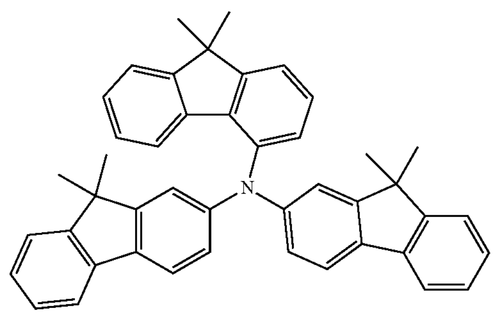 [SMILES: CC1(C)c2ccccc2-c2ccc(N(c3ccc4c(c3)C(C)(C)c3ccccc3-4)c3cccc4c3-c3ccccc3C4(C)C)cc21]
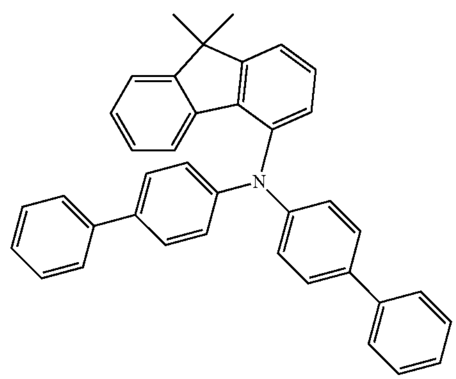 [SMILES: CC1(C)c2ccccc2-c2c(N(c3ccc(-c4ccccc4)cc3)c3ccc(-c4ccccc4)cc3)cccc21]
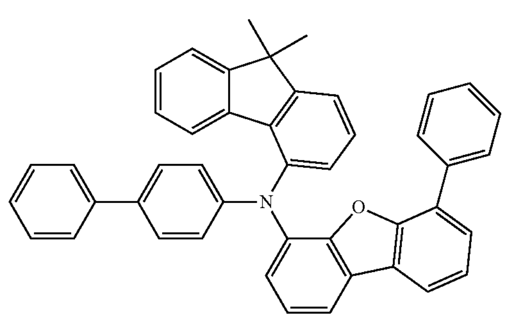 [SMILES: CC1(C)c2ccccc2-c2c(N(c3ccc(-c4ccccc4)cc3)c3cccc4c3oc3c(-c5ccccc5)cccc34)cccc21]

-continued
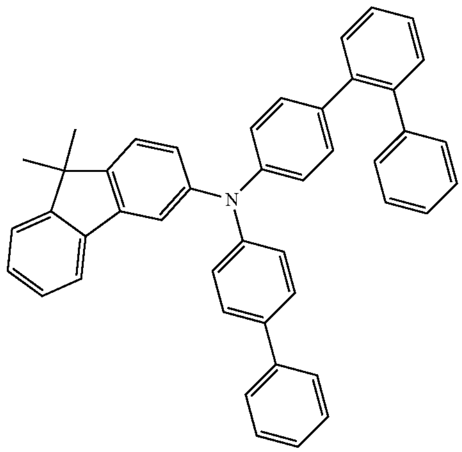 [SMILES: CC1(C)c2ccccc2-c2cc(N(c3ccc(-c4ccccc4)cc3)c3ccc(-c4ccccc4-c4ccccc4)cc3)ccc21]
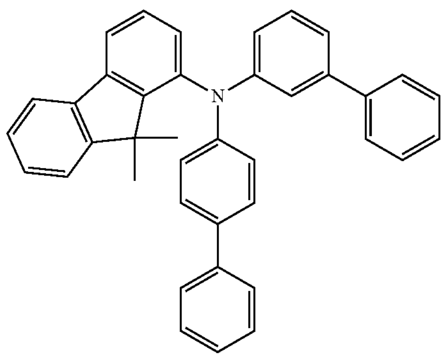 [SMILES: CC1(C)c2ccccc2-c2cccc(N(c3ccc(-c4ccccc4)cc3)c3cccc(-c4ccccc4)c3)c21]
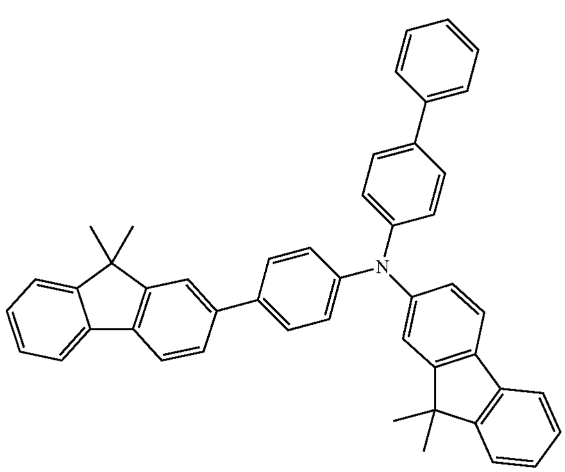 [SMILES: CC1(C)c2ccccc2-c2ccc(-c3ccc(N(c4ccc(-c5ccccc5)cc4)c4ccc5c(c4)C(C)(C)c4ccccc4-5)cc3)cc21]

-continued
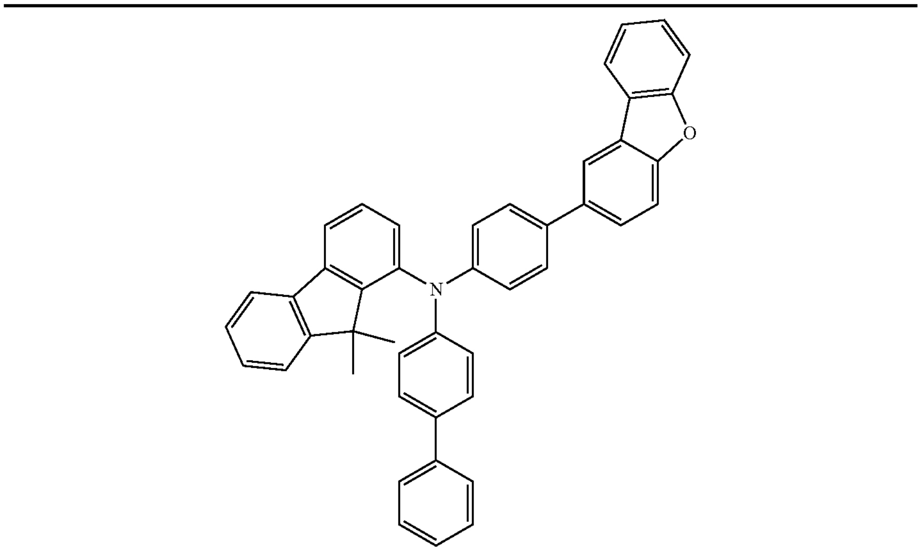
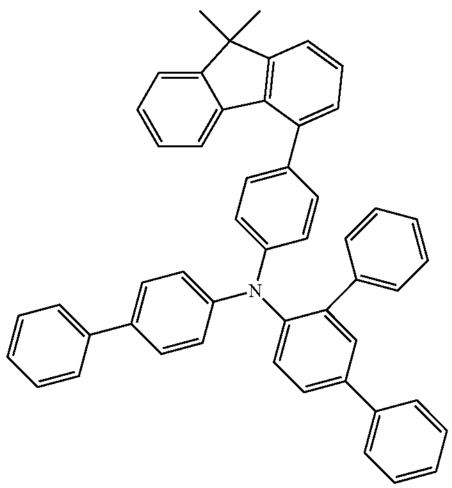 [SMILES: CC1(C)c2ccccc2-c2c(-c3ccc(N(c4ccc(-c5ccccc5)cc4)c4ccc(-c5ccccc5)cc4-c4ccccc4)cc3)cccc21]
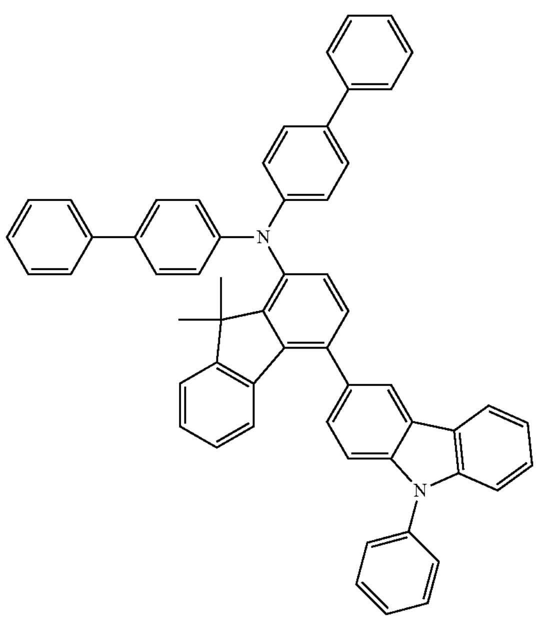 [SMILES: CC1(C)c2ccccc2-c2c(-c3ccc4c(c3)c3ccccc3n4-c3ccccc3)ccc(N(c3ccc(-c4ccccc4)cc3)c3ccc(-c4ccccc4)cc3)c21]

-continued
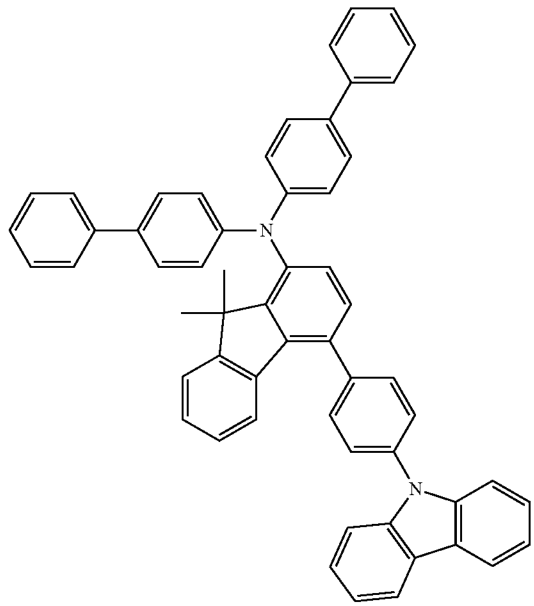 [SMILES: CC1(C)c2ccccc2-c2c(-c3ccc(-n4c5ccccc5c5ccccc54)cc3)ccc(N(c3ccc(-c4ccccc4)cc3)c3ccc(-c4ccccc4)cc3)c21]
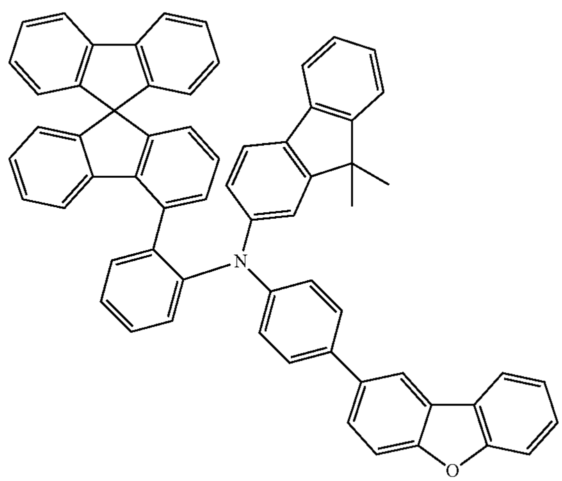 [SMILES: CC1(C)c2ccccc2-c2ccc(N(c3ccc(-c4ccc5oc6ccccc6c5c4)cc3)c3ccccc3-c3cccc4c3-c3ccccc3C43c4ccccc4-c4ccccc43)cc21]
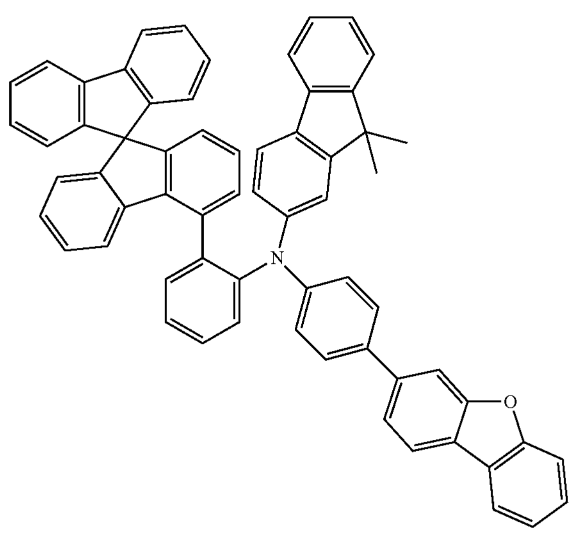 [SMILES: CC1(C)c2ccccc2-c2ccc(N(c3ccc(-c4ccc5c(c4)oc4ccccc45)cc3)c3ccccc3-c3cccc4c3-c3ccccc3C43c4ccccc4-c4ccccc43)cc21]

-continued

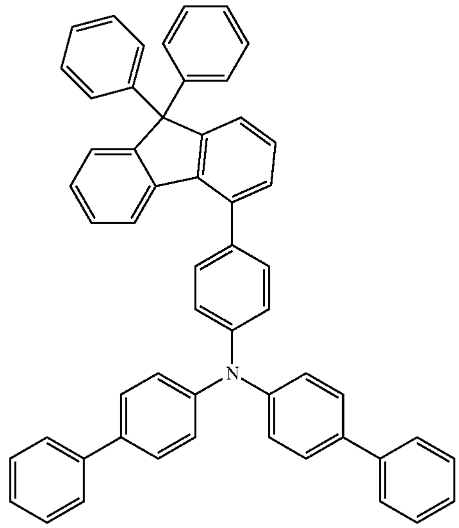 [SMILES: c1ccc(-c2ccc(N(c3ccc(-c4ccccc4)cc3)c3ccc(-c4cccc5c4-c4ccccc4C5(c4ccccc4)c4ccccc4)cc3)cc2)cc1]

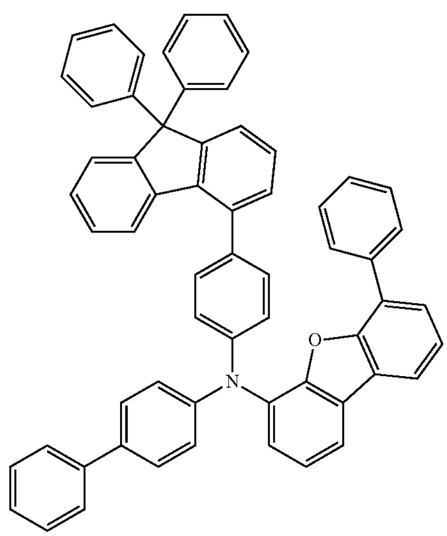 [SMILES: c1ccc(-c2ccc(N(c3ccc(-c4cccc5c4-c4ccccc4C5(c4ccccc4)c4ccccc4)cc3)c3cccc4c3oc3c(-c5ccccc5)cccc34)cc2)cc1]

Suitable materials for hole blocker layers, electron transport layers and electron injection layers of the electronic device are especially aluminium complexes, for example $Alq_3$, zirconium complexes, for example $Zrq_4$, lithium complexes, for example Liq, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Examples of specific compounds for use in these layers are shown in the following table:

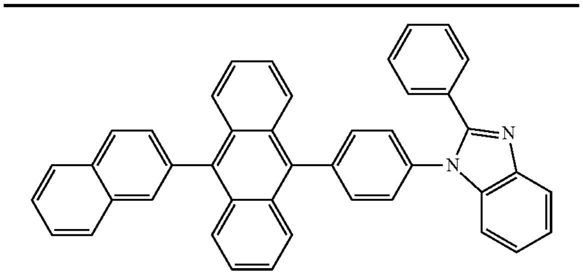

-continued
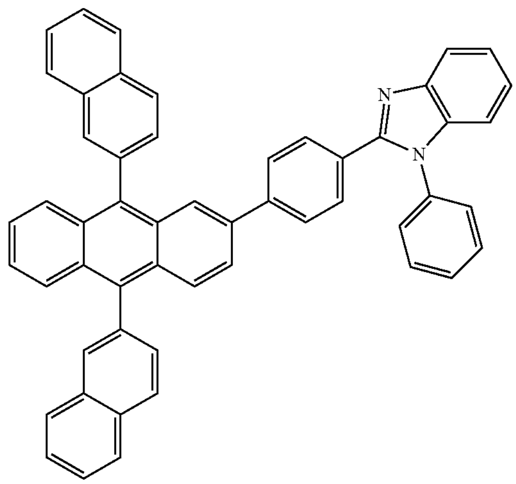 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]
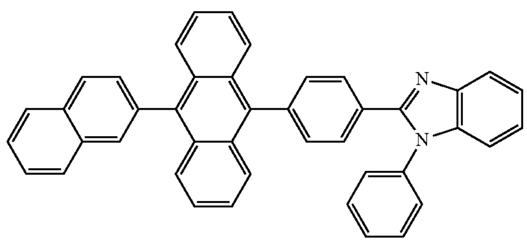 [SMILES: c1ccc(-n2c(-c3ccc(-c4c5ccccc5c(-c5ccc6ccccc6c5)c5ccccc45)cc3)nc3ccccc32)cc1]
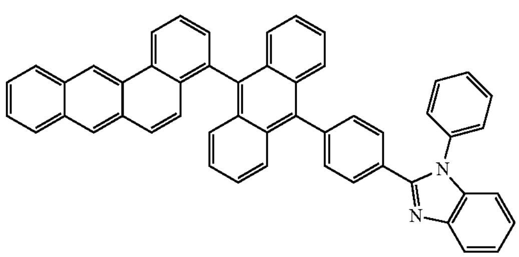 [SMILES: c1ccc(-n2c(-c3ccc(-c4c5ccccc5c(-c5cccc6c5ccc5cc7ccccc7cc56)c5ccccc45)cc3)nc3ccccc32)cc1]
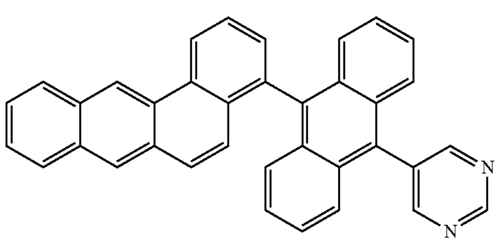 [SMILES: c1ccc2cc3c(ccc4c(-c5c6ccccc6c(-c6cncnc6)c6ccccc56)cccc43)cc2c1]
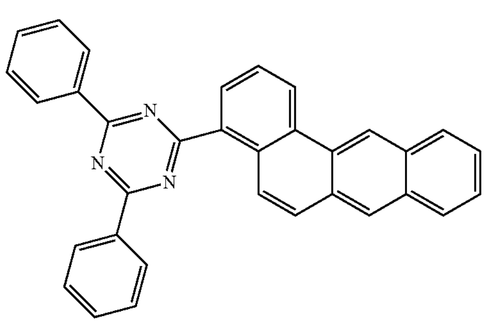 [SMILES: c1ccc(-c2nc(-c3ccccc3)nc(-c3cccc4c3ccc3cc5ccccc5cc34)n2)cc1]
-continued
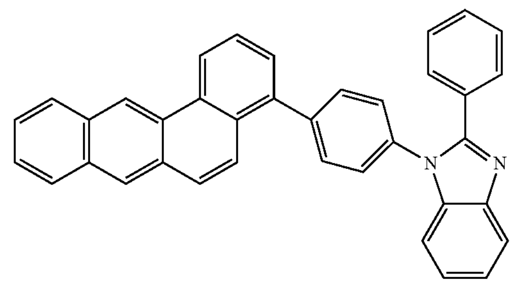 [SMILES: c1ccc(-c2nc3ccccc3n2-c2ccc(-c3cccc4c3ccc3cc5ccccc5cc34)cc2)cc1]
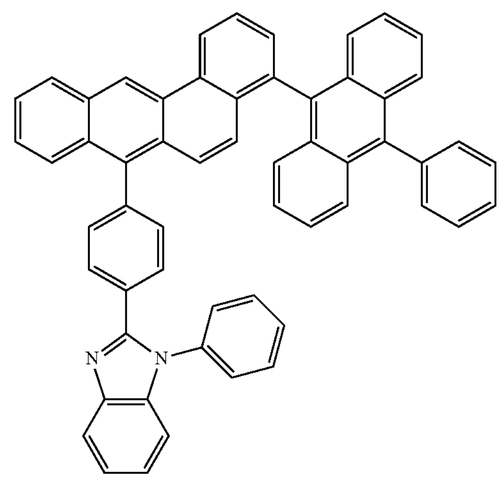 [SMILES: c1ccc(-c2c3ccccc3c(-c3cccc4c3ccc3c(-c5ccc(-c6nc7ccccc7n6-c6ccccc6)cc5)c5ccccc5cc34)c3ccccc23)cc1]
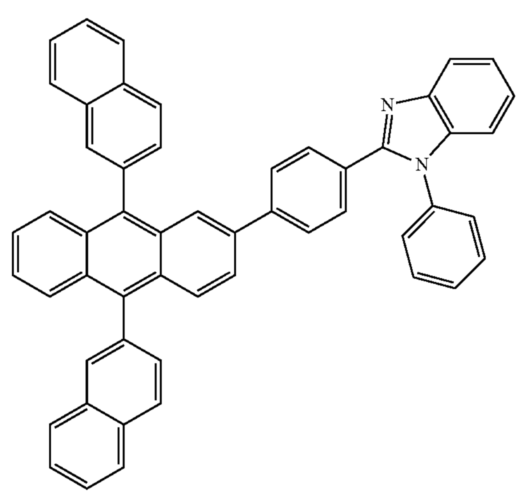 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

-continued
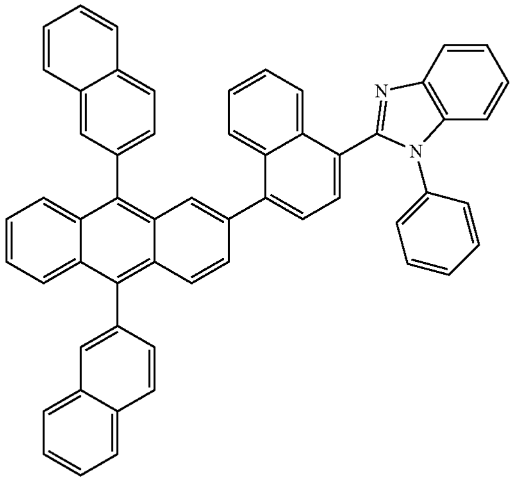 [SMILES: c1ccc(-n2c(-c3ccc(-c4ccc5c(-c6ccc7ccccc7c6)c6ccccc6c(-c6ccc7ccccc7c6)c5c4)c4ccccc34)nc3ccccc32)cc1]
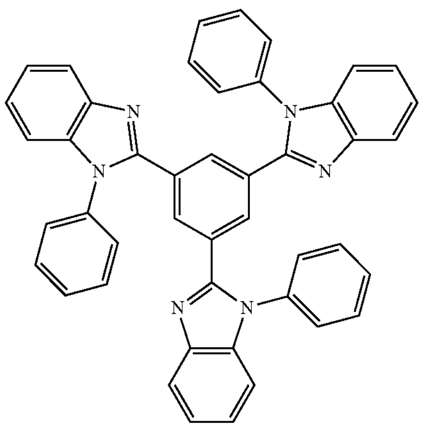 [SMILES: c1ccc(-n2c(-c3cc(-c4nc5ccccc5n4-c4ccccc4)cc(-c4nc5ccccc5n4-c4ccccc4)c3)nc3ccccc32)cc1]
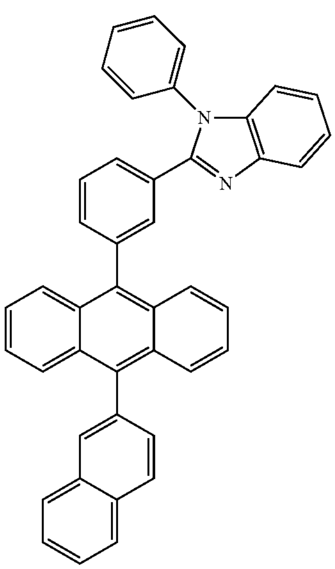 [SMILES: c1ccc(-n2c(-c3cccc(-c4c5ccccc5c(-c5ccc6ccccc6c5)c5ccccc45)c3)nc3ccccc32)cc1]
-continued
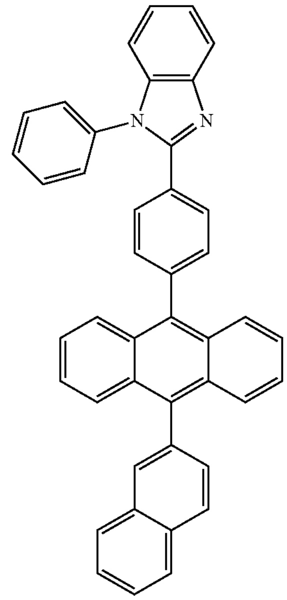 [SMILES: c1ccc(-n2c(-c3ccc(-c4c5ccccc5c(-c5ccc6ccccc6c5)c5ccccc45)cc3)nc3ccccc32)cc1]
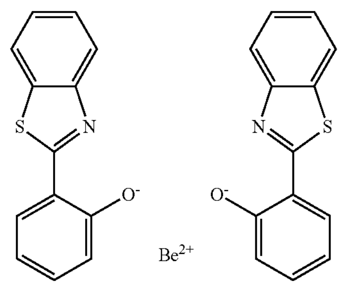
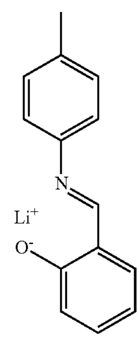 [SMILES: [Li+] ; Cc1ccc(/N=C/c2ccccc2[O-])cc1]
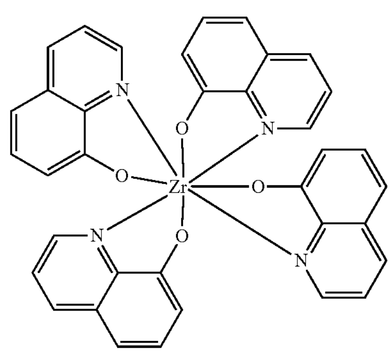

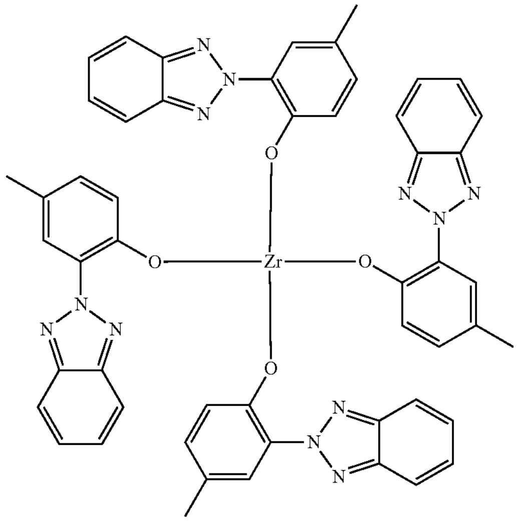
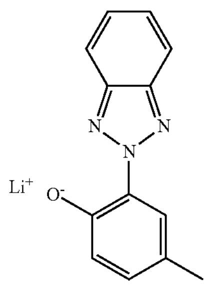 [SMILES: [Li+] ; Cc1ccc([O-])c(-n2nc3ccccc3n2)c1]
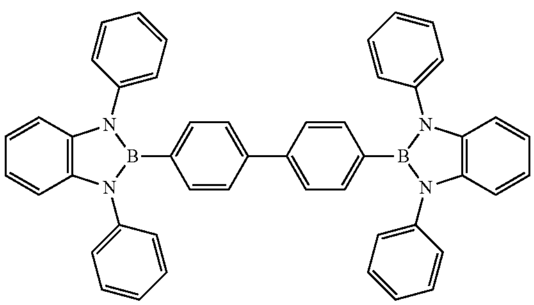 [SMILES: c1ccc(N2B(c3ccc(-c4ccc(B5N(c6ccccc6)c6ccccc6N5c5ccccc5)cc4)cc3)N(c3ccccc3)c3ccccc32)cc1]
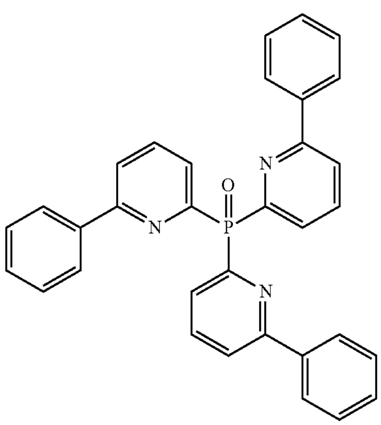 [SMILES: O=P(c1cccc(-c2ccccc2)n1)(c1cccc(-c2ccccc2)n1)c1cccc(-c2ccccc2)n1]
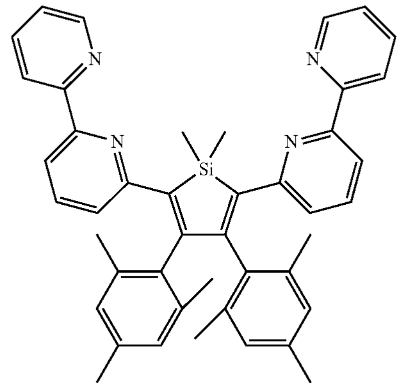 [SMILES: Cc1cc(C)c(C2=C(c3cccc(-c4ccccn4)n3)[Si](C)(C)C(c3cccc(-c4ccccn4)n3)=C2c2c(C)cc(C)cc2C)c(C)c1]
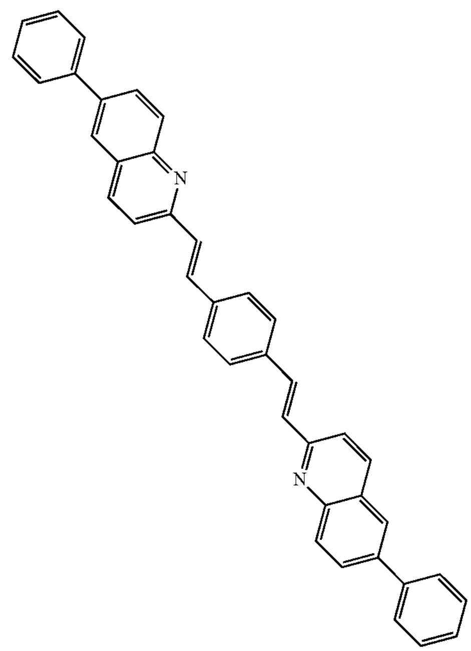 [SMILES: C(=C\c1ccc2cc(-c3ccccc3)ccc2n1)/c1ccc(/C=C/c2ccc3cc(-c4ccccc4)ccc3n2)cc1]
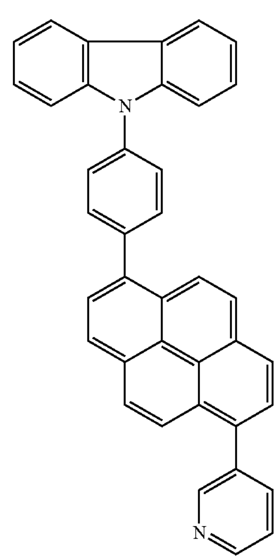 [SMILES: c1cncc(-c2ccc3ccc4c(-c5ccc(-n6c7ccccc7c7ccccc76)cc5)ccc5ccc2c3c54)c1]

-continued

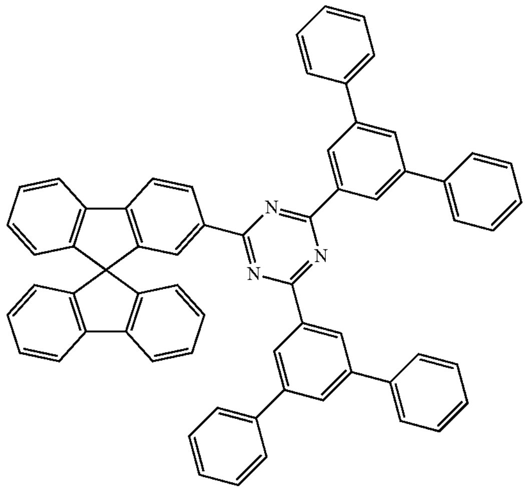 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]

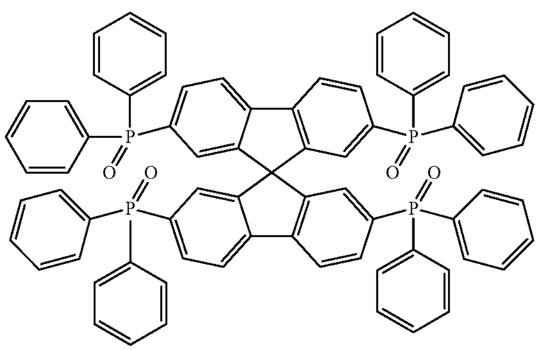

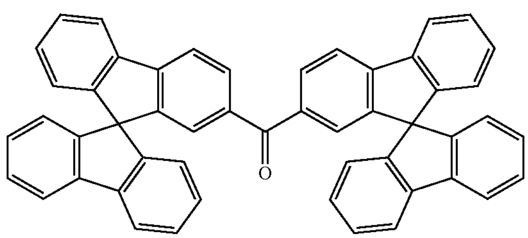 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2]

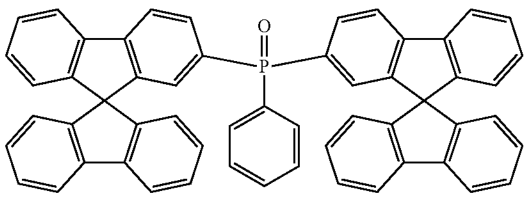 [SMILES: O=P(c1ccccc1)(c1ccc2c(c1)C1(c3ccccc3-c3ccccc31)c1ccccc1-2)c1ccc2c(c1)C1(c3ccccc3-c3ccccc31)c1ccccc1-2]

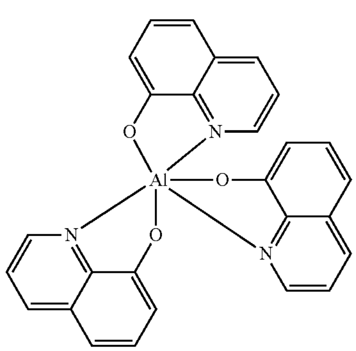

In a preferred embodiment, the electronic device is characterized in that one or more layers are applied by a sublimation process. In this case, the materials are applied by vapour deposition in vacuum sublimation systems at an initial pressure of less than $10^{-5}$ mbar, preferably less than $10^{-6}$ mbar. In this case, however, it is also possible that the initial pressure is even lower, for example less than $10^{-7}$ mbar.

Preference is likewise given to an electronic device, characterized in that one or more layers are applied by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., Appl. Phys. Lett. 2008, 92, 053301).

Preference is additionally given to an electronic device, characterized in that one or more layers are produced from solution, for example by spin-coating, or by any printing method, for example screen printing, flexographic printing, nozzle printing or offset printing, but more preferably LITI (light-induced thermal imaging, thermal transfer printing) or inkjet printing. For this purpose, soluble compounds are needed. High solubility can be achieved by suitable substitution of the compounds.

It is further preferable that an electronic device of the invention is produced by applying one or more layers from solution and one or more layers by a sublimation method.

After application of the layers (according to the use), the device is structured, contact-connected and finally sealed, in order to rule out damaging effects of water and air.

The electronic devices of the invention are preferably used in displays, as light sources in lighting applications or as light sources in medical and/or cosmetic applications.

EXAMPLES

1) General Production Process for the OLEDs and Characterization of the OLEDs

Glass plaques which have been coated with structured ITO (indium tin oxide) in a thickness of 50 nm are the substrates to which the OLEDs are applied.

The OLEDs basically have the following layer structure: substrate/hole injection layer (HIL)/hole transport layer (HTL)/electron blocker layer (EBL)/emission layer (EML)/electron transport layer (ETL)/electron injection layer (EIL) and finally a cathode. The cathode is formed by an aluminium layer of thickness 100 nm. The exact structure of the OLEDs can be found in the Table 1.

All materials are applied by thermal vapour deposition in a vacuum chamber. The emission layer here, in the present examples, consists of a matrix material (host material) and an emitting dopant (emitter) which is added to the matrix material in a particular proportion by volume by co-evaporation. Details given in such a form as SMB1:SEB1 (3%) mean here that the material SMB1 is present in the layer in a proportion by volume of 97% and the material SEB1 in a proportion by volume of 3%. Analogously, the electron transport layer and, in the examples according to the application, the HTL as well also consist of a mixture of two materials, where the proportions of the materials are reported as specified above.

The chemical structures of the materials that are used in the OLEDs are shown in Table 2.

The OLEDs are characterized in a standard manner. For this purpose, the electroluminescence spectra, the operating voltage and the lifetime are determined. The parameter U @ 10 mA/cm² refers to the operating voltage at 10 mA/cm². The lifetime LT is defined as the time after which the luminance drops from the starting luminance to a certain proportion in the course of operation with constant current density. An LT80 figure means here that the lifetime reported corresponds to the time after which the luminance has dropped to 80% of its starting value. The figure @60 mA/cm² means here that the lifetime in question is measured at 60 mA/cm².

2) OLEDs with a Mixture of Two Different Materials in the HTL and Comparative Examples with a Single Material in HTL OLEDs containing a mixture of two different materials in the HTL and comparative OLEDs containing a single material in the HTL are produced in each case, see the following table:

| | U @ 10 mA/cm² [V] | LT80 @ 60 mA/cm² [h] |
|---|---|---|
| C1 | 3.6 | 217 |
| I1 | 3.8 | 288 |
| I2 | 3.7 | 349 |
| C2 | 4.0 | 161 |
| I3 | 4.0 | 323 |
| I4 | 3.9 | 418 |
| I5 | 3.9 | 343 |
| C3 | 3.7 | 163 |
| I6 | 3.6 | 441 |
| I7 | 3.6 | 551 |
| I8 | 3.6 | 455 |
| C4 | 3.8 | 233 |
| I9 | 3.7 | 399 |
| I10 | 3.7 | 490 |
| I11 | 3.7 | 428 |

TABLE 1

| Ex. | HIL Thickness/nm | HTL Thickness/nm | EBL Thickness/nm | EML Thickness/nm | ETL Thickness/nm | EIL Thickness/nm |
|---|---|---|---|---|---|---|
| C1 | HIL1 5 nm | HTM1 175 nm | HTM4 10 nm | SMB1:SEB1(3%) 20 nm | ETM:LiQ(50%) 30 nm | LiQ 1 nm |
| I1 | HIL1 5 nm | HTM1:HTM2(20%) 175 nm | HTM4 10 nm | SMB1:SEB1(3%) 20 nm | ETM:LiQ(50%) 30 nm | LiQ 1 nm |
| I2 | HIL1 5 nm | HTM1:HTM4(20%) 175 nm | HTM4 10 nm | SMB1:SEB1(3%) 20 nm | ETM:LiQ(50%) 30 nm | LiQ 1 nm |
| C2 | HIL1 5 nm | HTM1 175 nm | HTM9 10 nm | SMB1:SEB1(3%) 20 nm | ETM:LiQ(50%) 30 nm | LiQ 1 nm |
| I3 | HIL1 5 nm | HTM1:HTM2(20%) 175 nm | HTM9 10 nm | SMB1:SEB1(3%) 20 nm | ETM:LiQ(50%) 30 nm | LiQ 1 nm |
| I4 | HIL1 5 nm | HTM1:HTM4(20%) 175 nm | HTM9 10 nm | SMB1:SEB1(3%) 20 nm | ETM:LiQ(50%) 30 nm | LiQ 1 nm |
| I5 | HIL1 5 nm | HTM1:HTM8(20%) 175 nm | HTM9 10 nm | SMB1:SEB1(3%) 20 nm | ETM:LiQ(50%) 30 nm | LiQ 1 nm |
| C3 | HIL1 5 nm | HTM1 175 nm | HTM2 10 nm | SMB1:SEB1(3%) 20 nm | ETM:LiQ(50%) 30 nm | LiQ 1 nm |
| I6 | HIL1 5 nm | HTM1:HTM2(20%) 175 nm | HTM2 10 nm | SMB1:SEB1(3%) 20 nm | ETM:LiQ(50%) 30 nm | LiQ 1 nm |
| I7 | HIL1 5 nm | HTM1:HTM4(20%) 175 nm | HTM2 10 nm | SMB1:SEB1(3%) 20 nm | ETM:LiQ(50%) 30 nm | LiQ 1 nm |
| I8 | HIL1 5 nm | HTM1:HTM8(20%) 175 nm | HTM2 10 nm | SMB1:SEB1(3%) 20 nm | ETM:LiQ(50%) 30 nm | LiQ 1 nm |
| C4 | HIL1 5 nm | HTM1 175 nm | HTM8 10 nm | SMB1:SEB1(3%) 20 nm | ETM:LiQ(50%) 30 nm | LiQ 1 nm |
| I9 | HIL1 5 nm | HTM1:HTM2(20%) 175 nm | HTM8 10 nm | SMB1:SEB1(3%) 20 nm | ETM:LiQ(50%) 30 nm | LiQ 1 nm |
| I10 | HIL1 5 nm | HTM1:HTM4(20%) 175 nm | HTM8 10 nm | SMB1:SEB1(3%) 20 nm | ETM:LiQ(50%) 30 nm | LiQ 1 nm |
| I11 | HIL1 5 nm | HTM1:HTM8(20%) 175 nm | HTM8 10 nm | SMB1:SEB1(3%) 20 nm | ETM:LiQ(50%) 30 nm | LiQ 1 nm |

In the comparison of OLEDs 11 and 12 with the OLED C1 containing the pure material HTM1 in the HTL, the addition of the material HTM2 (11) or HTM4 (12) results in a distinct improvement in lifetime, with substantially unchanged operating voltage.

On comparison of the OLEDs 13, 14 and 15 with OLED C2 containing the pure material HTM1 in the HTL, the addition of the material HTM2 (13) or HTM4 (14) or HTM8 (15) results in a distinct improvement in lifetime, with substantially unchanged operating voltage.

The same applies to the comparison of 16, 17 and 18 with C3, and the comparison of 19, 110 and 111 with C4.

The four test series differ by the different material in the EBL (HTM2, HTM4, HTM8 or HTM9). This shows that the effect of the improvement in lifetime occurs within a broad range of application, with different materials in the EBL.

TABLE 2

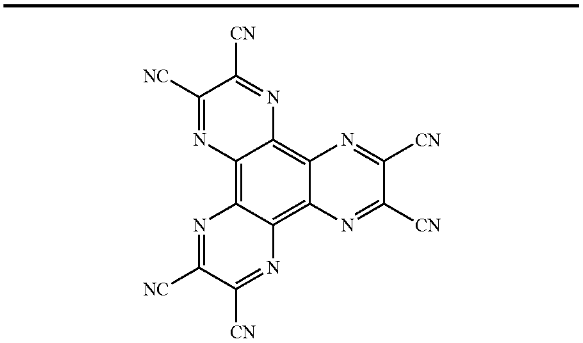

HIL1

TABLE 2-continued
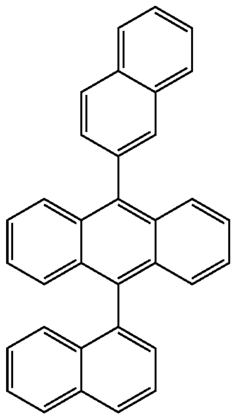
SMB1
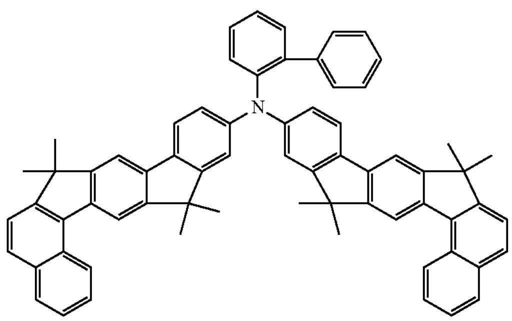
SEB1
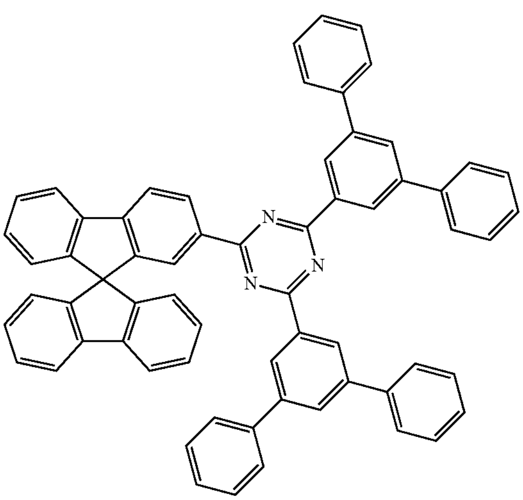
ETM
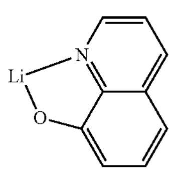
LiQ
TABLE 2-continued
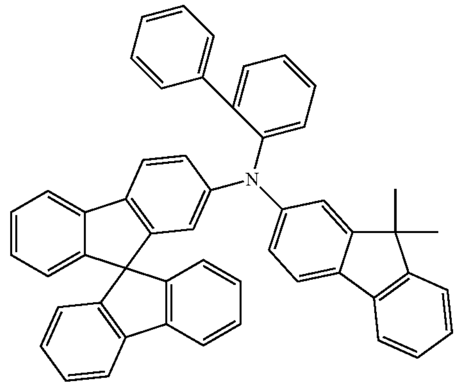
HTM1
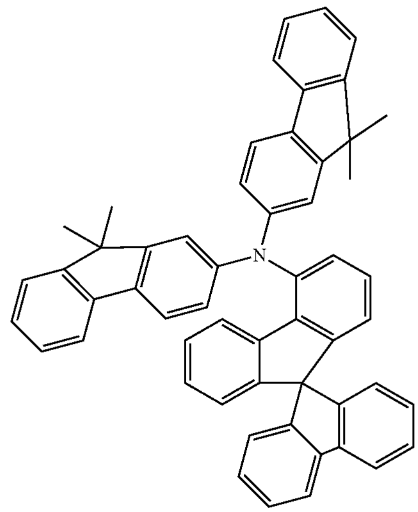
HTM2
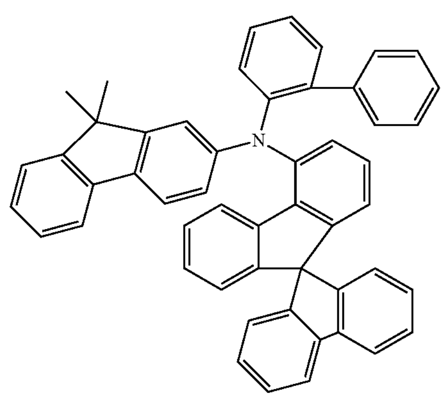
HTM4

TABLE 2-continued

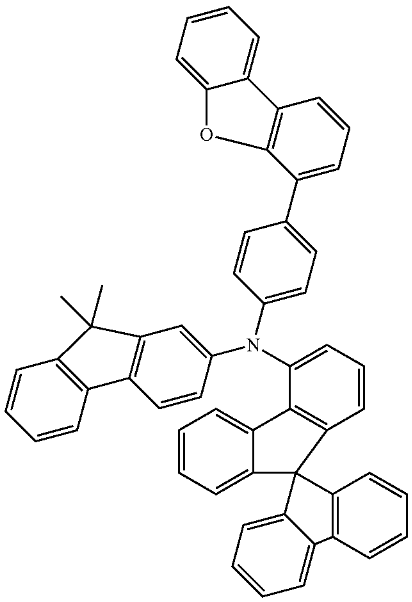

HTM8

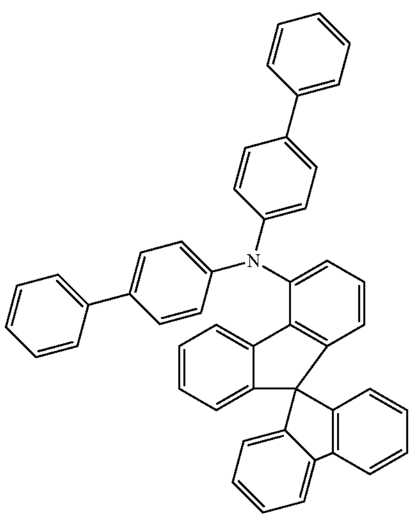

HTM9

3) Determination of the HOMO of the Compounds that are Used in the Mixed HTL

The method described at page 28 line 1 to page 29 line 21 of published specification WO 2011/032624 gives the following values for the HOMO of the compounds HTM1, HTM2, HTM4 and HTM8:

| Compound | HOMO (eV) |
|---|---|
| HTM1 | −5.15 |
| HTM2 | −5.18 |
| HTM4 | −5.26 |
| HTM8 | −5.25 |

The invention claimed is:

1. An electronic device comprising an anode, a cathode, an emitting layer disposed between anode and cathode, a first hole-transporting layer disposed between anode and emitting layer and containing two different compounds conforming to identical or different formulae selected from formulae (I) and (II)

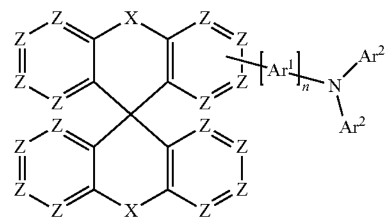

Formula (I)

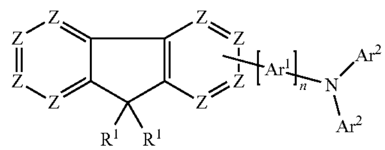

Formula (II)

where

Z is the same or different at each instance and is selected from $CR^1$ and N, where Z is C when a

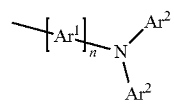

group is bonded thereto;

X is the same or different at each instance and is selected from single bond, O, S, C $R^1)_2$ and $NR^1$;

$Ar^1$ and $Ar^2$ are the same or different at each instance and are selected from aromatic ring systems which have 6 to 40 aromatic ring atoms and are substituted by one or more $R^2$ radicals and heteroaromatic ring systems which have 5 to 40 aromatic ring atoms and are substituted by one or more $R^2$ radicals;

$R^1$ and $R^2$ are the same or different at each instance and are selected from H, D, F, Cl, Br, I, $C({=}O)R^3$, CN, $Si(R^3)_3$, $N(R^3)_2$, $P({=}O)(R^3)_2$, $OR^3$, $S({=}O)R^3$, $S({=}O)_2$ $R^3$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^1$ or $R^2$ radicals may be joined to one another and may form a ring; where the alkyl, alkoxy, alkenyl and alkynyl groups mentioned and the aromatic ring systems and heteroaromatic ring systems mentioned are each substituted by $R^3$ radicals; and where one or more $CH_2$ groups in the alkyl, alkoxy, alkenyl and alkynyl groups mentioned may be replaced by $—R^3C{=}CR^3—$, —C≡C—, $Si(R^3)_2$, C═O, $C{=}NR^3$, —C(═O)O—, $—C({=}O)NR^3—$, $NR^3$, $P({=}O)(R^3)$, —O—, —S—, SO or $SO_2$;

$R^3$ is the same or different at each instance and is selected from H, D, F, Cl, Br, I, CN, alkyl or alkoxy groups having 1 to 20 carbon atoms, alkenyl or alkynyl groups having 2 to 20 carbon atoms, aromatic ring systems having 6 to 40 aromatic ring atoms and heteroaromatic ring systems having 5 to 40 aromatic ring atoms; where two or more $R^3$ radicals may be joined to one another and may form a ring; and where the alkyl, alkoxy, alkenyl and alkynyl groups, aromatic ring systems and heteroaromatic ring systems mentioned may be substituted by one or more radicals selected from F and CN;

n is 0, 1, 2, 3 or 4, where, when n=0, the $Ar^1$ group is absent and the nitrogen atom is bonded directly to the rest of the formula; and a second hole-transporting layer disposed between the first hole-transporting layer and the emitting layer, and one of the two different compounds in the first hole-transporting layer is a compound HTM-1 and the other of the two different compounds in the first hole-transporting layer is a compound HTM-2, wherein HTM-1 has a HOMO of −4.8 eV to −5.2 eV, and HTM-2 a HOMO of −5.1 eV to −5.4 eV.

2. The electronic device according to claim 1, wherein the emitting layer is a blue-fluorescing or a green- or red-phosphorescing emitting layer.

3. The electronic device according to claim 1, wherein the first hole-transporting layer has a layer thickness of 20 nm to 300 nm.

4. The electronic device according to claim 1, wherein the first hole-transporting layer has a layer thickness of not more than 250 nm.

5. The electronic device according to claim 1, wherein the first hole-transporting layer contains exactly two different compounds conforming to identical or different formulae selected from formulae (I) and (II).

6. The electronic device according to claim 1, wherein the first hole-transporting layer consists of compounds conforming to identical or different formulae selected from formulae (I) and (II).

7. The electronic device according to claim 1, wherein the first hole-transporting layer contains two different compounds conforming to a formula (I).

8. The electronic device according to claim 1, wherein the two different compounds conforming to identical or different formulae selected from formulae (I) and (II) are each present in the first hole-transporting layer in a proportion of at least 5%.

9. The electronic device according to claim 1, wherein HTM-1 conforming to a formula selected from formulae (I-1-A) and (II-1-A)

Formula (I-1-A)

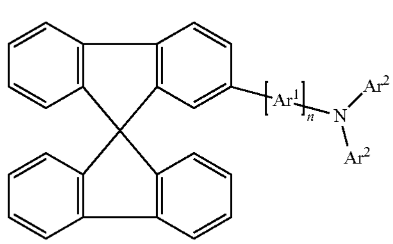

-continued

Formula (II-1-A)

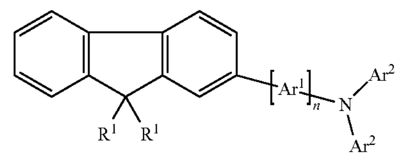

and HTM-2 conforming to a formula selected from formulae (I-1-B), (I-1-C), (I-1-D), (II-1-B), (II-1-C), and (II-1-D)

Formula (I-1-B)

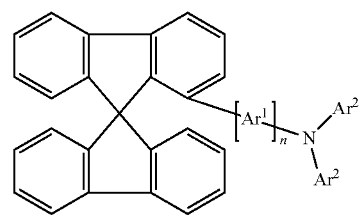

Formula (I-1-C)

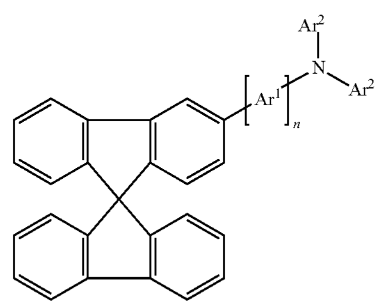

Formula (I-1-D)

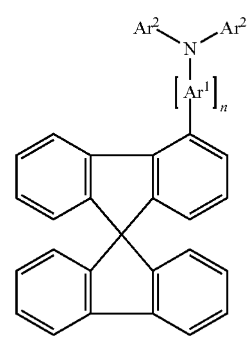

Formula (II-1-B)

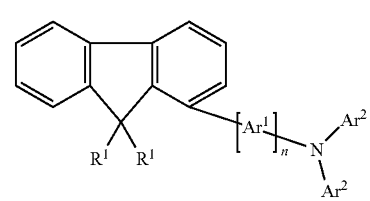

Formula (II-1-C)

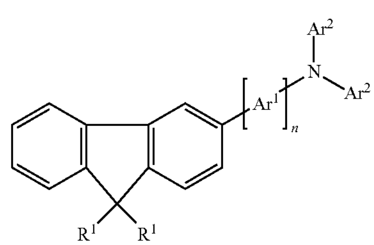

-continued

Formula (II-1-D)

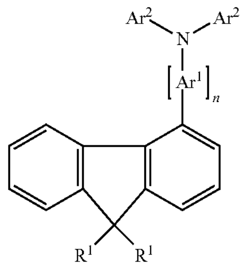

where the groups that occur in the formulae (I-1-A) to (I-1-D) and (II-1-A) to (II-1-D) are as defined in claim 1, and where the unoccupied positions on the spirobifluorene and fluorene are each substituted by $R^1$ radicals.

10. The electronic device according to claim 9, wherein HTM-1 is present in the first hole-transporting layer in a proportion five to two times as high as the proportion of HTM-2 in the layer.

11. The electronic device according to claim 9, wherein HTM-1 is present in the layer in a proportion of 65% to 85%, and HTM-2 in the layer in a proportion of 15% to 35%.

12. The electronic device according to claim 9, wherein HTM-1 has a HOMO higher than HTM-2 by 0.02 eV to 0.3 eV.

13. The electronic device according to claim 1, wherein the second hole-transporting layer directly adjoins the emitting layer on the anode side, and directly adjoins the first hole-transporting layer on the cathode side.

14. The electronic device according to claim 1, wherein the second hole-transporting layer contains a compound of a formula (I-1-B), (I-1-D), (II-1-B) or (II-1-D)

Formula (I-1-B)

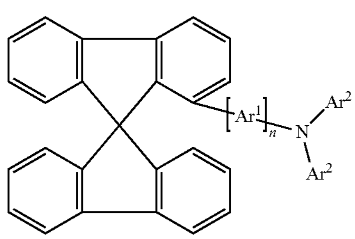

Formula (I-1-D)

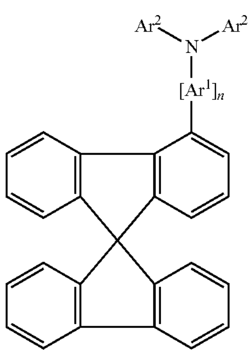

-continued

Formula (II-1-B)

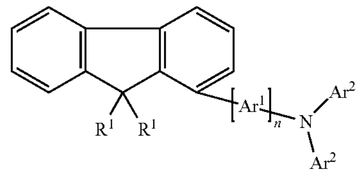

Formula (II-1-D)

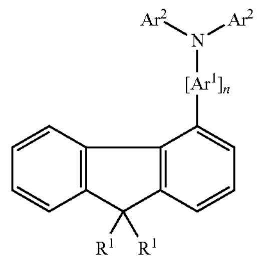

where the groups that occur in the formulae (I-1-B), (I-1-D), (II-1-B) and (II-1-D) are as defined in claim 1, and where the unoccupied positions on the spirobifluorene and fluorene are each substituted by $R^1$ radicals, or in that the second hole-transporting layer contains a compound of a formula (III)

Formula (III)

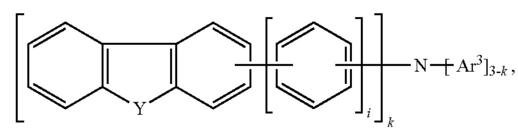

where:

Y is the same or different at each instance and is selected from O, S and $NR^1$;

$Ar^3$ is the same or different at each instance and is selected from phenyl, biphenyl and terphenyl, each of which is substituted by $R^1$ radicals;

k is 1, 2 or 3;

i is the same or different at each instance and is selected from 0, 1, 2 and 3;

and where the formulae are each substituted by an $R^1$ radical at the unoccupied positions.

15. A process for producing the electronic device according to claim 1, wherein one or more layers of the device are produced from solution or by a sublimation process.

16. A method comprising providing the electronic device according to claim 1 and incorporating the device in displays, as a light source in lighting applications or as a light source in medical and/or cosmetic applications.

* * * * *